(12) United States Patent
Denninghoff

(10) Patent No.: US 9,721,017 B2
(45) Date of Patent: *Aug. 1, 2017

(54) SEARCH AND NAVIGATION TO SPECIFIC DOCUMENT CONTENT

(71) Applicant: Karl Louis Denninghoff, Snohomish, WA (US)

(72) Inventor: Karl Louis Denninghoff, Snohomish, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/137,379

(22) Filed: Apr. 25, 2016

(65) Prior Publication Data

US 2016/0292276 A1    Oct. 6, 2016

Related U.S. Application Data

(63) Continuation of application No. 14/084,372, filed on Nov. 19, 2013, now Pat. No. 9,356,574.

(60) Provisional application No. 61/728,696, filed on Nov. 20, 2012.

(51) Int. Cl.
*G06F 17/30* (2006.01)
*H03H 9/02* (2006.01)
*H03H 9/10* (2006.01)
*H03H 9/25* (2006.01)
*G06F 3/0484* (2013.01)
*G06F 17/22* (2006.01)

(52) U.S. Cl.
CPC .... *G06F 17/30864* (2013.01); *G06F 3/04842* (2013.01); *G06F 17/2235* (2013.01); *G06F 17/30873* (2013.01); *H03H 9/02622* (2013.01); *H03H 9/1092* (2013.01); *H03H 9/25* (2013.01)

(58) Field of Classification Search
None
See application file for complete search history.

(56) References Cited

U.S. PATENT DOCUMENTS

2006/0173817 A1*  8/2006  Chowdhury ...... G06F 17/30696

* cited by examiner

*Primary Examiner* — Anh Tai Tran

(57) ABSTRACT

A computer-implemented system and method for search and navigation on a network to find and display specific search identified information in documents. Queries are sent to search engine services and responses comprising snippets are returned. Then, in response to only one or a few user inputs, documents are opened and locations of content matching or best matching the snippets are found reliably and distinguished in a display.

28 Claims, 45 Drawing Sheets

```
┌─────────────────────────────────────┐
│ Let <current_node, current_position>│
│ be the right pair that is to be     │
│ adjusted. Let <traversal_counter>   │
│ equal the right offset value. Let   │
│ <next_node> be the node to the      │
│ right of <current_node> in the node │
│ array (if there is none to the      │
│ right it is null ). Let <exit_loop> │
│ be false.                           │
│            4205                     │
└─────────────────────────────────────┘
                    │  ← 4200
                    ▼
┌─────────────────────────────────────┐
│ Set <exit_loop> to true if:         │
│ 1. <traversal_counter> is zero or   │
│    less,                            │
│ 2. <next_node> is null, or          │
│ 3. <next_node> contains text mapped │
│    by the Canonical Form.           │
│            4210                     │
└─────────────────────────────────────┘
```

Flowchart continues — FIG. 42 (left) blocks 4205, 4210, 4215 (Is <exit_loop> true?), 4220 (set <current_node> to the value of <next_node>, decrement the <traversal_counter> if <next_node> is not a Text node or Alt node interpreted as a Text node, and set <next_node> to the node to the right of the new <current_node> in the node array.), 4225 (Is <current_node> null or is VnT the type of <current_node>?), 4230 (Set <current_position> to the position of the last code unit of the text of <current_node>.), 4235 (Set <current_position> to 0.), 4240 (Return <current_node, current_position>.)

FIG. 43 (right) — 4300, blocks 4305, 4310, 4315, 4320 (increment the <traversal_counter>; node to the left), 4325, 4330, 4335, 4340 — mirror of FIG. 42 for left-side traversal.

FIG. 42        FIG. 43

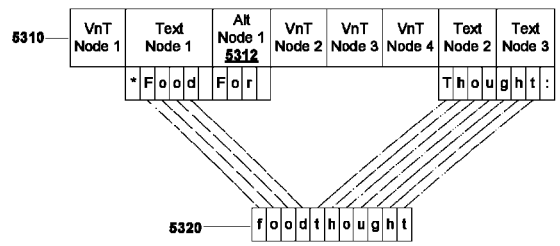
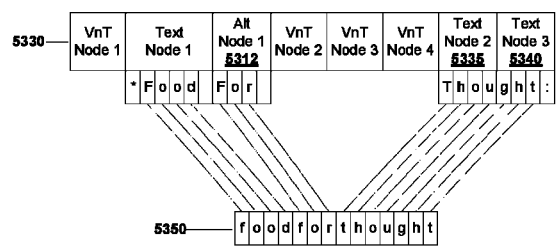
FIG. 53
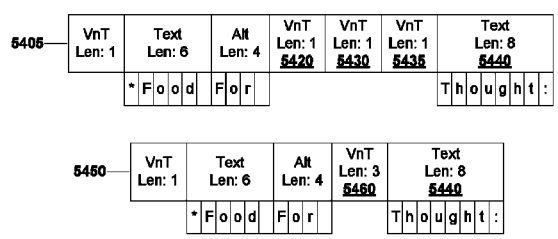
FIG. 54

SEARCH AND NAVIGATION TO SPECIFIC DOCUMENT CONTENT

CROSS-REFERENCES TO RELATED APPLICATIONS

This application claims the benefit of U.S. patent application Ser. No. 14/084,372, filed Nov. 19, 2013, the entire contents of which are incorporated herein by reference in entirety. Application Ser. No. 14/084,372 claims the benefit of U.S. provisional patent application Ser. No. 61/728,696, filed Nov. 20, 2012, the entire contents of which are incorporated herein by reference in entirety.

BACKGROUND

The design of hyperlinks, search engines, and browsers as well as many documents found in the Internet centers around first finding and then displaying desired content. This is what those components mainly do. Efficiently, conveniently, and reliably finding information and displaying it are core guiding design goals of the whole of the Internet and its components. Improvements in any aspect of these processes are earnestly sought.

Individual documents found on the Internet can be large, and user agents (typically Internet browsers) provide users with functionality similar to document editors for finding content. Typically, a user can type an arbitrary string, or copy an arbitrary string, into a "find" box of a browser and then search for that string. Often, he will copy text from the document itself into a "find" box, and search for additional instances in that same document. Also, he will copy content from the document and paste it into a search query to be sent to the search engine, in order to find instances of that content in other documents. A user may also open other documents and search for content that he found elsewhere in those documents.

When searching on the Internet using a search engine service, a user might enter the query string "brown cow"; in response the search engine service will typically return a document with several hyperlinks to web pages that the search engine service deems relevant. A search engine service also typically presents evidence of the relevance of the document represented by at least some of the hyperlinks, in the form of snippets constructed from the document's contents presented in proximity to the hyperlink for that document. For example, one document might have an associated snippet that reads, "how now brown cow." The user can read this snippet evidence, and further evaluate the relevance of that particular document to his actual intentions—which typically are not entirely captured by the interpretation of the query. Having determined that he wants to see the content of a document represented by a hyperlink in the search results, the user then clicks on the hyperlink and in response the browser presents or displays the content of the document.

BRIEF DESCRIPTION OF THE DRAWINGS

Exemplary embodiments are illustrated in referenced figures of the drawings. It is intended that the embodiments and figures disclosed herein be considered illustrative rather than limiting.

FIG. 42 illustrates adjusting the right position relative to a mapped node array according to a positive right offset value of type VnT (non text visual nodes).

FIG. 43 illustrates adjusting the right position relative to a mapped node array according to a negative right offset value of type VnT (non text visual nodes).

FIG. 53 illustrates the relationship between the Canonical Form and Alternative Canonical Form.

FIG. 54 illustrates the common DOM Form structure, including the compacted representation for transmission.

DETAILED DESCRIPTION

Figure 1:
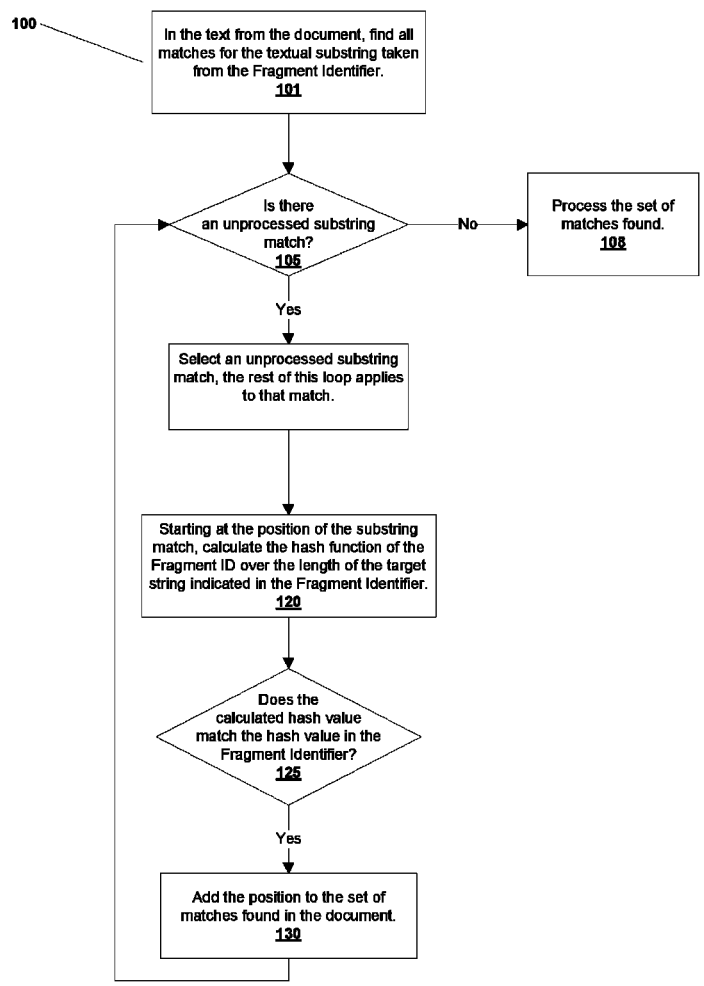
FIG. 1 illustrates prior art using a short substring match to filter potential matches for a standard hash comparison.

When a user examines search results, he may wish to initially see the context of the evidence that he saw in the search results. In other words, he may wish to see the evidence that was presented to him (e.g., the snippet or snippets) in the full context of the document contents. For example, he might want to see the context around "how now brown cow" and not just see some instance of "brown cow". While the user can achieve this by first opening and then reading through the entire document, in many situations such a thorough reading is inefficient if not entirely impractical. By just skimming a user may fail to find the searched-for evidence because it is no longer in the document—or it may have been changed since the document was indexed by the search engine; he cannot tell whether the snippet evidence is no longer present or he just missed what he was looking for, unless he does a thorough reading.

A possible efficiency improvement over doing a thorough reading is to manually copy the text of a snippet of interest from the search engine display into a clipboard and then, after the document of interest is displayed, pasting the snippet into the "find" box and use the find functionality by pressing the "next" and "previous" buttons to find matching snippets. There are many circumstances in which this is problematical as a solution; for example, the snippet evidence might not actually be in the document because the document changed. Also, the snippet evidence is often altered, sometimes necessarily, by search engines in various ways, making it an inexact string match. Because of these and other difficulties, without resorting to carefully reading through the whole document it is difficult to know with any confidence that the snippet evidence is in fact not present.

As a matter of productivity in many employment situations, it is important how quickly these operations can be done; browsing through search results and quickly and reliably finding any relevant information is a ubiquitous goal. The aggregated acts that together manually select text from a snippet in search results, copy the selected text into a clipboard, and paste the copied text into a "find" box, in addition to the selection act of clicking on a hyperlink, are time-consuming, error-prone, and tedious relative to simply clicking on a hyperlink. While less reliable and flexible than other embodiments, some embodiments operate in part by automating part or all of the above described manual process of getting snippet text out of a search results display, placing that snippet text into an existing find box on a browser, and then the user presses the existing "next" and "previous" buttons to distinguish, including scrolling to, matching text in an opened document associated with the snippet text. Other embodiments go part way in this automation process; for example, by automatically getting snippet text from the search results document into a clipboard along with selecting the document for display in a single action. From there the user can finish the task by pasting the clipboard contents into a find box.

In some browsers and other user agents, there is a single "find" box for all open documents. A user could manually type search text of interest into that single "find" box and perform the same find operation on each document that is opened after a search query; every time he changes the query for the search engine he may need to change the query in the find box. This approach fails to distinguish between the specific snippet evidence that is presented in the search engine results, may find too many matches to be useful, and it could fail to find a snippet of interest. While this can be done by a user, the required user inputs include arbitrary text input into the find box, which means that all document text that can be found by the find functionality is likewise distinguished.

Both of these manual operations for distinguishing exact matches to snippets are commonly used and error prone in the ways described. Reducing the number of distinct user actions needed to achieve the desired outcome is one means to increase reliability and productivity. Here we count the minimum number of single actions performed for the copy and paste operation described earlier. At a minimum, there are two single actions for delimiting the left and right bounds of the selection to be copied, at least one action to effect the copy, at least one single action to move the cursor or focus point to the "find" box, and the paste requires at least one single action. Then, there is at least one movement or positioning and one single action for activating the hyperlink for the document. Thus at least 7 single actions are performed by this method. In practice the movements, selections, copy and paste operations are more tedious; additional actions that may be required include making a request for the find box to be open for paste, scrolling or panning to make action points visible, and an initial request to actually find a first matching string may be required. In some embodiments all of this is beneficially reduced to a single action.

The method of directly typing in a snippet into the find box cannot be included in a useful set of distinguishing inputs for a distinguishing context because anything can be typed and the inclusion of such input capability in a set of distinguishing inputs makes every part of the document that can be found in this way distinguished. Permitting such arbitrary typed inputs leaves no inherent way to distinguish between one string and another in a document—they are all in effect distinguished depending on what the user inputs. In addition, entering such a search query by hand takes at least one action to select the point to enter the text, and snippet searches shorter than 7 characters are essentially useless in general. Thus, this mechanism effectively requires more single actions than the copy-and-paste mechanism and is tedious as well as error prone.

A focus of some embodiments is to enable the user to efficiently navigate from search engine results to document snippets of interest in the source document. In some embodiments this occurs even though the version of the document that is indexed is different from the version that the user obtains when following the hyperlink.

Since various applications can take a user to a particular part of a document and distinguish that part, rapid navigation to a particular document snippet could occur inadvertently and in a manner that doesn't provide the intended benefit; for example, a simple annotation could have previously been attached to a particular word in a document that happens to be located within a document snippet of interest. When the document is opened, such an annotation might automatically be attached to an instance of "how now brown cow", which might also have been the snippet of interest in search results from which the document was opened.

To avoid such an annotation from satisfying the conditions of a description of the desired behavior, and thereby causing inadvertent confusion and interfering with a clear description, when precisely describing the desired functionalities of some embodiments it is useful to describe the behavior in terms of a pair of searches that produce snippets from the same document. If the user can efficiently navigate to only one or the other set of snippets and the user can visually identify the snippets of interest from the rest of the document, then those two snippet sets are usefully distinguished by the navigation mechanism. An annotation that is attached to the document cannot meet this requirement because it distinguishes the same content. In the "how now brown cow" example, it would always annotate "how now brown cow", which might by accident satisfy the requirements for one search but would not satisfy two unrelated searches.

The desired functionality cannot be demonstrated in every document; for example, a document in which the text of every word is the same, although it could be repeated thousands of times, has nothing useful to distinguish—any snippet sequence from the document would appear everywhere.

Likewise, not all query pairs can be used to demonstrate the benefits; for example, if both queries were the same, then the same snippets would result and the "how now brown cow" example above could accidentally take the user to the "right" document snippet for both. However, for most documents that are neither trivially short nor trivially repetitive, a pair of search queries can be written for which the resulting snippets from the two queries appear separately in the document.

Documents served out via the Internet are increasingly dynamic, i.e., they have content that is different for different types of accesses or from one access to the next. In many cases, no two sets of document content are identical when they are served out, and in addition the content provided to search engines may be different to anything ever served out to browsers or other user agents. In addition, by the action of active content or scripts, a document may change after it is transmitted or may change dynamically as it is displayed. Of course, if the versions of the document are so different that there is no commonality between them, then whatever the search engine finds in its index for that document is unrelated to the content of a later access to the document. However, even when every served out copy of a document is different in some way or is modified at the user agent that displays it, it is likely that the different copies have considerable common content; moreover, only content that will be common long enough for users to search for that content is usefully indexed in a search engine. Therefore, it is useful to have a mechanism that works effectively in an environment of dynamically changing documents. Some embodiments have this capability.

INTRODUCTION

Computationally speaking, a symbol is a distinct identifier that is computer readable. Sequences of symbols may represent sequences of any set, such as characters from a language script or set of scripts, image color intensities, DNA base pairs, and protein sequences. Such sequences range from those where symbols may repeat without restriction to those where a particular symbol appears at most once.

A sequence of n symbols is called an n-gram, and its hash value is called an n-gram hash. In application, large numbers of n-gram hashes are calculated efficiently over a lengthy symbol sequence.

There are particular hash value computations that are especially useful for computing some n-gram hashes. These hashes are computed over the n-symbol sequences that result when a window that is n symbols long moves over the input stream, one character at a time; i.e., a sequence consists of the last n−1 symbols of the previous sequence and an additional symbol. The terms "rolling" and "recursive"

apply interchangeably to identify computations over these sequences using a hash function with three inputs: the hash value of the previous sequence, the symbol to be removed from the start of the previous sequence, and the symbol to be added to its end. A rolling hash function updates the previous value and does not repeat the hash calculation over the n−1 symbols common to both sequences. If a rolling hash calculation procedure is known to exist for a particular hash function, it is called a rolling or recursive hash function. Its advantage compared to other hash function calculations is its computational efficiency. The use of rolling hash computations reduces the cost of repeated n-gram hash calculations and the savings can be substantial even for small values of n. The savings generally increase as n increases with specific benefits depending on the rolling hash function chosen.

While it is widely believed that some hash functions, such as the standard cryptographic hash functions, are not rolling hash functions it is generally not definitively known whether a particular hash function is a rolling hash function unless someone has invented a rolling computation procedure for that hash function or the function has been shown definitively to have some characteristic incompatible with rolling hash computations.

The state of the art for recursive (rolling) n-gram hashing is presented in "Recursive n-gram hashing is pairwise independent, at best", a paper by Daniel Lemire and Owen Kaser, herein called Lemire-Kaser. Lemire-Kaser rigorously proves that families of fully randomized irreducible-polynomial based rolling hash functions, collectively called "GENERAL", have an important quality of distribution property called pairwise-independence. Lemire-Kaser further proves that no rolling hash function family can have better than pairwise-independence. Thus Lemire-Kaser proves that GENERAL has the best possible quality of distribution property within the class of rolling hash functions. Their paper provides multiple methods for implementing GENERAL and further studies the computational cost of those methods in rigorous mathematical detail. Lemire and Kaser also implemented and empirically tested the relative performance of GENERAL implementations against other hash functions. In the end, Lemire-Kaser recommends the use of other hash functions over GENERAL in all circumstances.

The state of the art in the application of n-gram hashing is realized by cross-matching arbitrary n-character-sized pieces from two files, typically done to efficiently synchronize the contents of the files using shorter hash values (relative to n characters, so n is relatively large in this application) for the n-character blocks. Multiple patents describe such matching as a component of what has come to be known as de-duplication. (Note that some forms of de-duplication do not use rolling n-gram hashing.) In these schemes the use of efficient rolling n-gram hashes is often combined with standard hashes in a two-stage process. The n-gram hash is used to efficiently detect most non-matching comparisons and eliminate them from fruitless primary hash calculations. The standard hash, usually having many more hash bits, is calculated for a potentially matching n-gram only if the efficient rolling hashes match. If the rolling hash values do not match, the two underlying strings differ so there is no need for further comparison. If the rolling hash values match, however, the underlying content might be different because of the unreliability of efficient n-gram hashes, so a more reliable hash value is calculated to eliminate false positives. The second hash function used in commercially viable implementations is typically a cryptographic hash function.

Fragment identifiers are given as suffixes on Universal Resource Identifiers (URIs); URIs are somewhat imprecisely but commonly called Universal Resource Locators (URLs). RFC 3986, "Uniform Resource Identifier (URI): Generic Syntax", specifies that fragment identifiers follow a hash ('#') character at the end of a URI. Other specifications consider only the part before the hash to be the URI and, when followed by a fragment identifier, the URI becomes a URI reference or "URIref". For example, in its Resource Description Framework document "RDF Primer" (found on the www.w3.org web site in the document referenced by TR/rdf-primer/), the W3C standards organization states that "A URI reference (or URIref) is a URI, together with an optional fragment identifier at the end." The part before the hash most commonly identifies a document, and the part after the hash identifies a particular part of that document, i.e., a "fragment". A basic motivation is that a fragment identifier at the end can precisely identify relevant content in a document, and hyperlinks utilizing such fragment identifiers may more precisely and concisely contribute to the intended meaning of hypertext.

The current state of the art for arbitrary identification of specific content by URI fragment identifiers is reviewed and advanced in a paper by Sebastian Hellmann, Jens Lehmann, and Sören Auer, called Hellmann-Lehmann-Auer here, which has been preliminarily 'published' on the Internet as "NIF: An ontology-based and linked-data-aware NLP Interchange Format", and can currently be downloaded from the document papers/2012/WWW_NIF/public.pdf found on the web site svn.aksw.org. It is a draft that is in the peer-review process prior to formal publication, so edits might occur.

Hellmann-Lehmann-Auer distinguishes between fragment identifiers using position-based schemes and those using content-based schemes. It shows via logic and by empirical examination of Wikipedia modification logs, that position-based schemes are fragile—with high probability they break in the face of modifications to a target web page. Hyperlinks that depend on them are even more susceptible to the ubiquitous broken-link problem, commonly called 'linkrot', than simple URIs. Linkrot has been identified by multiple investigations as a fundamental impediment to web usage and many users avoid web pages plagued by it. Document writers know that if their content has linkrot, their readership can decline severely. Nevertheless, prior art provides few examples of alternative content-based fragment identifier schemes even though they are more resistant to linkrot, and fewer still where the fragment identifier does not grow in length as the identified content grows in size. It is perhaps revealing that, at this late date, Hellmann-Lehmann-Auer felt it useful to empirically prove by test results that position-based fragment identifier schemes are highly susceptible to linkrot and that the problem is diminished by using content-centric fragment identifiers.

Unbounded length content identifier schemes essentially append the target string to the end of the URI, which can only work up to a somewhat fuzzy limit in length, because user agents that interpret URIs (e.g., web browsers) limit their size for practical reasons. Moreover, long URIs are inefficient even if their length is under some ad-hoc limit. Additional disadvantages are that URIs may be encoded in their entirety as arguments to much longer URIs. Users routinely encounter and use such URIs-within-URIs when they click on hyperlinks in search engine results. Thus the effective limit may be much shorter and less well defined than the truncation point for any particular browser. If arbitrary content is to be identified, fragment identifier schemes cannot grow proportionally with the size of the text identified, and being shorter than the content is generally better.

Fragment identifiers using position-based schemes have the advantage (for average non-contrived documents) of only growing logarithmically with the sizes of the target documents and identified fragments. However, schemes such as some XPath-based XPointer schemes of XML that identify positions in the markup (as opposed to positions relative to e.g., the beginning of content), can be made to grow as fast, or faster, than the size of the document's content. Markup paths can be made arbitrarily deep independently of the size of the content, and each step down in such a path may be encoded separately to arrive at an XPath position. Thus it is possible to artificially construct a web page with little content for which either the automated XPointer creation will fail or the created link will fail due to its large size.

Positions have no fundamental relationship with content or its intended meaning. Original content could be removed and semantically unrelated content inserted to replace it without changing the markup at all; pre-existing position-based fragment identifiers would then identify the new unrelated content. This is not different from standard fragment identifiers that name the 'id' attribute of an HTML element pre-inserted for the purpose of identifying a position in the markup. While typically meaningful in practice, there is no requirement that id names used in standard fragment identifiers be meaningful. A web page can be reorganized as described above, and a fragment identifier can be reused to identify content unrelated to the previous content. Use of that internal 'id' attribute as a fragment identifier would have the same disadvantage as position-based fragment identifiers. From this we see that fragment identifiers have been intended, for the most part, as extensions of the basic URI philosophy of an 'address', where the content at a particular address can change at any time.

A reasonable question naturally arises: if the URI preceding the hash ('#') has these changeable characteristics, what additional harm is done if a fragment identifier after the hash also has this issue? Asked differently, given that URIs preceding fragment identifiers have this issue, what good can be done by fragment identifiers that do not have this issue? In part this question is answered by Hellmann-Lehmann-Auer; they show that in general fragment identifiers contribute significantly to linkrot but content-based fragment identifiers contribute far less.

The answer from the broad Internet and XML communities has been that there is no compelling benefit. For example, passing interest in an aspect of this problem was seen in the 1999 requirements statement from the XPointer specification. It allowed the optional ability to determine whether an XPointer still pointed at the "same target" as when it was created, and pointed out that a checksum would work for this. The W3C XPointer requirements document "XML XPointer Requirements Version 1.0", contained in the file TR/NOTE-xptr-req, found on the web site www.w3.org, states:

'It must be possible, but not mandatory, to create XPointers that can be tested for whether they identify "the same" target when followed as they did when created. For example, this may be accomplished by providing a checksum of the destination data. This massively improves robustness because you can detect when a link has broken (although it cannot prevent link breakage from ever happening). [There is no consensus on whether this requirement should be addressed within XPointer or XLink].'

It isn't clear whether the "same target" meant content or content plus markup together, because there is still no specification, and responsibility for creating such a specification has been passed from one group to another as well as postponed.

The lack of interest may be consequent to the fact that no one seems to know what useful action the browser might have taken if it detected a change. If there is nothing useful to do, it does not improve the user experience. The requirement documents do not help with this; there is apparently no documentation providing insight as to what a browser might have done.

This lack of interest occurred even when it became clear that something is wrong. For example, the XPointer implementation itself was inadvertently crippled in the popular Mozilla Firefox browser implementation during a code reorganization, which occurred years before the loss was first noticed, in 2011. When finally noticed, it was observed that either no one knew or no one who had known cared enough to mention that XPointer had been absent for years. This contributed to a decision to formally eliminate it from the code base. These events occurred even though the XML community has been sufficiently exercised about XPointer to carefully write specifications and books about it. It appears that at least some in the XML community thought that XPointer would have contributed to the uptake of XML and the consequent obsolescence of HTML, leading to unification in XML. The contrast between expectations and outcomes could not be greater. This long-standing experience would tend to support notions that a central focus of XPointer (e.g., positioning via markup) is suboptimal, the problem addressed by XPointer is a sideshow to the real problem, or there was no real problem to be addressed in the first place.

After years of inaction by the mainstream, Hellmann-Lehmann-Auer appeared out of the natural language processing community, with central issues being robustness of the links and general applicability (i.e., not limited to just XML, HTML, or any other single document format). At least some in that community believe that the web needs something better than XPointer. If precisely targeted cross-document externally-generated links are so hard to understand, uninteresting, unreliable, unusable, fragile, long, or whatever the right descriptive combination is for whatever causes the wider communities of HTML, XML, PDF, and DOC file authors to be unable or unwilling to use them, then the practical means available to achieve the precision envisioned in broader notions of a semantic web do not include means for externally-generated precise links to specific information within a document. While such means are effectively absent, it may be reasonable to ask if effective organic evolution towards the more ambitious notions of a semantic web is possible.

As described in Hellmann-Lehmann-Auer, and abridged here mainly by shortening, the now abandoned LiveURLs project was a Firefox plugin that has content-based means to produce string identifiers. The string identifiers are in turn appended to URIs as fragment identifiers. The user can select text in a browser and the plugin creates the URL with the corresponding fragment. The URI can be shared and the referenced string is highlighted by a browser equipped with the plugin when it opens the URI. The content-based fragment has a format of sSI+c, where s is the length of the starting word of the selection, S is the starting word of the selection, l is the length of the total selection, + is a delimiter, and c is the selection checksum. This scheme does not provide uniqueness; in many natural circumstances it does not unambiguously identify a particular instance of a string that is repeated elsewhere in the document. In particular, as target strings grow shorter it becomes more likely they will be unintentionally repeated. Moreover, any length string may be intentionally repeated any number of times.

Note that LiveURLs' content-based fragment identifiers have the significant benefit of not growing proportionately with the length of either the selected text or the document. Since the length of the selected text is encoded, the fragment identifier formally grows logarithmically to the size of the selection, which effectively matches the minimum space requirements of a position-based fragment identifier. Such logarithmic growth leaves it well within URI length limits for practical web pages and usefully-sized target documents.

Hellmann-Lehmann-Auer advances the art by providing a new scheme for identification of arbitrary content that the authors call 'Context-Hash-based URIs'. The fragment identifier of that scheme contains 5 elements described in the following quote:

"Context-hash-based URIs are constructed from five parts separated by an underscore '_':
1. a scheme identifier, in this case the string 'hash',
2. the context length (number of characters to the left and right used in the message for the hash-digest),
3. the overall length of the addressed string,
4. the message digest, a 32-character hexadecimal MD5 hash created from the string and the context. The message M consists of a certain number C of characters (see 2. context length above) to the left of the string, a bracket '(', the string itself, another bracket ')' and C characters to the right of the string: 'left-Context (String)rightContext'
5. a human readable part, the first 20 (or less, if the string is shorter) characters of the addressed string, urlencoded."

In both LiveURLs and Context-Hash-based URIs, a short portion of the target string is included in the fragment identifier. This can be said to help users understand the fragment identifier, but it also limits the number of places in the document that could match, which in turn beneficially limits the number of hash function calculations that must be made in searching for the full match. In both of these schemes, in order to find the targeted fragment, for efficiency reasons it is necessary to search for those positions that match the short included string, and then calculate the hash only at the position of each such match. The procedure given in Hellmann-Lehmann-Auer to ensure uniqueness of the hash within the document does not in fact achieve uniqueness for the matched string; i.e., in some circumstances more than one string may match the fragment identifier. Nevertheless, the basic idea expressed in the prose is to grow the context on each side of the target string equally by one character at a time until the whole of the string is unique in the document; in other words until the prefix, targeted fragment, and suffix concatenated together is unique. The context length is then encoded in the fragment identifier. A disadvantage of this scheme is that it either becomes undefined or fails to achieve uniqueness when the prefix or suffix grows to the beginning or end of the document but, due to the non-uniqueness, additional growth on each side is required.

There are circumstances other than when opening a URI with a fragment identifier, where users are provided with a selective or modified display of documents. In some circumstances, Google assists the user in locating occurrences of the search terms by modifying the selected document's presentation based on the user's search criteria. The user types a set of terms in a Google search window and Google returns a set of possible documents with chosen document content (typically titles) as hyperlinks. The user clicks on one of the hyperlinks to select a document. In the subsequent presentation, all occurrences of the user's search terms are highlighted. At the time of writing, the Google patent search engine presents documents in this manner. This behavior for patent searches is the state of the art for providing additional user assistance wherein the presentation of target documents is modified to reflect prior user interactions with a search engine.

Multiple existing search engines present snippets from selected documents as part of their search results. The snippets give the user additional information about the relevance of a particular search result by providing him with short strings (snippets) that are typically document content, and are often taken from what appears to the search engine to be the part of the document most relevant to the search criteria. Google and other search engines have extended this snippet concept to include content taken from non-displaying markup embedded in the HTML; this markup is actually meta-data that identifies different kinds of information to computers, so that a computer can categorize it and associate it with other data. This capability is a feature of the "semantic web". For example, the snippets for a particular commercial product could include a product name, availability, price, etc. that are taken from the document's markup and formatted for display according to the "rich snippet" format. The additional markup uses one of three standard formats; these implement a universal schema and provide a kind of template with slots that can be filled in with data. This information is presented to the search engine along with the associated schema information. It is displayed without the markup which would be confusing for human readers.

Whether the snippets are only generated by text matching schemes, or are also based on semantic information embedded in the markup as is done for "rich snippets", the content is presented to the user in order to help him determine if he is interested in that particular document. If he is, then he clicks the hyperlink having a URI to that document.

According to RFC 3986, browsers do not send fragment identifiers to the server with the rest of the URI. However, modern browsers have changed from tools that just showed content to tools that do things, and the fragment identifier has evolved into a different kind of tool as well. It is used for a wider range of things having nothing to do with the original intent. For example, the content of a fragment identifier may easily be sent to the server by web page scripts, as is done by a great many web sites today. This circumvents the original prohibition against web servers seeing that part of a URI. Now the server may download a script that obtains the fragment identifier for a page and sends it back to the server. The fragment identifier may then determine what content will be downloaded by the server. Moreover, a specific intent of RFC 3986, the ability of users to identify content of documents without the source of the document (i.e., the server providing the document in the case of HTML over the Internet) having an opportunity to interfere, has been thwarted.

Of particular interest is the provision of RFC 3986 that makes '#' a reserved delimiter and precludes it from appearing in the fragment identifier itself. Since the fragment identifier portion of a URI cannot have a second '#', a URI cannot have multiple fragment identifiers. Thus, if a fragment identifier is used to modify the actual downloaded content (as is commonly done now via scripts on a browser), the syntactic position for a fragment identifier has been taken and there can be no second fragment identifier to serve the original purposes as specified in RFC 3986. This syntactic provision of RFC 3986 is now regularly ignored, but not without consequences. A presentation of several relevant points is found in a W3C Internet document titled "Repurposing the Hash Sign for the New Web", which discusses the widespread violation of RFC 3986 and explores some issues not discussed here.

The repurposing of the fragment identifier to change the displayed content has interfered with aspects of the Internet as a searchable information platform, which has in turn lead to further repurposing. For example, in response to deleterious effects on the quality of web searches from these unplanned organic changes in usage, Google created and publicly specified the '#!' (hashbang) delimiter syntax as an extension of the '#' URI delimiter. Hashbang semantics allow web servers to provide Google and other search engines with what is effectively a separate promise of what users will see when they open some URIs. This differs from prior search engine indexing behavior, which looked at web page content as it would have downloaded to a user agent, with no further processing.

The use of the hashbang facility creates a new problem for search engines; the promised content may not be what a user actually sees. Such inaccuracy could arise from many causes ranging from malicious manipulation of search engines to benign temporary database inconsistencies. With modern web browser and server behavior, particularly with web pages that use scripts to identify and dynamically download further content, the only means to verify the accuracy of such a promise is to open the web document in a browser environment and allow its scripts to run. This is costly for search engines; Google created the hashbang facility in part to avoid the inefficiency of running scripts. If Google were to verify every such promise by running web page scripts in a browser environment, then there is essentially no point in the hashbang facility since such verification could accurately index documents.

The ad-hoc Google hashbang 'specification' allows additional appearances of the hash ('#') character to follow a hashbang ('#!'). Even if Google and other search engines were to download every document into a browser environment and run its scripts in order to index the content, allowing multiple hash delimiters would remain a practical necessity. While doing so violates the syntax requirements of RFC 3986, it permits appending true fragment identifiers (fragment identifiers that are used according to the semantics of RFC 3986) to any URI, including those that may already have one or more hash delimited 'fragment identifiers' serving other purposes. This allows some of the intent of RFC 3986 to survive while sacrificing one of its constraints. Given this situation, use of multiple 'fragment identifiers' syntactically delimited by multiple hashes '#' is not in effect a violation of the specification.

FIG. 1 illustrates a prior art process 100 that uses hash functions in fragment identifier schemes such as Hellmann-Lehmann-Auer and LiveURLs. The substring appearing in the fragment identifier is searched 101 by standard text matching algorithms across the document to find any matches. If there are 105 such text matches, then starting at each match the hash function of the scheme (e.g., MD5 for Hellmann-Lehmann-Auer) is calculated 120 over the length of the target fragment (the length is known because it is encoded in the fragment identifier). If the calculated hash matches 125 with the hash value from the fragment identifier, then that match is construed 130 to be an identified fragment of the document; as such it is further processed 108.

Several embodiments of the described technology are presented in detail in reference to the Figures. The computing devices on which the described technology may be implemented may include one or more central processing units, memory, input devices (e.g., keyboard and pointing devices), output devices (e.g., display devices), storage devices (e.g., disk drives), and network devices (e.g., network interfaces). The memory and storage devices are computer-readable storage media, e.g., storage media that are non-transitory, that may store instructions that implement at least portions of the described technology. In addition, the data structures and message structures may be stored or transmitted via a data transmission medium, such as a signal on a communications link. Various communications links may be used, such as the Internet, a local area network, a wide area network, or a point-to-point dial-up connection.

For this description, the capitalized term 'Fragment Identifier' applies to URI fragment identifier created according to these embodiments, although 'of an embodiment' or words to that effect may also appear. If a Fragment Identifier is appended to a URI, thus creating a URI with a Fragment Identifier (of an embodiment), then for brevity we may call that URI a 'Fragment URI'. Similarly, a hyperlink that comprises a Fragment URI (of an embodiment) is termed here a 'Fragment Hyperlink'. To refer to fragment identifier that are not of an embodiment, we use the term 'Conventional Fragment Identifier'.

Some embodiments utilize a rolling hash function to filter potential matches for further checking with a primary hash function. Also, some embodiments use a rolling hash function to find matches solely on the basis of rolling hash function matches, i.e., without further checking of matches by subsequent use of a conventional hash function.

Figure 2:
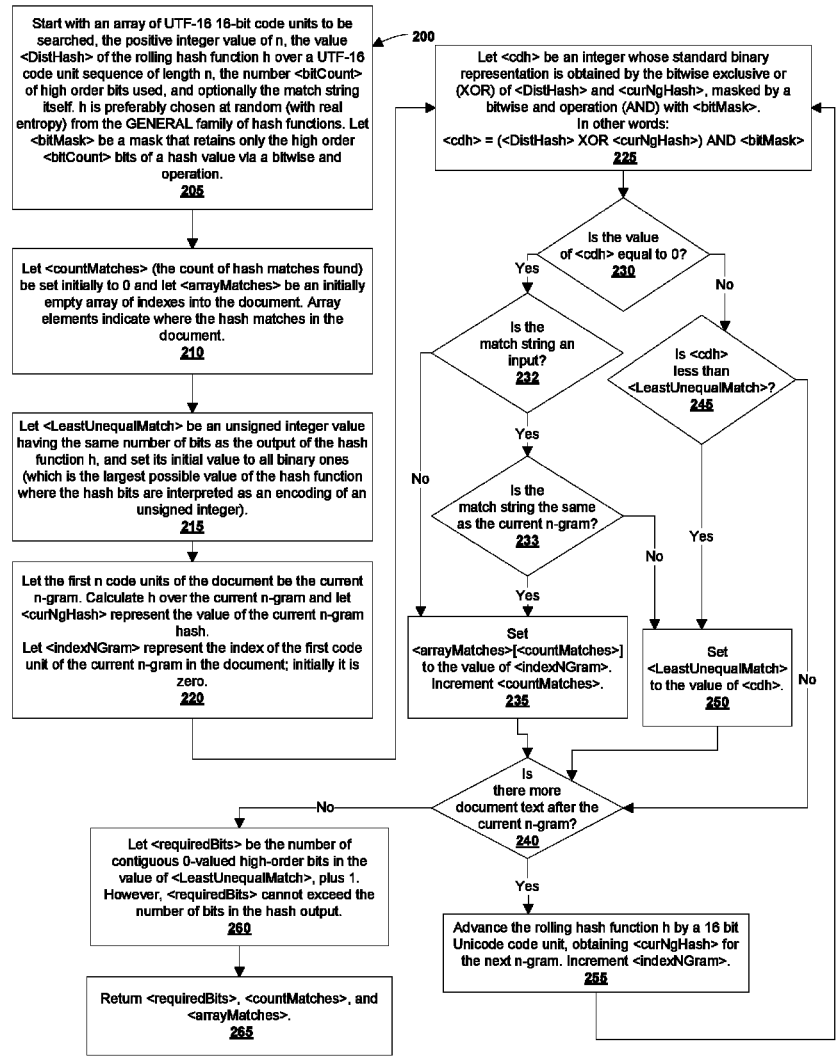
FIG. 2 illustrates using a rolling n-gram hash for searching and simultaneously calculating the required number of bits.

FIG. 2 illustrates the calculation 200 of a rolling hash whereby n-gram hashes are calculated across a document to find potential matches and to calculate the number of bits required to distinguish between substrings of the document and the match string. For the purpose of finding the number of bits required, all the hash bits are used. For such calculations the number of bits passed in the input is all of them, which in some implementations is 64 bits. In the transmission of Fragment Identifiers and subsequent searches for fragments identified, the number of bits used is generally much fewer than 64 and is calculated as described below.

The rolling hash calculation 200 requires 205 inputs of an array of code units, the length n of a match string, the value of the rolling hash function <DistHash> over the n-length match string, the number of high order hash bits used <bitCount>, and optionally the match string itself. Note that the match string itself is not available when searching for a match for a Fragment Identifier, but is available when calculating the number of hash bits required to distinguish the fragment. The mask <bitMask> is set to have the high-order <bitCount> of bits set to 1 and the rest of the bits are set to zero. By bitwise and operation with <bitMask> only the <bitCount> high order bits of the output of the rolling hash function are retained and hence only those bits are compared.

In these examples and in some implementations, the length n is in 16-bit code units. Note that a 16-bit code unit is always 16 bits, even though a UTF-16 character may use two 16-bit code units. This does not mean that a match string would ever beneficially stop or start between the code units of a character, which should be avoided where possible. Thus n is not in general the number of characters but instead may be a larger number, and can be up to twice the count of characters. UTF-16 was designed with the intent that few documents in any language would need to utilize Unicode characters outside the UTF-16 Basic Multilingual Plane (BMP), and thus most have no characters longer than 16-bits; so for example this distinction has no effect on the vast majority of documents encountered by browsing the Internet, including those having Chinese, Japanese, and Korean. Nevertheless, some embodiments are applicable to documents having characters outside the BMP, and this distinction becomes important to realize some speed benefits of such embodiments. Alternative embodiments comprise checking every character to determine if it might be longer than 16 bits, and dealing with n-gram hashes where n applies to characters not having a fixed size of 16 bits, but it entails costly checking of conditionals in the inner-loops of rolling hash calculations and more space is required in the hash tables. This additional cost is high enough that embodiments that convert characters to the 32 bit fixed-length Unicode as a pre-processing step provide benefits over those embodiments. The conversion requires computation time and generally double the space and time used to calculate the hashes. However, according to some embodiments the benefits are realized without such conversion. Nevertheless, while efficiency could be negatively affected, those skilled in the art will appreciate that any character encoding may be used without departing from the teachings of this specification, including the use of n as the number of characters as opposed to code units.

Initially 210 the number of rolling hash matches is set to zero and an empty array is created to store the indices of any matches found. An unsigned integer <LeastUnequalMatch> is large enough to store the hash output. In a rolling hash pass over the document it will always have the smallest value of a bitwise exclusive-or-based comparison between the hash to match (<DistHash>) and the n-gram hashes of the document. It is set initially 215 to the largest value possible from the comparison. The first n characters of the document become 220 the current n-gram and the rolling hash h is calculated over the current n-gram with the result placed in the variable <curNgHash>. The position <indexNGram> of the first 16-bit code unit of the current n-gram in the document array is initially set to zero, which indicates the first code unit of the document, where the document is interpreted as an array of code units.

The rolling hash loop begins 225 by calculating the bitwise exclusive-or (XOR) between the current n-gram hash and the hash to match, then masking it by bitwise AND with the bit mask. The result is placed in the variable <cdh>. I.e., <cdh>=(<curNgHash> XOR <DistHash>) AND <bitMask>

If the value of <cdh> is zero 230, then the match hash (<DistHash>) is the same as the current n-gram hash; however, if the match string itself is also available 232, then we compare the match string directly 233 to the current n-gram. If the strings are identical or if the match string is unavailable, then the <countMatches> position of array <arrayMatches> is set 235 to the position <indexNGram> of the current n-gram. I.e., <arrayMatches>[<countMatches>]=<indexNGram>

The number of matches, <countMatches>, is incremented.

In some embodiments, the direct match string comparison is not used on the basis that it is probabilistically unlikely that hash values of 64 bits or more would be the same for two different strings. Moreover, a decision to rely only on the hash can be based on easily meeting any required level of confidence; the probability of error drops exponentially as the number of bits in the hash increases. So with sufficiently many bits in the hash any desired level of confidence can be achieved. If higher confidence is desired then embodiments having 128, 256, or more bits from the hash function can be used.

If the value of <cdh> is not zero 230 or if the string comparison 233 fails, the match string differs from the current n-gram. In this case we check 245 to see if <cdh> is less than <LeastUnequalMatch>; if so then <LeastUnequalMatch> is set 250 to the value of <cdh>.

If there is more of the document following the current n-gram 240, then the rolling hash function value <curNgHash> is updated 255 to the hash of the next n-gram, which is the n-gram to the right in the document by one 16 bit code unit (one code unit is added to the end, and one removed from the beginning), and then the loop 225 begins again. The calculation of one beneficial rolling hash function is described in detail below.

If there are no more code units in the document to process 240, then the return value <requiredBits> is set 260 to the number of contiguous 0-valued high-order bits in the value of <LeastUnequalMatch>, plus 1. However, <requiredBits> is not allowed to be greater than the number of bits in the hash. One is added to ensure that at least one bit will be non-zero on any comparison of the match string's hash with any non-matching n-gram hash from the document. The values <requiredBits>, <countMatches>, and <arrayMatches> are returned 265.

Embodiments that calculate the number of bits required, and also do not require content substrings in the Fragment Identifiers, have a significant space advantage over existing content hash-based fragment identifier schemes. In not calculating how many bits are required, those schemes have no reliable choice but to use more bits than are in fact required. For example, Hellmann-Lehmann-Auer encodes the full MD5 complement of 128 hash bits into their fragment identifier as well as the partial substring. Because some embodiments limit the number of bits used by such precise means, and do not require either substrings or some other hash value from the Fragment Identifier to limit the number of expensive hash calculations, those embodiments save large amounts of space in Fragment Identifiers and hence URIs. It therefore becomes reasonable to use multiple hash values in a single Fragment Identifier while at the same time guaranteeing uniqueness where needed. Note that hash value uniqueness does not imply that a distinguished string is not duplicated as duplications occur arbitrarily in documents; it implies only that strings that are actually different have different hash values.

This rolling hash function is a modified form of the fully randomized rolling hash family called GENERAL by Lemire-Kaser. While Lemire-Kaser references Cohen as a precursor of the fully randomized GENERAL hash function, careful study of both papers reveals that the computation methods given by Cohen for his early version of GENERAL can be applied to the fully randomized version of GENERAL described in Lemire-Kaser; continuing the study also reveals that the resulting computation is asymptotically superior in time, space, or both to the implementations of Lemire-Kaser. In fact, the resulting implementation provides both pairwise-independence and the fastest computation amongst all of the rolling hash functions studied by Lemire-Kaser, including Karp-Rabin.

The GENERAL family also has advantages because it can be implemented with high efficiency for arbitrarily many output bits, which is not true of any other rolling hash function studied by Lemire-Kaser. For the other rolling hash functions, increasing the number of output bits increases the computational costs disproportionately. As noted in the introduction, Lemire-Kaser demonstrated by way of mathematical proof that the fully randomized GENERAL family has the highest theoretical quality of bits possible for any rolling hash function, i.e., pairwise independence. This is a high standard; for example, cryptographic hash function families such as SHA-1 and SHA-2 are not known to have pairwise independence or related pairwise independent constructions.

This version of GENERAL produces 64 pairwise independent hash bits in its output, but the number 64 is only chosen because it provides a sufficient level of confidence; those skilled in the art will appreciate that arbitrarily wide versions such as 128 bits, 256 bits, or even wider for GENERAL could be used. Wider versions would have a small additional computation cost when implemented on modern processors having SIMD (Single Instruction Multiple Data Path) registers and instruction sets. Because we calculate the number of hash bits actually required in Fragment Identifiers and thereby limit them, use of such wider versions of GENERAL would on average have no effect on the size of Fragment Identifiers created by such embodiments.

A particular 64-bit GENERAL family hash function was chosen by picking an irreducible polynomial, an initial value, and obtaining 4 kilobytes of true random (real entropy as opposed to pseudo-random) bits, which fills an array of 256 entries with 64 random bits each. This procedure for computing GENERAL is closer to that of Cohen because of its performance. This hash uses 8-bit symbols as input. In some implementations UTF-16 Unicode strings are hashed by repeated application of the function GENERAL for 8 bits of the encoding at a time; in the example implementation of this specification it is performed twice to align with a 16-bit Unicode code unit symbol.

Thus this example shows how to consume a piece of a symbol at a time and have smaller tables. The example implementation uses 16 bit symbols by consuming 8 bits at a time, which beneficially reduces the size of the tables. However, implementations that consume 4 bits at a time for 8 bit symbols, 4 bits at a time for 64 bit symbols, or 8 bits at a time for 8 bit symbols are all possible and analogous; those skilled in the art will appreciate that both larger and smaller symbols and larger and smaller sizes consumed at a time can be constructed according to these teachings.

Modifications to GENERAL used by some embodiments include an arbitrary initial value of the hash, which in both Cohen and Lemire-Kaser is fixed at 0. Here a randomly chosen value is used instead of 0. This random initial value becomes the 'hash' of a zero length string, which adds to the probabilistic insurance that different length strings will have different hash values, regardless of the random values assigned to individual symbols. While this non-zero initial value mathematically complicates GENERAL as a function, the effect on computation cost can be limited to a slight increase in the cost of building the hash tables. This aspect of this embodiment adds nothing to the computation cost in time or space once the modified tables are constructed. The following describes the modified version of GENERAL for 64 bits.

GENERAL family hash functions are each based on an irreducible polynomial, and for each width in bits there are different possible irreducible polynomials. One such polynomial for 64 bit width is the ECMA-182 standard polynomial, as described in "Standard ECMA-182. Data Interchange on 12.7 mm 48-Track Magnetic Tape Cartridges—DLT1 Format". It is represented most commonly in 64 bits (0-63) as the encoding 42F0E1EBA9EA3693, with the highest order (order 64) bit set to 1. According to industry practice the high order bit is not present in such an encoding; we let p stand for this encoding in the procedures that follow. In full polynomial form the ECMA-182 polynomial is written:

$$x^{64}+x^{62}+x^{57}+x^{55}+x^{54}+x^{53}+x^{52}+x^{47}+x^{46}+x^{45}+x^{40}+x^{39}+x^{38}+x^{37}+x^{35}+x^{33}+x^{32}+x^{31}+x^{29}+x^{27}+x^{24}+x^{23}+x^{22}+x^{21}+x^{19}+x^{17}+x^{13}+x^{12}+x^{10}+x^{9}+x^{7}+x^{4}+x+1$$

In the procedural descriptions that follow, the symbol pair '<<' stands for "left shift the left operand by the number of bits of the right operand, the shifted bits on the right are filled in with zeros". The leftmost bit or bits are shifted out and lost from 64 bit operands. The symbol pair '>>' stands for "right shift the left operand by the number of bits of the right operand, the bits shifted out are lost and zeros are shifted in". The symbol '&' stands for the "bitwise logical AND operator between the operand to the left and the operand to the right". The symbol pair '<-' means "assign the right operand value to the left operand". The symbols '0x' precede a literal integer given in hexadecimal; thus '0xff' is a sequence of 8 low-order binary bits of all ones and '(c[j] & 0xff)' gives the low order 8 bits of the value of the array c at position j. The symbol triple 'XOR' is the bitwise exclusive-or operator, the operand on the right is bitwise exclusive-or combined with the operand on the left. Note again that we process code units of 16 bits.

The rolling GENERAL family computation with initial state set to an arbitrary value requires an initial value w, a mapping (table) $h_1$ from 8-bit values to random 64-bit values; a table t with 64-bit entries previously built according to the function Buildtable below, and a 2-entry table r that holds 0 and the lower 64 bits of the polynomial (p).

```
1:  input: array c of UTF-16 16-bit code units
2:  input: 64 bit initial hash value w
3:  x <- w
4:  for each integer j starting at 0 to n-1 do
5:      x <- (x<<1) XOR r[x>>63] XOR h_1[ c[j] & 0xff]
5:      x <- (x<<1) XOR r[x>>63] XOR h_1[ c[j]>>8 ]
6:  end for
7:  yield x // i.e., further process this first n-gram hash
8:  for each integer j starting at n to the end of data do
9:      x <- (x<<1) XOR r[x>>63] XOR h_1[ c[j] & 0xff] XOR t[ c[j-n]& 0xff ]
9:      x <- (x<<1) XOR r[x>>63] XOR h_1[ c[j]>>8 ] XOR t[ c[j-n]>>8]
10: yield x // i.e., further process the n-gram hash x
11: end for
```

Buildtable: The function Buildtable builds tables t and r using the function Shift. Note that $Shift^n(w)$ represents the result of repeatedly applying the shift function to w, n times, using the result of each application of the shift function as input to the next one.

```
1:  input: 64 bit initial hash value w
2:  input: the mapping h_1
3:  input: 64 bit representation of the polynomial, p
4:  input: the number of code units n in an n-gram
5:  q <- Shift^{2n+1}(w) XOR Shift^{2n} (w) //q is a 64-bit integer
6:    for each 8-bit integer y do
7:        t[y] <- Shift^{2n}( h_1[y] ) XOR q
8:    end for
```

-continued

```
9:    r[0] <- 0
10:   r[1] <- p
```

Shift: The function Shift requires the irreducible polynomial of degree 64 described above represented by the encoding of its lower 64 bits as described above, as p.

```
1: input: 64-bit integer x
2: input: 64 bit representation of the polynomial, p
3: x' <- x<<1; // x is shifted left one bit to yield x', the leftmost (high
   order) bit of x does not appear in x'
4: if (x>>63) // i.e., if leftmost or highest order bit of x is 1, then
5:     x' <- x' XOR p
6: end if
7: return x'
```

The table r has only two entries and holds the values 0 and the polynomial p, which for performance reasons beneficially avoids a costly conditional branch in the inner loop. It is costly because a CPU cannot predict this particular branch based on the past behavior at this conditional branch. This inefficiency occurs in both the Cohen and Lemire-Kaser procedures for GENERAL. Such a two entry table will nearly always be in the level 1 cache of modern processors and the lookup is extremely fast. On the latest modern processors such an access is one cycle, the same time taken to access a CPU register.

Figures 3, 4:
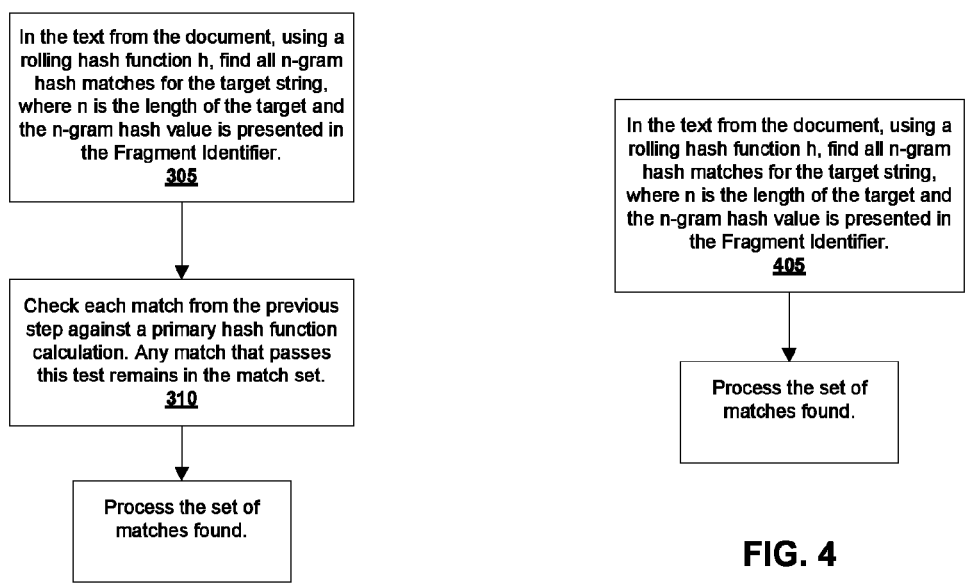
FIG. 3 illustrates using an n-gram hash to filter matches for Fragment Identifiers, and then using a standard hash-based comparison to find all content-based fragment matches.
FIG. 4 illustrates using an n-gram hash alone to find all content-based fragment matches.

FIG. 3 illustrates the use of the n-gram rolling hash 200 of FIG. 2 to filter matches 305 for Fragment Identifiers, and then using a primary standard hash-based comparison 310 to find all fragments that have content matching the "target string" (i.e., the string to be matched). A benefit of this mechanism is that there is no substring used to pre-qualify positions for the application of the primary hash function. The Fragment Identifier instead contains some bits of a rolling hash function, beneficially calculated over the entire target string, to eliminate most non-matching strings in a document.

FIG. 4 illustrates the use of the n-gram rolling hash 200 of FIG. 2 to perform the entire matching operation 405. In this operation, enough high-quality rolling hash function bits are used to match the string accurately within the document. In some embodiments, the number of bits used is encoded in the Fragment Identifier in order to make the Fragment Identifier short; a maximum of 64 bits is considered sufficient for this purpose but any larger maximum value could be used with the same effect on Fragment Identifiers. Also, smaller numbers of bits could be used most of the time without deleterious effects, but with increasing likelihood of difficulties as the number is lowered. With this space savings, embodiments as presented below can reasonably use more than one hash value in Fragment Identifiers.

One goal is to create robustness of links. Robustness is desirable against at least the following kinds of modifications:
1. Changes to the document outside the targeted information.
2. Changes within the targeted information that do not or that likely do not affect its semantics.

Note that if a benefit can be realized both by language-unaware means and language-aware means, then it is reasonable to determine if the language-unaware means provides additional computational or software-development efficiency. For example, if a benefit requires language-aware means, then typically at least some development occurs separately for each supported language. Thus, it is a goal to achieve what can be achieved by language-unaware means, and use language-aware means only where no efficient language-unaware means can be found.

These goals are interpreted broadly. Changes outside the targeted information include cutting and pasting the targeted information into another document, conversion of a document from one kind to another (e.g., from an HTML document to a PDF, XHTML, DOC, or XML document), presenting a document using one software product rather than another, adding to or removing extraneous information from a document, and wholesale changes to the markup structure of a document.

Language-unaware means cannot reliably deal with arbitrary meaning-preserving transformations such as translations between languages. Meaning is sometimes lost. This fact results in the ubiquitous nature of the phrase "lost in translation". As with arbitrary meaning-preserving transformations, categorizing transformations according to whether or not they preserve meaning also creates the opportunity for loss of information. It is the intention in choosing an embodiment to limit, insofar as is possible, such loss of information to circumstances that are likely to have been contrived to create such loss. This involves choices and judgment calls in the achievement of multiple but conflicting desirable outcomes:
- all meaningless transformations should be seen as meaningless,
- all meaningful transformations should be seen as meaningful, and
- any computed transformations and uses made of transformed documents should be computationally efficient.

It will be understood by those skilled in the art that such choices and judgment calls could be made differently without departing from these teachings. Moreover, experience may refine the choices and judgments that determine a precise embodiment or the best settings for its configurable elements.

Language-unaware implies that all languages are treated identically as though they are collectively one language, which in turn means that a character set that represents all languages simultaneously is beneficially used. It also means that content in one language does not generally match content in another language, even though their meanings may be identical. While any universal character set could be used, there is a set of related standardized character sets, collectively called Unicode, that have been created previously for this purpose. Any character set that achieves such universality could be mapped to any of these different Unicode character sets. The world-wide-web utilizes more than one such Unicode character set, and HTML documents can declare their character set representation at the beginning of the document. Nevertheless, whatever representation the document is in when transmitted or stored, some display engines (browsers) convert the representation internally to the UTF-16 Unicode variant. In this way all code accessing the document may be written to that common variant. Therefore, for these reasons and without loss of generality, from here onward we presume either that a document is represented natively in UTF-16 or has been translated to it.

Unicode characters are utilized non-uniformly from a meaning perspective. In some circumstances, the use of two different Unicode characters has the exact same effect on meaning. Such characters may even appear identical to the eye or only differ slightly in appearance. Examples of this are the different forms of quotation marks having different Unicode character values. In other circumstances the intended meaning can only be achieved by the use of a single unique Unicode character and different appearance is of necessity achieved in the presentation software by application of different presentation rules, such as use of a different font.

Different languages have different character sets and may have characters that are similar in appearance while having different Unicode values.

A basic unachievable but useful concept is to partition the set of characters into equivalence classes, whereby replacing any character with any other in its class is meaning neutral in all circumstances. If many such classes existed with more than one character in them, then a large number of meaning-neutral transformations would naturally be defined by character substitutions. Moreover, a representative of each such class could be used to replace the other members to arrive at a canonical form for all Unicode documents. While useful to describe theoretically, a partition with such perfect characteristics does not exist. However, for purposes of identifying related meaningful text, a key observation is that the ability to transform a document into another related meaningful document may be unnecessary. If two documents or parts of documents known to be meaningful can be efficiently transformed into the same (not necessarily meaningful) document, and this can only occur if the two original documents are likely closely related in meaning, then this one-way transformation can be used to associate text from one with the other.

Adding further complications are characters or character sequences that, without altering meaning in any way, take the place of other character sequences. Simple examples of this are ligatures, such as the single character ligature or combined form of "ae", as it commonly appears in print form of the name "Cæsar". Unicode provides separate characters for many such ligatures. It would be contrary to the goals if an edit that changed the two-character sequence "ae" to its corresponding single-character ligature "æ" were to cause a Fragment Identifier to fail to identify its intended fragment. In addition there are language constructs, abbreviations and acronyms, which take the place of their longer forms without altering meaning. Unlike ligatures, Unicode does not directly support abbreviations and acronyms.

Some embodiments transform the text to a canonical form. Western language text in the in the example canonical forms presented here are effectively unreadable, but two meaningful uncontrived text documents or fragments that have the same canonical form likely have the same or closely related meanings. While an embodiment uses a particular transformation or transformations, those skilled in the art will appreciate that many useful transformations or canonical forms could achieve similar benefits. A useful property of the example transformation presented here is that it uniquely maps each Unicode string to another string, which is its canonical form. If it is a unique mapping, i.e., if it is a function in the technical sense of the term 'function', then it usefully defines equivalence classes of strings, including equivalence classes of documents, with each class consisting of those strings that map to a particular canonical form string.

The conversion to a canonical form first performs a full case-folding operation according to the Unicode Consortium specification, which converts to lower case and expands some ligature-like characters that are not true ligatures, such as the German sharp s, as well as several true ligatures in various languages, such as English and Greek. Some embodiments then expand the sequence of characters to a normalized form that expands composite characters of various stripes and any remaining Unicode compatibility ligatures. (Compatibility normalization by expansion is defined by the Unicode consortium.)

While an embodiment that expands both ligatures and abbreviations is useful, such expansions might not be done because of the tendency to require language awareness and the additional computational complexity that such awareness entails. However, in many contexts such expansions are useful and act to further associate strings having identical meaning. In other embodiments acronyms and abbreviations are expanded in a first step to arrive at a canonical form. Formal grammar style production rules to convert acronyms and abbreviations to their expanded forms would be applied.

Some embodiments partition the universal character set (plus an empty character, i.e., substitution in the class with the empty 'character' means to remove all members of the class entirely) into classes of characters, such that wherever a member of a class appears in the corpus of existing and reasonably expected future meaningful (uncontrived) documents, then one of the following holds:

1. In likely actual usage, replacement with another member of the class does not affect meaning.

2. In likely actual usage, meaningful replacement with another member of the class is unlikely to occur without that change occurring in conjunction with other changes that both affect meaning and that are not intra-class substitutions.

Such transformations do not preserve meaning and the results might be meaningless. Nevertheless, in some embodiments they define equivalence classes of characters, documents, and parts of documents. If two naturally occurring (uncontrived) documents or parts of documents are in the same equivalence class and are in fact meaningful, then they are likely closely related in meaning if not identical. A simple example of this involves collapsing all whitespace and punctuation to the empty string (so whitespace and punctuation in any unbroken sequence are in the equivalence class that transforms to the empty string). It also converts all upper case characters to their lower case form, so the upper case and lower case character pairs are in the same equivalence class. Once punctuation and whitespace are collapsed and upper case letters are converted to lower case, the canonical form for "Food For Thought:" is "foodforthought". Because some far-eastern languages rely less on whitespace, punctuation, and capitalization to separate terms and establish meaning, a canonical form for such languages can be more readable than for European languages. However, this fact confers no significant advantage since such a canonical form is generally not interpreted by humans.

A canonical form can also expand Unicode characters that have an expanded representation, such as those with diacritical marks, to a decomposed canonical form defined by the Unicode consortium. Their two defined standard "compatibility" decompositions expand the Unicode defined ligatures as well as separate accented characters into a canonical sequence of characters that beneficially permits treatment of the diacritical marks as separate combining characters. The decomposition used in the example embodiment is the NFKD (Normalized Form Compatibility Decomposition).

Some embodiments normalize the Unicode text to arrive at a canonical form using the following steps:

1. Transform the text according to full case folding, which is a mapping described by the Unicode Consortium as part of the Unicode Standard version 6.2.0, in machine and human readable form in the document Public/UNIDATA/CaseFolding.txt, found on the Unicode.org web site. This expands some ligatures and ligature-like forms, and converts all characters that have case to lower case.

2. Transform the output of step 1 to the standard NFKD (Normalized Form Compatibility Decomposition) form, as described in the Unicode consortium's "Unicode Standard Annex #15: Unicode Normalization Forms" found in the document reports/tr15, on the Unicode.org web site. This is the standard normalization procedure that expands Unicode ligatures and decomposes various complex characters to their base characters followed by combining characters. It does not convert to lower case, which was done in step 1.

3. The non-starters (also called combining characters by the Unicode Consortium) are removed. These include the combining forms of diacritical marks, all of which were separated out in step 2. The combining characters that are removed are those that are marked "COMBINING" in the Unicode Consortium file found in the document Public/UNIDATA/UnicodeData.txt on the Unicode.org web site.

4. Whitespace and punctuation characters are removed. Specifically, the following Unicode code units and code unit ranges are removed from the sequence: \u0000-\u002f, \u003a-\u0040, \u005b-\u0060, \u007b-\u00bf, \u00d7, \u00f7, \u055a, \u1680, \u180e, \u2000-\u206f, \u2420, \u2422, \u2423, \u3000, \u301c, \u3030, \ufe58, \ufe63, \ufeff, \uff0d.

This procedure is called the "Canonical Form Transform" or "Canonical Form Transformation". Those skilled in the art will appreciate that the same transformation may be achieved by different rules applied in a different order, and also that many different transformations will provide similarly useful results.

In alternative embodiments, additional "ligature-like" characters are expanded before the NFKD transformation is performed. Ligature-like is determined by general practice in real documents; for example, the Scandinavian and German languages have ligature-like umlaut (also called dieresis or diaeresis) vowels such as "ü" in that they are often written, especially in electronic communication, in an alternative expanded character form. For example, the character "ü" is often written in the alternative form "ue". Unlike true ligatures and even if restricted to the languages in which they are most used, the ligature-like "ü" is not equivalent to "ue"; while "ue" can be and is commonly substituted for "ü", "ü" cannot be substituted at will for "ue". Nevertheless, as discussed the canonical form is a one-way transformation that does not preserve meaning, and first transforming "ü" to "ue" allows those appearances of "ü" and "ue" that are made equivalent by general usage to be recognized as equivalent in the canonical form. A downside of such expansions is that in general they are language-dependent because ligature-like characters are not expanded uniformly across the various languages in which they appear, and may not be ligature-like in another language. For example, in French the word "aigüe" has an alternative spelling "aiguë", with the diacritic mark indicating equivalently how the word is to be pronounced. This equivalence is captured by dropping the diacritic mark entirely, which is achieved in some embodiments in a language-unaware manner. This usage in French is a dieresis, and in German it is an umlaut, which are actually quite different but the difference is unknown programmatically without first establishing the language; Unicode does not provide different encodings for dieresis and umlaut—they are visually identical and have identical Unicode encodings. Knowing the difference is achieved by a language aware embodiment. Alternative embodiments improve the behavior for one language as compared with another—in other words language-specific implementations.

Other embodiments give the user a choice of base language. For example, if the user chose German the vowels with an umlaut would be expanded as ligatures before the NFKD transformation. These alternatives are implemented in embodiments.

In other embodiments, whitespace is not included in the class that collapses to the empty string. Instead, contiguous strings of whitespace collapse to a single space, so the whitespace rules remain contractive but not entirely collapsing. If a character between whitespace collapsed to the empty string, then the two sections of whitespace would further collapse to a single standard space, which requires repeated application of production rules (if it is implemented using production rules). While this transformation has the desirable characteristic of preserving the separation between terms for languages that use whitespace for that purpose (e.g., English and other European languages), in experimentation it introduced additional difficulties for Internet web page processing. For example, browsers differently place whitespace in the DOM (Document Object Model) where no such whitespace existed in the source code (typically HTML) for the page. Also, proper separation of terms in the created canonical form becomes dependent on knowing when to add whitespace because of implicit separation based on the markup. Different commercial browsers do this differently. For example, HTML allows the display of otherwise adjacent terms (i.e., terms with no spaces between them) to be spatially separated when displayed; if proper separation of terms is to be achieved in such a case, a space is beneficially inserted between the otherwise adjacent terms when creating the canonical form.

Even the most popular existing search engines get this wrong by concatenating such distinct terms when indexing web pages, and in the process they create non-existent terms that complicate and thwart searches for the actual terms. To avoid some undesirable consequences of gratuitous concatenation of terms by search engines, it became useful for some embodiments to concatenate all terms in the canonical forms in part by the removal of white space. Difficulties in retaining white space term separation were, with care, overcome for some aspects of other embodiments and well-behaved implementations were achieved. However, even then some space characters in the canonical form tended to depend on markup structure and not only on the textual content. The practical benefit of whitespace separation of terms was weighed against the additional complexity and dependence on markup, and total collapse of whitespace became the behavior of some embodiments. Again, it is unnecessary for a canonical form to be meaningful. If two uncontrived meaningful documents or document parts having the same meaningless canonical form are nevertheless likely to be closely related in meaning, then that canonical form could beneficially be used to establish the meaningful relationship between the two documents.

In other embodiments, punctuation is separated into more equivalence classes. For example, the different apostrophe characters can form a useful equivalence class of characters that are all mapped, in canonical forms, to the same member of the class. This can be useful because such changes are made in editing documents with no intention to change meaning. Further, some popular search engines read in one such character from a web page and translate it to another before putting it in a search result. Such a gratuitous change could eliminate an exact match in a search for content except that the two characters are in the same equivalence class. Similarly, it could be beneficial if the question mark '?' were not in the same equivalence class as the period '.'. The additional complexity was weighed against the likelihood of making matches between unrelated text, and the simpler implementation (where punctuation is collapsed) is used in some embodiments.

The description of these embodiments assumes, without loss of generality, that a document has an associated Document Object Model (DOM) instance. All document formats can be represented by a DOM, although not all are formally associated with a DOM specification. For example, simple text documents can trivially be placed in a DOM instance by creating a single DOM node that holds all of the text, but there is no formal DOM associated with simple text. Modern browsers create a DOM for simple text documents when displaying them. Modern display engines for complex documents such as Adobe reader generally use a DOM instance to describe the document internally and most also have the means to convert their documents to HTML.

The World Wide Web Consortium (W3C) standard Document Object Model for HTML is used to describe these embodiments. For example, in the W3C HTML standard DOM, the notion of a 'text' node is defined and understood by those skilled in the art. We therefore simply refer here to 'text' nodes. While described in the context of a particular DOM, those skilled in the art will further recognize that the teachings of this specification can be applied to any DOM model and thence to any document in any language.

As is often the practice by those skilled in the art, for brevity and clarity we will often refer to a DOM instance for a particular document as simply the 'DOM'; the particular document or part of a document that is modeled in any particular instance is determined by context. This carries through to parts of a DOM instance. For example, nodes of an instance of a DOM for a particular document will be referred to as nodes of the DOM and, where the DOM itself is clear from context, they may be referred to as simply nodes.

The canonical form of some embodiments, as a transformation of Unicode strings as described above, is hereafter written as the "Canonical Form". This transforms one Unicode UTF-16 sequence (string) to another in only one way; however, the Canonical Form Transformation of strings extends to two different transformations of DOM instances. DOM instances have nodes, and text is associated with those nodes; a left to right traversal of those nodes, while concatenating "encountered text", creates a string. There are two different rules to determine what constitutes encountered text; determining which of the two sets of rules to use in the Canonical Form Transformation of a DOM instance is based on configuration and in some circumstances interactive user input.

The text from standard text nodes (i.e., those nodes displayed to users as text) of an HTML DOM instance are included by both sets of rules governing what constitutes encountered text; standard text nodes are the only nodes included for the DOM transformation that is simply called the "Canonical Form". The other transformation includes non-trivial text from the 'alt' attributes of the HTML DOM instance's image nodes; this DOM instance transformation is called the "Alternative Canonical Form".

These Canonical Form Transformations, as extended to DOM instances, maintain positional relationships between individual code units in the transformed string (the Canonical Form string) and the input string in the context of a DOM instance. When either a Canonical Form (resp. Alternative Canonical Form) is created for a DOM instance, each code unit in the Canonical Form (resp. Alternative Canonical Form) is mapped to its corresponding DOM node and code unit using a two member tuple consisting of the DOM node, and code unit position within that node. Since some characters are collapsed, not all code units in the DOM are mapped from the Canonical Form (resp. Alternative Canonical Form). In contrast, ligature code units in the DOM are mapped from multiple code units in the Canonical Form (resp. Alternative Canonical Form). Because the Canonical Form and Alternative Canonical Form differ only in which nodes contribute to the text string to be transformed, it is unnecessarily cumbersome to repeatedly distinguish between the form that includes alternative image text and the form that does not; therefore, in circumstances that are unaffected by this distinction, they may both be referred to as a "Canonical Form" or the "Canonical Forms".

An entire Text node may have no character mapped at all, as all characters in a text node may have been collapsed in constructing a Canonical Form. Because, in some embodiments, each character is a member of an equivalence class, even for simple 1-to-1 mappings the character mapped is in general not the same in a Canonical Form. For example, upper case characters 'A' are changed to lower case 'a' in a Canonical Form.

Non-text document content is not mapped directly from a Canonical Form; for example, images (except for any non-trivial alternative text they might have) do not appear in a Canonical Form. However, some DOM node types are designated to be members of a pre-determined class of nodes, called Visible non-Text nodes ("VnT" nodes). While various other node types could be included in this class, some embodiments only include image nodes ('img' tag name in HTML). Alternative embodiments may beneficially include other node types; for example, multimedia nodes could be included. For any embodiment, the pre-determined class of visible non-text nodes is called the Visible non-Text (or VnT) nodes of that embodiment. Note that "VnT" is sometimes referred to as a class, but other places refer to it as a node type. In either case it refers to nodes of the same class.

There is a separate canonical form that preserves separation of terms and comes the closest to preserving meaning; it is the "Common DOM Form". This form is suitable for indexing a search engine and producing strings for search criteria (e.g., its terms are separated as in the original document). The Common DOM Form (as a model) is a minimalistic DOM, complete with DOM nodes, arranged in an array called a "Common DOM Node Array". An instance is by design self contained, has as few nodes and node types as is practical, and a compact representation. A Common DOM Node Array has only three node types, two of which have associated text. Because it is self contained (it has no external references) it can be independently transmitted and stored.

As could be done beginning with any DOM instance, a Canonical Form can be generated starting with a Common DOM Form instance. When this happens, each of the code units in it will individually be mapped, via a node and position pair, to code units of the Common DOM Form.

Given an arbitrary instance of any DOM model, a corresponding instance of the Common DOM Form can be generated. The Common DOM Form instance can be used, in conjunction with the Canonical Forms, with techniques of the present teaching to reproduce arbitrary pieces of the original content in a form suitable for finding that and similar content. For example, it can be used in searching for the content with general Internet based search engines. Uses of this capability include mitigating the ubiquitous loss of information across public networks when links become stale and unusable.

The text of the Canonical Forms is used to locate specific document content but, unlike the Common DOM Form, does not preserve separation of terms. These, simply called the "Canonical Forms", remove whitespace and punctuation. The first of these (the Canonical Form) only takes text from standard text nodes of a DOM instance. The second (the Alternative Canonical Form) behaves identically except that it also includes alternative text used to describe images and (in alternative embodiments) other non-text nodes.

In some document description languages, such as HTML, images are associated with a textual description. This textual description is increasingly used in order to facilitate searches as well as to provide accessibility for blind users. Neither search engines nor the blind are effective at discerning the content of images, so they both may use alternative associated text if present. The content of these alternative ('alt') attributes to image elements may appear in search results and in some circumstances may be read or audibly processed by a user agent and user. Moreover, sequences of images without intervening visible text may best be represented by use of the descriptive text in the 'alt' attributes. However, not all document formats support these textual attributes for images, and they are unseen when normally perusing a document that does support them. Consequently, a straight conversion from one document format to another could break a content-based fragment identifier if it uses 'alt' attribute content. Also problematical is that as usually unseen attributes, changes to them are easy to make and usually go unnoticed.

Because of the goal that some embodiments should work effectively across document formats as well as be robust to meaningless changes, it is problematical to include 'alt' attribute image text. It is also problematical to not include it since it may contain text that meaningfully identifies visual content. Therefore some embodiments make the choice configurable and, if so configured, it may be decided at the time of Fragment Identifier creation. When the user chooses to include 'alt' image attributes as text, if an image has an 'alt' attribute that is not empty and which does not collapse to all whitespace or to the empty string during creation of the Alternative Canonical Form, then that image node is treated similarly to the way a Text node is treated, and the text of that node is the value of the 'alt' attribute. Since there is no effective way for users to select part of the text found in calf attributes, either all the text is included in a selection or none of it is. Such an image node is identified as a VnT node if it essentially has no 'alt' attribute, and as a special type of node referred to as an "Alt node" if it has a non-trivial 'alt' attribute. Individual ranges in Fragment Identifiers that are created using 'alt' attributes are identified as such by a Boolean. Interpreters of Fragment Identifiers use the Boolean to know whether to treat images with non-trivial 'alt' attributes as text nodes.

In some embodiments, a user can choose a configuration option whereby he is given an interactive choice to include 'alt' image text each time such non-trivial (i.e., non-collapsing) text is found within a selected range for which a Fragment Identifier is being created interactively.

The Text and VnT nodes derived from a DOM instance are arranged in an ordered set 510, or an array, in the left-to-right order of their appearance in the DOM; this is referred to as either a node array or a derived node array. Nodes in the node array have the same node types as are found in the Common DOM Array. An object in the node array is identified as a node (for VnT nodes and Alt nodes when treated as VnT nodes), or a node and code unit (for Text and Alt nodes when treated as Text nodes). For representational efficiency, the node and code unit pair is sometimes abbreviated to a "code unit", with the associated node implied.

Figure 5:
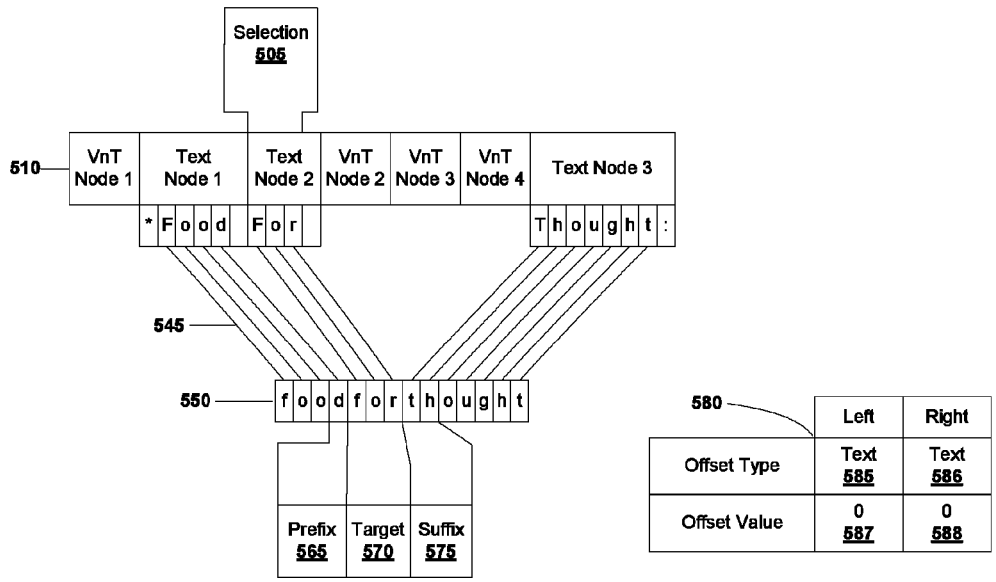
FIG. 5 illustrates Canonical Form mapping with unique target text.

FIG. 5 illustrates a Canonical Form 550, a mapping 545 to the code units and nodes of the array, a contiguous selection or range 505 of the document, and three substrings of the Canonical Form, prefix 565, target 570, and suffix 575, which are used in identifying the selection. In this case all three are unique in the Canonical Form. The prefix and suffix are extended until they are either unique or the end of the Canonical Form is reached. The target is that part of the Canonical Form having source that falls within the selection. Since the character "d" appears only once in the Canonical Form, a prefix length of 1 is unique. The suffix requires two characters because the character "t" appears elsewhere. The triple of this prefix, target, and suffix uniquely identifies the selection. In fact, in this case, the target alone identifies the selection unambiguously because the target is unique.

An offset table 580 indicates how far a selection extends beyond the mapping of the target. For example, if the selection included the space after the "For", then the prefix, target, and suffix would be the same but the value of the right offset 588 would be 1 instead of 0. If the selection included the space before the selected "For", then the value of the left offset 587 would be −1 instead of 0. Since the selection does not extend beyond text that is mapped from the target, the offsets 585,586 are of type Text and their values 587,588 are zero.

FIGS. 6 through 9 further explore the relationship between a selection and the internal data structures used. The ends of the selection are mapped from the document DOM into the node array. In addition, the last (rightmost) code unit of the prefix, first (leftmost) code unit of the suffix and ends of the target (also called the "Canonical Target") are all mapped from the Canonical Form to the node array. In FIGS. 6 through 9, these are referred to as the selection, prefix, suffix and target or Canonical Target and may also denote either the items in the Canonical Form or to their corresponding mappings in the node array. For example, when the term "target" is not explicitly limited to either the target in the Canonical Form or to its mapping in the node array, then its meaning is determined by context.

Figure 6:
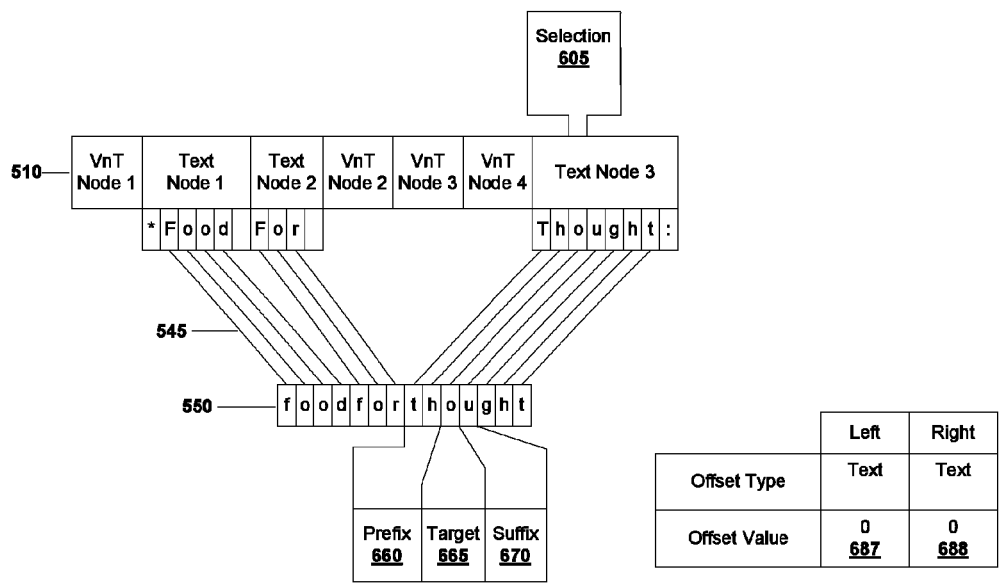
FIG. 6 illustrates Canonical Form mapping with non-unique target text.

FIG. 6 illustrates a Canonical Form 550 and mapping 545 with a selection 605 that defines non-unique target 665 text. The selection does not extend past the ends of the target's mapping, so the offsets 687,688 are 0. While the target is not unique, the triple of the prefix 660, target 665, and suffix 670 uniquely identify the position in the Canonical Form and hence the selection.

Figure 7:
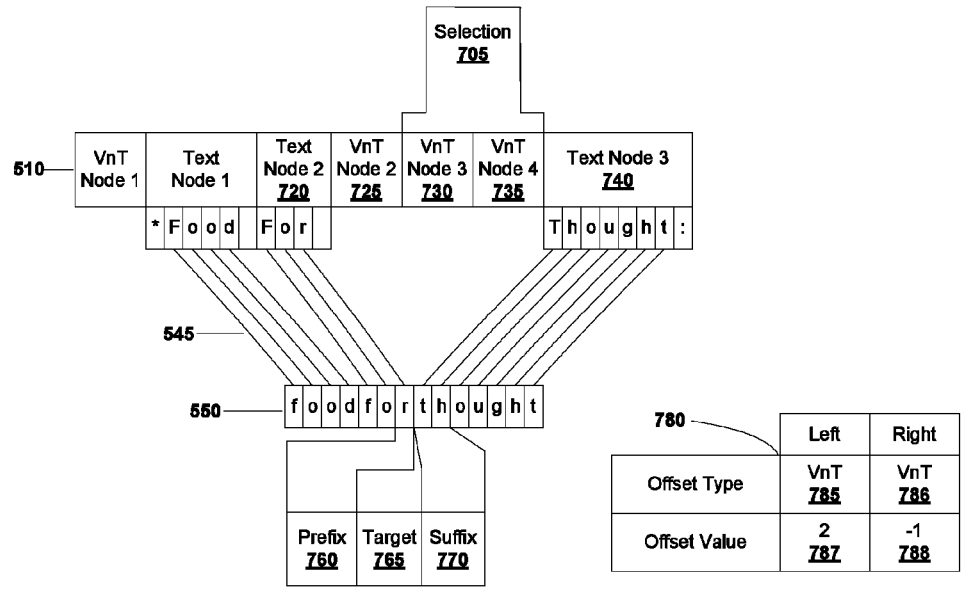
FIG. 7 illustrates Canonical Form mapping with a non-text selection.

FIG. 7 illustrates a Canonical Form mapping for a non-text 705 selection, which only contains VnT nodes 730,735. Non-text selections are represented in part by a zero length "Canonical Target" (the target string represented in the Canonical Form) 765. When the Canonical Target has zero length, the offset table's entries 780 cannot be computed relative to the ends of the Canonical Target; a zero length string matches everywhere so there are multiple possible positions from which to compute offsets. The selection's offsets in the node array could both be computed relative to the last code unit of the prefix 760 and both could be computed relative to the first code unit of the suffix 770. In addition, the left offset could be computed relative to the prefix and the right offset could be computed relative to the suffix.

All three of these representations are used in different circumstances, and the choice is made in favor of the offset with the least absolute value. If a selection's endpoint (either right or left) is closer to the prefix than it is to the suffix ('closer' here means the absolute value of the resulting offset is less), then the offset is zero or positive for that endpoint and it is computed relative to the prefix. Otherwise the offset is zero or negative, and the offset is computed relative to the suffix.

Any selection endpoint has two possible objects from which to compute offsets, one to the right of the endpoint and the other to its left. A positive offset from an object to the endpoint indicates that the endpoint is to the right of that object, so the object is to the endpoint's left. A negative offset from an object to the endpoint indicates that the endpoint is to the left of the object, so the object is to the endpoint's right. In this way, the sign of the offset indicates which object was used to calculate the offset.

Occasionally the endpoint will coincide with one of the two objects and an offset will be zero. For this to work consistently with the above, there are two representations of zero, in effect a positive zero and a negative zero. A positive zero offset indicates that the endpoint is in the left position (from which to calculate offsets) and a negative zero offset indicates that the endpoint is in the right position (from which to calculate offsets). Those skilled in the art will appreciate that there are a multiplicity of means to have space-efficient representations of integers that nevertheless have precisely two representations of only the integer zero. Implementations of this capability typically use either sign-magnitude or ones-complement integer representations.

Some embodiments use sign-magnitude and thereby use what is in effect a positive and negative zero. However, since the ASN.1 encoding mentioned above does not natively support sign-magnitude or ones-compliment integers, in the example implementation integers are represented as a Boolean for the sign and an unsigned integer together to achieve a sign-magnitude integer. This representation is used wherever a signed integer is called for in an ASN.1 encoding.

For this selection 705, the last object in the selection is 735 a VnT node, so the type 786 of the right offset is 'VnT'. The count of VnT nodes to the right endpoint of the selection is fewer from the suffix 740 than it is from the prefix 720. Picking the potential offset having the lowest magnitude gives an offset to the left (negative) from the suffix 740, with a magnitude of 1; i.e., the right offset value is -1. When counting, the last VnT node 735 of the array 510 is counted as 1 even though the count stops with that node.

For this selection 705, the first object in the selection is 730 a VnT node, so the type 785 of the left offset is also 'VnT'. The endpoint is the same count (2) in VnT nodes from the suffix 740 as it is from the prefix 720. By default the positive offset is chosen when both positive and negative offsets have the same magnitude. This results in an offset to the right (positive) from the prefix 720 with a magnitude of 2; i.e., the left offset value is 2. The VnT node adjacent to the selection 725 is counted as 1, then adding 1 for the selection's first endpoint node 730 makes it 2.

Figure 8:
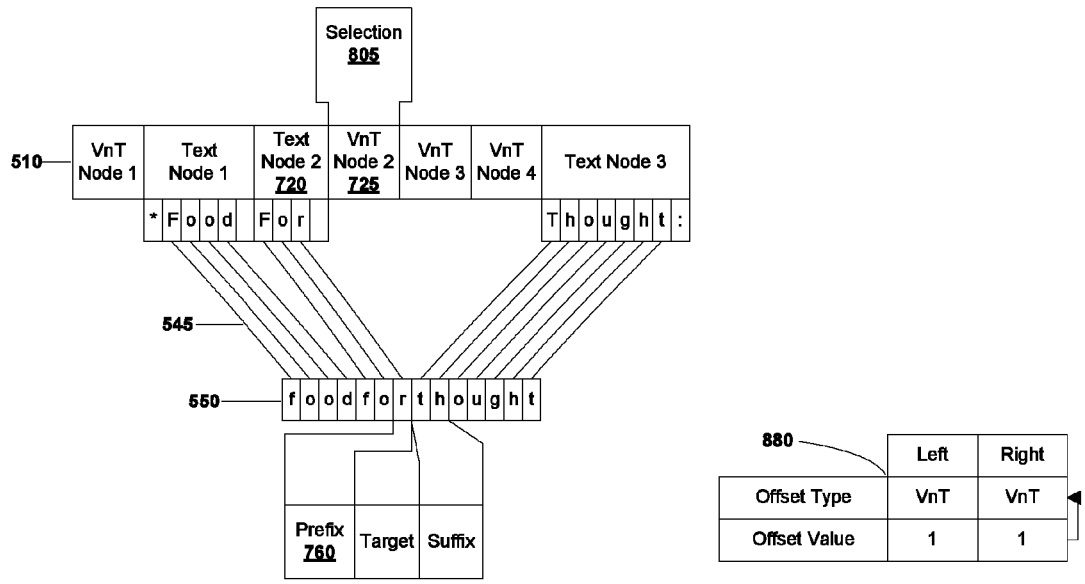
FIG. 8 illustrates Canonical Form mapping with a single node non-text selection.

FIG. 8 illustrates a Canonical Form mapping with a single node non-text selection 805 in the node array 510. Only one node 725 is selected, so it is both the first and the last node in the selection. Since the first (and also the last) node has type VnT, both offsets have type VnT 880. The offset with the least magnitude is chosen for both the left and right offsets; each offset has a value of 1 node to the right from the prefix 760, which maps to a code unit of a node 720 of the node array.

Figure 9:
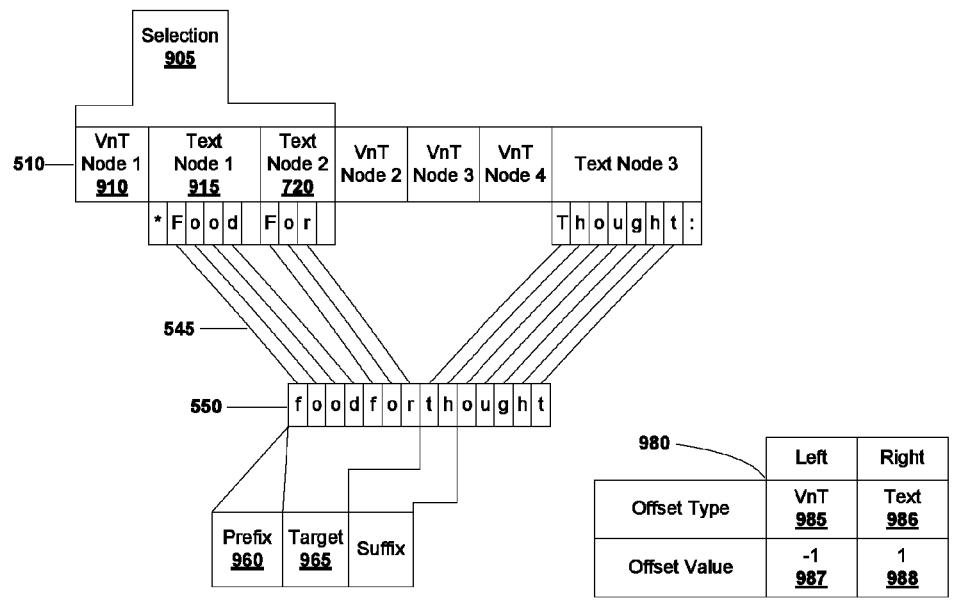
FIG. 9 illustrates Canonical Form mapping with combined text and non-text selection.

FIG. 9 illustrates a Canonical Form mapping for a selection 905 having both text 915,920 and non-text 910 content. It also has a zero-length prefix 960. The last code unit of the Canonical Target 965 maps to the next to last code unit of a Text node 720, which is also the next to last code unit in the selection. Therefore, the right offset has type text 986 and a value of 1 code unit 988. Since the leftmost object in the selection is a VnT node, the left offset is in VnT 985 nodes. The nearest of the two potential left objects is at the beginning of the Canonical Target, so the offset is calculated from the Canonical Target and extends to the left; it has the value -1 987 (i.e., one VnT node to the left). Therefore, the left offset has type VnT and the right offset has type text 980.

When a prefix 960 has zero length, it maps to the left of the node array's first node 510; it can be convenient to have an imaginary Text node having one imaginary code unit before the first node of the array, to which a zero length prefix maps. Similarly, when a suffix has zero length, it maps to the right of the array's last node; it can be convenient to have an imaginary Text node having one imaginary code unit following the array, to which a zero length suffix maps. Positioning of a zero length prefix or suffix is especially critical if the Canonical Target also has zero length, since offsets are based solely on prefix and suffix positions in that circumstance.

These illustrations in FIGS. 5 through 9 represent a Canonical Form that is created for the body of documents. For HTML the title and the 'META' tag description of the document are strings that may be displayed and used to represent the document in various circumstances, and these strings may also be found in searches by commercial search engines. Therefore, they are included at the beginning of the node array as special Text nodes, first the title and then the description nodes. They are always included even though they may be empty. If not empty they thus appear in this order in the Canonical Form of the document text and may be matched. However, they do not participate in a document selection since they are not part of the body.

In a Fragment Identifier based on the canonical mapping described, the canonical prefix, target, and suffix are represented by a calculated number of high order bits of the hashes for each of the three substrings. This greatly limits the space taken up in a Fragment Identifier. As has been shown by example, after building the canonical mapping these three substrings and the offsets can unambiguously identify any contiguous range or selection of a document consisting of text and non-text nodes intermixed. Even for large documents, the number of required bits calculated is probabilistically much less in total for these three hash values than the full complement of 128 bits for a single MD5 hash.

The goal of robustness against extraneous changes (i.e., changes outside the selection), should be examined against the possibility of minimizing the number of hash bits too-aggressively. Changes outside the selection and its unique prefix and suffix context should not affect finding and positively identifying the originally intended selection or fragment. However, if the number of bits in the hashes is kept to the absolute minimum required in an unmodified document, then an extraneous change could cause such limited hash bits to match outside the intended selection. While it is possible to create such n-gram hash matches by random changes to a document, they will with reasonable probability not be created for all three of the prefix, target, and suffix hashes. Moreover, it is further very unlikely that they will be lined up perfectly as sequential matches in the Canonical Form. Such accidentally created matches will occur, if they occur at all, at random locations in relationship to each other. Of course, it is possible for the entire canonical sequence of prefix, target, and suffix to be copied, but this would always and should always result in a match. Some implementations thus look for matches that are sequentially lined up perfectly (perfect matches), and select such matches. For added confidence, although probabilistically unnecessary under some reasonable assumptions, the number of hash bits required is calculated for all three substrings and the maximum of the three maxima is used. Then we add 6 bits and round up to the next multiple of 6 (the 64 character encoding used for fragments encodes 6 bits per character). From experience, it is uncommon for the maximum number of bits required to be more than 20 bits, which makes the actual number used after adding and rounding to most often be 30 bits or less. Thus, the three hashes together take up much less space in the resulting URI than a single MD5 hash complement of 128 bits. The savings also includes the elimination of any need for substrings used to perform initial match candidate filtering.

With such space savings, it is sensible to ask whether even more can reasonably be done to improve robustness. For example, it would be useful if anything could be done to find imperfect matches where the match string is somewhat modified. This is achieved by encoding a "partitioned hash" of the Canonical Target into Fragment Identifiers. Here "partitioned hash" refers to an array containing the high-order bits of hash values computed over consecutive segments of the Canonical Target.

Figure 10:
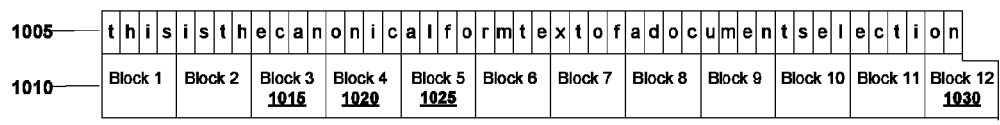
FIG. 10 illustrates Canonical Form text with partitioned-hash blocking.

FIG. 10 illustrates the partitioning of a Canonical Target 1005 into 11 blocks (alternately called segments) 1010 having an equal number of 16-bit code units, and a $12^{th}$ odd-sized segment 1030 containing the remaining code units, which did not make up a full length segment. The number of equal-sized segments has no minimum and a configurable maximum.

Segments like those shown in FIG. 10 are used to determine if a Canonical Target matches somewhere in an arbitrary string. The discussion of FIG. 33 explains this use in detail, but FIG. 10 illustrates one aspect of detecting matches using segments. In FIG. 10 a minimum of four consecutive code units is needed to exactly match any Canonical Target segment except the last segment. However, a subsequence of four consecutive code units that matches part of the Canonical Target will frequently not match any segment because the subsequence spans a segment boundary. Consider the sequence "canonical" that is split between Block 3 1015, Block 4 1020, and Block 5 1025 which is 9 code units long; only one of the segments 1020 is fully contained by the "canonical" sequence. Of all the possible four code unit subsequences that match in "canonical", only one will also match a segment. It is possible to select sequences of the Canonical Target of length 6 that do not match any of the segments of the partition (for example, the subsequence "hisist"). If n is the nominal segment length (4 in FIG. 10), it is possible to select up to 2(n−1) consecutive code units from the Canonical Form without matching a segment. In general, a Canonical Target could have a subsequence up to n−1 code units in length on each end that is not in a fully matched segment.

The length of each block is determined by knowing the length of the target and the number of blocks in the partition. Typically, the number of bits used for each block hash is much less than is required to ensure uniqueness of an individual hash across a document. However, the determination of a best match involves grouping matches together as well as lining them up in correct order. Even if each block hash matches in many places in a document, grouping the matches together and in the correct order is probabilistically unlikely, depending on the number of blocks and the number of matches for each hash.

There is a tradeoff between number of blocks in a partition and the number of hash bits retained, with more bits per block needed if there are fewer blocks. There is also a tradeoff with the smallest contiguous piece of the whole that can be recognized separately from the whole. This concept can be taken to the extreme of retaining only one bit from each block hash and using, for example, nominally 128 blocks. In a Conventional Fragment Identifier such a partitioned hash would take up the same space as a single MD5 hash. However, unlike MD5 or SHA family hashes, a partitioned hash can be used to find and quantify the nearness of imperfect matches.

To illustrate why this works, we describe the simple case of 1 hash bit, a single 16-bit code unit per block, and a Canonical Target of 128 16-bit code units. Each code unit appearing in the Canonical Target will be hashed to either 0 or 1. Typically about half of the distinct code units will hash to 0 and the others will hash to 1, with lopsided counts possible but increasingly unlikely. For purposes of illustration map the entire Canonical Form, including the target, to its hash bits and consider them to be strings of binary 1s and 0s. The Canonical Target is now a 128 bit sequence of pairwise independent hash bits, which is a sub-sequence of a larger sequence of pairwise independent hash bits. The probability of meaningfully and accidentally matching the 128 bits of the target somewhere else in the sequence is small; doing this by accident is akin to obtaining a 128 bit cryptographic key by making a few guesses. Again, actual duplications are expected and should match, and we are unconcerned with possible matches in documents that are not meaningful or otherwise contrived. A binary sequence elsewhere will typically match the target bit sequence in about half of its bits, so the threshold of a good match is somewhere between half and all of the bits matching. Some implementations use more than one bit and as we shall see matching can be more sophisticated, but this illustrates why it works.

In embodiments the user indicates a portion or portions of a document. He typically makes such an indication by selecting a portion or portions of the document using a document editor or browser by clicking and dragging a mouse over the selection, which is then rendered in a different color or in some other way to cause the selection to appear different from the surrounding document contents. In some embodiments this selection is done in the same manner as for copying a portion of the contents.

So far, we have treated a selection as a single contiguous portion of a document. However, for some browsers and editors a single selection may comprise multiple contiguous portions of a document. Thus a selection in general consists of one or more ranges, and a range is a single contiguous portion of a document.

In FIGS. 5,6,7,8, and 9, there is a node array, which is constructed from the DOM instance at hand at the time of creating the Canonical Form. Beneficially, two node arrays can differ greatly in structure without affecting the components used for matching—canonical prefix, target, suffix, or the offsets that identify specific content. In fact, the document type (an HTML document, a PDF document, a document with Microsoft Word format, etc.), the DOM (as a model), the DOM instance, and the node array resulting from the DOM instance may change without affecting the components. For purposes of finding a range in a DOM instance that is identified by a Fragment Identifier, the node array is beneficially constructed from that DOM instance so that the nodes in the derived array are also nodes in the particular DOM instance. In this way operations are performed directly against DOM instances, instead of e.g., HTML files, because the actual content presented to users may be dynamically created by scripts.

In order to recover the information content of Fragment URIs, some embodiments store information useful for recovery in a service across a network. Such a service is called a "URI Service". With some limitations involving whitespace, embodiments can recover the text of any range represented by a Fragment Identifier from which a Fragment URI was created. However, since content is typically copyrighted, simply serving a missing web page out as a complete copy on demand to a user agent for display could possibly create legal complications. For example, a copyright owner might intend that some material no longer be available and could possibly construe his rights to have been violated by serving out the whole of it. Moreover, serving out complete documents for display requires greater storage capacity and bandwidth. Instead, in some embodiments, stored content is first used to search for alternate existing sources across the Internet.

This is beneficial because most information available on the Internet is available from more than one source and often in many variations. Even if the information is unique, it can be moved from one location to another within the same source domain. Expected information can be missing when you activate a URI. This is known as "linkrot". A user may get nothing at all when he attempts to activate such a document, or more subtly, information may be missing or changed. This occurs via editing pages and often by simply changing the address of a page. Nevertheless, as things stand prior to embodiments, recovery of the URI may not even be possible in some cases; in other words, it may not be possible in some cases for a human with a computer to achieve recovery. With the content missing, the intended purpose of an arbitrary link cannot usefully be guessed in all cases, and the only effective recourse can be to at least partially rewrite the document.

In alternative embodiments, the URI Service indexes the whole indexable portion of the Internet, and keeps a historical archive of everything. When requested, it finds the document version indicated by a particular Fragment URI and URI prefix. However, such an embodiment would blindly keep a history of everything in order to ensure the capability of recovering even one arbitrary Fragment Identifier; such an approach would require significant resources up front. For other embodiments, the size of the database and the bandwidth used increase with the usage of the URI Service. If an instance of such an embodiment were to achieve universality, it would then more closely resemble embodiments that index the whole indexable portion of the Internet.

Some embodiments only keep information that is needed to find, in conjunction with a search engine, identical or similar information that is presently available elsewhere. This can be considerably less data than is required for archiving the history of the Internet with the intent of serving it out as if it all remained available precisely as it existed, in perpetuity. Besides being compact, the archival nature of these embodiments only engages when a user creates or recovers a Fragment URI. Conventional links may become unusable due to linkrot, but the information itself might nevertheless remain available somewhere else; archival information sufficient to find related or identical information is smaller than archival information sufficient to reproduce and display the original information independently.

Instances of some embodiments are arranged so that a URI Service obtains knowledge of every Fragment Identifier created (of a recoverable type, defined later as version 1 Fragment Identifiers). While more than one instance of an embodiment could exist, they would have separate databases and no intentional ability to process Fragment Identifiers from other instances. Moreover, since 2048 bytes of random bits defines an instance of the GENERAL hash function described above, it is probabilistically impossible to create compatible Fragment Identifiers except by design and presumably any such choice would be copyrighted. Note that accurately picking the first eight bytes of a 2048 byte random sequence is less likely than correctly picking a specific pre-determined second out of 550 billion years (more than an order of magnitude longer than the known age of the universe). Then guessing the rest of the 2048 bytes by accident would be equivalent to repeating that feat 255 additional times in succession. Thus an additional benefit of using a fully randomized hash function is the probabilistic impossibility of accidentally or inadvertently creating compatible instances of embodiments, even with a complete specification in hand. Fragment Identifiers of other implementations would not be recognized.

If more than one enterprise were to create a URI Service according to an embodiment, and if they used the same Fragment Identifier encoding and the same hash function to achieve interoperability, then the distributed system created by those enterprises is here considered a single instance of the embodiment.

At the time Fragment Identifiers are created, the user agent requesting creation checks with the URI Service to determine if a document version consistent with the Fragment Identifier is already represented in the URI Service database or databases. If it is not, then the user agent sends this information to the server. By sending the document information from the machine running the user agent that is requesting creation of a recoverable Fragment Identifier, user agent machines are beneficially used to run the scripts and thereby obtain accurate document content, even when the content is dynamically generated. This avoids the issues that lead to the hashbang solution for obtaining document content. It also avoids the potential accuracy issues created by the hashbang solution. It also avoids any issue of improperly accessing content by the URI Service; i.e., the URI Service is performing an operation on behalf of the user who has access to the content at the time he requests the operation.

As previously discussed for the Common DOM Form, information kept will be used to perform searches. When a client sends information for a document to a URI Service, i.e., when it sends the Common DOM Form for a document, the separation between terms (in western languages typically delimited by whitespace or punctuation) is preserved. Different search engines interpret punctuation differently as to what is and is not a term delimiter, so punctuation is retained unaltered in the Common DOM Form as well. Ligature expansion could as well thwart a search in some engines. Thus, in those embodiments the actual encountered character sequence is sent from the document, except for changes involving insertion, modification, and removal of whitespace. The textual representation can be created by a left-to-right traversal of all the content nodes of the DOM. For HTML documents there are two sequences of text that begin this Common DOM Form followed by the body of the DOM. The initial Text nodes are the title of the document and the document's 'META' tags description, if they exist, with a space inserted after each. When Text nodes (including Alt nodes) are encountered, their text is appended to the Common DOM Form text until the traversal is complete.

Most DOM node types implicitly separate terms, but some do not; for example, text and emphasis DOM nodes may start or end in the middle of a single term. On the other hand, image and division ('div') nodes occur between terms and implicitly delimit terms. White space is not always explicitly found between terms in HTML, or in DOM instances built by some user agents. In a left to right traversal of the DOM tree starting at the content root (for HTML the 'body' node) a space is inserted whenever a DOM node that implicitly separates terms is first encountered and before any text from descendent nodes is appended; a space is also inserted after all text from descendent nodes has been appended, and processing the node is complete.

For an HTML example implementation of an embodiment, all nodes have a space inserted as described above except for nodes having the following tags: "a", "b", "big", "em", "i", "param", "samp", "small", "span", "strong", "tt" "var", and "#text".

Following the traversal, contiguous whitespace is collapsed to a single standard space character and any beginning and trailing spaces are removed. In some embodiments, whitespace is defined as the space, tab, carriage return, newline, vertical tab, and form feed characters, for this particular collapse of whitespace.

Those skilled in the art will appreciate that the same result can be achieved in a single pass over the content and that other procedures to achieve the same or similar results are possible.

In addition to this textual part of a Common DOM Form, there is a "Common DOM Node Array", which is also sent to the server. It has three types of nodes: "Text", "Alt", and "VnT". This Common DOM Node Array comprises a sequence of <node_type, length> pairs; 'node_type' gives a pair's type and the 'length' member contains the length of the text for Text and Alt nodes, or 1 for VnT nodes. The first two Text nodes of the array are called the "Title" and "Description" nodes, in that order. These nodes will always be present and will not be combined with adjacent Text nodes. If the document has no title or no description, the corresponding Text nodes will have zero length.

In the Common DOM Form, a Text node does not follow another Text node (except for the first two, the Title and Description); in other words, contiguous text from the body of an HTML document is represented by a single Text node, where 'contiguous' as used here means that the text is not separated by a node that maps to an Alt or VnT Common DOM Form node. The length member of a Text type node is the number of code units in the resulting text, including space characters that remain after spaces have been collapsed.

A document DOM instance node that is determined (according to the rules for the particular embodiment) to be either a VnT type node or Alt node, and which has no non-trivial alternative text, is represented by a VnT type node in the Common DOM Node Array. The length of a VnT node belonging to the Common DOM Node Array is 1. Alt type nodes represent VnT nodes that have non-trivial descriptive text. In some embodiments only image nodes may be Alt nodes; in other embodiments, descriptive text for other VnT node types such as videos can also be represented by an Alt node. The length of an Alt type node is the length of the text from the corresponding image-associated text in the DOM instance, as represented in the resulting text and may include inserted spaces. Descriptive text from only one document DOM VnT node (e.g., an image node) is represented in a single Alt node of a Common DOM Node Array.

The length members of the Text and Alt type nodes in the sequence add up to the length, in code units, of the textual portion of the Common DOM Form.

For transmission a Common DOM Node Array is represented by an array of <node_type, length> pairs. For compactness in transmission, a contiguous sequence of length m of VnT type nodes in a Common DOM Node Array is consolidated into a single pair of the form <VnT, m>. This consolidation may be seen in graphical form in FIG. 54.

Since the Common DOM Form and ranges within the Common DOM Form are self-contained, it is possible to transmit them to a URI Service using a suitable encoding, including binary encodings. The transmission details are implementation specific.

A range in a document DOM instance can be converted to a range in a corresponding Common DOM Form by first creating the node array as shown by example 510 in FIGS. 5 through 9. (To see a direct comparison of Canonical Form and Alternative Canonical Form, as well as image (i.e., Alt) nodes having non-trivial text see FIG. 53.) The range is found in the node array constructed from the original document DOM instance and then, using the Common DOM Form and its special Alternative Canonical Form (described below), a version 1 Fragment Identifier is created for the range according to the process 1200 of FIG. 12. The newly created Fragment Identifier is applied to the Common DOM Form for the document, according to the process 2700 of FIG. 27, to arrive at a range. To see a graphical representation of the Common DOM Form, and a comparison between it and corresponding node array structures for the same document, see FIG. 53 and FIG. 54.

The Common DOM Form has the same general form as a node array constructed from a DOM instance (e.g., an HTML DOM instance), so a Fragment Identifier could mistakenly be applied directly to a Common DOM Form instance without first converting it to a node array. A Common DOM Form instance is actually a DOM instance and it differs from its corresponding node array in that the first two nodes (the 'title' and 'description' nodes) are removed from a Common DOM Form to arrive at its corresponding node array. Those skilled in the art will appreciate that implementations may beneficially avoid actually constructing a separate node array for a Common DOM Form, since the node array derived from a Common DOM Form is a sub-array of that Common DOM Form.

In common use, content of a document at a particular URI prefix changes over time. Therefore the URI Service can have many Common DOM Forms for any particular URI prefix. While the Common DOM Form provides a benefit of proper separation of terms for later use (e.g., in searches, hence the retention of spaces and punctuation), a Common DOM Form can change trivially and a hash over its unmodified content is not generally stable across simple format changes. Alternative Canonical Forms are unaffected by many such simple changes, but if the sequence of terms in a document changes then the corresponding Alternative Canonical Form hash will likely also change. For this reason, the data store at the URI Service associates Common DOM Forms with hashes of their related Alternative Canonical Forms. However, when constructing the Common DOM Form's Alternative Canonical Form made for purposes of creating a stable identification for a Common DOM Form, the 'title' and 'description' nodes are included so that changes to them will also be detected. In this document the term "Common DOM Form hash" refers to the hash of this special Alternative Canonical Form, constructed over the Common DOM Form text including the text and description nodes. If the text and description nodes are empty, then this rule makes no difference for the Alternative Canonical Form. This hash is used to detect changes to the document and can be used to locate its corresponding Common DOM Form at the server. By design, this special Alternative Canonical Form can be constructed directly from a Common DOM Form; subsequent references (explicit or implicit) to the Common DOM Form's hash refer to the full 64 bit hash (64 bits in some embodiments) of this special Alternative Canonical Form of the Common DOM Form.

A range in the Common DOM Form is represented by left and right range endpoints, each of which consists of ordered pairs of integers. The first integer in a range pair is the index of a node in the Common DOM Form. The second integer is an offset. The offset is either in code units or in nodes, depending on the type of node in the Common DOM Form. If it is type VnT, then the offset is in nodes; if it is any other type, then the offset is in code units. Note that the text of an Alt type node is included in its entirety because the image it represents is included in an HTML DOM range in its entirety. In other words, ranges do not include partial images (or partial alternative text).

The Common DOM Form uses a different model than the W3C uses for HTML and XML DOM instance range boundaries. HTML range boundaries indicate positions between nodes or code units. As a consequence of this model and the fact that the HTML DOM uses a tree structure, there is often more than one way to represent what is in effect the same HTML range. The Common DOM Form range "boundaries" use the endpoints of a range, in the form of actual nodes or code units within nodes. A Common DOM Form range only has one representation.

If a Common DOM Form range endpoint indexes a VnT node, then the offset is 0. If a Text node is indexed by a Common DOM Form range endpoint, then the offset can have any value up to the position of the node's last code unit. If an Alt node is indexed by a range endpoint, then the offset is 0. If an object (a node or code unit) is a left range endpoint, then the objects that come before it (to its left) are excluded from the range; for a text-type offset, any code units in the same node having indices less than the offset are excluded from the range, along with any nodes to the left. If an object is a right range endpoint, then objects that follow it (to its right) are excluded from the range; for a text-type offset, any code units in the same node having indices greater than the offset are excluded from the range, along with any nodes to the right.

A range is valid provided there is no object that is excluded from the range by both the range's left and right endpoints.

While there are several advantages to using a model that identifies actual objects to delineate a range instead of gaps between objects, representing the position of a null range (i.e., one with no content, identifying a gap between adjacent objects) can be counterintuitive. For a null range (a position between adjacent objects), the Common DOM Form left range endpoint is immediately to the right of an object that is the right range endpoint. The left range endpoint excludes everything to its left; the right range endpoint excludes everything to its right. Since the left range endpoint is to the right of the right range endpoint, everything is excluded, leaving an empty range. If a valid range is empty, then it effectively identifies the position between the endpoints.

Documents may indicate "Friendliness" to a particular implementation of an embodiment, in order to better enjoy the benefits of the corresponding embodiment. The declaration is made within the document in the form of a Boolean metadata datum, according to some embodiments, which indicates that the behavior of any active document content (e.g., scripts) shall be oblivious to (not depend upon) the presence or absence of Fragment Identifiers of the particular implementation. This means in particular that the user experience will be identical whether a Fragment Identifier of the implementation in question is present or not, provided the document is displayed by a user agent (e.g., browser) that itself has no code sensitive to the implementation's Fragment Identifiers. This is a non-trivial assertion; there are HTML web sites with page scripts that behave quite differently when they encounter a Conventional Fragment Identifier that the script does not recognize. The document may even be redirected to another site and thereby display entirely different content. This may also occur when there is more than one Fragment Identifier, which is not precluded by existing practice or de-facto specifications but is nevertheless unexpected by the active content of some documents. When seeing the unexpected, such document scripts may behave as if the entire URI is in error and may redirect to different content.

This can be achieved in any number of ways in the various document types. In some embodiments, for HTML documents this Boolean datum is declared in the header according to HTML provisions for metadata tags. The actual strings used to represent this Boolean are implementation-specific. For example, in HTML documents a declaration of Friendliness to a particular implementation of the preferred embodiment could be made by an HTML statement of the following form: <META name="MagLink" content="Friendly">

This friendliness assertion is subsumed by a general assertion that active content will ignore unrecognized Fragment Identifiers, and will act exactly as if the unrecognized Fragment Identifiers were not present. This logically entails an assertion that multiple Fragment Identifiers (that are not understood) will not result in different behavior regardless of the order in which they appear relative to each other or relative to Fragment Identifiers that are understood. This is more general since it is not a specific assertion of Friendliness to a particular implementation of an embodiment. If such a general assertion were accurately made in a document it would achieve similar benefits. In some embodiments this general assertion is made in HTML headers according to HTML provisions for metadata tags, and is an HTML statement of the following form:
<META name="Fragment-Identifier-Extensions" content="MagLink General Conformance">

In what follows, a document that makes either of these kinds of friendliness declarations, then it is referred to as "MagLink Friendly" or as having declared "MagLink Friendliness".

It is useful for any particular implementation of an embodiment to protect itself from possible interference, accidental or deliberate, by legally restricting sites from making false or unauthorized declarations of MagLink Friendliness. A deliberately false self-declaration of MagLink Friendly can be used in a subtle denial-of-service attack, whereby false declarations are used to deny anyone the benefit of making accurate declarations. Moreover, as will be described in detail below, it can be used to enable a means for document scripts to determine if the user agent is an embodiment, which should not be determinable except by truly friendly sources of documents. Therefore, the use of trademark, copyright, and any other possible legal protections applicable in the various jurisdictions world-wide that could protect against such malicious usage is advisable. In particular, a key term used (in the example it is MagLink), should be trademarked.

There is no requirement that documents be MagLink Friendly, but if documents do declare MagLink Friendliness, then Fragment Hyperlinks identifying fragments in those documents can be freely created and used without some unwanted consequences. In some embodiments, as will be explained later, these declarations would become unnecessary due to standards-based user-agent action that prevents visibility of such Fragment Identifiers to the active content of documents. I.e., if the active content of a document simply cannot see Fragment Identifiers of an embodiment in any circumstance, then a promise to behave appropriately when they are seen becomes superfluous. In the absence of general standards-based provisions, as described above some embodiments provide a mechanism for documents to self-declare that document scripts will behave the same whether or not the user-agent prevents visibility of such Fragment Identifiers. This is useful because hyperlinks created according to some embodiments will be interpreted by user agents that do not act in accordance with those embodiments, and will therefore permit document scripts to access Fragment Identifiers created by embodiments.

Because the active content for some documents and some user agents will likely not behave according to embodiments, especially at first as embodiments are adopted, an additional aspect of some embodiments is a "Safe-Mode" Fragment Hyperlink provision. A Safe-Mode Fragment Hyperlink is a special hyperlink format, conformant to existing hyperlink specifications, which is used under circumstances where a) user agents that will interpret the hyperlink may not conform to this specification and b) the target document does not declare MagLink Friendliness. I.e., these embodiments do not encourage the use of a Safe-Mode Fragment Hyperlink where either the interpreting user-agent is known to behave according to the specific embodiment, or the target document self-declares MagLink Friendliness.

A Safe-Mode Fragment Hyperlink according to some embodiments has a 'href' attribute URI value that does not comprise a Fragment Identifier of an embodiment. Instead, the full Fragment URI is contained in another attribute of the hyperlink, one that is only examined and used by user agents acting according to the embodiment that created it. The name of the attribute is implementation specific. In an example implementation, the name of this full Fragment URI attribute is 'maglink_href'. For clarity and without loss of generality, we hereafter refer to this attribute by this example name of 'maglink_href'. When a user agent acting in accordance with its embodiment is requested to activate a Safe-Mode Fragment Hyperlink (e.g., a user clicks on the hyperlink in a browser), the user agent checks for the presence of a 'maglink_href' attribute and, if present, verifies it as a Fragment URI and then (in some embodiments) further verifies that the 'maglink_href' attribute URI and the 'href' attribute URI are identical up to the first hash. If these verifications succeed, then the user agent activates the Fragment URI from the 'maglink_href' attribute. Otherwise it activates the URI of the 'href' attribute. A user agent that is not an embodiment will typically act according to existing practice and specifications, which means that it ignores the 'maglink_href' attribute that it does not recognize, and activates the URI of the 'href' attribute. In this way the use of a Safe-Mode Fragment Hyperlink prevents a Fragment Identifier of an embodiment from being interpreted by scripts of a hyperlink-target document when it is activated by a user agent that is not an embodiment.

For simplicity the above description of Safe-Mode Fragment Hyperlinks ignores an intra-document navigation aspect of embodiments, which is the use of Safe-Mode Fragment Hyperlinks for same-document references. This usage follows the pattern of relative URIs in HTML, whereby a hyperlink references a different part of the same document identified by a named anchor, which is a common usage of existing Conventional Fragment Identifiers. If the 'maglink_href' attribute of a Safe-Mode Fragment Hyperlink begins with a hash, i.e., it is a naked Fragment Identifier, or it has the same URI prefix as the referencing document, then some embodiments interpret it as an identifier of content in the same document and its 'activation' occurs in that same document display. The 'href' attribute of such a hyperlink can point to the nearest target anchor, such as an earlier heading, or it can identify nothing at all. Since relative hyperlinks that have no matching anchor are ignored by user agents that are not embodiments, if the 'href' is to be inoperative then the maglink_href Fragment Identifier can be dispensed with and its value placed in the 'href' attribute.

It is perhaps counterintuitive that there is significant advantage in the creation of intra-document references in that the referenced content need not be modified; after all, creating the link itself modifies the document. Nevertheless, such capabilities have utility beyond the elimination of the work required to create a target anchor in the document. For example, in a forum web page or a blog, where a particular document grows as different people post messages into it, the only modification possible for a normal contributor is to append new content in the form of a message or post. In such a case modifying what is already there is not possible but adding new content with arbitrary embedded links is often allowed. An intra-document Safe-Mode Fragment Hyperlink can take a user to the specific content referenced without modifying it. This navigation is of value even if the user also wishes to quote the referenced content, because a reader may want to see additional context of that content. Today, considerable existing context is copied into the same document in follow-on posts that is marginally pertinent, in order to provide context, even though it is already there earlier in the document. In some embodiments the most pertinent content can be copied (if desired) as well as referenced by a Fragment Hyperlink, and by activating it a user can select the referenced copy and scroll it into view automatically, which identifies the pertinent content in its original context. Then the back-button returns the user to the location where he started in the same document. Comments added to blogs can use the same facility. In addition to user convenience, this facility reduces the need for user driven duplication of content. Note that this is superior to use of position style fragment hyperlinks in such a situation, as they are more prone to linkrot because of the continually changing nature of such documents.

In another aspect of some embodiments, both intra-document and inter-document Fragment Hyperlinks can advantageously be Safe-Mode Fragment Hyperlinks, even though the target document might be Maglink Friendly. According to this aspect, when a Fragment Hyperlink of an embodiment is created, an analysis of the structure of the DOM is made to determine if there is a "suitable nearby anchor" that can be targeted by a Conventional Fragment Identifier. If there is one, then the Conventional Fragment Identifier is appended to the URI prefix to obtain the 'href' attribute, and the Fragment Identifier of an embodiment is appended to the URI prefix to obtain the 'maglink_href' attribute. This allows a conventional user agent to scroll the document to the general vicinity of the targeted content; thereby the user obtains benefit from activating a Fragment Hyperlink of an embodiment even if his user agent does not comprise an embodiment. According to those embodiments, a suitable nearby anchor is an anchor that is determined by examination of the DOM instance of the document to have the following characteristics:

1. Some hyperlink within the document itself targets the anchor. This requirement derives from uncertainty about script behaviors. If no hyperlink of the document targets an anchor then it is unknown whether the scripts of the document will misbehave when they see a URI with a Conventional Fragment Identifier. Some existing scripts will consider either a Conventional Fragment Identifier or Fragment Identifier to be an error and will change the display to unrelated content.

2. It is partially or completely within the first range of the user's selection or it precedes the first range of the user's selection when the Fragment Identifier is made. To choose between more than one possibility, those partly or completely within the range are preferred over those without and then the anchor nearest to the start of the first range is preferred.

As described before, here the term 'Fragment Hyperlink' applies to all fragment hyperlinks of embodiments, which includes Safe-Mode Fragment Hyperlinks. By 'Normal-Mode' Fragment Hyperlink we refer only to those hyperlinks that use a Fragment URI of an embodiment as the value of the href attribute.

The Safe-Mode Fragment Hyperlink provision is desirable because the alternatives can be less desirable in some circumstances. However, over time it can be deprecated provided an implementation of a specific embodiment comes into widespread use. It is a suboptimal solution in that its use can interfere with desirable processing of the full Fragment URI, even when the user agent displaying the document is an implementation of the corresponding embodiment. For example, a word processor or email application may have a document open that contains a Safe-Mode Fragment Hyperlink, which the user clicks. Because the word processor knows nothing about Safe-Mode Fragment Hyperlinks, and in particular it does not recognize the maglink_href attribute, it passes the URI of the href attribute to an Internet browser. The browser that opens the URI could be an implementation of the corresponding embodiment, and therefore capable of interpreting the maglink_href Fragment URI—but it never sees it in this scenario. The common clipboard-centric practice of copying or creating an HTML hyperlink and pasting it into modern document editors including Microsoft Word documents, web page editors, and email editors will set up this scenario. Thus beneficially, if a document declares itself MagLink Friendly, only Normal-Mode Fragment Hyperlinks need be created for it. In those circumstances where the href attribute would contain a Conventional Fragment Identifier, and a user is advanced enough to understand the consequences of his choice, he may beneficially choose a Safe-Mode Fragment Hyperlink over a Normal-Mode Fragment Hyperlink even where the target document is MagLink Friendly.

Another aspect of some embodiments is indirect Fragment Hyperlinks, wherein a simple URI is created as a unique "Surrogate URI" (or just "Surrogate") for a Fragment URI and an associated conventional URI. Surrogate URI based hyperlinks are called "Surrogate Hyperlinks". In such embodiments, a network "Redirect Service", on receiving HTTP requests for Surrogate URIs, returns HTTP redirect responses (in some embodiments either 302 or 303 HTTP responses, but others such as 301 and 307 may also be used) to the user agent. In the HTTP response from the Redirect Service, the URI prefix (possibly suffixed by a Conventional Fragment Identifier associated with the Fragment URI) is sent in the standard manner as the URI to be activated. The Fragment Identifier of an embodiment and the Conventional Fragment Identifier (if there is one) are sent in a HTTP custom response header created for that purpose. According to the usually followed convention, some embodiments use a custom header name that is prefixed with "X-"; an example implementation of one of those embodiments uses the header name "X-Mag-Link-Fragments". A conventional user agent activates the URI that appears in the standard part of the response. A user agent comprises a matching implementation of an embodiment if it recognizes the custom response header name and from its value can extract the Fragment Identifier and, if present, the Conventional Fragment Identifier. If the user agent comprises a matching implementation, then it removes the Conventional Fragment Identifier from the URI, appends the extracted Fragment Identifier, and then allows activation of the resulting Fragment URI to proceed. In alternative embodiments the Conventional Fragment Identifier is not removed even though the scroll position that it establishes will be modified by processing of the Fragment Identifier; this alternative behavior has an advantage in some circumstances if the document has changed and the Fragment Identifier no longer identifies content; however, it has a disadvantage if the document changes have also moved or removed the anchor used by the Conventional Fragment Identifier.

In order to give the user opportunities to upgrade his user agent to enjoy the benefits of an embodiment, a user agent acting according to that embodiment sends a custom header in the HTTP request to the Redirect Service whenever it makes HTTP requests using a Surrogate URI. If the Redirect Service does not see this custom header in a request having a Surrogate URI, then it knows that the user agent does not comprise an embodiment. In order to do this efficiently and only for Surrogate URI requests, in some embodiments that provide this capability, each Surrogate URI has a common short prefix that is used solely for Surrogate URIs associated with the embodiment. According to the usually followed convention, some of these embodiments use a custom header name that is prefixed with "X-"; an example implementation of an embodiment uses the header name "X-Mag-Link-Agent" with the assigned value having a prefix of "MagLink". A version number for the embodiment follows the "MagLink" string. The Redirect Service also causes an HTTP cookie to be created by the user agent to persistently keep the user's preferences concerning offers to upgrade or extend his user agent.

In some embodiments, the user is given opportunities to upgrade to a user agent that comprises an embodiment. Before such an opportunity is offered, there are a number of checks that are made at the Redirect Service based in part on the value of the cookie passed to the service. The following are checked:

1. Has the user agent declared in the HTTP request header to be an embodiment and a sufficiently recent version?

2. Has the user asked to not be offered an opportunity to upgrade or extend this user agent for a period of time? In some of those embodiments this information is kept in a browser cookie for the domain of the Redirect Service with a time stamp. If the user deletes his cookies then this information is lost. By default, less than one week is "recently", but this is a configurable amount of time.

3. Has the user expressed a desire to never again be offered to upgrade or extend his user agent by the Redirect Service? In some of those embodiments this information is kept in a browser cookie for the domain of the Redirect Service. If the user deletes his cookies then this information is lost.

4. Can this user agent be upgraded or extended to an embodiment? In some of those embodiments this information is determined based on the cookie information that is sent with HTTP requests to the Redirect Service. The generic browser identification information, which is sent with HTTP requests, is not used for this purpose in some embodiments because of its unreliability.

5. Is a user agent that comprises an embodiment available for the user's platform (computation device)?

If the user agent is already a sufficiently recent embodiment, the user has requested to not be offered this opportunity at this time or forever, or no user agent embodiment is available for the platform, then no offer is made and the Redirect Service sends the redirect response. Note that the identification information contained in a standard HTTP request generally includes platform and browser identification information. However, browsers often identify themselves incorrectly or otherwise interfere with accurate determination based on the browser identification string sent to services that process HTTP requests. Therefore, the identity of the platform is also determined definitively based on information stored in the cookie. In some embodiments that use cookies, if no cookie is present then the platform identification is taken as unknown and a page that uses scripts to make those determinations at the user agent is served out by the Redirect Service.

If the Redirect Service responds with a document (i.e., not with a redirect response), then the document's scripts accurately determine the type of platform (both hardware and OS). It communicates this information back to the server, which determines whether the platform can be upgraded to a user agent that comprises an embodiment. If the platform is not suitable then the platform information is stored in a cookie and the page's scripts redirect. The platform information in the cookie allows the server to immediately redirect in the HTTP response on subsequent requests. If the platform is suitable and if the user's current user agent can be upgraded or extended to an embodiment, then content that offers to perform that specific user agent upgrade or install the extension is presented to the user. If changing user agents is required to make the upgrade, then the situation is explained to the user and an offer is made to make the required installations. When an upgrade offer is made, the user is also given an opportunity to indicate that he does not want such offers in the future, both for a period of time and forever, depending on the user's choice. If the user chooses to upgrade his running user agent then the upgrade is performed, if possible, without halting the user agent and then the Fragment URI represented by the Surrogate URI is activated. If the upgrade cannot be or is not performed on the running user agent, then the upgrade is performed and the user agent is restarted (if possible) with restoration of the user agent session. Such restoration will beneficially restore the Surrogate URI, but since the user agent now comprises an implementation of an embodiment, the Fragment URI represented by the Surrogate URI is automatically activated by the Redirect Service. Whether the user has chosen to upgrade or not, his upgrade preferences are saved in a cookie along with accurate platform information. If he did not choose to upgrade, the original user agent instance is still active and the conventional URI represented by the Surrogate is activated by document scripts (originally provided with the document from the Redirect Service).

In alternative embodiments, the Redirect Service determines whether the user agent comprises an embodiment by parsing the browser identifier string. The information that this is an embodiment is appended to the browser identifier string, which by standard HTTP specifications goes with HTTP requests.

Advantages of Surrogate URI based hyperlinks include that they can take the place of Safe-Mode Fragment Hyperlinks (except intra-document hyperlinks, which are best served by Safe-Mode or Normal-Mode Fragment Hyperlinks as described above). A site can obliviously use Surrogate URIs and Surrogate Hyperlinks as they would any other URI or hyperlink when they identify an external document. For example, a user could create a Surrogate URI or Surrogate Hyperlink and embed it in an email, MS-Word document, or a forum web site and it would work as a simple URI or hyperlink when activated on browsers that are not embodiments; it would work as a Fragment URI or Fragment Hyperlink on browsers that are embodiments. Moreover, without specific cooperation from scripts in documents that contain Surrogates, an embodiment's redirection service can inform a user whose user agent is not an embodiment, in a temporarily-displayed document, that he is opening or activating a URI intended for precise identification of content; it can show him what that means by example and provides him with an opportunity to upgrade or install software to take advantage of the capability.

Such a redirect, which may be implemented as 301, 302, 303, and 307 redirects in the HTTP protocol, generally results in the original referrer becoming the HTTP "referer". (Note that the misspelling of referrer as "referer" is intentional to match the HTTP specifications that define a "referer".) However, the specifications do not require this behavior. Tests have shown that 302 redirections on most browsers work as desired, but again it is not required by the specifications. User agents are also not required by the specifications to behave the same in this regard with the different types of HTTP redirects. For this and other possible implementation differences for any particular user agent or user agent version, the use of any of the possible HTTP redirects may be preferable over the others; thus, in some embodiments the determination between types of HTTP redirects is done using configurations of the Redirect Service. These configurations can be as specific as a particular version number of a user agent, depending on how it is identified by the HTTP browser identifier string passed to the Redirect Service in HTTP request headers by the user agent.

While Surrogate URIs can avoid most disadvantages (described above) of Safe-Mode Fragment Hyperlinks and thus satisfy normal expectations of most users, it has some disadvantages for services that serve out web pages. For example, of significance to many web sites is the accuracy of a database where they keep the value of the referring URIs, which tells an Internet service how visitors to its site found it. In spite of the efforts (described above) to preserve the accuracy of such usage, in principle according to the standard specifications this surrogate approach could reduce the accuracy of such databases. Moreover, even if all user agents of interest behaved identically, and used the original source as the referrer when receiving HTTP redirects, a redirection service could obtain important business information about the target service that they would otherwise not have access to. In particular, a third party redirection service could obtain accurate statistics for either outgoing or incoming requests (essentially the same statistics as the sites themselves) for any site where traffic was redirected substantially through such a service. Generation of such statistics could potentially be a valuable service to some businesses, but other businesses could find it an unwanted loss of sensitive business information.

Thus, while use of Surrogate URIs solves usability problems from the end user's perspective, some embodiments also provide for the creation and use of Safe-Mode Fragment URIs to accommodate other needs and in particular some needs of web service businesses. Because of simplicity and ease of use, end users are beneficially encouraged to create Surrogate URIs wherever they will meet that end user's needs, and leave Safe-Mode Fragment URIs mainly to those who have specific needs for characteristics not provided by Surrogates.

In another aspect some embodiments provide for the automated conversion of Surrogate Hyperlinks to Safe-Mode or Normal-Mode Fragment Hyperlinks as appropriate, as well as the reverse conversion of Fragment Hyperlinks to Surrogate Hyperlinks. For embodiments where Surrogate URIs are always created for recoverable Fragment URIs (i.e., version 1 Fragment Identifiers as described presently), the conversion to Surrogate URIs is performed by look up at the URI Service or Redirect Service starting with that Fragment URI. To convert the other way, first look up the Fragment URI using the Surrogate URI. Whether to convert to a Safe-Mode or Normal-Mode Fragment Hyperlink is determined by the Boolean of the Fragment Identifier, which indicates whether or not the URI identifies a Maglink Friendly document. This Boolean is described presently.

Conversion uses communication with the URI Service but automatically inserting the results into a document or a database from which documents are generated in general requires secure access to that document or database. Some embodiments provide code libraries containing interfaces to these conversions using licensee code that invokes the library interfaces. This allows automatic conversion do be done from code that has security credentials that enable modification of licensee documents and databases. Such conversions can occur at the time that information is added to a document. For example, when a forum or web blog accepts a posted message for display on a page, the post is parsed for Fragment Identifiers (of an embodiment) and those found are converted to the desired form prior to insertion into the forum or blog document.

In another aspect of some embodiments (and subject to appropriate configuration to act as described), when a Fragment Hyperlink is inserted into a document such as a blog or forum document, the URI prefix is compared with the URI of the document into which the hyperlink is being inserted. If the two URIs match then the hyperlink is converted into an intra-document (i.e., local) hyperlink; this means that the URI prefix is removed from the Fragment Identifier and, if one exists for this URI, the Conventional Fragment Identifier. If there is no Conventional Fragment Identifier then a Normal-Mode local Fragment Hyperlink is created; in HTML this means that the Fragment Identifier part of the Fragment URI (i.e., absent the URI prefix) becomes the value of the hyperlink's href attribute. If there is also a Conventional Fragment Identifier, the hyperlink's href attribute is set to the Conventional Fragment Identifier string and the maglink_href attribute is set to the Fragment Identifier string. The Fragment Identifier and Conventional Fragment Identifier are obtained from the Redirect Service in a redirect response from the Surrogate. A benefit of this aspect is that such hyperlink activation results in simple navigation within the document.

In another aspect of some embodiments, when part or all of a document is copied to the clipboard, any relative hyperlinks are converted to absolute hyperlinks. In addition to that behavior, in some of those embodiments, when a Safe-Mode Fragment Hyperlink is copied the 'maglink_href' Fragment Identifier attribute's value is prefixed with the document's URI prefix (the URI of the document absent any embodiment Fragment Identifiers and any Conventional Fragment Identifiers that match anchors in the document). This is done before the HTML is placed in the clipboard.

In another aspect of some embodiments, when an end user activates a Surrogate URI and is presented with the opportunity to upgrade to an embodiment, the presented document includes a snippet from the targeted information. This is gotten by looking up the targeted information at the URI Service from the Common DOM Form that is stored there to identify the targeted information. If the identified information is short (i.e., snippet length or less), then it is presented in its entirety to the end user. If the identified information is longer, a snippet length prefix is chosen and used for this purpose. While it is configurable, by default snippet length means 200 Unicode characters or less. In either case, the user can press a button in the document as many times as he likes; the displayed page will select the snippet and scroll it into view to give the user a flavor of how an embodiment works. These actions are effected by JavaScript embedded in the displayed document, so that a user agent that enables JavaScript will provide the user with the desired experience. In alternative embodiments, use of this snippet is conditioned on whether the targeted document has a copyright notice. In other embodiments, by default, the target document's snippet is not displayed if the owner of the copyright that covers the snippet has requested, according to legal requirements for making such requests, that the enterprise providing the URI Service not use information from that copyrighted document in this manner. However, this prohibition can be overridden according to configuration for content based on its length and its length in relation to the full length of the document. Further, such configurations can be applied separately to particular web sites or parts of web sites.

In another aspect of some embodiments, when an end user activates a Surrogate URI and a Redirect Service presents an opportunity to upgrade to an embodiment, the end user's navigation history is used to identify advertisements appropriate for that user, to be displayed in conjunction with upgrading his user agent. Some of these embodiments target users for specific advertisements in a manner described later in this description. If no targeted advertisements are identified, then untargeted advertisements are chosen. One or more advertisements are chosen depending on the form factor of the user agent and his platform, and these are displayed in the document that presents the user with an opportunity to upgrade.

Figure 11:
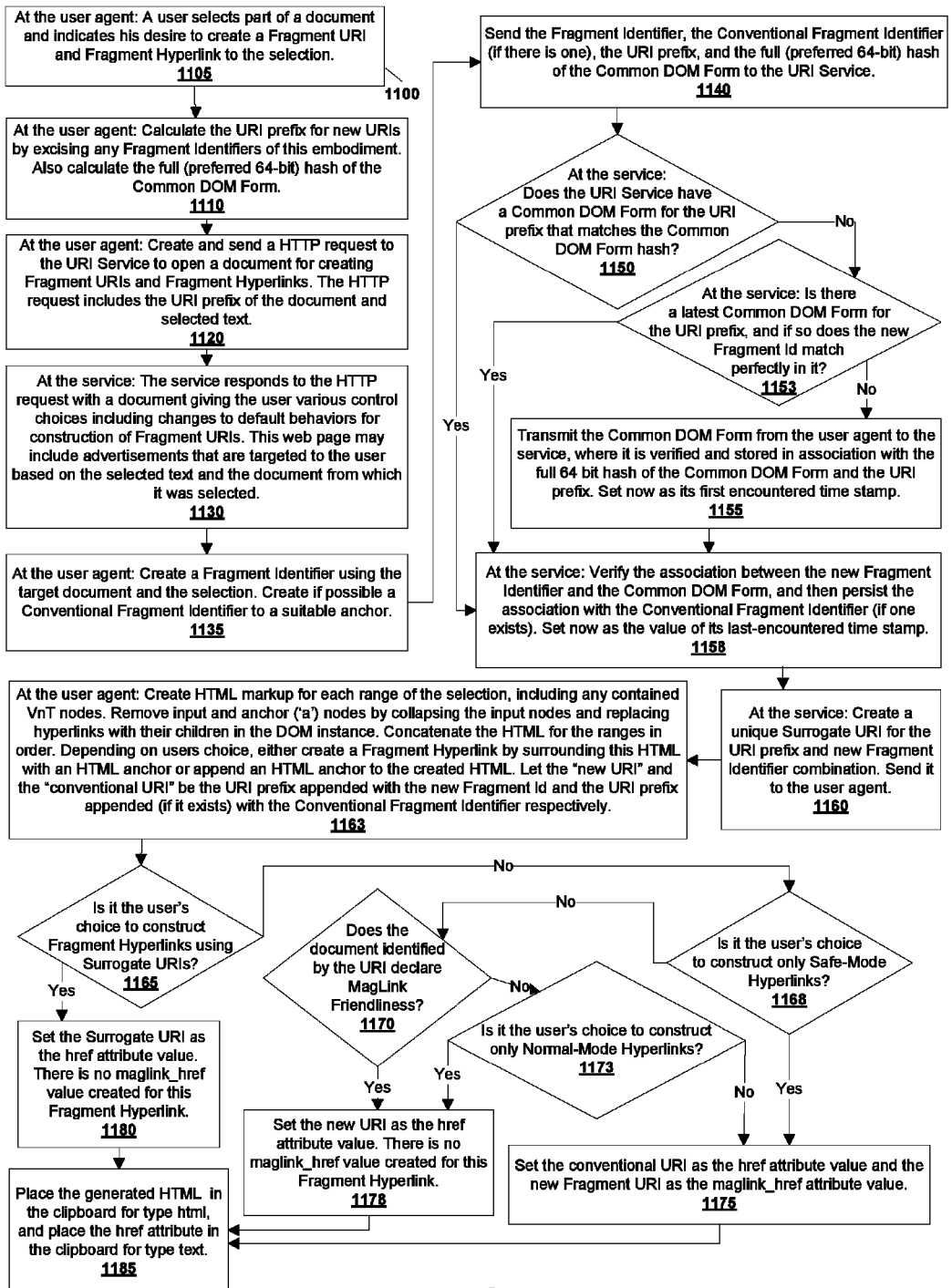
FIG. 11 illustrates creation of a recoverable Fragment URI and Fragment Hyperlink from a user selection at the user agent, and placing the results in the clipboard.

FIG. 11 illustrates the creation of a recoverable Fragment URI and a Surrogate, Normal-Mode or Safe-Mode Fragment Hyperlink from a user selection, and then placing the results in the clipboard. After the user makes his selection, he indicates a desire to construct a link to the selection in that document 1105; for example, the user may use a mouse to do this by first making a selection and then, from a list where simply copying the selection would logically be a choice, he indicates his desire to create a link to the selected portion of the document. The URI for the document is modified by removing any Fragment Identifiers of this embodiment 1110, and then any Conventional Fragment Identifier that identifies a specific (existing) target anchor in the document; the result becomes the URI prefix. Construct the special Alternative Canonical Form for the document and calculate its full (preferably 64-bit) Common DOM Form hash value.

At the user agent create 1120 an HTTP request to the URI Service. Its purpose is for retrieving a document from which the user can control the creation of Fragment URIs and Fragment Hyperlinks. The HTTP request includes the URI prefix of the document and selected text. In some embodiments this is performed using an HTTP POST request with the URI prefix and the selected text in the body of the message. The selected text is truncated if it is longer than a configured maximum, which maximum by default is 4000 characters. If there are fewer than a configured minimum number of characters in the selection, then the context surrounding the selection is included equally on both sides until the configured minimum number of characters is reached or the document is exhausted; the configured minimum is 100 by default. However, only whole terms (words) are taken and thus the result may exceed the configured minimum number of characters. If a selection has multiple ranges, the first configurable number of ranges is taken to be the selection; by default the number of ranges is 4. The longest range is truncated until the configured maximum limit (again by default 4000) of characters is achieved. Whole terms (words) are eliminated instead of single characters. This request may be repeated and meets the requirements of the HTTP specifications' defined notion of "safe" requests in that it does not create obligations on the part of the sending user or user agent. In order to accommodate information that may require longer URIs than some user agents can tolerate, the bodies of HTTP POST messages are nevertheless used in some embodiments.

At the service, using the received URI and selected text, the user's navigation history is updated to include a request for creation of this Fragment URI and its activation record. The record will not contain the Fragment URI at this point because it has not yet been created; after the Fragment URI has been created according to user preferences, the record will be updated with it. Then advertisements are selected from available advertisements according to the embodiments being used and the user's navigation history as described later.

With advertisements chosen, the URI Service of some embodiments creates and serves out 1130 a document in response that displays the selected text, displays the advertisements, has boxes to display hyperlinks and URIs (to be created later and then displayed), and gives the user control choices including the following:
1. Create a Surrogate Hyperlink.
2. Override the normal behavior and create either a Safe-Mode Fragment Hyperlink or a Normal-Mode Fragment Hyperlink regardless of the characteristics of the document.
3. Never incorporate alternative image text, even if it is found in the selection.
4. Always incorporate alternative image text.
5. Ask the user each time about image text but only if image text is present and could be included.
6. Make these choices the default.
7. Subscribe to a paid service to avoid advertising.
8. Append a Fragment Hyperlink to the HTML for the selection, or make the selection into a Fragment Hyperlink.
9. Create-the-Hyperlink now button. When this is pressed, the hyperlink is created according to the preferences.

Starting with the document and the selection, a Fragment Identifier is created 1135 for the selection. Details of Fragment Identifier creation are given in the process 1200 of FIG. 12 based on the user's preferences expressed here.

If possible, identify a nearby conventional anchor 1140 that, if appended to the URI prefix as a Conventional Fragment Identifier, would create a conventional URI that causes scrolling to a part of the document near the selection. If no targetable anchor is found, then no Conventional Fragment Identifier is used. Initially only anchors that are targeted by hyperlinks in the document itself are considered. This is done because, if no hyperlink actually targets an anchor in the document then the page scripts might view either a Conventional Fragment Identifier or a Fragment Identifier as an error; when such an "error" is encountered, some scripts will open entirely different and unwanted content. Next "targetable anchors" (i.e., anchors that are unique amongst the document's anchors and thereby have uniquely targetable identifier strings) that are entirely or partially within the selection's first range are considered; if there are any, the first of these is selected. Next targetable anchors that precede the first range of the selection are considered, and the last of these is taken if there are any. If no anchor was selected, then no Conventional Fragment Identifier is used; if a suitable anchor was identified, then its identifier string is prefixed with a hash ('#') to create the Conventional Fragment Identifier. The URI prefix, the new Fragment Identifier, any Conventional Fragment Identifier, and the full 64 bits of the Common DOM Form hash are sent to the URI Service.

As described below, some embodiments check to see if an exact or nearly-exact document indicated by the user agent is already entered in the URI Service database. This is done by checking whether the full Common DOM Form hash sent by the user agent matches one already associated (via the Common DOM Form) with the URI prefix that was sent. If none match but there are one or more Common DOM Form entries for the URI prefix, it checks to see if the new Fragment Identifier matches somewhere in the most recent one, as described in detail below.

In the URI Service database, if there is 1150 a Common DOM Form for the URI prefix having a full Common DOM Form hash value that matches the hash value transmitted from the user agent, or the new Fragment URI matches 1153 perfectly (see below) in the latest Common DOM Form (if there is one) for the URI prefix, then verify 1158 (if not already verified in 1153) a perfectly matching association between the new Fragment Identifier and the Common DOM Form and persist that association. Also persist the association between the Conventional Fragment Identifier (if there is one) and the new Fragment Identifier. Mark the new Fragment Identifier as created by the user making these requests through his user agent. Note that in some embodiments the creation of a version 1 Fragment Identifier may occur without such a specific request by a user; for example, a search engine may create a version 1 Fragment Identifier in association with a search-generated snippet, so no "user" per-se is associated with the request; the search engine is marked as the creator of the Fragment Identifier.

Set the current time (now) as the last-encountered time stamp for the Common DOM Form.

Figure 35:
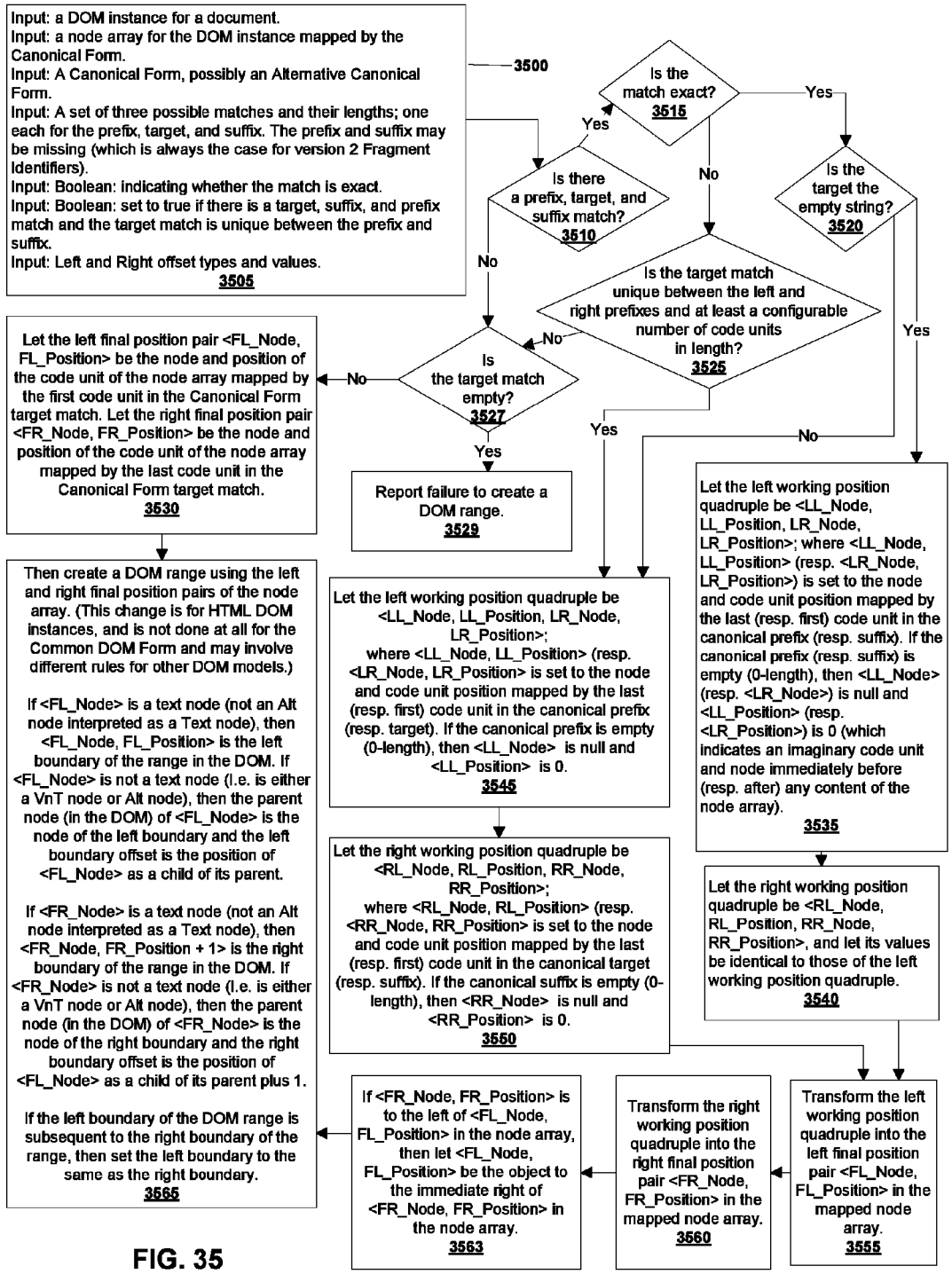
FIG. 35 illustrates processing a Canonical Form match into a DOM range.

Determining if a new Fragment Identifier perfectly matches in a Common DOM Form is done in substantially the same way as a search for perfect Fragment Identifier matches in a document DOM is done in a user agent. If there are multiple ranges they are separated into individual Fragment Identifiers as is illustrated 2220 in FIG. 22. The now-separate Fragment Identifiers are processed against the Common DOM Form as illustrated in process 2700 of FIG. 27. Note that process 2700 requires a DOM instance as input, from which it first constructs a node array, but the Common DOM Form is already essentially in node array form. Unlike at the user agent, there is no complicated DOM instance for input and the node array that is constructed from the DOM need not actually be constructed in an implementation because the Common DOM Form is already effectively in the required form (i.e., the first two nodes and their text can be ignored during processing). Ranges in the Common DOM Form are created by essentially the same procedures as used for creating a range in a DOM; however, since Common DOM Form range endpoints identify objects (nodes and code units) instead of gaps between objects, the final translation of a range into an HTML style DOM tree is not done; i.e., the translation step 3565 to the DOM of FIG. 35 is not performed. (In subsequent uses of this procedure, the strings identified against the Common DOM Form will be used to recover Fragment Identifiers by searching for that content.)

To reduce the computation cost of the process 2700, the last Common DOM Form for a URI could have a pre-computed Canonical Form and Alternative Canonical Form. Transmission and storage of the Common DOM Forms beneficially use deduplication technology to reduce transmission bandwidth and storage space.

In the URI Service database, if there is 1150 no Common DOM Form for the URI prefix whose Common DOM Form hash value matches the hash transmitted from the user agent, and the new Fragment URI does not match 1153 perfectly in the latest Common DOM Form (if there is one) for the URI prefix, then the Common DOM Form is transmitted 1155 from the user agent to the URI Service, where it is verified (see below) and stored in association with the full 64 bit Common DOM Form hash and the URI prefix. Set its first-encountered time stamp to the current time (now). Verify 1158 a perfectly matching association between the new Fragment Identifier and the Common DOM Form and persist that association. Also persist the association between the Conventional Fragment Identifier (if there is one) and the new Fragment Identifier. Set the last-encountered time stamp for the Common DOM Form to now.

Verification of the Common DOM Form consists of its transformation into the special Alternative Canonical Form, calculation of its hash, and verification of the new hash against the hash sent from the user agent. If any of the verifications fail then the user agent (and user) is informed of a fatal error, any persisted changes are backed out of the database and processing halts at the URI Service for process 1100.

The URI Service creates 1160 a unique Surrogate URI for the URI prefix and new Fragment Identifier in combination. It is sent to the user agent. Here "unique" means that a common URI prefix (for all Surrogate URIs) is appended with a Base64 encoding of an integer that has been chosen as an identifier of exactly one URI prefix and Fragment Identifier in combination in the URI Service database or databases. If a particular integer has already been used, then it may not be used again for this purpose. The length of the integer is kept short by using only as many bits of the randomly generated integer as are required to achieve uniqueness in the database. If the number of bits required is 4 more than the number of bits required to enumerate all of the database entries, then the pseudo random number is abandoned and another generated for this purpose. A configurable minimum number of bits are nevertheless used, which by default is 30.

In alternative embodiments, if the Common DOM Form hash does not match 1150, then the Common DOM Form is always transmitted 1155 to the URI Service. In other words, there is no secondary check to see if the Fragment Identifier nevertheless matches in the existing Common DOM Form. Advantages of these alternative embodiments include that the entire context of Fragment Identifier content is always guaranteed to be available. Disadvantages include that the space requirements at the URI Service are greater. This disadvantage is exacerbated by the fact that some dynamic documents are altered frequently and may change every time the document is loaded. Such fast changes are typically made to minor aspects of a document, such as a time stamp or a change in advertising information, but they are changes nonetheless. Since a user selection across such fast changing dynamic content is relatively unlikely (these are not the parts of a document that users typically want to communicate or remember), embodiments that provide a secondary check to see if the Fragment Identifier nevertheless matches in the existing Common DOM Form provide a significant beneficial reduction in the number of versions stored.

The user agent creates 1163 HTML markup for each range of the selection, including any contained images. This can be done by multiple means including by working directly with the textual markup for the document. In some embodiments it is performed by finding the deepest (or lowest in the DOM instance tree) common ancestor node (here the "ancestor" could be the node itself) to the two boundary nodes of the range (which could be the same node). Then the deepest ancestor node of that node which can be cloned is found. Note that cloning of DOM nodes is a standard operation against HTML DOM instances; in general HTML element nodes may be cloned. The identified node with its descendents is cloned to obtain a new tree of nodes. The content of the cloned structure that corresponds to nodes or text that is excluded from the range in the DOM instance is pruned from the cloned tree. The resulting cloned node tree is at this point effectively a copy of what is in the range.

A new root node of type 'span' is created and made the parent of the root node of the cloned copy. The input nodes are removed from the tree, together with their descendents. Script and noscript nodes and their descendents are removed. Anchor ('a') nodes (which as a group include hyperlinks) are removed from the tree while preserving node order; i.e., an anchor node's descendents are made children of its parent node in-order and they take the position of the anchor node in the parent node. Then an HTML snippet is obtained for this created tree, which in some embodiments for HTML documents is done by retrieving the innerHTML property of the root node, which contains the HTML for the descendent nodes, in order. This HTML snippet (snippet here means that it is not a complete document) is the generated HTML for the range. The HTML snippets for the (possibly multiple) ranges are concatenated in their original order to obtain the HTML for the selection. Depending on the user's choice, either create a Fragment Hyperlink by surrounding the selection's HTML with an HTML anchor, or append an HTML anchor to the newly-created HTML. In either case, the values of the anchor's 'href' and 'maglink_href' attributes are determined as described below. If the hyperlink surrounds the HTML for the selection, then in effect the whole of the text becomes the clickable hyperlink. If the hyperlink is appended, then some embodiments display an image that is about the height of text and which has an 'alt' text attribute. In an example implementation of an embodiment, the 'alt' text attribute of the image is "MagLink" and the image is a stylized icon-sized image that contains "MagLink".

If it is 1165 the user's choice to construct hyperlinks using Surrogate URIs, then the Surrogate URI is set 1180 as the href attribute value for the hyperlink and no maglink_href value is created for the hyperlink. Then place 1185 the generated HTML (including the hyperlink) in the clipboard for type html, and place the Surrogate URI in the clipboard for type text.

In what follows it is assumed that the user has not chosen to create Surrogate Fragment Hyperlinks.

If it is the user's choice is to construct 1168 only Safe-Mode Fragment Hyperlinks or the document does not declare 1170 itself MagLink Friendly and the user agent is not configured 1173 to create only Normal-Mode Fragment Hyperlinks, then the "conventional URI", i.e., the URI prefix appended (if it exists) with the Conventional Fragment Identifier, is set 1175 as the value of the href attribute and the new Fragment URI (URI prefix appended with the new Fragment Identifier) is set as the maglink_href attribute value.

If it is not the user's choice is to construct 1168 only Safe-Mode Fragment Hyperlinks and a) the document declares 1170 itself MagLink Friendly or b) the user agent is configured 1173 to create only Normal-Mode Fragment Hyperlinks, then the new Fragment URI is set 1145 as the href attribute value and no maglink_href attribute value is created.

The generated HTML is placed 1185 in the clipboard for type html, and the href attribute of the new HTML hyperlink is placed in the clipboard for type text.

Embodiments have many permutations whereby functionality illustrated in the Figures is performed by different devices and embodiments also have many combinations of functionality whereby some functionality is performed and other functionality is not performed. For example, in some embodiments, sending the Common DOM Form to the URI Service 1140 is not performed, which may affect the ability of the service to recover the created Fragment Identifier. In some embodiments, communication with a separate URI Service in process 1100 is eliminated entirely; if any functionality of the URI Service is performed, then the user agent performs that functionality; for example, in some embodiments the user agent creates a Surrogate URI having a sufficiently long string to guarantee uniqueness. In some embodiments this is achieved in a manner similar to the creation of GUIDs on computation devices, where the GUID is probabilistically presumed to be globally unique as a random or pseudo-random number, and the GUID (in string form) is appended to a URI to achieve uniqueness. This creation of Surrogates at the user agent can be effective, for example, where the user agent machine will also perform actions of the Redirect Service. In other embodiments none of the functionality of the URI Service is performed, but a version 1 Fragment URI is nevertheless created at the user agent, in particular without a Surrogate URI and without a database for recovery. In other embodiments the user agent uses its navigation history (described below), enhanced by holding the Common DOM Form for Fragment URIs, to provide URI Service style recovery from the user agent machine acting as a URI Service for the URIs it creates.

In some embodiments, a web site such as a blog acts as the URI Service beneficially for creating Fragment Hyperlinks that point to the domain of the blog. In some such embodiments, the user agent executes JavaScript that is served out by the site with its web pages, which performs user agent activities described in process 1100. All of the user agent activities described in FIG. 11 can be performed by such JavaScript, except for (in some user agents) inserting the resulting created hyperlink into the clipboard of the machine, which may be restricted for security reasons. In some such embodiments the creation of a Fragment Hyperlink is initiated by a user making a selection and then pressing a button; for example, the button could have the title "Create MagLink". In some such embodiments the Fragment Hyperlink is created as illustrated in FIG. 11 and then, instead of placing 1185 the hyperlink in the clipboard, the Fragment Hyperlink, Fragment URI, or both is displayed in the document that is already displayed 1130 for creating the Fragment Hyperlink. The user may then copy the Fragment Hyperlink or Fragment URI from that document into the clipboard using the normal copy and paste facilities of the user agent.

In this manner a web site, such as a blog or forum, may beneficially support Fragment Hyperlink creation for its own pages by including JavaScript for that purpose with its document content. A major benefit of such embodiments is that unmodified existing user agents can act according to embodiments, provided they support JavaScript; note that most modern browsers support JavaScript. A major disadvantage is that, unless the user agent can perform the user agent actions of FIG. 11 independently of document scripts, the user could only create Fragment Hyperlinks to web pages that provide such support from their scripts. Note that such embodiments also beneficially provide JavaScript for other functionality of these teachings, and in particular would beneficially interpret Fragment URIs according to process 2600 of FIG. 26; since the JavaScript would be from the web site itself, some embodiments beneficially dispense with the notification and timer processes of FIGS. 21 through 25 and instead directly determine when the document is complete and process it according to FIG. 26 at that time. In some such embodiments, the user's preferences for interpreting Fragment URIs according to process 2600 are kept in a cookie at the user agent; in other such embodiments they are set to a default set of preferences.

In other embodiments, some web sites have a JavaScript capability to create and process Fragment URIs as described above, but they do so in cooperation with any user agent that has this same capability built-in and in cooperation with the same URI Service of the user agent embodiment. The "MagLink Friendly" facility described above, as specified 2303 in FIG. 23, is used in some embodiments to communicate the information that the user agent is itself an embodiment to the JavaScript of displayed documents. In some such embodiments the JavaScript from the web site only engages in performing the functionality of these teachings when the user agent has no such capability. In this way a blog or other site can arrange for its users to enjoy benefits of embodiments even if the user's particular user agent does not comprise an embodiment. Because the makers of some hardware platforms restrict the incorporation of new technologies, and in particular could restrict the incorporation of a user agent embodiment, this combination would be beneficial to users of such platforms. In addition, since there are so many user agents to be modified, this combination could be beneficial to users of user agent software that does not comprise an embodiment, even if an embodiment were available for the user's platform.

Figure 12:
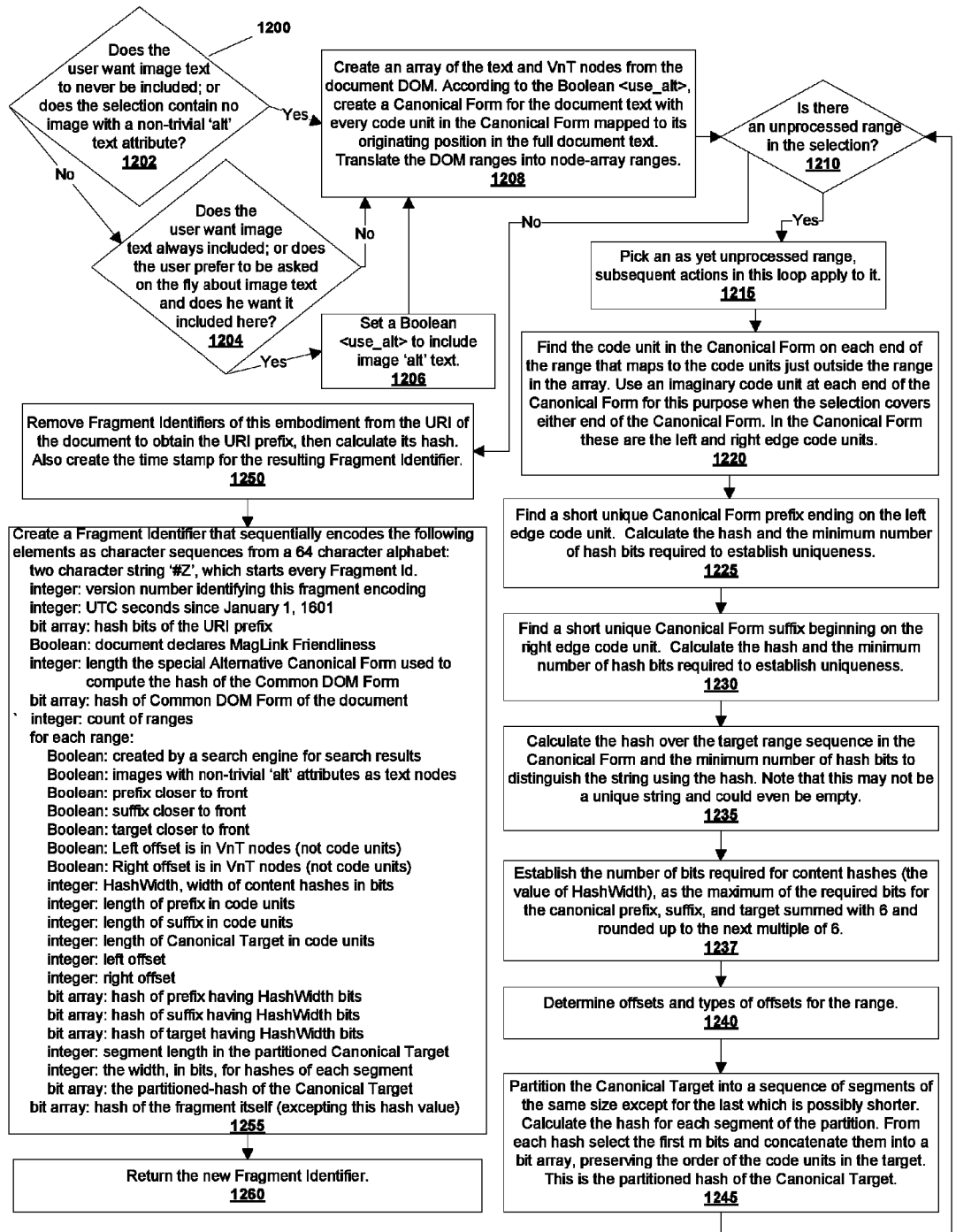
FIG. 12 illustrates creation of a Fragment Identifier using the target document and a selection.

FIG. 12 illustrates the process 1200 of creating a Fragment Identifier using the document DOM and a selection. A Boolean <use_alt> is set to its default value in some embodiments, which indicates that alternative image text will be omitted. If the user chooses 1202 to always treat image nodes as non-text nodes, even when they have non-trivial image descriptive text (e.g., the text of 'alt' attributes for HTML), or if the selection contains no image having non-trivial descriptive text, then proceed to the creation 1208 of an array of Text and VnT nodes, where any DOM image nodes are mapped to VnT nodes. Otherwise processing proceeds to further checking of the user's preferences 1204.

If the user chooses 1204 to always treat images having non-trivial descriptive text as text nodes, then the Boolean <use_alt> is set 1206 to this effect and processing proceeds to the creation 1208 of an array of text and VnT nodes where image nodes having non-trivial descriptive text are treated as text nodes.

If the user chooses not 1204 to always treat images having non-trivial descriptive text as text nodes, but instead chooses to be asked "on the fly" whenever images have hidden alternative image text that could be included, then the user is prompted to make this determination and processing waits until he responds. (This check is done at this point in the logic because the earlier checks 1202 guarantee that there is image text that could be included.) If he responds in the negative then processing proceeds with the creation 1208 of an array of text and VnT nodes where all image nodes are VnT nodes. If he responds positively, then the Boolean <use_alt> is set 1206 to this effect and processing proceeds to the creation 1208 of an array of text and VnT nodes where image nodes having non-trivial descriptive text are treated as text nodes.

In some embodiments, non-trivial text for images means that the text does not collapse, in the Canonical Form, to the empty string (or to whitespace, in alternative embodiments that do not entirely collapse whitespace). In alternate embodiments, if an 'alt' attribute collapses to a string with a length that is less than some configured number of code units, then it is considered to be trivial.)

A derived node array containing text and VnT nodes is created 1208 from the document's DOM; nodes appear in the same order as in the DOM. (Although the DOM is typically a tree, it has an order from left to right, with a parent node appearing before any of its descendents.) In some embodiments, when applied to an HTML DOM, only text and image nodes are copied to the node array; depending on the Boolean <use_alt>, some image nodes may be treated as text nodes. If a particular DOM range contains no image nodes with non-trivial text and the constructed prefix and suffix for that range also contain no image nodes with non-trivial text, then the range in the Fragment Identifier is marked for processing without using image text. (This marking allows such ranges to be utilized and processed without including image text, which makes them more robust to some types of changes.) If the Boolean <use_alt> requires inclusion of image text, processing checks the generated canonical prefix, suffix and target for actual mappings to image nodes having non-trivial text; if there are none then the Fragment Identifier range's Boolean governing image text inclusion is set to false, but if there is image text to be included then it is set to true.

The ranges of the DOM selection 1208 are translated into ranges in the derived node array. The derived node array uses the same range identification scheme as the Common DOM Form, which was described earlier. In particular, range endpoints in node arrays identify objects (i.e., nodes or code units) instead of gaps or positions between objects as is done for HTML DOM ranges.

This translation is done by finding the <node, position> in the derived node array that corresponds to each DOM range boundary. The <node, position> that corresponds to a right DOM range boundary is that <node, position> pair in the node array that is furthest to the right amongst those that are to the left of the right boundary in the DOM. The <node, position> that corresponds to a left DOM range boundary is that <node, position> pair in the node array that is furthest to the left amongst those that are to the right of the left boundary in the DOM.

Given this approach, the node array will always have right and left range endpoints. When the document DOM selection is translated into node array ranges and a range in the node array is empty (e.g., when a video is the sole object in the range and an embodiment is chosen that does not include video nodes as VnT nodes), the definition given in the previous paragraph identifies both a left and a right range endpoint. However, they will be crossed. The left endpoint will be to the right of the right endpoint as described in more detail earlier.

Implementations can use ordering functions provided by browsers, whereby a function returns a Boolean indicating the order relationship between two DOM nodes. Not all browsers with such a function call it by the same name, but most modern browsers have the capability. If such a capability exists in the browser or editing software, then it is used to perform a binary search for the position in the node array. If there is no such ordering function, then a traversal of the document DOM is used whereby each node in the DOM traversal is compared against the next node in the derived array (starting with the first). If the nodes are the same then the positions in both the derived node array and DOM advance; if not then only the position in the DOM advances. The left endpoint is the first node array object encountered after the left range boundary in the DOM is found. The right endpoint is the node array object encountered just prior to locating the DOM right range boundary. Since not all DOM objects are included in the derived node array, the left endpoint can be to the right of the right endpoint. This circumstance indicates that the range is only a position having no node or code unit, as was discussed above.

It is somewhat common practice to use transparent or otherwise invisible small images (typically single pixel) that are interleaved with various whitespace characters to achieve visual uniformity between user agent displays and to achieve a greater precision in spacing between text or text and a normally visible image. This usage complicates the representation of ranges in Fragment Identifiers and establishing ranges with boundaries within such a sequence. However, such a composite 'space' is visually a single unit to the reader so we beneficially treat it as such so long as it remains visually a single unit. An additional complication is that display and editing software may insert whitespace text nodes (that have no counterpart in the HTML source) into the DOM, or may insert whitespace in existing nodes, and they do this without any uniformity between software products. Thus we take advantage of the generally meaningless nature of an additional space here or there added into HTML source or that may be treated differently by different user agent software. For these and other reasons we have these rules:

1. If traversing an array of nodes and counting code units (characters or parts of characters) to establish an offset:
    a) any amount of contiguous whitespace, even if it spans across node boundaries, is counted as a single code unit,
    b) VnT nodes are ignored, and
    c) stopping a traversal within a character is forbidden, i.e., a range boundary should not be between code units of a character and, if it is improperly found to be so, then it is extended to include whole characters.
2. If traversing the derived array of nodes and counting VnT nodes to establish an offset, then Text nodes containing only code units that collapse to the empty string are ignored. In addition, if using an implementation that does not collapse all whitespace, then text nodes that are whitespace or that collapse to only whitespace are ignored.

The Canonical Form Transform is extended and applied 1208 to the derived node array text to arrive at the Canonical Form of the derived node array. In this extension every code unit in the textual Canonical Form is mapped to the position in the derived array from whence it or its corresponding code unit (e.g., an upper case version of a character) came. For ligature characters in the array there are multiple code units in the Canonical Form that map to that one ligature character in the array.

While not used in all embodiments, expansions of multi-character strings, like abbreviations and acronyms, from the node array to the Canonical Form, result in mappings from every character of the expanded string in the Canonical Form to the entire substring containing the abbreviation or acronym in the node array. This has a side effect of making it impossible for a Fragment Identifier to select only part of an expanded abbreviation or acronym. While semantically partial selection of an expanded form is not a problem, in that it could reasonably occur; it could be an issue for an unexpanded abbreviation that underlies the partial selection. A semantic equivalency is assumed between the unexpanded and expanded forms of these multi-character strings. It is difficult to tell exactly what part or parts of the abbreviation correspond to the partial selection, or what meanings they convey. In such a case the presumption of semantic equivalency could be erroneous.

In some embodiments this is dealt with by automatically determining that an unexpanded acronym or abbreviation is itself the semantic issue when it is partially selected. Otherwise, in these embodiments the user can adjust configuration to select non-expansion of acronyms and abbreviations in cases when he feels the selected acronyms or abbreviations should not be expanded. This is beneficial because the difference is determined in the mind of the user creating the Fragment Identifier, since it cannot be discerned based solely on the selection. Because this adds complexity to the use and understanding of products, other embodiments do not initially have such a feature. When users in general become more comfortable with tools built upon these embodiments, i.e., when there is a body of 'expert' users of such tools, then the introduction of such capabilities becomes feasible from a user perspective, and embodiments that do not provide such flexibility to the user will change accordingly. When the user chooses non-expansion of acronyms and abbreviations, his product will essentially behave like embodiments that do not provide such flexibility.

Abbreviations and especially acronym expansions are not unique even within a single language, so the application of such expansions requires contextual information. In these alternative embodiments, one or more namespaces are selected as context, with priority in case of conflict between namespaces. Each namespace is identified by a URI (as XML namespaces are identified today). However, unlike simple XML namespace names, the URI of these namespaces meaningfully identifies a resource having the expansions, which are downloadable using the URI; i.e., the expansions governed by a namespace are available across the Internet. Under some circumstances they are automatically downloaded. In these alternative embodiments, Fragment Identifiers identify the applicable namespaces. There will be, for example, a standard electrical engineering English namespace, in which the acronym 'Hz.' expands to 'Hertz' using that namespace' when generating the Canonical Form. The use of such a Fragment Identifier requires either a local copy of the namespace information, which will be cached by alternative embodiments that have encountered that namespace previously, or it will be freely downloaded to embodiments having access to the Internet.

Depending on the embodiment in use, a Canonical Form is created 1208. Then for each range 1210,1215 of the selection, execute a loop of actions as follows:

Find 1220 the highest index (farthest to the right) code unit in the Canonical Form that is before (is to the left of) all code units that either map into the range in the derived array or map after it. Use an imaginary code unit at the left end (beginning) of the Canonical Form for this purpose when there is no canonical code unit that precedes those that map into or map after the range. In the Canonical Form this code unit is called the left edge code unit; its index is its position in the Canonical Form, or −1 if it falls outside of the Canonical Form.

Find 1220 the lowest index (farthest to the left) code unit in the Canonical Form that follows (is to the right of) all code units that map into the range in the derived array or map before it. Use an imaginary code unit at the right end of the Canonical Form for this purpose when there is no canonical code unit that follows those that map into or map before the range. In the Canonical Form this code unit is called the right edge code unit; its index is its position in the Canonical Form, or −1 if it falls outside of the Canonical Form.

Figure 13:
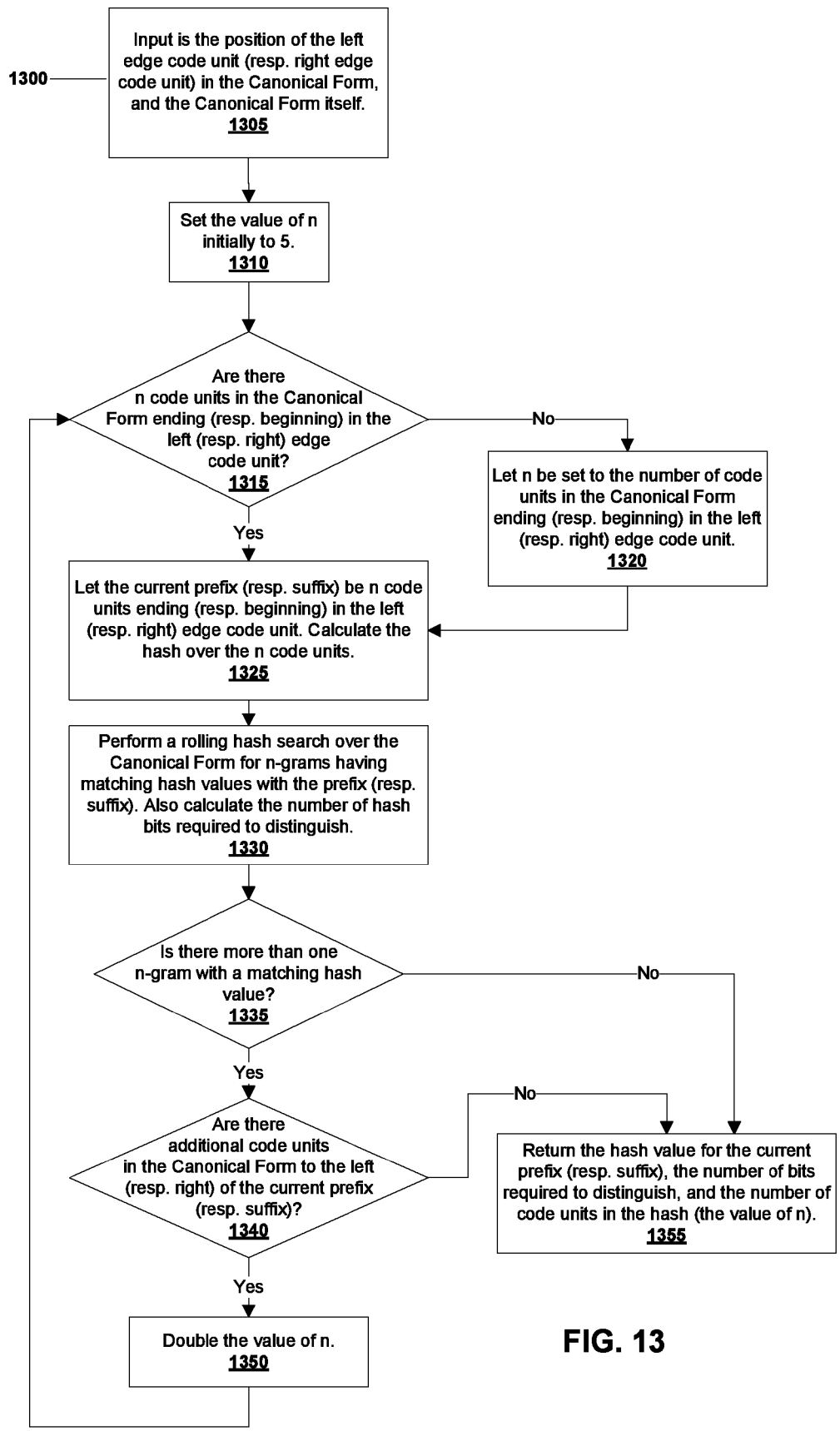
FIG. 13 illustrates calculation of unique prefix and suffix lengths, hash values, and required bits.

Find a unique Canonical Form prefix ending on the left edge code unit 1225 by applying the process 1300 of FIG. 13. Find a unique Canonical Form suffix beginning on the right edge code unit 1230 by applying the process 1300 of FIG. 13. Note that the uniqueness is achieved by successively lengthening the prefix or suffix candidates, and the hash value is not guaranteed to itself be unique if the edge of the Canonical Form is encountered prior to achieving uniqueness by lengthening the string. In fact, a canonical prefix or suffix can be as short as the empty string, in which case its hash value matches at every possible position. Nevertheless, if a prefix hash or suffix hash is not unique within a Canonical Form then its position in the (unaltered) Canonical Form is uniquely known—the prefix or suffix would have either been extended until its hash is unique, or until the edge of the Canonical Form. Such a prefix positioned at the first match for its hash, and such a suffix is positioned at the last match for its hash. In unaltered Canonical Forms, an empty prefix maps uniquely to a position prior to the derived node array and an empty suffix maps uniquely to a position after the node array.

Prefix or suffix uniqueness that is achieved by successively lengthening and either finding a string with a unique hash or finding the edge of the Canonical Form are only dependable at the edges for unaltered documents. In an altered document, a non-unique hash cannot be assumed to indicate a match at the edge of the Canonical Form. For example, a canonical prefix may be empty in a Fragment Identifier and the document could subsequently be altered by adding text before the earlier beginning of the document. While it is possible to know that the document has been altered, in this situation the position of the intended content within the document, just based on the prefix, is unknown. It is therefore necessary to compare possible match positions against target and suffix match positions in Canonical Forms to find the content.

For example, if the prefix and target are empty, then one knows that the suffix should preferentially be the first suffix hash match position in the Canonical Form. This same reasoning holds for a non-empty target and suffix pair, if the prefix is empty or short and matches in multiple locations.

In altered documents it is also useful to have some idea of whether a match is toward the front of the document or toward the end of the document. If a prefix fails to match anywhere in an altered document, and the target and suffix hash matches line up together in multiple locations, then some implementations resolve this ambiguity by having Boolean values that indicate whether to prefer such matches that are earlier or later in the document. Based on the above discussion, it is unnecessary to use such Boolean values unless the Canonical Form has been altered. To know whether or not it was altered, we include a hash of the entire Canonical Form in Fragment Identifiers.

The definition of Canonical Target is the text in the Canonical Form between the left edge code unit and the right edge code unit; the edge code units are not included. A hash is computed 1235 over the Canonical Target, then a rolling n-gram hash pass is done over the Canonical Form using the length of the Canonical Target (n), its hash value, and the Canonical Form as inputs to the rolling n-gram hash process 200 of FIG. 2. Since the Canonical Target is fixed in length based on the range, it may not be unique and no adjustments in length are made to achieve uniqueness. Nevertheless, a search pass is made over the full Canonical Form to determine the number of high order bits required to distinguish it from all like-length substrings of the Canonical Form that have different hash values.

Establish 1237 the number of bits required for content hashes (the value of HashWidth). First obtain the maximum of the required bits for the canonical prefix, suffix, and target; then add 6 and round the result up to the next multiple of 6. This use of a multiple of 6 aligns the representation, where 6 bits are expressed by each Fragment Identifier character.

Because it may be counterintuitive we note that a hash that matches in many places in a Canonical Form typically requires fewer bits to distinguish when determined in accordance with the process 200 of FIG. 2. In the extreme case of a zero length string, which matches everywhere, the number of bits required to distinguish its hash value is zero since it is not distinguishable from any other zero length string. A length of one code unit on average uses about the same number of bits to distinguish its hash as are used to count the code units appearing in the Canonical Form. Because of the high quality of the hash function including its fully randomized characteristic, the variance in the number of bits required is also low.

Figure 14:
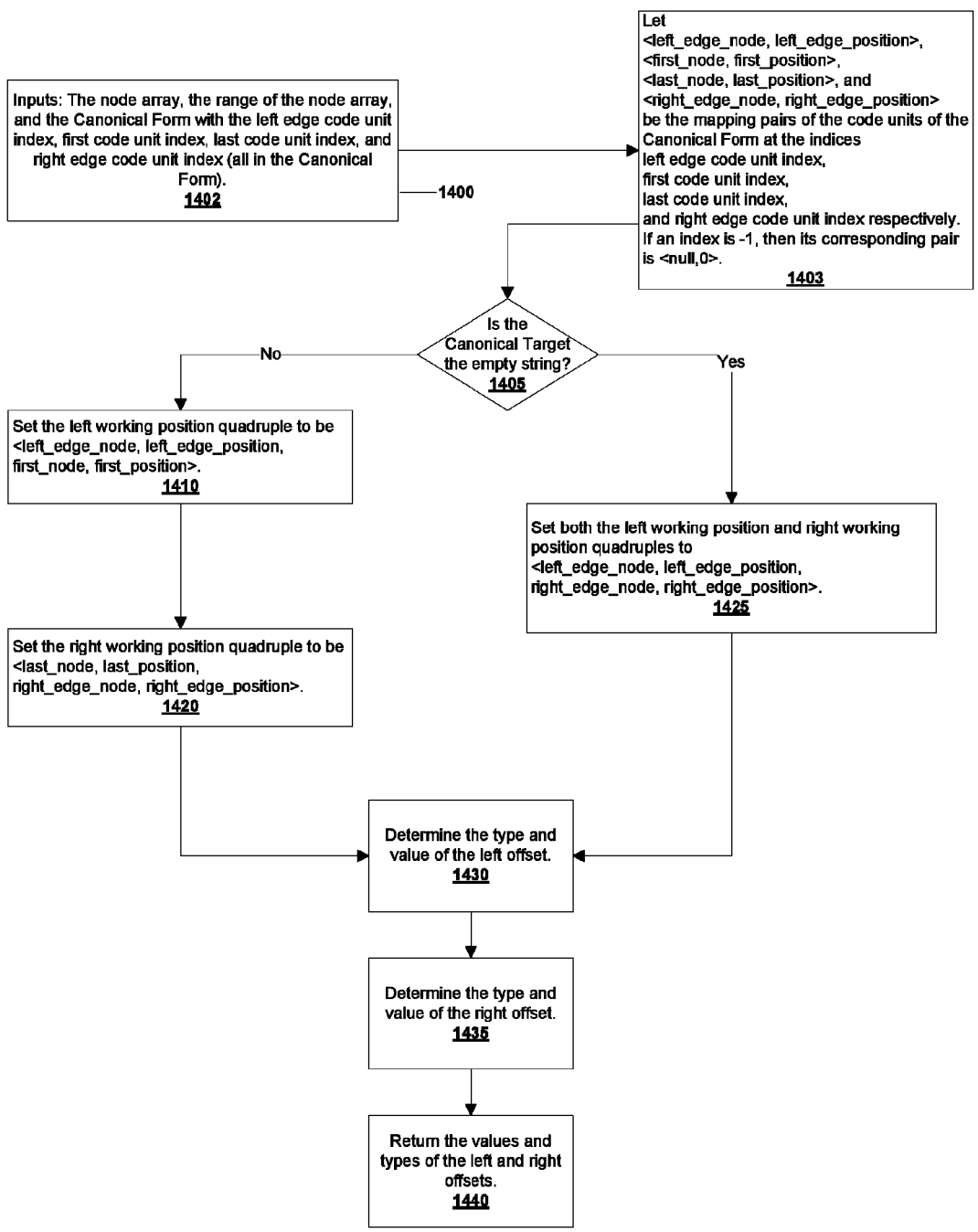
FIG. 14 illustrates determining the values and types of offsets for a range.

The two offsets and their types are determined 1240 in accordance with the process 1400 of FIG. 14, which requires as input the node array, the range in the node array, the left edge code unit index, the index of Canonical Target's first code unit (or −1 if the Canonical Target is the empty string), the index of the Canonical Target's last code unit (or −1 if the Canonical Target is the empty string), the right edge code unit index, and the Canonical Form. The left and right offsets with their respective types are returned.

The Canonical Target is nominally partitioned 1245 into equal sized segments; the last may be a remainder of smaller size than the rest. The number of segments is configurable, and the implementation can accept any number, but the default is 15 segments plus the remainder. The size of the segments is determined by dividing the nominal number of segments (by default 15) into the length of the Canonical Target in code units. The segment size is encoded into Fragment Identifiers so that any number of segments can be used. If the result is less than 1 code unit per segment, then segments of 1 code unit are used. If the Canonical Target is less than 4 code units in length, no partitioned representation is used; this is indicated by encoding the integer for the length of each segment as zero, and then dropping the integer encoding for the number of bits and the bit array from the encoding. The result is the partitioned Canonical Target. The hash is calculated for each segment of the partitioned Canonical Target. The high order (first) m bits from each hash are selected and are concatenated into a bit array, preserving the order of the segments in the range. In the implementation being discussed, the value m is set to 16. As with the number of segments this is configurable and the implementation (when interpreting a Fragment Identifier) accepts any value for m. The value of m is encoded into each Fragment Identifier.

This completes the processing for the current range (except for encoding the results into the Fragment Identifier). If there are one or more 1210 unprocessed ranges then the processing continues from the point of the check for unprocessed ranges, described above.

If there are no more unprocessed ranges, then 1250 the URI for the present document is examined for Fragment Identifiers of the user agent's embodiment. The check is thorough and involves a complete parsing of fragment identifiers before they are determined to be of the embodiment. Any Fragment Identifiers of the embodiment that are found are excised from the URI. This removal can result in separated pieces of the fragment identifier being re-concatenated. Every character pair '#Z' in the URI is found, and parsing begins from that point. Parsing can fail at any point where the form of a fragment identifier fails to parse according to the encoding used (which is implementation specific). The parsing of the part beginning with '#Z' is performed according to the encoding of the Fragment Identifier. While any encoding may be used, the parsing should be in accordance with that encoding to ensure that only valid Fragment Identifiers of the particular implementation (of an embodiment) are removed. Then every Conventional Fragment Identifier, if any, that positively identifies a specific target anchor in the document is removed. The result after any such removals is the URI prefix, to which we will later append the newly created Fragment Identifier. The hash of the URI prefix is calculated. A time stamp for the current time (time of Fragment Identifier creation) is created in the form of an integer that contains the number of Coordinated Universal Time seconds since Jan. 1, 1601.

When preparing a URI prefix for a Fragment Identifier, removing an old Conventional Fragment Identifier may not be safe since its full purpose may not be known. For example, removing a Conventional Fragment Identifier may cause the content itself to change and the intended text identified by a Fragment Identifier might not even be present in the resulting content. Such a determination can be achieved by experiment, i.e., by removing Conventional Fragment Identifiers and seeing what happens when the resulting URI is activated. In another embodiment, such an experiment is performed in an automated way to determine which fragment identifier are true fragment identifier according to RFC 3986 and can be safely removed, and which are in contrast used in effect to identify the resource itself. The experiment is performed after first removing any Fragment Identifiers of the embodiment, then removing additional Conventional Fragment Identifiers one at a time, activating the URI, and comparing the resulting content. If the resulting content changes then the removed Conventional Fragment Identifier is returned. This is repeated until the experiment has been performed for all of the Conventional Fragment Identifiers. The resulting URI is, in this alternative embodiment, the URI prefix.

In another embodiment, Conventional Fragment Identifiers (i.e., that are not of an embodiment) are not removed at all prior to isolating the URI prefix. It is possible for a Conventional Fragment Identifier to identify an anchor of the document, and in this way conform to RFC 3986, but even if it is used as the RFC intended there is nothing that prevents the same Conventional Fragment Identifier from also being used by content scripts to determine what page content to display. While this is unlikely it remains possible and it is, at least in principle, only an assumption that a Conventional Fragment Identifier will not be used in this manner. Therefore, in an alternative embodiment, only Fragment Identifiers of the embodiment are removed and the others remain.

Finally 1255 the Fragment Identifier is created. The Fragment Identifier in this example implementation of an embodiment begins '#Z'. The 'Z' character is for compatibility with unrelated software that may be configured to use these Fragment Identifiers in isolation, where it is simpler if the identifiers are guaranteed to begin with an alphabetical character. Thus, in the implementation-specific choice made in the examples of this description, Fragment Identifiers begin with a 'Z', immediately after the standard URI delimiter '#'. Then, using an implementation specific encoding, the information is encoded into the Fragment Identifier. In the some embodiments, this is a dense encoding that does not involve URI escaped characters. For example, integers could use a variable length sign-magnitude encoding that grows in size as necessary to represent integers of larger magnitude. This creates a dense representation that does not waste space for small integers. An example implementation has a Base64 encoding using the standard English alphabet (52 upper and lower case characters), the digits (0-9), the underbar ('_'), and dash ('-'), which uses the same character set and encoding order presented in RFC 4648, "The Base 16, Base 32, and Base 64 Data Encodings", for URL-safe encodings. This character set beneficially avoids requirements to escape these characters in any standard URI context, which in turn beneficially avoids lengthening the Fragment Identifiers before transmission.

In an example implementation of an embodiment, a structure is populated with the values of the elements to be encoded, and from that instance of a structure a standard ASN.1 encoding is created as specified in ITU-T Rec. X.680-X.683, using canonical unaligned PER (Packed Encoding Rules) as specified in ITU-T Rec. X.691. The unaligned aspect achieves the highest compaction, and the canonical version achieves precisely the same encoding for the same data under all circumstances. As will be appreciated by those skilled in the art, by its nature and in accordance with the purposes for which the ASN-1 and PER standards were created many years ago, such an encoding is dense. Density is a relative term that could be quantified in a continuum, and other implementations and embodiments may have more or less density than that provided by ASN-1 PER encodings, with varying effects. Density achieves shorter Fragment Identifiers, and encodings that are more or less dense only affect the "shorter identifier" benefit of an embodiment. Moreover, those skilled in the art will appreciate that reasonably dense encodings may be achieved in a multitude of ways and that small proportional differences in Fragment Identifier length are typically of little consequence. While it is possible for those skilled in the art to hand-optimize such an encoding based on the exact structure and information to be encoded, and thereby achieve an even more compact encoding, the advantages of a standards based encoding include ease of implementation.

In this example, the resulting ASN.1 canonical PER encoding is then further encoded into the chosen base-64 encoding. This can be efficiently done using a lookup table that converts each 6-bits of the ASN-1 encoding into a character of the base-64 character set. Again there are a large number of choices made by an implementation; even with restricting the choice for embodiments to the base-64 character set described above, every possible order of those characters in the lookup table represents an implementation detail that maps ASN-1 encodings to different character strings, and if it were done differently across a distributed system the encodings would be inconsistent and incompatible. This example implementation uses a modified version of the Base64 character encoding of RFC 4648, section "5. Base64 Encoding with URL and File Name Safe Alphabet." That standard encoding is modified in some embodiments by omitting the equals (=) character padding at the end, which modification generally shortens the encoding.

The following information is encoded:
1. The two character string '#Z'
2. An integer version number identifying this particular Fragment Identifier version. In a concrete implementation of an embodiment, this number in effect identifies the encoding used. This specification describes two such versions. However, this element supports any number of versions since an arbitrary integer is encoded to identify the version.
3. An integer representing the number of Coordinated Universal Time (UTC) seconds since Jan. 1, 1601, when this Fragment Identifier was created.
4. A bit array of the high order bits of the hash of the URI prefix. This array uses 30 bits in this example implementation.
5. An integer representing the length in code units of the specially created Alternative Canonical Form (as described previously) used for calculating the Common DOM Form hash for the whole document.
6. A bit array of the high order bits of the hash of the Common DOM Form of the document from which this Fragment Identifier was made. The number of bits for this hash is 42 in this example implementation.
7. A Boolean that indicates whether the document is MagLink Friendly. In some embodiments, this is determined by examining the document's header META tags. However, this Boolean would usefully be set in any embodiment in circumstances where document scripts are known to permit multiple fragment identifiers, and behave identically when the scripts do not have processing rules specific to one or more of them. I.e., if scripts do not 'understand' a fragment identifier of some kind, they ignore it.
8. An integer representing the number of ranges in the Fragment Identifier.

9. A sequence of range encodings, which consist of:

a) A Boolean that indicates whether this range was created by a search engine for search results. This is set to true only by search engines serving out search results with Fragment Hyperlinks.

b) An "images as text nodes" Boolean, which indicates that at least one image with non-trivial alternative text ('alt' attribute in HTML) contributed to the string content.

c) A Boolean indicating whether the canonical prefix was closer to the front of the Canonical Form or its rear.

d) A Boolean indicating whether the canonical suffix was closer to the front of the Canonical Form or its rear.

e) A Boolean indicating whether the Canonical Target was closer to the front of the Canonical Form or its rear.

f) A Boolean indicating whether the left offset is in VnT nodes or in code units.

g) A Boolean indicating whether the right offset is in VnT nodes or in code units.

h) An integer 'HashWidth', which indicates how many bits of the hash values for the canonical prefix, suffix, and target are represented in the encoding.

i) An integer that indicates the length of the canonical prefix in code units.

j) An integer that indicates the length of the canonical suffix in code units.

k) An integer that indicates the length of the Canonical Target in code units.

l) An integer that has the left offset value.

m) An integer that has the right offset value.

n) A bit array of the high order bits of the canonical prefix hash. The number of bits is HashWidth.

o) A bit array of the high order bits of the canonical suffix hash. The number of bits is HashWidth.

p) A bit array of the high order bits of the Canonical Target hash. The number of bits is HashWidth.

q) An integer indicating the length of a segment in the partitioned Canonical Target.

r) An integer PartitionedHashWidth indicating the width, in bits, of the hash values for each segment in the partitioned Canonical Target. By default this value is 12 in this example implementation.

s) A bit array of the high order bits of the hashes of the segments of the partitioned Canonical Target, in sequence. The number of bits for each segment is PartitionedHashWidth. The number of segments is the length of a segment divided into the length of the Canonical Target, rounded up.

10. A bit array of the high order bits of the hash of the Fragment Identifier's encoding. The hash is computed beginning with the 'Z', not the '#'. Encodings of elements 1 through 9 above are hashed; i.e., this element itself is not included in the hash. The number of bits included in this hash in some embodiments is 30 and is fixed. Thus, this element is not part of the ASN.1 encoding, but is the hash of the ASN.1 encoding, and is directly converted to 5 characters, each representing 6-bit pieces of the hash, using the same Base64 encoding.

The new Fragment Identifier is returned 1260.

FIG. 13 illustrates the process 1300 of calculating the prefix and suffix of a range, how uniqueness is established for a prefix and suffix, and the determination of the number of bits to be used in the prefix and suffix hashes. The input 1305 consists of the position of the left edge code unit (resp. right edge code unit) in the Canonical Form, along with the Canonical Form. These code units identify the last code unit excluded prior to the range (first code unit excluded following the range). By default in some embodiments we set 1310 the initial value of n to 5, which represents the number of code units in an n-gram.

Enter a loop that tests 1315 if there are n code units possible in the n-gram. For a prefix, see if there are n code units prior to the Canonical Target, including the left edge code unit. For a suffix see if there are n code units to the right in the Canonical Form beginning with the right edge code unit. If n is too large, then make n 1320 equal to the maximum possible. Calculate the hash of the prefix or suffix 1325 over the n code units adjacent to the Canonical Target. Then, using the prefix or suffix hash as the <DistHash> input to the process 200 of FIG. 2, calculate a rolling n-gram hash across the entire Canonical Form, searching for matches 1330. Concurrently calculate the number of hash bits required to distinguish the input hash from other n-gram hashes according to the process 200 of FIG. 2.

If the search process 200 indicates that there was only one hash match 1335, or if there are no additional code units 1340 that may be added to the prefix (resp. suffix), then the hash value of the prefix (resp. suffix) is returned 1355 with its length (n) and the number of bits required to distinguish it from other n-grams in the Canonical Form. Otherwise, double the value of n 1350 and loop back to test 1315 if there are n code units possible in the n-gram.

There are many ways to find a unique prefix and unique suffix. Asymptotically efficient (i.e., highly efficient in the worst case on large data sets) techniques are known in the art for the k-mismatch problem that are based on the widely studied uses of generalized suffix trees. Nevertheless, while highly efficient asymptotically in the worst case, they are not as efficient on average as the process 1300 of FIG. 13. In alternative embodiments, generalized suffix tree techniques are used to find the minimum length of prefix or suffix to achieve uniqueness, and then the n-gram hash is run as illustrated in FIG. 13 to find the number of bits required. This is, on average, less efficient than the process 1300 of FIG. 13, which is considerably faster most of the time on real data. Other alternative embodiments use this process 1300 first, for a few iterations, and then switch over to a generalized suffix tree method if a unique prefix or suffix has not yet been found.

By way of reminder, all code units in the Canonical Form directly map to the positions of code units in node array Text nodes or sometimes Alt nodes. Adjacent Canonical Form code units might map to adjacent characters in a node array Text node. However, even though adjacent Canonical Form code units might map to the same node, their corresponding characters can be separated by whitespace or punctuation that is not included in the Canonical Form. Adjacent Canonical Form code units can map to different nodes in the node array and these can be separated by intervening nodes (see FIG. 53), possibly with considerable content. The node array might begin with non-text nodes or text nodes with only punctuation or whitespace, prior to the character mapped to by the Canonical Form's first code unit. An analogous situation can happen after the last Canonical Form code unit.

As described earlier, the process of converting the range in a document DOM instance to a range in a corresponding Common DOM Form involves creation of a version 1 Fragment Identifier; part of creating this requires finding the ends of the range in the node array relative to characters that are mapped to by Canonical Form code units, as described in discussions of offset tables 580, 687/688, 780, 880 and 980 of FIGS. 5, 6, 7, 8 and 9, respectively. An end of the range might directly map to a code unit in the Canonical Form, in which case no additional work is required to locate the corresponding position in the node array (see FIG. 5). The beginning and end of the range can fall between a pair of adjacent Canonical Form code units, in which case the Canonical Target will be null (see FIGS. 7 and 8). One or both ends of the range can fall prior to the first or after the last node array characters mapped to by the Canonical Form (see FIG. 9). There are several scenarios, but one "worst case" occurs when the entire document only contains images, and the user selected one of the images. In this case the Canonical Form, canonical prefix, canonical suffix and Canonical Target are all empty.

Figure 15:
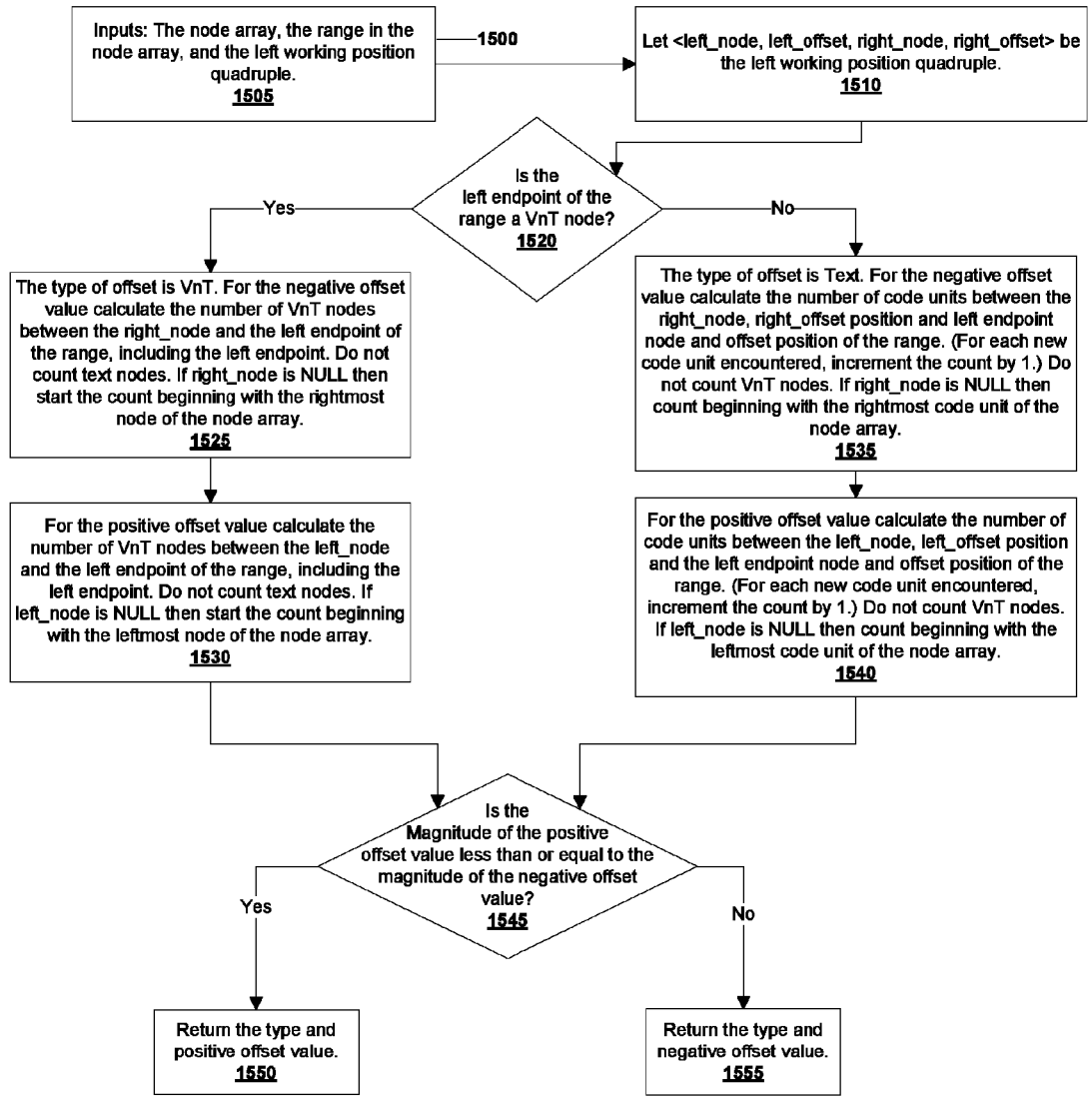
FIG. 15 illustrates determining the type and value of the left offset.
Figure 16:
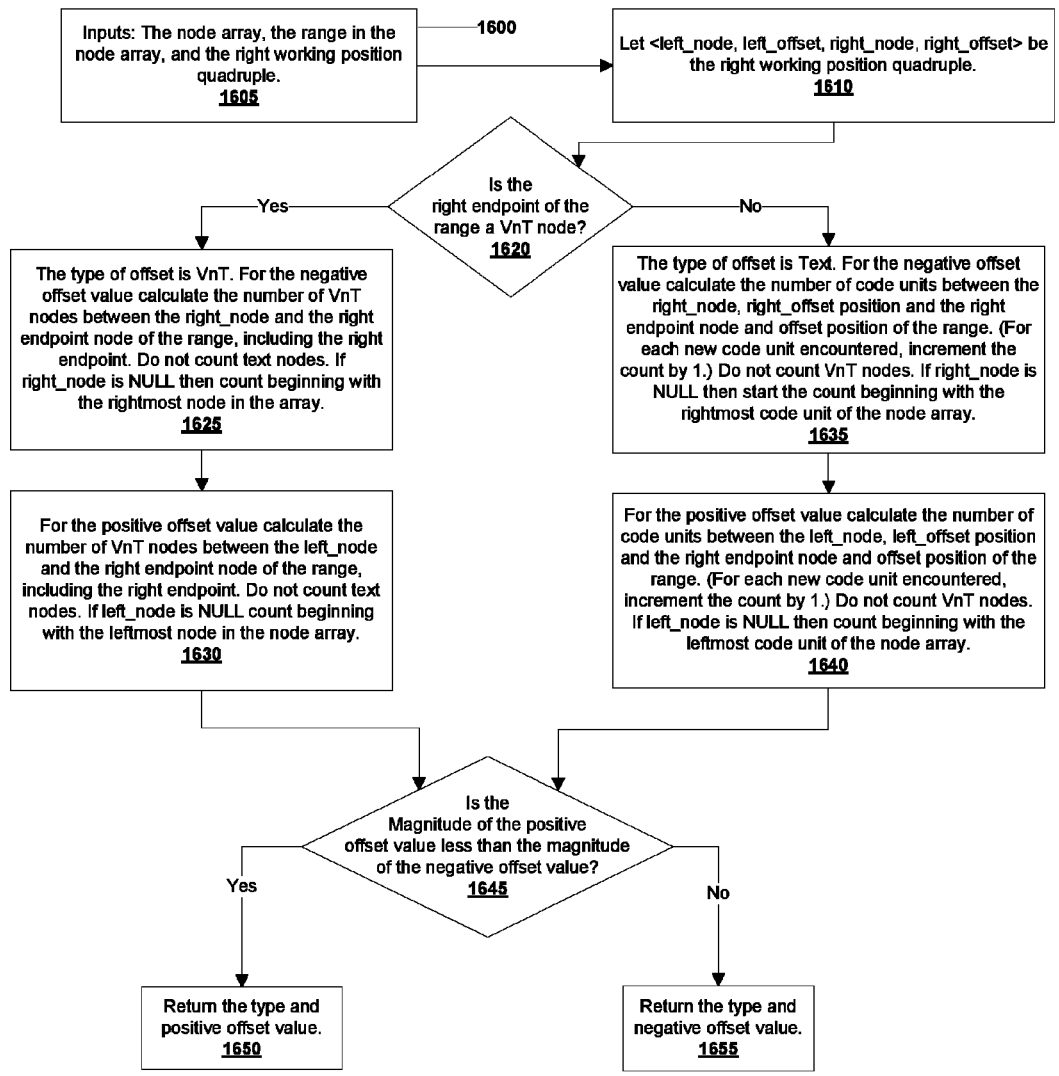
FIG. 16 illustrates determining the type and value of the right offset.

FIGS. 14, 15 and 16 describe processes that work together to determine the values and types of offsets for the ends of a range in the node array relative to code units mapped to by Canonical Form code units. These figures refer to "working position quadruples". Each working position quadruple contains two <node, position> pairs that are mapped to by adjacent Canonical Form code units; the two <node, position> pairs in each working position quadruple brackets (provides inclusive bounds in the form of objects for) one end of the range.

FIG. 14 illustrates a process 1400 that determines the type and value of offsets in the node array for a range, relative to code units mapped by Canonical Form code units. Its inputs 1402 are the node array, the range of the node array, the Canonical Form with the left edge code unit index, first code unit index, last code unit index and right edge code unit index in the Canonical Form. Note that the first and last code units' indices, in conjunction with the Canonical Form, define the Canonical Target.

Define pairs that map each of the Canonical Form code unit indices 1403 into the node array, where each pair consists of a node and a position within that node as appropriate. If an index is −1, then the corresponding pair is <null, 0>. The mappings are:
 Map the left edge code unit index to <left_edge_node, left_edge_position>
 Map the first code unit index to <first_node, first_position>
 Map the last code unit index to <last_node, last_position>
 Map the right edge code unit index to <right_edge_node, right_edge_position>

This procedure uses a left working position quadruple and a right working position quadruple to determine the offsets of the left and right ends of the range, respectively. The pairs in the left working position quadruple usually consist of the code unit positions mapped by of the last code unit of the canonical prefix (the last code unit that is excluded prior to the range), and the first code unit of the Canonical Target. Pairs in the right working position quadruple usually consist of the code unit positions in the node array mapped to by the last code unit of the Canonical Target and the first code unit of the canonical suffix (the first code unit excluded following the range).

If there is an empty prefix or suffix, the left_edge_code_unit_index or the right_edge_code_unit_index, respectively, will be −1 upon entry. In this case, the "null" node value and position 0 is used to indicate imaginary nodes and code units outside of the ends of the node array. Imaginary text nodes (i.e., a node in the node array that has no counterpart in the DOM) are used before the beginning of and after the end of the node array so that there are endpoints for the prefix and suffix that do not imply exclusion of any object from the range that is also in the DOM. The imaginary node and code unit on the left is "mapped" by an empty canonical prefix, and the imaginary node and code unit on the right is "mapped" by an empty canonical suffix.

The contents of left and right working position quadruples will be set somewhat differently when the Canonical Target is empty. Both working position quadruples will have identical content: the first <node, position> pair of each is mapped from the last code unit of the canonical prefix, and the second <node, position> pair is mapped from the first code unit of the canonical suffix.

Once the node array positions corresponding to the ends of the canonical prefix, canonical suffix and Canonical Target are mapped, offset types and offset values are computed.

If the Canonical Target is the empty string 1405, then set both the right and left working position quadruples 1425 to the same values: <left_edge_node, left_edge_position, right_edge_node, right_edge_position>.

If the Canonical Target is not the empty string 1405, set the left working position quadruple 1410 to <left_edge_node, left_edge_position, first_node, first_position>. Next set the right working position quadruple 1420 to <last_node, last_position, right_edge_node, right_edge_position>.

The node array, the range in the node array and the working position quadruples are used to calculate the offsets to the ends of the range in the node array and the type of each. First determine the type and value of the left offset 1430, as is shown in process 1500 of FIG. 15. Then determine the type and value of the right offset 1435, which is shown in process 1600 of FIG. 16. Return the types and values of the left and right offsets 1440.

Procedures presented in FIGS. 15 and 16 each determine an offset type and value for an endpoint of the range. FIG. 15 determines the type and offset of the first object, or left endpoint, of the range; FIG. 16 determines an offset type and value for the last object, or right endpoint. In some embodiments, each endpoint is found relative to the closest of two positions that effectively bracket it (i.e., inclusively bound it), the two <node, position> pairs of a working position quadruple. An end of the range can be specified relative to either position. If the end of the range is calculated relative to the object to its left, the offset from the end of the range to the end of the object is positive; if the end of the range is calculated relative to the object to its right, the offset is negative.

A situation can arise where one of the two bracketing objects coincides with the end of the range. In this case the offset from the bracketing object to the endpoint is zero. In order to indicate whether the left or right bracketing object was used, +0 is used to represent the first or leftmost object and −0 is used to indicate the second, or rightmost, object.

Occasionally the range is empty. This situation was first considered during the discussion of 1208 in FIG. 12, in the section about how ranges in the DOM are translated into ranges in the derived node array. In this case the left and right edges of the range cross over each other, so that the left edge of the range is to the right of the right edge or the range. This cross-over indicates that the range became a position between two specific objects (i.e., the range is a position between two adjacent objects that does not contain either of the objects).

FIG. 15 illustrates the process 1500 of determining the type and value of a left offset. Inputs 1505 to this process include the node array, the range in the node array and the left working position quadruple, as defined in process 1400. Assign the names 1510 left_node, left_offset, right_node and right_offset to the members of the left working position quadruple, in that order.

The first step is to determine 1520 whether the left range endpoint is a VnT node. If it is a VnT node, then the type of the offset is VnT 1525. For the negative offset value calculate the number of VnT nodes between the right_node and the left endpoint of the range, including the left endpoint. Do not count text nodes. If right_node is NULL then begin counting with the rightmost node of the node array.

Next establish the positive offset value 1530. Calculate the number of VnT nodes between the left_node and the left endpoint of the range, including the left endpoint. Do not count text nodes. If left_node is NULL then begin counting with the leftmost node of the node array.

If the left range endpoint is not a VnT node 1520, then the type of the offset is Text 1535. To determine the negative offset value, calculate the number of code units between the right_node, right_offset position and the range's left endpoint node and offset position. For each new code unit encountered, increment the count by 1. When the text includes contiguous whitespace, only count the first encountered whitespace code unit of the contiguous whitespace, as discussed for FIG. 12, item 1208 above, in the rule that addresses traversing an array of nodes and counting code units. Do not count VnT nodes. If right_node is NULL then begin counting with the rightmost code unit of the node array.

Next establish the positive offset value 1540. Calculate the number of code units between the left_node, left_offset position and the range's left endpoint node and offset position. For each new code unit encountered, increment the count by 1. When the text includes contiguous whitespace, only count the first whitespace code unit, as discussed above. Do not count VnT nodes. If left_node is NULL then count beginning with the leftmost code unit of the node array.

Determine whether to return the positive or negative offset 1545. Compare the magnitudes of the positive and the negative offset values. If the magnitude of the positive offset value less than or equal to that of the negative offset value, return the positive offset value 1550 together with its type. Otherwise return the negative offset value 1555 and its type.

FIG. 16 illustrates the process 1600 of determining the type and value of a right offset. Inputs 1605 to this process include the node array, the range in the node array and the right working position quadruple, as defined in process 1400. Assign the names 1610 left_node, left_offset, right_node and right_offset to the members of the right working position quadruple, in that order.

First determine 1620 whether the right range endpoint is a VnT node. If it is, then the type of the offset is VnT 1625. For the negative offset value calculate the number of VnT nodes between the right_node and the right endpoint of the range, including the right endpoint in the count. Do not count text nodes. If right_node is NULL then begin counting with the rightmost node in the array.

Next establish the positive offset value 1630. Calculate the number of VnT nodes between the left_node and the right endpoint of the range, including the right endpoint. Do not count text nodes. If left_node is NULL start the count beginning with the leftmost node in the node array.

If the right range endpoint is not a VnT node 1620, then the type of the offset is Text 1635. To determine the negative offset value, calculate the number of code units between the right_node, right_offset position and the range's right endpoint node and offset position. For each new code unit encountered, increment the count by 1. When the text includes contiguous whitespace, only count the first encountered whitespace code unit of the contiguous whitespace, as discussed for FIG. 12, item 1208 above, in the rule that addresses traversing an array of nodes and counting code units. Do not count VnT nodes. If right_node is NULL then start the count beginning with the rightmost code unit of the node array.

Next establish the positive offset value 1640. Calculate the number of code units between the left_node, left_offset position and the range's right endpoint node and offset position. For each new code unit encountered, increment the count by 1. When the text includes contiguous whitespace, only count the first whitespace code unit, as discussed above. Do not count VnT nodes. If left_node is NULL then begin counting with the leftmost code unit of the node array.

Determine whether to return the positive or negative offset 1645. Compare the magnitudes of the positive and the negative offset values. If the magnitude of the positive offset value is less than or equal to that of the negative offset value, return the positive offset value 1650 together with its type. Otherwise return the negative offset value 1655 and its type.

This completes the detailed description of creating version 1 Fragment Identifiers. In some cases it is useful to create a Fragment Identifier when only part of a document is available. In some such cases only the target string is available and no other information is known about the document; Fragment Identifiers created according to some embodiments, when the full document is not available (e.g., only a target string is available) are called version 2 Fragment Identifiers. Herein we call URIs and hyperlinks having version 1 Fragment Identifiers version 1 URIs and version 1 hyperlinks, and similarly for version 2 Fragment Identifiers, URIs and hyperlinks. Since both version 1 and version 2 Fragment Identifiers are utilized in some embodiments, the class of Fragment URIs comprises the classes of version 1 and version 2 Fragment URIs. Similarly, the class of Fragment Hyperlinks comprises the classes of version 1 and version 2 hyperlinks.

Another aspect of some embodiments provides for the utilization of both version 1 and version 2 Fragment Identifiers to enhance the usability of search engine results, including those of Internet based search engines. Multiple existing search engines present snippets from selected documents as part of the search results. Snippets typically appear immediately below related hyperlinks and give the user additional human readable information about the relevance of a particular search result. Snippets are often taken from what appears to the search engine to be the most relevant part of the document, given the search criteria. According to this aspect of those embodiments, a snippet or some larger relevant range of the document associated with it becomes the target of a Fragment Identifier range in that document. Either a version 2 or a version 1 Fragment Identifier is created that embodies that fragment range, and the Fragment Identifier is incorporated into a hyperlink that takes the user to the snippet or some content related to the snippet in the target document.

In some embodiments, the user may configure various aspects of the creation and display of snippet-associated hyperlinks. If so configured, the text of the snippets in the search results also become the anchor text (a hyperlink's visible, clickable text, also called a link label) of hyperlinks having Fragment URIs created from the associated Fragment Identifiers. When the user activates such a hyperlink he is not only taken to the document, but also to the content related to the snippet-hyperlink that he activated (e.g., clicked on).

If so configured, the anchor text of these hyperlinks includes distinct new elements added to the search results display. These are placed so that the user will visually associate each with its corresponding snippet. For example, the single word "MagLink" can be the anchor text of the hyperlink associated with a snippet, and this text can follow the display of each snippet. Similarly, a hyperlink anchor image could precede or follow each snippet in the display; the image could comprise a logo or a trademark.

When the user selects one of these hyperlinks, a browser or other user agent typically opens the URI of the hyperlink and, acting according to the particular embodiment and the user configuration, will use the Fragment Identifier created according to that embodiment to take the user directly to the target document range associated with the snippet.

In some embodiments the user can configure his browser or the user agent he uses to either select the target content using the browser's selection mechanism or highlight it. A benefit is the user's time saved finding the content of interest, as well as the time saved not looking for content that may no longer be present. According to the embodiment being used, the user agent performs those determinations and scrolling actions for the user automatically. This is even more beneficial on small screen displays that typically have no keyboard and at best a slow touchpad keyboard that takes over the display, since all of this occurs with the user only making a selection and without requiring keyboard input.

By activating a snippet associated hyperlink, the user provides additional information about what he is seeking at that moment to the embodiment being used. This additional information is used, in some embodiments, to modify the display of the target document by showing the user that specific snippet in the document. Under some circumstances, including failure to find the snippet in the document, it is also used in further searches on behalf of the user. At that point, the snippet content becomes a focused search criterion.

When search results are first generated (i.e., without regard to length), a search engine may initially produce ranges that are too long to display in snippets. While such search engine generated ranges are shortened into snippets that can be displayed, a longer range may be advantageously associated with the snippet through a Fragment Hyperlink. This can be achieved when the embodiment comprises the search engine. While the snippet or snippets are shortened in order to provide for space-efficient visual display, the associated range of the document represented in a Fragment Identifier may include additional text or images. In particular, snippets in search engine results may only be phrases, but the user may configure some embodiments to not artificially shorten the search-identified relevant content purely on the basis of length, as is done to arrive at search result snippets. He can also choose to not artificially shorten content below the granularity of full sentences; if this is configured and the snippet is found in a part of the document containing sentences, then full sentences surrounding the snippets are placed in the range associated with the snippet. A search engine receiving a search request with such preferences will provide hyperlinks to content that is generally larger than the associated snippets.

The notion of "rich snippets" gives another example where the range can usefully be longer than any particular snippet. 'Rich snippets' are document text identified by hidden meta-data and taken from a document's body and displayed in the search results, below its main URI on the search results page. Google presents rich snippets according to their own templates for such display; the order used to display individual snippets is not necessarily the same as the order of the information in the document, and information appearing between the rich snippets chosen for display by the search engine may not appear in the search results. For example, this may be done for products where the product information determined to be most relevant by the search engine is presented in a sequence of short data points (rich snippets), each having an explanatory Google-provided prefix. These prefixes are generated from the schema markup, and not from user visible content. However, the data itself generally comes from a block of visible information found in the target document, all of which is advantageously in the range of one Fragment Identifier created for the set of associated rich snippets and applicable to a single search engine result hyperlink. In an alternative embodiment, if the user has opted for aggregation of snippet ranges for a single target document, then a search engine creates a range of a Fragment Identifier from a rich snippet collection for the single target document, and in so doing it encompasses the full range of the presented rich snippets from the document in the Fragment Identifier range. In other words, from an associated set of attributes that contribute to a set of rich snippets, the rich snippet that appears first in the source document and the rich snippet that appears last in the document are placed within the range along with everything between them including the other associated rich snippets. In addition, any sentence fragments are expanded at the edges to encompass complete sentences, which results in the final range.

Two forms of Fragment Identifiers were mentioned earlier, version 1 and version 2. For search results version 1 Fragment Identifiers can be created by a search engine; version 2 Fragment Identifiers can be generated for search results by either a user agent or a search engine. The range of a Fragment Identifier created for a set of associated rich snippets is preferably incorporated into a version 1 Fragment Identifier and Fragment URI, from which a Normal-Mode Fragment Hyperlink is constructed. If the search engine is so configured, the range can be incorporated into a version 2 Fragment Identifier. (This differs from the behavior for non-rich snippets, where each snippet is made into its own range and, if aggregation is selected by the user, then a single Fragment Identifier comprises all of the resulting ranges.) The constructed hyperlink is embedded in the search results page in association with each of the rich snippets. If the user has configured his user agent so snippets become the anchor text of their Fragment Hyperlinks (i.e., the snippet's text is the hyperlink anchor text), then each snippet of the rich snippet set becomes the anchor text for its own hyperlink, but each has the same Fragment URI for its href attribute. Otherwise, a hyperlink having the Fragment URI appears adjacent to each rich snippet.

If the user has configured for un-aggregated snippets, then each snippet has a (preferably version 1) Fragment Identifier having a single range created for it. Individual rich snippets may be very short, and it is disadvantageous for version 2 Fragment Identifiers to be created for short un-aggregated snippets. Nevertheless, if the search engine is so configured, then version 2 Fragment Identifiers are created. For snippets that are fragments of sentences, the range is expanded to include full sentences, depending on user configuration. Then the resulting Fragment URI is used to build a Fragment Hyperlink for each snippet and it is displayed as determined by the user's preferences.

In another embodiment, the individual snippets are each associated with a Fragment Hyperlink that can be activated for just that snippet. In addition, a Fragment Hyperlink for all of the snippets together (for that particular document) is created and placed adjacent to the simple hyperlink for the document.

Users sometimes have multiple online personalities or identities that are often called "roles". For example, a user might want a role for his business activities that is distinct from his role as a coach for a children's soccer team. In some cases the issue is security, and the user may have different machines for different roles and different levels of security. In some embodiments, the URI Service and each machine used by a user maintains a separate document navigation history for each of the user's roles. User machines keep this history provided the user has instructed the URI Service that the particular machine should retain the information for a particular role.

This history for a user's role comprises a graph of nodes which are a set of "Content Records", and edges which are "Activation Records". The nodes, i.e., the Content Records, come in three types: "Simple Content Records", "Fragment Content Records", and "Search Content Records".

Content Records of all types have a URI, a 128 bit (probabilistically unique) identifier that is a hash of the URI string (including any Fragment Identifiers), a time stamp for when the record was first created, a document supplied title, and a document supplied description. For a version 1 Fragment URI the time stamp is also the time stamp for when the URI was created. Title and description strings are possibly empty; i.e., a document may not have supplied a title or description. For HTML documents, the document title is found as described in the HTML specifications and the description is taken, if it exists, from the 'META' tag description value from the head of the HTML document.

A Fragment Content Record may contain a Surrogate URI string, if such a Surrogate URI exists for the Fragment URI. In some embodiments all version 1 Fragment URIs are mapped by Surrogate URIs and every Surrogate URI maps a version 1 Fragment URI. A Fragment Content Record also has an identifier for the role of a user who created the Fragment URI; however, as shall be described in more detail below, while this information is known to the URI Service and the user agent where the URI was created, it may not be synchronized to any particular user agent.

Fragment Content Records additionally have an ordered set of representative strings that indicate the content identified by the record's Fragment URI to a user. The strings of this ordered set are called snippets when they are displayed to a user. While this set of strings often contains just one string, there may be a multiplicity of them, up to a configured maximum. When the URI of the Content Record is first opened, the user agent calculates this ordered set of strings according to one of the processes 5100,5101 of FIG. 51. The two starting points of FIG. 51 differ on the basis of whether ranges of a DOM are the starting input (which are first converted to strings), or strings are the starting input (which may have come from search snippets directly). These strings are sized for display to the user when perusing navigation history or bookmarks. The maximum number of snippets displayed for a document is configurable and by default the maximum in some embodiments is 5. There is a Boolean associated with the strings in the Content Record that indicates whether the strings were generated from ranges located in the DOM. This Boolean is synchronized in conjunction with the strings between user agents and the URI Service.

In addition to the common properties for all Content Records, a Search Content Record has a Boolean that indicates if the search query was initiated by a URI recovery operation, which is a process of automatically discovering linkrot and providing the user with relevant search results for the content that is missing. URIs that have some form of linkrot are recovered in part by searching for the original content, so a search launched automatically for such content is identified as such by this Boolean. Search Content Records also have an associated string, which is the search criterion string.

Note that version 1 Fragment URIs and their associated Surrogate URIs have matching Common DOM Forms stored at the URI Service. Content Records for version 1 Fragment URIs at the URI Service are preferentially the same as the records containing version 1 Fragment URI data stored at the URI Service. These are beneficially stored only once, and independently of any particular user or user's role. For other types of URIs (i.e., conventional URIs and version 2 Fragment URIs), the URI Service keeps separate Content Records for each of a user's roles. The user's role identifier, which identifies the creator of a Fragment URI, is only sent to machines that synchronize navigation history for that user's role; otherwise the value of zero is sent in place of the identifier, which indicates that the creator of that URI does not synchronize navigation history with the recipient machine. This restriction is a privacy issue in that a user may want to create and disseminate a Fragment URI that identifies some content but does not wish the Fragment URI to identify him as its creator, except to himself.

A Content Record is functionally determined by its URI (including any Fragment Identifiers of an embodiment); a hash value is calculated from the URI to produce a 128 bit identifier for the Content Record. If a high quality hash function is used, such as a member of the GENERAL family of hash functions previously described for some embodiments, then with high probability the hash values differ for URIs that differ.

When a URI is activated (e.g., the user clicks on a hyperlink to display a document), an Activation Record is created. An Activation Record consists of a unique Activation Record identifier, a creation time stamp, the Content Record identifier of the "Destination" Content Record, and the identifier of a "Previous" Content Record in the navigation history. The Content Record identified by Destination holds the URI that was activated. The Content Record identified by Previous holds the URI of the document from which the user caused the Destination document to be activated (e.g., the document where he clicked the URI of the Destination). If the user activated a hyperlink in document A to arrive at document B, then the newly created Activation Record will have a time stamp for the time B was activated and identify the Content Records having the URIs for documents A (the Previous Content Record) and B (the Destination Content Record). Because distinct Fragment URIs can indicate different parts of the same document, multiple Content Records will frequently identify the same document. Since users navigate using the same URI at different times, multiple Activation Records will identify the same Content Record. Not all Activation Records have a Previous Content Record, since a user could enter a URI by hand or by pasting from some arbitrary source that cannot be identified by a user agent. Similarly, when an external application activates a URI in a user agent as happens when a user clicks on a link in an email, the source may not be known. For example, search engines are often opened by entering a short URI by hand. On the other hand, a role's bookmarks and history are discernible sources of links and transitions from them to documents are marked with special Previous Content Record identifiers reserved for those sources.

In some embodiments the navigation history and bookmarks for a user's role are synchronized between the URI Service and the machines on which the user chose to keep the role's information. In order to facilitate this synchronization, the identifier scheme for Content Records preferably uses sufficiently many random bits or hash bits to probabilistically ensure there are no collisions between identifiers, so entities can create new ones without coordinating with other entities. Some embodiments use 128 bits for this number. Time stamps in the two record types are used in part for synchronization efficiency.

In some embodiments, the history for a user's role is searchable and also directly navigable by any user agent embodiment that has a copy of that history. Each set of strings for a Content Record is effectively a separate searchable entity that may be indexed. When the role's history is searched, the results are displayed in a manner similar to search engine results, complete with snippets and hyperlinks to the document from whence the snippet came. Snippets cannot always be provided, but if there are strings, such as a description or content of a document, then the whole string or a substring can be made into a useful snippet. If the strings are short then the entire string becomes the snippet, and if they are too long for a snippet then an initial substring is taken as an identifying snippet. Unlike a search engine index however, the history of a role in some embodiments may be directly navigated by repeating or reversing the user's previous paths through the history.

To facilitate this navigation, there are three ways to display the user's navigation history and one way to display his bookmarks. The first navigation history mode shows the sequence of documents in chronological order based on Activation Record time stamps. These can be displayed with or without content (snippets), and the user can switch between displays by pressing a button. In the form without content snippets, the history of activations is displayed as URIs together with document titles. The user may navigate through the history by scrolling forward or backward within a history display page. Alternately he or she can select a time period to display.

The second navigation history display mode is from the perspective of a search criterion applied to the history. This mode of display is most like a search engine display in that the results are based on the search criteria and the strings of the Content Records are what are searched. The URIs, document titles, and document descriptions are searched, as well as the content strings. Each Content Record displayed in search results includes the title of the document (as happens with regular search engine results), which is also a hyperlink to that document. This overall hyperlink uses the URI from the Content Record, which may be a Fragment URI. The search results are ranked by relevance, and the snippets (the short content most relevant to the search criteria from the matching Content Records) have associated version 2 hyperlinks that link to the snippet content in the document, as compared with the title hyperlink which uses the Content Record's original Fragment URI and could identify a range that is arbitrarily larger than a snippet. However, in many cases the overall hyperlink will target the same content, in which case the original URI is used for both the title and the snippet, instead of generating new version 2 hyperlinks. (Details of version 2 hyperlinks come below.)

The third navigation history display mode involves the concept of a designated Content Record. This is a Content Record to become a focal point for the history display in the third display mode. Clicking on a Content Record display (as opposed to the hyperlink that activates the Content Record's URI) in either of the earlier two display modes causes that Content Record to become a designated Content Record and its URI a temporarily designated URI.

The third navigation history display mode is a display from the perspective of a particular designated Content Record; the display includes a section containing the Content Records from whence the user navigated to the designated Content Record's URI (collectively called 'from' records), and a section containing the Content Records to which the user navigated from the designated Content Record's URI (collectively called 'to' records). Again, content snippets for each Content Record may be displayed or not, and the user can switch between display formats by pressing a button. Clicking on a Content Record display (as opposed to the hyperlink that activates the Content Record's URI) causes that Content Record to become the next temporarily designated Content Record.

A Content Record may have been activated many times; its activation time stamps can be used to limit the display to those 'from' and 'to' records relevant to a particular activation or range of activations. This filter can be achieved by: considering either a single activation of the distinguished Content Record or those in a specified time range, called the "distinguished activation set". Relative to the distinguished activation set, there is either a latest activation of the distinguished Content Record that precedes the distinguished activation set, called the "latest prior activation", or there is no such preceding activation. Likewise there is an "earliest subsequent activation" of the distinguished Content Record relative to the distinguished activation set, or there is no such subsequent activation. The 'from' Content Records are eliminated from display for activations that come after the last member of the activation set, and if it exists those that come before the latest prior activation are also eliminated. The 'to' Content Records are eliminated from display for activations that come before the earliest member of the activation set, and if it exists those that come after the earliest subsequent activation are also eliminated.

In some embodiments, the user may switch between these three modes of display at will by simply clicking one or more buttons. The user can navigate backward and forward through the various history and bookmark displays using browser backward and forward navigational arrows, if present.

In some embodiments, when a user begins navigating in the history and until the user again accesses a document outside the history of a user's role, there is no new history created. When the user activates a document from this history, the Activation Record created has a Previous identifier that indicates the navigation history itself as the source of the link. In an example implementation of those embodiments, this history URI is not a true URI at all but simply the string "UserMagLinkHistory", and there is only one such Content Record in a navigation history.

In some embodiments, a Content Record is created immediately when a user begins the Fragment URI creation process, before the Fragment Identifier itself is created. This can be used to target advertisements to the user while he is in the process of creating a Fragment Identifier. Initially the URI has no Fragment Identifier. Later, when the Fragment Identifier is in fact created according to the user's preferences, its information is also placed in the incomplete Content Record. If the user aborts creation of the Fragment Identifier, then the Content Record is altered by setting the URI to a fixed Fragment URI creation string that is not a real URI, which in this example is "MagLinkCreationURI".

At the URI Service the navigation history is useful for targeting advertisements with precision, which follows since Fragment Identifiers more precisely identify content of interest to the user than do whole document URIs. By having more precise information about a user's interests, the URI Service is in a unique position to accurately and effectively target advertising. The URI service maintains "Advert Display Records", which track what advertisements have been displayed to a user or that user's roles. Every advertisement that is displayed to a user, which was targeted according to some embodiments, is recorded in association with the Activation Record that resulted in display of that advertisement.

"Advert Display Records" remain at the URI Service and are not synchronized with user agents.

Advert Display Records include the identifier of the Activation Record that resulted in the advertisement's display and the identifier of the advertisement that was displayed. In some embodiments each advertisement has a distinct identifier for every version of that advertisement. An advertisement is given a unique identifier that is used across all users for whom that advertisement is displayed. If multiple advertisements are displayed as part of a particular activation, then there are as many Advert Display Records created. Advert Display Records include a Boolean indicating whether the user interacted with that advertisement, such as by clicking on it.

The goal is to better choose an advertisement, out of an arbitrary set of possible advertisements, to display to that user, in association with that document, at that moment in time. In principle the most effective advertisement should be the most valuable to the advertiser, so in an ideal efficient auction market the best advertisement to choose is the one having the highest price for the available slot. Over time a new targeting scheme finds its actual value, which is higher if it is more effective, so the price paid for slots chosen by such a new targeting scheme increases over time if it is more effective than expected. The problem is to know which advertisement is the best based on the user's history. Here we have the user's full browsing history (for a particular role), with content precision produced by the use of Fragment URIs; i.e., much of the content that is extraneous to a user's interests has been eliminated from consideration by the use of Fragment URIs that identify specific content within documents.

In some cases the URI Service or Redirect Service serves out the page containing the advertisement; for example, when a user creates a version 1 Fragment Identifier according to the process 1100 of FIG. 11, the displayed page from the URI Service may have 1130 advertisements that depend upon the source page, the selection, and other aspects of the user's history. The choice of advertisements made in process 1100 beneficially utilizes the user's history as described here. The creation of Fragment Hyperlinks is a valuable activity to the enterprise owning the URI Service, and it is possible for a document source (such as a blog) that sells slots to advertisers to promote the creation of Fragment Hyperlinks by its users.

When it comes to advertising, all user interest in content is not equivalent. For example, a user could have recently activated a Fragment URI having associated strings that contain a key phrase useful for targeting advertisements for product A. He may also have recently created a Fragment URI with associated strings that contain a key phrase useful for targeting product B advertisement. By one line of reasoning, the two are identical in value and by another line of reasoning the one may be worth more than the other. For example, if the user chose to activate a URI based on a snippet that he read at the time of activation, then he is purposefully following that link looking for that information or the context of that information, and such activations could be just as valuable as link creations. If the goal of navigation history analysis is to ascertain if there has been an expressed and very recent interest that could lead to a purchase then the older information in a user's navigation history could be of little value to that analysis, but if identifying the user's general interests is the goal of the analysis of navigation history, then using only the most recent history or most recent searches may be inaccurate and could lead to sub-optimal use of the advertising space. Only the advertiser knows what the goal of the analysis is and can craft his criteria and bids for advertising space to fit with that goal. The analysis provided by some embodiments beneficially allows the crafting of arbitrary query criteria that can work and be adapted to work across a wide range of possible goals.

There are database structures and query languages that can support a multitude of queries against this history, the most common and well known of which are from the relational database model. Thus, in some embodiments, an instance of the record sets described (Content Records, Activation Records, and Advert Display Records) can be queried according to existing commercial relational database query languages that include arbitrary first order logic criteria as provided by the relational model. Beyond basic relational logic (also known as first order predicate logic) they notably include complex string matching criteria for words, word stems, and phrases. They also include numerical comparison criteria that can be used in some embodiments; for example, they can be used to bound time stamps to arbitrary intervals, including open ended intervals bounded on only one side. They can also count the number of records resulting from queries or sub-queries, and base results on those counts. The most commonly used commercial relational database engines efficiently provide all of these capabilities and more.

Therefore, in some embodiments, an advertiser can provide the URI Service with an arbitrary relational query (a first order logic query augmented with capabilities provided by commercial relational database engines) against this database and associate prices with that query for display of various advertisement alternatives. These alternatives include size and media type. The query is applied at the time of advertisement display. If the result of the advertiser-supplied query is positive (for the particular user's role), then the prices the advertiser associated with advertisements and that physically fit in the available slots are taken as bids for those slots.

In this way an advertiser can make arbitrary criteria for his marketing campaign and bid on an essentially unbounded multitude of possible criteria defined by him. For example, by crafting his own queries the advertiser can bid on key words and phrases appearing in the ranges of Fragment URIs associated with snippets that the user activated and the search strings that generated those snippets; he can bid on key words appearing in strings of Fragment Identifiers activated but not associated with search snippets; he can bid on key words appearing in search strings, search strings utilized (a search string is utilized when the user activates a link from search results), or search strings utilized more than once (more than one link activated from the search results). The advertiser can also set criteria for how many distinct URIs in the user's history have a key word or phrase and how many times such a key word or phrase has appeared in Fragment URIs that were activated (although the same URI may be repeated). An advertiser can set criteria, either negative criteria or positive criteria, for how recently the user has been shown an advertisement from a set of advertisements and whether the user interacted with any of those advertisements. (For security reasons, in some embodiments, an advertiser can only query about previous display and interaction with his own advertisements.) In addition, an advertiser can set criteria for when the various query elements are to be applied. For example, a phrase may be required to be in one of the Fragment Identifier ranges from the current URI activation, or the current URI activation and a predecessor search criterion combined, or alternately within two hours of the current URI activation. Since the URI about to be opened is available in the database, it is possible for a partial string match criterion to select for or against a particular Internet domain or set of domains; in this way advertisements on some sites can be devalued or enhanced in value according to the goals of the marketing campaign.

Consider the following example. Suppose that the phrase "Harry Potter wand" has been bid up in price for advertisement space on prominent search engines. Also suppose that a user who followed a Fragment URI that has this phrase in its target string then opens a weather site to check on the local weather. An advertising slot on that weather site for that user at that moment is likely worth more than the weather site can hope to receive from untargeted advertisements. While weather sites are visited often, the advertising presented on them is often generalist in nature; i.e., the advertising has a wide market in the general population, typically has nothing to do at all with weather, and the price paid for such advertising space is less than for targeted advertising. But this increased value can only be realized if there is some means to target that particular user with advertisements based on his history rather than on the subject of the moment (in this example weather), or no subject at all, which is common for weather sites and many others.

There has been speculation about why, at least so far, social media sites are less effective for advertising than some other sites. According to one theory the ineffectiveness derives from the fact that users do not go there to buy things. While this may be true, they do not go to weather sites to buy things either. A weather site and a social media site have in common that users often do not reveal effectively, in their interactions at that site, what it is that they could be interested in purchasing. However, the social media sites and weather sites also both have users and advertising slots for display to those users. Mechanisms of some embodiments provide precise targeting solutions to overcome these difficulties. In those embodiments, the user precisely reveals his interests by the Fragment URIs he creates and uses, as well as his searches; that information is then used, potentially for whatever document he may open and read, to choose advertisements more likely to interest him.

When a user activates a URI that is served to user agents by an advertising server that targets advertisements according to some embodiments, and there is space for one or more advertisements associated with the display of that URI's document, then the various potential advertisers' key words, phrases, and other criteria as described by his relational database query or queries are evaluated against the user's history for his current role at the URI Service. Note that when the query is run at the URI Service, this role history in those embodiments includes the activation record for the URI that is currently being activated. For each slot available for advertising in association with that URI, starting with a most valuable slot, the return for that slot is optimized based on the query results. In other words, the highest price possible based on the user's history is taken. With that slot taken, then a next most valuable slot is optimized and so on until the advertisement slots are filled (provided they have any value to the set of advertisers at all) and the document is displayed complete with advertisements. In some embodiments, advertisements for competing products or services are not displayed in the same document at the same time, and advertisers can indicate that their advertisements have such a competitive relationship with advertisements from competitors. Similarly, an advertiser may limit the number of his own advertisements in a single document. Thus, when the first advertisement is chosen, it may preclude some other advertisements from also being chosen even if they would otherwise optimize the return for display of that document.

In other embodiments either more or less sophisticated advertisement targeting schemes can be used. To enhance targeting, searches can be augmented with semantic analysis to ensure that the selected text uses positive terms in association with the key word or phrase. In other cases negative terms in association with key words or phrases would be more desirable. For example, in advertising for political contributions, a user selecting text that is negative toward an opponent to the candidate of interest could be a more likely target than one selecting arbitrary or neutral text about the candidate himself.

Other embodiments allow targeting specific geographical areas based on IP addresses, zip codes of users, or precise real-time positioning systems such as GPS (Global Positioning System) when such are available. In such an embodiment, the query could require a computed distance from the nearest of several arbitrary points (which could for example be places of business) to be less than some maximum. It could likewise require distances to all points in a set to be greater than some minimum, perhaps to ensure a minimum distance from some store-front businesses.

Because each Surrogate URI is redirected by the Redirection Service every time it is activated, considerable navigation history may exist at the URI Service for users who do not use an embodiment. Because of this, sufficient information to target advertisements for display to an arbitrary user may exist. For example, when a user is shown an offer to upgrade to an embodiment (see FIG. 46), the algorithm yielding best targeting possible based on the available history is used to select advertisements to display in some embodiments. If an advertiser's query criteria are met for such a user and he is the highest bidder, then the advertising slots are filled by his advertisements. In some embodiments, insufficient information to evaluate an advertiser's query relative to a particular user causes that query for that user to evaluate negatively; i.e., the user does not meet the criteria of that query if the information for that user is insufficient to evaluate the query.

In some embodiments navigation history and bookmarks are supported from a common database and, from the user's perspective, the bookmarks and navigation history displays are part of the same unified or combined feature. For example, switching between the bookmarks display and any of the navigation history displays is performed by the same user interface facilities. For a browser, the display uses a content page that loads, in principle, from the URI Service, but in fact most of the data displayed comes from the local database. A Content Record can be bookmarked, and in this way bookmarks are in effect Content Records with additional user-supplied hierarchical and descriptive information. Some embodiments support a hierarchical (directory or folder) structure and the ability to switch between bookmark views and navigation history views. For example, for any Content Record that is a bookmark, a bookmark icon appears in association with the display for that Content Record in any navigation history display.

Any selection (including an empty selection or no selection) of an open document may be bookmarked in some embodiments. If a selection is active in a document, or the URI belonging to the document's Content Record is neither a search engine results URI nor a version 1 Fragment URI, then a version 1 Fragment URI is created for the document and the selection when it is bookmarked. If no selection is active (the selection is empty), and the URI belonging to the document's Content Record is a version 2 Fragment URI, then the version 2 Fragment URI is converted to a version 1 Fragment URI (i.e., the range or ranges as they would be displayed for the version 2 Fragment URI are used to create a version 1 Fragment URI according to the process 1100 of FIG. 11). If the URI of the Content Record is for a simple URI, i.e., neither a Fragment URI nor a search engine results URI, then a version 1 Fragment URI is created for the document with a range that encompasses the whole document. These creations or conversions to version 1 Fragment URIs support the best possible future recovery of bookmarked information.

Thus, in some embodiments bookmarks reference a Content Record for a version 1 Fragment URI or a search query results URI. Search query results URIs by their nature are not "recovered" for original information, but instead searches are run again when it is opened, even from a bookmark.

For bookmark support, two additional record sets are added to the navigation history database for a user's role. The first of these are "Folder Records", which have five parts: a possibly zero-length user supplied folder name string, a possibly zero-length user supplied description string, a unique identifier (for the Folder Record itself), and a parent folder identifier (the unique identifier of a parent Folder Record). The Folder Records for a user's role are in a rooted tree structure. Except for the root node, the user typically creates the Folder Records. The root node has no Content Record, description string, or parent; it has a user configurable name that, for English implementations, defaults to "Bookmarks" in some embodiments. A name may be used for multiple Folder Records since it is the identifiers and parent identifiers of Folder Records that establish the tree structure.

The second record set for bookmarks are the "Bookmark Records", each of which has a unique identifier for the Bookmark Record itself, a possibly empty user supplied title string, a possibly empty user supplied description string, a possibly empty set of tag strings, a Folder Record identifier, a Content Record identifier, and a time stamp for the time the Bookmark Record was created. As already described, the Content Record identifier for bookmarks is constrained in some embodiments to not refer to a Content Record of a version 2 Fragment URI. In some embodiments a Content Record can be referenced by one or more Bookmark Records. The tag string set is an arbitrary set of tags that the user can apply to bookmarked documents, and the user can choose views of bookmarks or navigation history that is limited to bookmarks having a particular tag or set of tags.

Some embodiments have, in addition to the three ways to display the user's navigation history, a way to display the user's bookmarks hierarchically. The left part of this display has the folder and its subfolders in a common graphical hierarchical presentation that includes the ability to collapse a folder and its subfolders to a single folder, or to expand these to show content at the next level downward, both by clicking on the folder's icon. This is similar to the display of folder or directory hierarchies used for file systems.

In an adjacent space on the right there is a separately scrollable list of both folders and bookmarked Content Records. The document titles are displayed with the URIs for the Content Records. If the user has supplied a title for a document, then that takes precedence over the title provided in the document and is stored (if it exists) in the Content Record. A selected bookmark is temporarily a designated bookmark and the Content Record of a designated bookmark is temporarily the designated Content Record. The user can choose (e.g., by clicking a button) any of the other three navigation history display types, and when changing to them the designated Content Record is the temporarily designated Content Record in the new display mode. Like the other display modes, changing between a display that includes snippets and descriptions to a more compact display with one line per bookmark can be performed at any time at the user's request, which in some embodiments is achieved by the clicking a button.

If the current designated Content Record is also associated with exactly one bookmark, then that bookmark becomes the designated bookmark when the bookmarks display is entered. The designated bookmark, if there is one, is marked as selected and the folder hierarchy leading to that bookmark is opened.

When bookmarks are displayed with snippets, the user supplied description of the bookmark (if there is one) is displayed after the title and before the snippets, but without being part of a hyperlink. Each bookmark may be activated (its document opened) using the URI found in the Content Record. Further, each snippet has a version 2 hyperlink that on activation takes the user to that snippet in the document.

If a user changes to the bookmarks display from one of the non-bookmark entries in the history, and the designated Content Record is not associated with any bookmark, then the display opens the root bookmarks folder and there is no designated bookmark. Again, when a Content Record is bookmarked, its display (except when in the bookmarks display, where every Content Record is bookmarked) includes a small bookmark icon, so the user has a visual indication that a particular Content Record is bookmarked. The user can navigate backward and forward through the various bookmark and history displays using browser backward and forward navigational arrows, if present.

The user can view or edit a folder's description any time the folder name is displayed in the panel to the left. This is done using the context menu's 'Edit' option, displayed when the user hovers over the folder's name and clicks the mouse button that activates the context menu. He can edit a bookmark's title, description or tags using the context menu's 'Edit' option for any bookmark that is the designated bookmark.

Changing to the bookmarks display when the designated Content Record is the Content Record associated with multiple bookmarks is done based on session history, i.e., history since the current user agent process was started on the hardware device. This session's most recently designated bookmark (i.e., the one most recently selected while in the bookmarks display) that is associated with that designated Content Record becomes the designated bookmark, and its Content Record remains the designated Content Record. If there is no such recently designated bookmark, then the most recently created bookmark that has the designated Content Record becomes the designated bookmark.

The Bookmark Record sets for a user's role are synchronized with the URI Service as they are created. As with the navigation history the Bookmark Records have time stamps, in part to make synchronization efficient. Relational database facilities provide the query and transformation abilities for performing the described operations to arrive at the displayed content in some embodiments.

While the Bookmark Records are synchronized and backed up for a user through the URI Service database, in some embodiments those bookmark specific records are not exposed to advertiser's queries.

A non-embodiment user agent can access the navigation history and bookmarks for a user's role from the URI Service provided by some embodiments. This is done by providing a visually similar HTML based document interface for viewing the user's history and bookmarks. A major difference is that the content is provided as complete web pages from the URI Service rather than by constructing the content from a copy of the navigation history and bookmark database at the user agent. However, if the user activates a Fragment URI from this history using a non-embodiment browser, then document scripts cause the user to be offered upgrades to an embodiment according to the process 4600 of FIG. 46.

It is convenient for the user to have a Fragment Hyperlink that will select or highlight all of a document's identified content when the Fragment Hyperlink is activated. In order to provide this convenience we create such a Fragment Hyperlink and call it an "Overall Fragment Hyperlink". An Overall Fragment Hyperlink contains an "Overall Fragment URI", which in turn contains an "Overall Fragment Identifier". An Overall Fragment Identifier includes all of the snippets (relative to a particular search) or snippet related content for the document and often includes multiple ranges. Since users may sometimes want to use a conventional link to the document, we do not replace the conventional hyperlink but instead insert the Overall Fragment Hyperlink after the corresponding conventional hyperlink usually found at the top of a document's search results. This allows users to see all the content identified as relevant selected or highlighted without returning to the search results page and picking a Fragment Hyperlink for another snippet. Users may evaluate the search result snippets and choose the Overall Fragment Hyperlink, an individual snippet-specific Fragment Hyperlink, or the conventional hyperlink depending on the user's purposes and evaluation of the data.

Overall Fragment Identifiers are similar but not identical to Fragment Identifiers having aggregated snippet ranges. For both, all of the ranges associated with a document's snippets (relative to a particular search) are represented in a single Fragment Identifier. For an Overall Fragment Identifier, snippet ranges appear in the order found in the Common DOM Form and all of the snippets or their related relevant content will be selected or highlighted when the user activates a corresponding Overall Fragment Hyperlink—and the user will be taken to the first snippet. Aggregated Fragment Identifiers and their associated Fragment Hyperlinks differ in that the user is taken (the document scrolls to) the snippet or related relevant content visually associated with (e.g., adjacent to) the Fragment Hyperlink. This is arranged when creating a Fragment Identifier by placing the range associated with the particular snippet in the first position.

Figure 17:
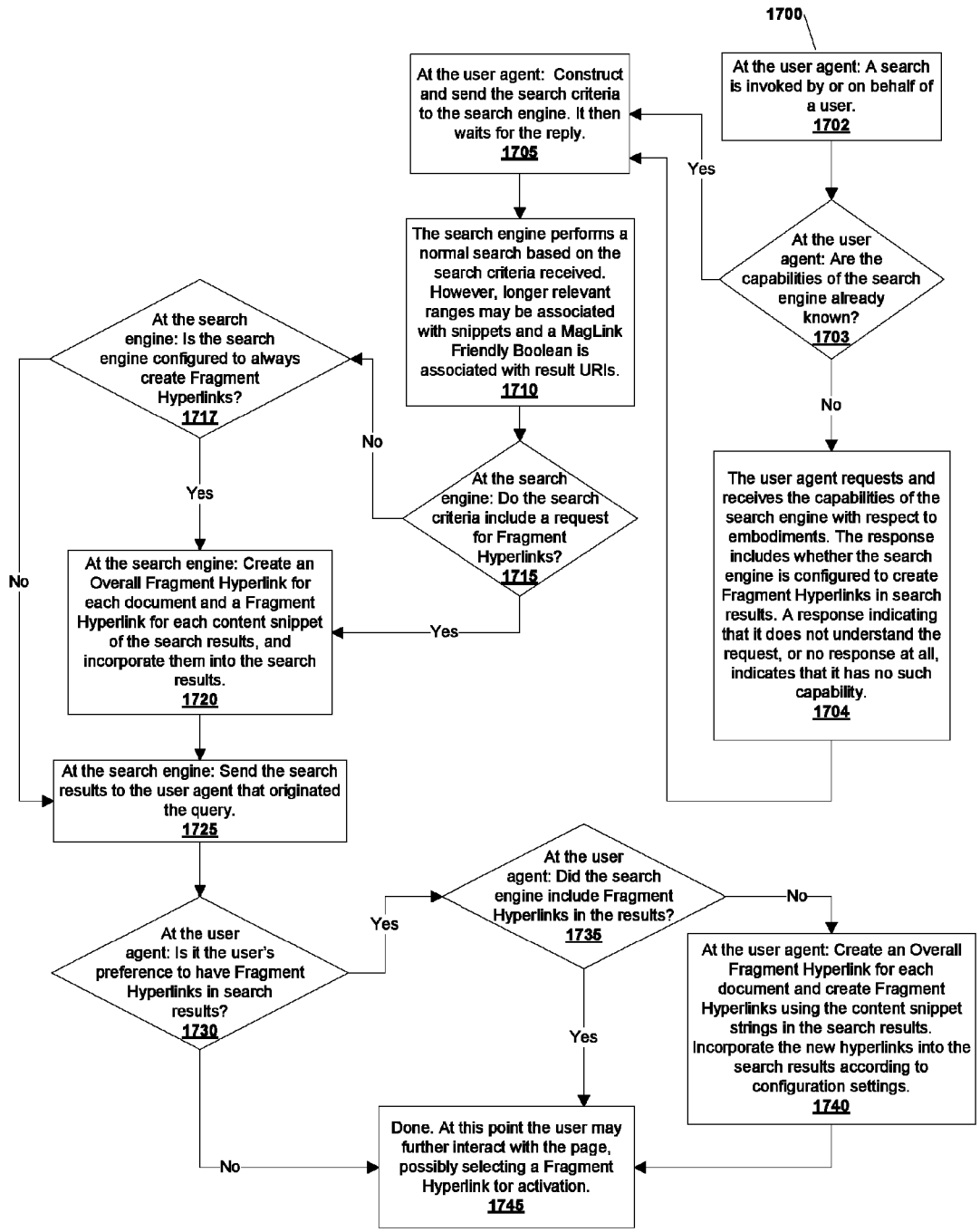
FIG. 17 illustrates behaviors of search engines and user agents when the user invokes a search.

FIG. 17 illustrates the coordinated behavior 1700 of search engines and user agents when the user invokes a search according to some embodiments. A user invokes a search interactively or via automated means 1702, and this invocation comprises search criteria that usually include search terms. For interactive invocations, search criteria are typically entered into a search engine web page using a user agent. User agents are most often browsers running on a PC, laptop, tablet, or a mobile phone, but may be other things such as a proxy search engine, a proxy browser that does server-side rendering, or a non-browser web application.

If the user agent instance has not received the capabilities of the search engine (i.e., it has not been established since launching the user agent process) 1703, then a query is sent to the search engine to determine the capabilities 1704 of the search engine with respect to the embodiment. The response includes whether the search engine is configured to create Fragment Hyperlinks in search results. A response indicating that it does not understand the request or no response indicates that it has no such capability. This step 1704 may be omitted when a web page created by the search engine is used to invoke the search, since the search engine web page state would, in some embodiments, provide that information. Under such circumstances the state for the search engine is kept on the user agent, perhaps through the use of cookies, which would also (in some embodiments) record the user's preferences with respect to Fragment Hyperlinks. Alternately, the web page would have means to input user preference information for a particular search.

However achieved, once the search engine capabilities are known, the user agent constructs the search query and sends it to the search engine 1705, then awaits the reply. The query sent to the search engine includes the user's preferences relating to Fragment Hyperlinks, but only if the search engine supports such preferences. The user preferences include those required by the process described in FIG. 18. In some embodiments, these include:
whether the user prefers "full relevant content"; i.e., that Fragment Identifier ranges identify highly relevant content without regard to length or without shortening relevant content to snippets;
whether the user would prefer that ranges be aggregated in Fragment Hyperlinks;
if the user wants full-sentence Fragment Hyperlinks.

Recall that such capabilities have been described above for version 1 Fragment Identifiers; the version 2 Fragment Identifiers, described subsequently, will have these capabilities as well.

The search engine performs a normal search using the search criteria received 1710. When content relevant to the search is found and shortened into snippets for display, longer ranges of relevant content may be advantageously associated with the shortened snippets. This is done using the capability that is provided by some embodiments to represent Fragment Identifier ranges that are independent of the range's length. Thus, while the text may be shortened into one or more snippets in order to provide for space-efficient visual display to the user, the associated document range represented in a Fragment Identifier may advantageously, depending on the search criteria, include additional text. Unlike snippets in most search engine results, in some embodiments such ranges will not be artificially shortened below complete sentences, provided the user's configuration requires full sentences and the snippet originated in a part of the document that uses them.

Implementation of these embodiments involves implementation-specific choices. Examples include the exact syntax chosen for the MagLink Friendly declarations and the particular encoding used for the version number of a Fragment Identifier. An implementer will make many such choices in realizing a concrete implementation of an embodiment. Because some of these choices determine or affect the syntax of communication between different computation devices, those skilled in the art will appreciate that some of these choices become details of communication protocols, and that they must be uniformly chosen across a distributed embodiment. For example, if choices were made differently for a search engine than for a user agent, then that search engine could only interoperate with the user agent as described herein with the aid of a translation layer. For these reasons and in order to add clarity, we sometimes provide detailed syntax and describe embodiments in the context of that syntax, even though the syntax presented is only one possible implementation.

When a search engine implements some embodiments, it keeps a Boolean datum that indicates whether the document is MagLink Friendly with each indexed document. Recall that "MagLink Friendly" was described with an example detailed syntax, which is most advantageously uniformly chosen across a distributed implementation. Without loss of generality we assume for descriptive purposes that there is a single distributed implementation of an embodiment, which means that the search engine implementation is compatible with and interoperates with implementation specific elements on other machines. Thus for example, declarations of MagLink Friendly have the same syntax and meaning in the search engine implementation as in user agent implementations. Likewise, the version 1 and 2 encodings are the same for all parties.

Each search result URI is associated 1710 with the corresponding document's MagLink Friendly Boolean in order to affect further processing of the search results. Being MagLink Friendly means that the document contains a Boolean metadata datum, according to an aspect of some embodiments, which indicates that the behavior of any active document content (e.g., scripts) is oblivious to (does not depend upon) the presence or absence of an embodiment's Fragment Identifiers. This means that the user experience will be identical whether an embodiment's Fragment Identifier is present or not, when the document is displayed by a user agent (e.g., a browser) that itself has no code sensitive to the embodiment's Fragment Identifiers. This is a non-trivial assertion; there are HTML web sites whose scripts behave quite differently when they see any kind of a fragment identifier that is not recognized by the script. This may also occur when there are multiple fragment identifiers of whatever kind, which is formally forbidden by RFC 3986, but is not precluded by existing practice though it is nevertheless unexpected by active content of many documents. When seeing the unexpected such documents may behave as if the entire URI is in error and may go so far as to redirect to another site or otherwise display different content.

If the search engine is not capable of constructing Fragment Identifiers of the embodiment, then it will not have been requested to do so or will not recognize that it has been requested to do so, and it sends the normal search results back to the invoking user agent 1725. However, if it does have such capability, then it determines if the user desires Fragment Hyperlinks 1715 based on the criteria received with the search request. If no Fragment Hyperlinks are desired and the search engine is not 1717 configured to always create Fragment Hyperlinks, then the results are sent back to the invoking user agent 1725. If Fragment Hyperlinks are desired 1715 or the search engine is 1717 configured to always create Fragment Hyperlinks, then the search engine creates an Overall Fragment Hyperlink for each document and a Fragment Hyperlink for each content snippet found in the search results 1720 and incorporates them into the search results according to the process 1800 of FIG. 18. The results are then sent 1725 to the invoking user agent.

On receiving the results at the user agent it is not known definitively whether the search engine incorporated Fragment Hyperlinks according to the user's desires or not. If the user desires 1730 Fragment Hyperlinks then the results are parsed to determine if the search engine 1735 included Fragment Hyperlinks into the search results. If it did not then 1740 the user agent creates an Overall Fragment Hyperlink for each document in the search results and individual Fragment Hyperlinks using the content snippet strings from the search results. Then it incorporates the new hyperlinks into the search results according to configuration settings; a more detailed description of this process 1900 is given in FIG. 19. The hyperlinks embedded in the search results page are used in the normal manner 1745; the user may further interact with them, such as selecting a Fragment Hyperlink for activation.

Search engines can construct Fragment Identifiers to identify ranges in a document that are longer than the snippets they are associated with. Snippet length is limited in a search results page, and cannot be as long as would be most appropriate for some search results. Thus, association of a Fragment URI with a snippet does not necessarily mean that the Fragment URI identifies precisely that snippet in the target document; it may identify more than the snippet. For example, it could identify the complete sentence or the paragraph from which the snippet was taken.

In alternative embodiments, in cases where interpreting Fragment Identifiers that identify text larger than the associated snippet, the broader text of the range is highlighted, but the snippet is selected within that range and scrolled to. Search engines achieve this by providing two ranges, where one is contained entirely within another. When interpreted according to these embodiments, the larger range is highlighted and the contained range is selected.

Figure 18:
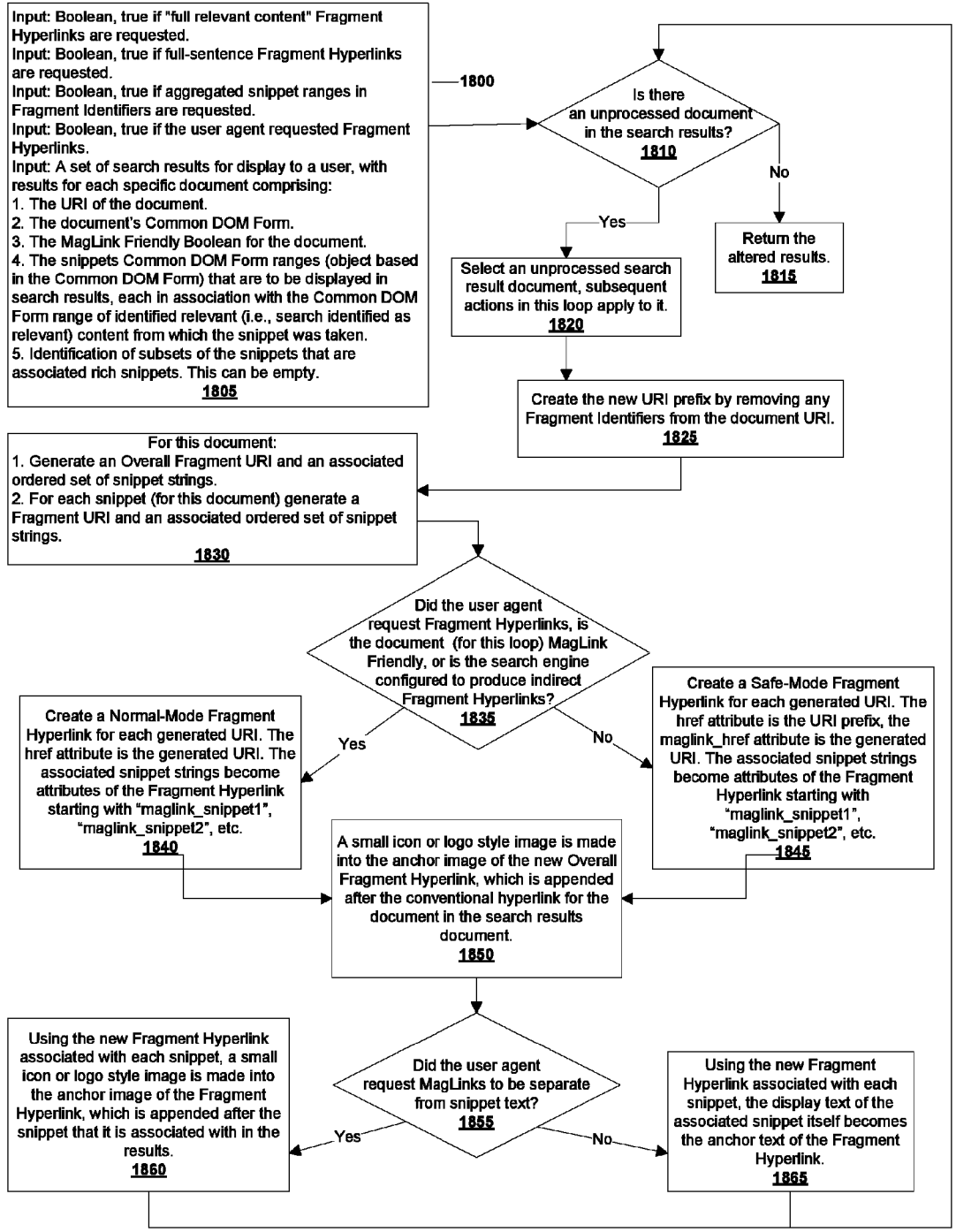
FIG. 18 illustrates processing search results at the search engine to create Fragment Hyperlinks.

FIG. 18 illustrates the process 1800 of creating Fragment Hyperlinks at the search engine, before they are sent to the user agent. Inputs 1805 for this process include:
Input: Boolean, true if the user prefers "full relevant content" Fragment Hyperlinks
Input: Boolean, true if full-sentence Fragment Hyperlinks are requested.
Input: Boolean, true if aggregated snippet ranges in Fragment Identifiers are requested.
Input: Boolean, true if the user agent requested Fragment Hyperlinks.
Input: A set of search results for display to a user, with results for each specific document comprising:
1. The document's URI.
2. The document's Common DOM Form.
3. The MagLink Friendly Boolean for the document.
4. The snippets' Common DOM Form ranges that are to be displayed in search results, each in association with the Common DOM Form range of content that the search engine identified as relevant, from which the snippet was taken. (Note that the ranges used here identify beginning and ending objects as opposed to the boundaries between objects.)
5. Identification of subsets of the snippets that are associated rich snippets. Rich snippets come in mutually associated sets; for example, a product name and its color could be associated rich snippets, and another product name and its color could be another set of associated rich snippets for the same document. Typically there will be at most one set of rich snippets in the search results for a particular document.

Note that some search engines also present snippets that do not actually come from document content. Since the search engine is in a position to know which snippets came from the content, in some embodiments only those snippets that come from the content of the associated document have Fragment Hyperlinks created for them.

Process each document in the search results set. First see if any unprocessed documents remain 1810. If all documents have been processed, return the altered results 1815 to the invoking procedure. Otherwise, unprocessed documents remain. Select an unprocessed search result document 1820 and apply the actions described below to it. (The remainder of this procedure applies to the selected document.)

In order to construct the Fragment Hyperlinks, the URI of the hyperlink associated with the snippets is parsed to be sure that there are no Fragment Identifiers of the embodiment already in that URI. Any that are found are removed 1825. The result becomes the URI prefix for the document being processed. Each of the Fragment Identifiers created for this document will be prepended with this URI prefix, in order to create a Fragment URI.

Figure 55:
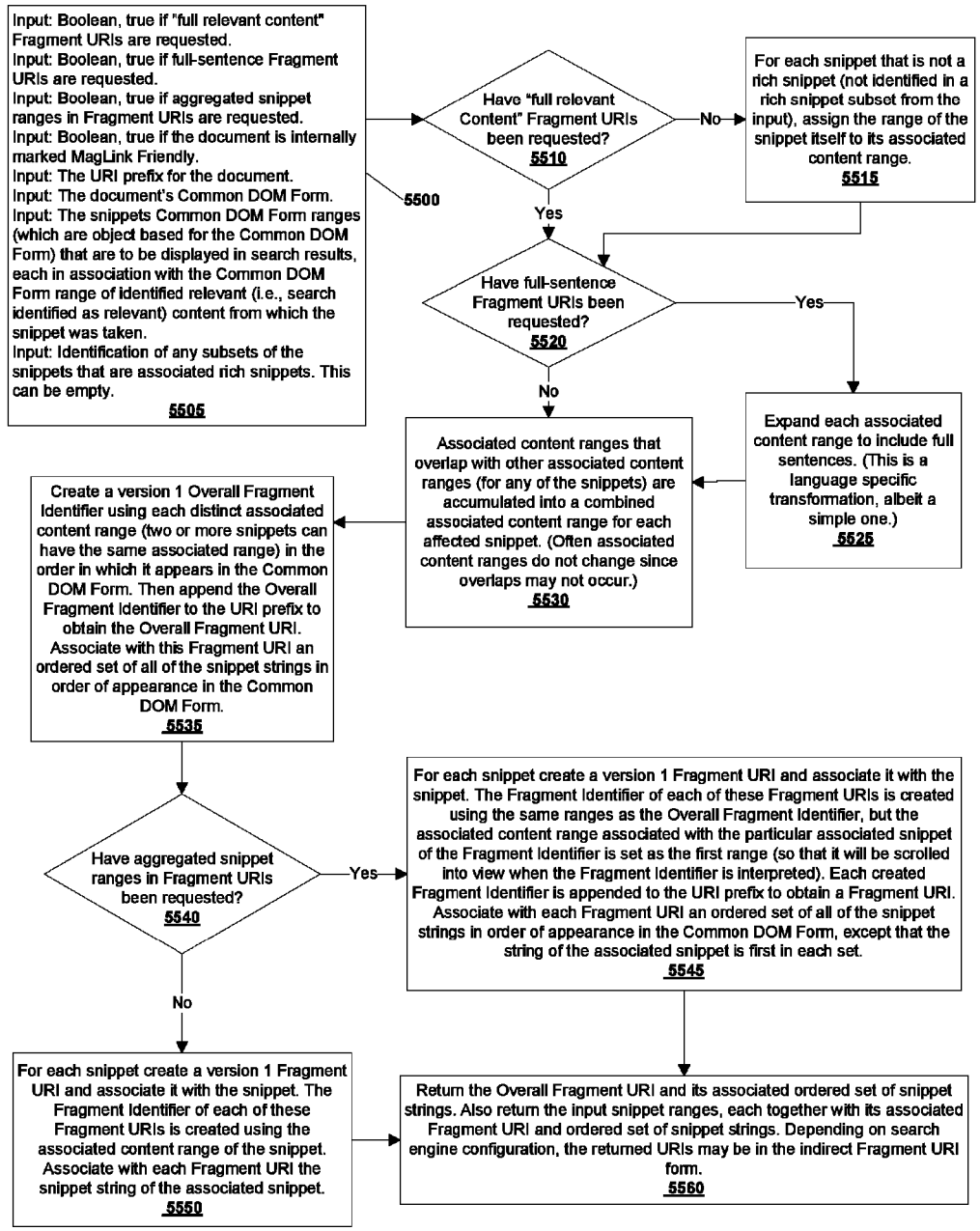
FIG. 55 illustrates creating Fragment URIs for search results at the search engine for a single document.

Next do 1830 the following, according to the details provided in the process 5500 of FIG. 55:
1. Generate an Overall Fragment URI and an associated ordered set of snippet strings.
2. For each of this document's snippets generate a Fragment URI and an associated ordered set of snippet strings.

Determine 1835 if the user agent requested Fragment Hyperlinks, if the document being processed by this loop is MagLink Friendly, or if the search engine is configured to produce version 1 indirect Fragment Hyperlinks for search results. If any are true, 1840 create a Normal-Mode Fragment Hyperlink for each URI generated above. Set the href attribute to the generated URI. Hyperlinks are given internal attributes that contain the snippet or snippets of the hyperlink, in range order, from which the hyperlink was constructed. In some embodiments the internal attributes containing the snippets have the name 'maglink_snippet', followed by its ordinal position as a string. Thus, the first has the name "maglink_snippet1", the second "maglink_snippet2", and so on until there is one attribute for each snippet range covered by that Fragment Identifier.

These internal attributes are used for both version 1 and version 2 Fragment Identifiers. They associate the applicable snippet text with an individual hyperlink. In some embodiments their function is two-fold. They provide a convenient way to connect the snippet text with the rest of the hyperlink, so that snippets are associated with history or bookmarks entries. They also can be used to help during recovery. If a user activates a version 2 Fragment Identifier that no longer matches anywhere in the document, the snippets can be recovered from the attributes and used to find similar content in the same document or the same or similar content in another document, as will be described later.

In alternative embodiments the version 2 Fragment Identifier is constructed by directly encoding the snippets into the Fragment Identifier (without rolling hash function values), and the snippets are simply searched for in the document. This search could be more sophisticated and include essentially the recovery procedure for version 2 Fragment URIs described below. However, such recovery activities are inefficient relative to the canonical form and hash based identification of the intended content, so one benefit of the other embodiments is speed. In addition, not all version 2 Fragment Identifiers are made from artificially short content such as snippets, and like version 1 Fragment Identifiers can include whole or nearly whole documents; for example, see FIG. 52 where a version 2 Fragment Identifier is sent to user agents to verify the majority of the content of a whole document. Thus usage of FIG. 52 cannot be accommodated by whole string based version 2 Fragment Identifiers of alternative embodiments.

If the user agent did not request Fragment Hyperlinks and the document is not MagLink Friendly, create 1845 a Safe-Mode Fragment Hyperlink for each generated URI. The href attribute is set to the URI prefix and the maglink_href attribute is set to the generated URI. The associated snippet strings become attributes of the Fragment Hyperlink starting with attribute names "maglink_snippet1", "maglink_snippet2", etc., until there is one attribute for each snippet range covered by the Fragment Identifier.

In some embodiments, the Overall Fragment Hyperlink will appear as a small icon or logo style image located to the right of the conventional hyperlink for the document being processed. When a user clicks on the image, the document will be opened and all of the snippets will be highlighted or otherwise distinguished. To add the Overall Fragment Hyperlink to the search results page, set its anchor image to the designated image 1850 and append the modified hyperlink after the conventional hyperlink for the document being processed in the search results page.

Individual snippet MagLinks can be associated with the snippet text, in which case the text acts as anchor text and will activate a hyperlink when clicked. However, snippet MagLinks do not need to be associated with snipped text but can be activated by clicking on an anchor image. If the user agent requested that MagLinks be separate from snippet text 1855, make a small icon or logo style image into the anchor image for the newly-created Fragment Hyperlink associated with each snippet 1860 and append it after its associated snippet in the search results. Otherwise, make the snippet's display text into the anchor text 1865 for the associated Fragment Hyperlink and replace the display text with the Fragment Hyperlink in the search results page. Note that when rendered, identical text is displayed but the snippet becomes the anchor text for a Fragment Hyperlink. Return to look for another unprocessed document 1810 in the search results set.

FIG. 55 illustrates the process 5500 of creating Fragment URIs for search results at the search engine for a single document. In some embodiments, version 1 Fragment URIs are generated by default; the search engine can also be configured to generate version 2 Fragment URIs. Note that all of the information used to create version 2 Fragment Identifiers is used to create version 1 Fragment Identifiers.

Inputs 5505 for this process include:
Input: Boolean, true if "full relevant content" Fragment URIs are requested.
Input: Boolean, true if full sentence Fragment URIs are requested.
Input: Boolean, true if aggregated snippet ranges in Fragment URIs are requested.
Input: Boolean, true if the document is internally marked MagLink Friendly.
Input: The URI prefix for the document.
Input: The document's Common DOM Form.
Input: The snippets' Common DOM Form ranges that are to be displayed in search results, each in association with the Common DOM Form range of the content that the search engine identified as relevant, from which the snippet was taken. The associated content ranges are also referred to as content ranges below. (Note that the ranges used here identify beginning and ending objects as opposed to the boundaries between objects.)
Input: Identification of any subsets of the snippets that are associated rich snippets. This can be empty.

If full relevant content is not requested 5510, set the associated content range to the range of the snippet. Specifically, 5515 for each snippet that is not identified as part of a rich snippet subset by the input (is not a rich snippet), replace the snippet's content range with the range of the snippet itself. In either case determine if full-sentence Fragment URIs were requested 5520. If so, expand 5525 each associated content range to include full sentences, provided the section containing the snippet uses full sentences. (This expansion to full sentences is a simple language-specific transformation.)

Content ranges can overlap with each other. Rather than maintaining separate overlapping ranges, they are consolidated in some embodiments. To this end, accumulate sets of overlapping associated content ranges 5530 into combined associated content ranges for each affected snippet. Often a snippet's associated content range is unchanged by this accumulation, since overlaps might not occur. Next create a version 1 Overall Fragment Identifier 5535 using each distinct associated content range (because of accumulation, two or more snippets could have the same content range) in the order in which it appears in the Common DOM Form and append the Overall Fragment Identifier to the URI prefix to make the Overall Fragment URI. Creation of a version 1 Fragment Identifier is done according to the procedure 1200 described in FIG. 12. Associate this created Fragment URI with the ordered set of all snippet strings, in order of their appearance in the Common DOM Form.

If Fragment URIs with aggregated snippet ranges 5540 were requested, create them. For each snippet create a version 1 Fragment URI according to the procedure 1200 described in FIG. 12 and associate it with the snippet 5545. The Fragment Identifier of each Fragment URI is created using the same ranges as the Overall Fragment Identifier, but the range corresponding to the particular snippet (for which the Fragment Identifier being created) is made the first range. This first range will be scrolled into view when the Fragment Identifier is interpreted. Append each Fragment Identifier to the URI prefix to create the corresponding Fragment URI and associate the Fragment URI with an ordered set of all of the snippet strings in order of appearance in the Common DOM Form, except for the string associated with the snippet, which is first in the set. Return the Overall Fragment URI 5560 and its set of ordered snippet strings. Also return the original snippet ranges passed as input, each together with its associated Fragment URI and ordered set of snippet strings. By default, some embodiments are configured to return indirect Fragment URIs; they can also be configured to return the direct forms of the URIs. A benefit of using the indirect form is that the search engine can return the indirect forms to any user agent (typically browser), and in this way advertise the capability; for example, as described in FIG. 46.

If Fragment URIs with aggregated snippet ranges 5540 were not requested, create a version 1 Fragment URI for each snippet 5550 according to the procedure 1200 described in FIG. 12 and associate it with the snippet. Use the snippet's associated content range (which may have been replaced 5515 with just the snippet range) to create the Fragment URI's Fragment Identifier. Associate the snippet string of the snippet with each Fragment URI (a set of strings having exactly one string). Return the Overall Fragment URI 5560 and its set of ordered snippet strings. Also return the original snippet ranges passed as input, each together with its associated Fragment URI and ordered set of snippet strings.

Figure 19:
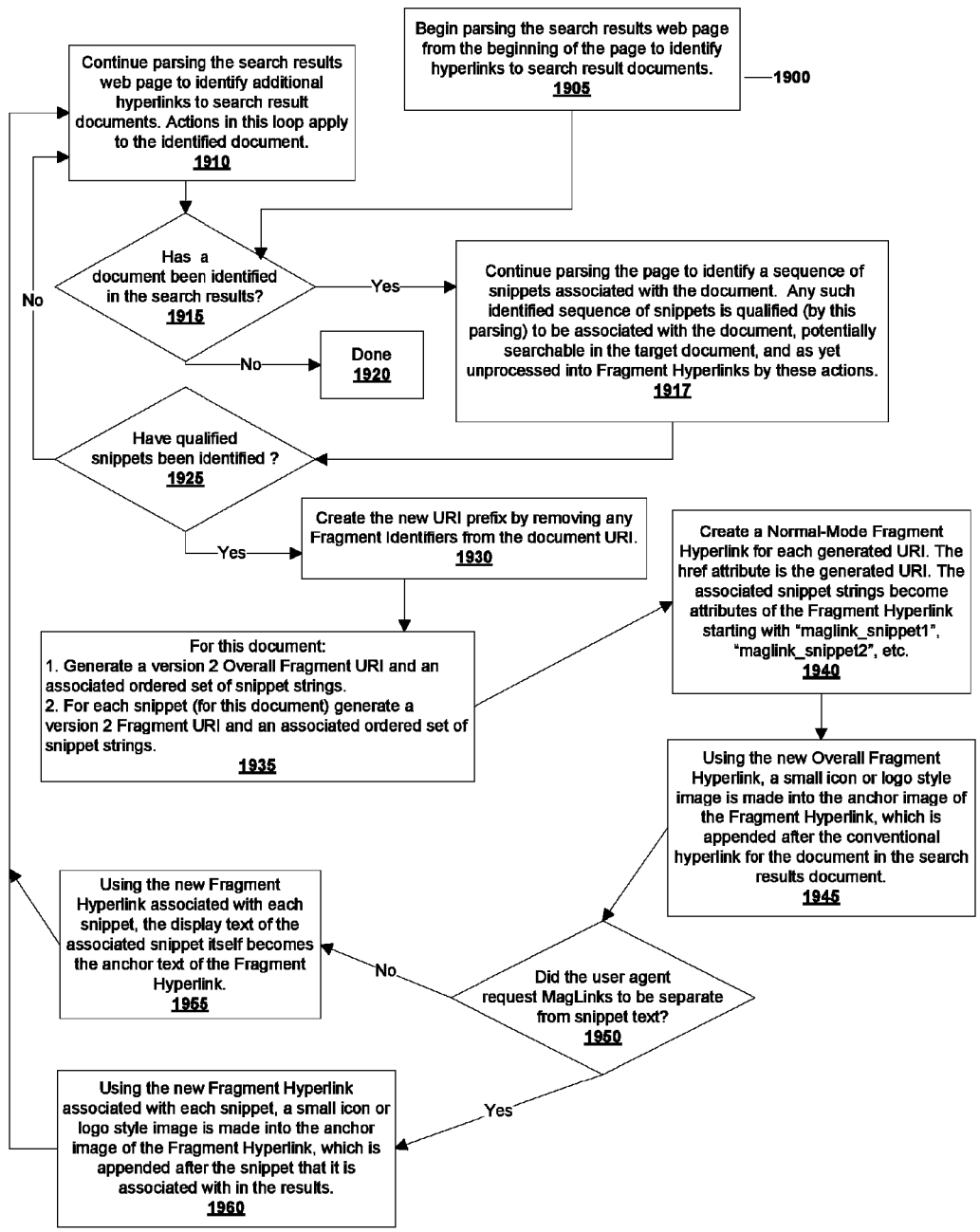
FIG. 19 illustrates processing search results at the user agent to create Fragment Hyperlinks.

FIG. 19 illustrates the processing 1900 of search results at the user agent to create Fragment Hyperlinks for content snippets. This alteration is described for a search results web page as presented by a browser, which represents it internally in an HTML DOM. Since each search engine uses different HTML markup and displays its results differently, the DOM instance for the search results web page is parsed according to rules created specifically for that search engine. This parsing is straightforward in concept, since any such web page must make visual sense as displayed to the user, which means for example that content snippets will be visually associated with the hyperlink for the documents from whence they came. Thus the parser first finds document hyperlinks and then looks for nearby (and subsequent, in every instance so far encountered) content snippets. However, the robustness of any such parser is in principle affected by the fact that this parsing may be done without cooperation of the search engine enterprise that produced the search results. Therefore the search engine enterprise could make superficial changes that require modification of parser details.

This process 1900 begins by parsing 1905 the search results web page DOM from the beginning of the page to identify the first hyperlink to a search result document. If no such document hyperlink is found 1915 then processing halts 1920. Otherwise a document has been identified in the search results; unless otherwise stated, the remainder of this procedure applies to the identified document.

Continue parsing 1917 in order to find any text snippets associated with the document. The parsing qualifies each snippet as potentially searchable in the document. It is only potentially searchable because not all snippets that the search engine associates with a document are in fact document content; for example, they may be general descriptions of the document as a whole. This parsing cannot in general make that distinction. However, if for some particular search engine such a distinction could be made, then snippets that do not appear as document content should not be qualified. Because a search engine may update a web page without changing all of its content, it is also necessary for this parsing to establish if a snippet has already been processed; if there is already a Fragment Hyperlink for the snippet in the DOM then it is not qualified.

If no qualified snippets for this document were found 1925, then processing for this document halts and parsing for hyperlinks to search results documents resumes 1910. If qualified snippets were found 1925, continue processing the document. The document's hyperlink is parsed to be sure that there are no Fragment Identifiers of an embodiment already in the URI and any that are found are removed 1930. The result becomes the URI prefix for the document being processed and it will be prepended to any Fragment Identifiers created for this document, in order to create a Fragment URI.

Figure 56:
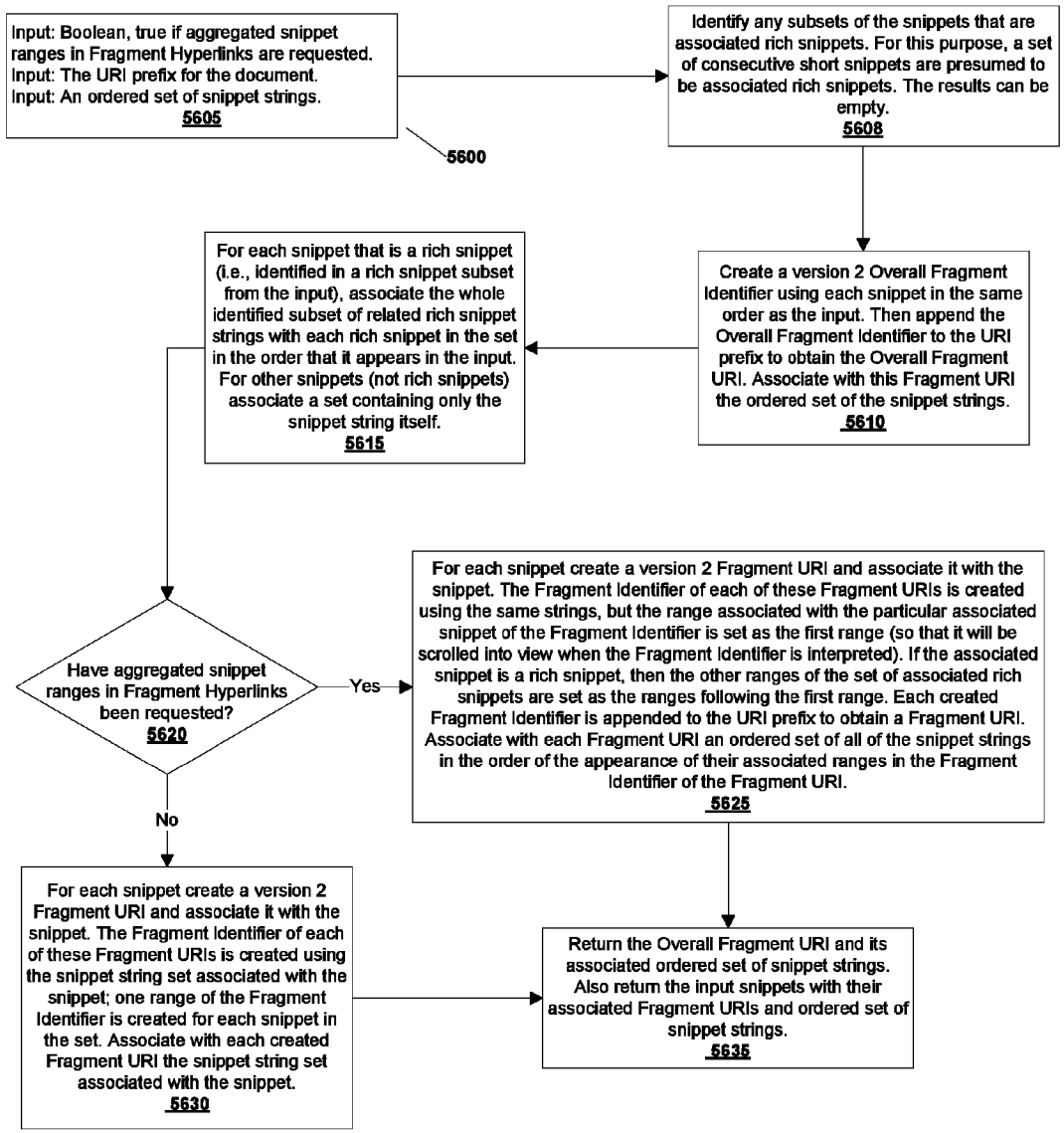
FIG. 56 illustrates processing search results for a document at the user agent to create Fragment Hyperlinks.

Next do 1935 the following, according to the details provided in the process 5600 of FIG. 56:
1. Generate a version 2 Overall Fragment URI and an associated ordered set of snippet strings.
2. For each of this document's snippets, generate a version 2 Fragment URI and an associated ordered set of snippet strings.

Create 1940 a Normal-Mode Fragment Hyperlink for each URI generated above. The href attribute is set to the generated URI. The hyperlinks are given internal attributes (which are not part of the URI) that contain the snippet or snippets, in the same order their corresponding ranges appear in the Fragment Identifier, from which the hyperlink was constructed. In some embodiments the internal attributes containing the snippets have the name 'maglink_snippet', and each is followed by its ordinal position as a string. Thus, the first has the name "maglink_snippet1", the second "maglink_snippet2", and so on until one for each range in the Fragment Identifier has been given. This is done to facilitate user agent actions when the user activates such a hyperlink. A beneficial effect of adding these "maglink_snippet" attributes is that the snippet can readily be associated with its range in a Fragment Identifier, even when the Fragment Identifier has multiple ranges.

Using the new Overall Fragment Hyperlink, make 1945 a small icon or logo style image into the anchor image of the Fragment Hyperlink, which is appended after the conventional hyperlink for the document in the search results page.

Determine 1950 if the user agent requested that MagLinks be separate from snippet text. If the user agent is configured so that MagLinks will be separate from snippet text 1960, make a small icon or logo style image into the anchor image for the newly-created Fragment Hyperlink associated with each snippet and append it after its associated snippet in the search results. Otherwise, make the snippet's display text into the anchor text 1955 for the associated Fragment Hyperlink and replace the display text with the Fragment Hyperlink in the search results page. Note that when rendered, identical text is displayed but the snippet becomes the anchor text for a Fragment Hyperlink.

When all qualified snippets for the document have been processed, continue 1910 parsing the search results web page to identify additional document hyperlinks. If no such document hyperlink is found 1915 then the search results page is 1920 complete. The browser automatically displays the altered DOM of the page in its new form. The user may interact with it, perhaps by selecting to activate an inserted Fragment Hyperlink.

FIG. 56 illustrates the processing 5600 of search results for a single document at the user agent to create Fragment Hyperlinks. Creation of version 2 Fragment Identifiers has distinct advantages because the creation of version 1 Fragment Identifiers at the user agent would require downloading every document in the search results as part of the hyperlink creation process, which is relatively costly in time and computation resources. The construction of version 2 Fragment Identifiers is described later in this document.

Inputs 5605 for this process include:
Input: Boolean, true if aggregated snippet ranges in Fragment Hyperlinks are requested.
Input: The URI prefix for the document.
Input: An ordered set of snippet strings.

Identify 5608 any subsets of the snippets that are associated rich snippets. For this purpose, a set of consecutive short snippets are presumed to be associated rich snippets. The results can be empty. How short a snippet needs to be for this determination is configurable and in part context determined. A snippet shorter than a configurable number of characters (by default 18) is provisionally considered a rich snippet. If a snippet is adjacent to a snippet already provisionally determined to be a rich snippet, and it is shorter than a configurable number of characters (by default 28), then it is provisionally considered a rich snippet. Each maximal (longest possible) set of consecutive provisional rich snippets is identified as a distinct set of associated rich snippets. Typically at most one set of rich snippets is identified by application of these rules.

Create a version 2 Overall Fragment Identifier using each snippet in the same order as was used for the ordered set of snippet strings that were input. (Version 2 Fragment Identifiers are created according to the procedure 2000 described in FIG. 20.) Append the Overall Fragment Identifier to the URI prefix to create the Overall Fragment URI. Associate the ordered set of the snippet strings with this Overall Fragment URI.

Next, for each snippet that is a rich snippet (i.e., identified as part of a rich snippet subset), associate 5615 the whole identified subset of related rich snippet strings with each rich snippet in the set, in the order that the snippets appear in the input. For snippets that are not rich snippets, associate a set that only contains the snippet string itself.

Determine 5620 if aggregated snippet ranges in Fragment Identifiers have been requested. If they have, create them as follows: For each snippet, create a version 2 Fragment URI according to the procedure 2000 described in FIG. 20 and associate it with the snippet 5625. The Fragment Identifier for each Fragment URI is created from the same strings, but the range associated with the particular snippet for which a Fragment Identifier is being created is set as the first range in the Fragment Identifier so that the snippet will scroll into view when the Fragment Identifier is interpreted. If the snippet being processed is a rich snippet, then the other ranges from the set of associated rich snippets follow the first range. Append each Fragment Identifier to the URI prefix to obtain a Fragment URI and associate it with the ordered set of all of the snippet strings, in the same order of appearance as their associated ranges have in the Fragment Identifier.

Figure 20:
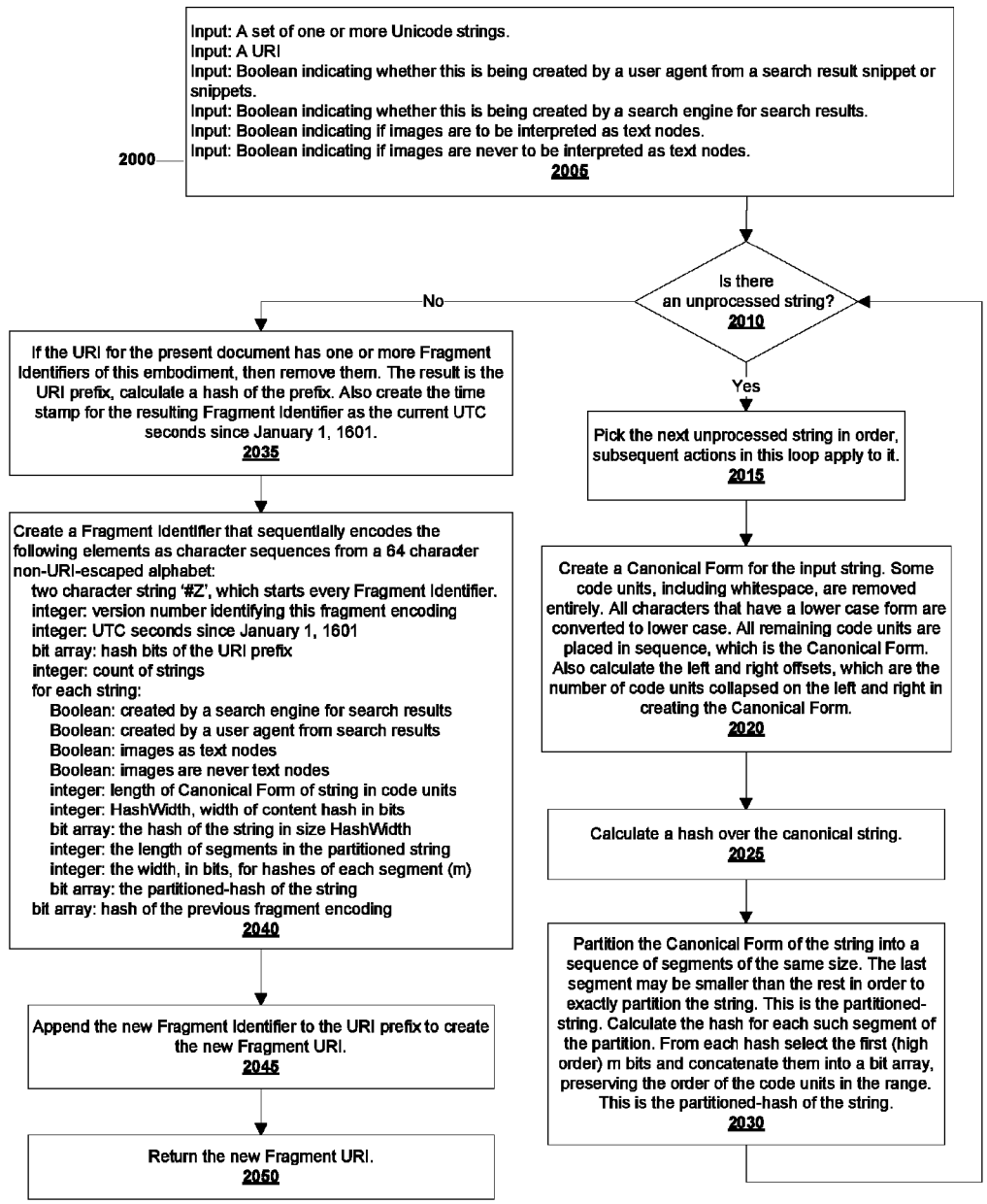
FIG. 20 illustrates creation of version 2 URIs using Fragment Identifiers from only the target strings.

If aggregated snippet ranges in Fragment Identifiers 5620 have not been requested, for each snippet create 5630 a version 2 Fragment URI using the procedure 2000 described at FIG. 20 and associate it with the snippet. The Fragment Identifier for each of these Fragment URIs is created using the snippet string set associated with the snippet; one range of the Fragment Identifier is created for each snippet in the set. Associate the snippet string set (as an ordered set of strings) with each created Fragment URI.

Return 5635 the Overall Fragment URI and its associated ordered set of snippet strings. Also return the input snippets, each together with its associated Fragment URI and ordered set of snippet strings.

FIG. 20 illustrates the process 2000 of creating version 2 URIs using Fragment Identifiers created from only the target strings. This type of Fragment URI is needed because it can be impractical in some circumstances to create a version 1 Fragment Identifier. Version 2 Fragment Identifiers do not involve finding a unique canonical prefix or suffix, and in general no more may be known about the document than that it has the target string or strings when the Fragment Identifier is created. Therefore, version 2 Fragment Identifiers cannot ensure uniqueness of a match. Further, the construction cannot calculate precisely how many hash bits are required to distinguish n-grams in the document. However, in some circumstances these drawbacks are not severe issues. If only the target string was ever known by the end user, and if it is long enough that there are only likely to be a few matches, then its non-uniqueness in the document is of little or no harmful consequence. For example, snippets produced by search engines for interactive display are typically long enough to limit the number of matches and the user perusing search results usually knows nothing about the rest of a document's content.

Both version 1 and 2 Fragment Identifiers constructed by search engines can identify ranges in a document that are longer than their associated search engine result snippets. Snippet length is limited in a search results page, and cannot be as long as may be most appropriate for some search results. Thus, association of a Fragment URI with a snippet does not necessarily mean that the Fragment URI identifies precisely that snippet in the target document; it may identify more than the snippet. For example, it could identify the complete sentence or paragraph from which the snippet was taken.

Inputs 2005 to the process 2000 are:
Input: A set of one or more Unicode strings.
Input: A URI
Input: Boolean indicating whether this is being created by a user agent from a search result snippet or snippets.
Input: Boolean indicating whether this is being created by a search engine for search results.
Input: Boolean indicating if images are to be interpreted as text nodes.
Input: Boolean indicating if images are never to be interpreted as text nodes.

Each input string 2010,2015 is processed in order, one at a time, and this loop applies to the currently chosen string. The order is significant since, if there is more than one range created, the first range appearing in the Fragment Identifier will be the one scrolled to when the Fragment Identifier is used.

The string is converted to its Canonical Form 2020. Some punctuation characters, including whitespace, are removed entirely. All characters that have a lower case form are converted to lower case. All remaining characters are placed in sequence, which is the Canonical Form. This Canonical Form is called the Canonical Target. Note that search engines do not accurately or consistently process whitespace; for example, sometimes search engines create terms by improper concatenation. By elimination of whitespace in the version 2 Fragment Identifiers we concatenate all terms and avoid that issue. Moreover, in some languages spaces have no particular meaning and do not determine term boundaries.

The hash of the Canonical Target is calculated 2025. This is the same hash as used for version 1 Fragment Identifiers, which means the same function according to process 200 of FIG. 2.

The Canonical Target is partitioned 2030 into equal sized segments, except for the last segment which may be a remainder of smaller size than the rest. The number of segments is configurable, and the implementation can accept any number, but in some implementations the default is 15 segments plus the remainder. Most often there will be 16 segments though occasionally there will only be 15. The size of the segments is determined by dividing the number (by default 15) into the length of the Canonical Target in code units. The segment size is encoded into Fragment Identifiers so that any number of segments can be used. If the result is less than 1 code unit per segment, then segments of 1 code unit are used unless the Canonical Target is less than 4 code units in length, in which case it is not partitioned. This is indicated by encoding the integer for the length of each segment as zero and then dropping the integer encoding for the number of bits and the bit array from the encoding. The result is the partitioned Canonical Target. The hash is calculated for each segment of the partitioned Canonical Target. The high order (first) m bits from each hash are selected and are concatenated into a bit array, preserving the order of the segments in the range. In some embodiments, the value of m is configurable and by default is 16. This value is configured in conjunction with the number of segments and for similar probabilistic guarantees the number of segments rises as the number of bits per segment falls. As with the number of segments, some embodiments (when interpreting a Fragment Identifier) accept arbitrary values for m, which is encoded into each Fragment Identifier.

There are usually 16 segments, so with 16 bits per segment hash there are usually 256 bits in a partitioned hash, which means that a partitioned hash in some embodiments by default have more bits than the rest of the range encoding. This can be lowered, but the consequences of doing that should be understood. With 16 bits per hash, if any contiguous 4 segments match then the probability that the match is not the same as in the target is small, about 1 in 256 billion in a 1 mega-character document, which means that about 25% of the whole can be recognized positively anywhere in the document. If matching 50% of the whole anywhere were good enough, then nominally 8 segments with 16 bits each, for a total of 128 bits, would suffice. It is important to recognize that placing fewer bits in each hash increases the number of spurious individual matches. Each 16 bit hash will, on average, randomly match once in every 65K positions. If there are 16 of them, then random matches occur, from one of the segment hashes, every 4K of the document. Thus, for a 1 mega-character document, there would be in aggregate about 256 random matches. This number rises exponentially as the number of bits in each segment hash is reduced, which increases the computation cost of finding matches.

This completes the processing for the current string (except for encoding the results into the Fragment Identifier). If there are one or more unprocessed strings then the processing continues from the point of the check for unprocessed strings 2010.

If there are 2010 no more unprocessed ranges, then 2035 the URI for the present document is examined for Fragment Identifiers of this embodiment and any that are found are removed. The result is the URI prefix. Calculate the hash of this prefix. Also create the time stamp for the resulting Fragment Identifier as the current UTC seconds since Jan. 1, 1601. This is done exactly as described 1250 above for FIG. 12.

Create 2040 the Fragment Identifier. While the specific values encoded differ from version 1 Fragment Identifiers, the encoding techniques are the same as is described 1255 above for FIG. 12.

The following information is encoded:
1. The two character string '#Z'
2. An integer version number identifying this particular Fragment Identifier version, which is version 2. In a concrete implementation of an embodiment, this number in effect identifies the encoding used. This specification describes two such example versions. However, this element supports any number of versions since an arbitrary integer is encoded to identify the version.
3. An integer representing the number of Coordinated Universal Time (UTC) seconds since Jan. 1, 1601, when this fragment identifier was created.
4. A bit array of the high order bits of the hash of the URI prefix. This uses 24 bits and this size is fixed.
5. An integer representing the number of ranges in the Fragment Identifier, i.e., the number of strings represented.

6. A sequence of range encodings, one for each string, which consist of:

a) A Boolean that indicates whether this range was created by a search engine for search results. This is set to true only by search engines serving out search results with Fragment Hyperlinks.

b) A Boolean that indicates whether this range was created by a user agent from search results. This is normally set to true only by a user agent that creates hyperlinks associated with search result snippets from a search engine.

c) An "images as text nodes" Boolean, which indicates that at least one image with non-trivial alternative text ('alf' attribute in HTML) contributed to the string content.

d) An "images are never text nodes" Boolean, which indicates that images were not taken as text nodes and did not contribute to the text in the string. If both this Boolean and the "images as text nodes" Boolean are false, then it is unknown whether image text is represented. Unknown is generally the case when the Fragment Identifier is constructed by a user agent from a simple string or snippet taken from a search engine result.

e) An integer that indicates the length of the string in code units.

f) A bit array of the high order bits of the hash of the Canonical Target. The number of bits is HashWidth.

g) An integer indicating the length of a segment in the partitioned Canonical Target.

h) An integer 'PartitionedHashWidth' indicating the width, in bits, of the hash values for each segment in the partitioned Canonical Target. By default this value is 12 in this example.

i) A bit array of the high order bits in sequence of the hashes of the segments of the partitioned Canonical Target. The number of bits for each segment is PartitionedHashWidth. The number of segments is the length of a segment divided into the length of the Canonical Target, rounded up.

7. A bit array of the high order bits of the hash of the Fragment Identifier encoding, including the 'Z' at the beginning but not the '#'. The encoding that is hashed is the elements 1 through 7; i.e., this element itself is not included in the hash. The number of bits included in some embodiments is 30 and is fixed. Thus, this element is not part of the ASN.1 encoding, but is the hash of the ASN.1 encoding, and is directly converted to 5 characters, each representing 6-bit pieces of the hash, using the same Base64 encoding.

Note that the pair of Boolean values for the alternative text of images is necessary for these ranges because we need a way to represent that image text (VnT text) participation is unknown. I.e., we represent 3 values, yes, no, and unknown. It is an error if both Booleans are set, but if both are set then it is also interpreted as unknown and the Fragment Identifier is not rejected in that case.

The new Fragment Identifier is appended 2045 to the URI prefix to create the new Fragment URI, which is returned 2050.

Figure 21:
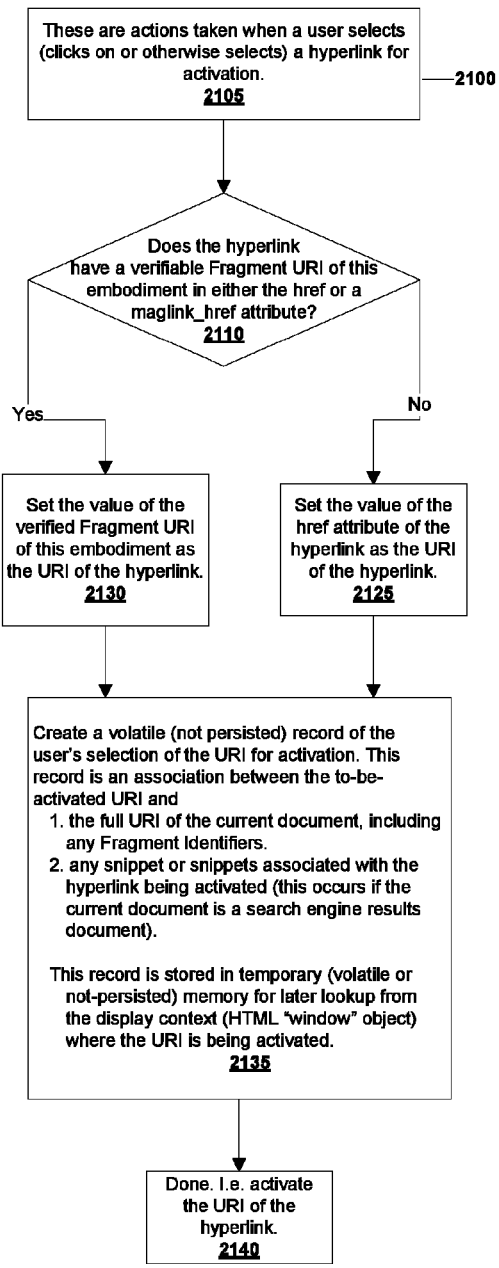
FIG. 21 illustrates actions of the user agent when the user selects a hyperlink for activation.

FIG. 21 illustrates 2100 actions of a user agent when a user selects 2105 a hyperlink for activation in some embodiments. First check 2110 to see if it has a Fragment URI of this embodiment. This is done by parsing the URI of the href attribute and checking for a valid Fragment Identifier of this embodiment or a Surrogate URI, and if not then similarly parsing and verifying 2110 the maglink_href attribute, if there is one. If the hyperlink does not have a Fragment URI of this embodiment, then the value of the href attribute is assigned 2125 as the hyperlink's URI.

If a Fragment URI of this embodiment is found 2110 in either the href or maglink_href attributes, then it becomes 2130 the hyperlink's URI.

Create 2135 a volatile (not persisted) record of the user's activation of the URI. This record represents an association between the URI to be activated and:
1. the full URI of the current document, including any Fragment Identifiers; and
2. any snippet or snippets associated with the hyperlink being activated. The hyperlink has attributes for any such snippets, which in an example implementation has attribute names "maglink_snippet1", "maglink_snippet2", etc. This occurs if the current document is a search engine results document and the activated hyperlink is associated with snippets. These attributes were previously inserted 1849, 1845,1940 into search engine result hyperlinks according to FIG. 18 and FIG. 19.

This record is stored in temporary (volatile or not-persisted) memory for later lookup when the display context exists for the URI that is being activated (e.g., after the HTML "window" object for this document activation exists and can be accessed). This is set up in such a manner that the snippets (if any), the search criteria, and the URI for the originating document can be retrieved using only the URI from the hyperlink. Given the URI of the originating document, the navigation history Content Record of the originating document can in turn be retrieved.

The URI of the hyperlink is activated 2140 complete with any Fragment Identifiers.

In alternative embodiments, some Fragment Identifiers will be inaccessible to any content based scripts. In other words, the user agent (e.g., web browser) carefully keeps specially delimited Fragment Identifiers isolated from active content of documents. The special delimiter is advantageously not '#' or '#Z', since both of these appear at the beginning of Conventional Fragment Identifiers that are presently visible to scripts, and such a choice would break some current web behavior. However, the sequence '##' works even though it too may appear in pathological circumstances under the de-facto existing specifications. In other words, existing practice does not effectively preclude the appearance of '##' at the beginning of a Conventional Fragment Identifier. The new delimiter and anything following it in a URI can be seen only by the user agent code and specifically not by content scripts. It will be removed by conforming browsers and other user agents, and placed in memory only accessible to the user agent and its extensions prior to activating a URI having such a Fragment Identifier of any kind delimited in this manner. Some embodiments use such a delimiter, which would have distinct benefits if there was an existing standard specification for it. In the absence of such a specification, some embodiments beneficially use # followed by some alphabetical character because, in present circumstances, the '##' is more likely to cause confusion on the part of existing user agent software and content scripts if they should encounter it. The example implementation described herein uses "#Z", but other implementations could use other delimiters, including "#" without following it with an alphabetical character. Note that, regardless of all attempts provided herein to isolate '#Z' delimited Fragment Identifiers from content scripts, they will nevertheless encounter such Fragment Identifiers of this embodiment under some circumstances until such a time as there is a standard specification to prevent it and user agents conform to the specification. For example, if a user manually pastes a Fragment URI of this embodiment into a browser that behaves according to current practice, then the content scripts for the web page will have access to the entire URI, including the Fragment Identifier.

Figure 22:
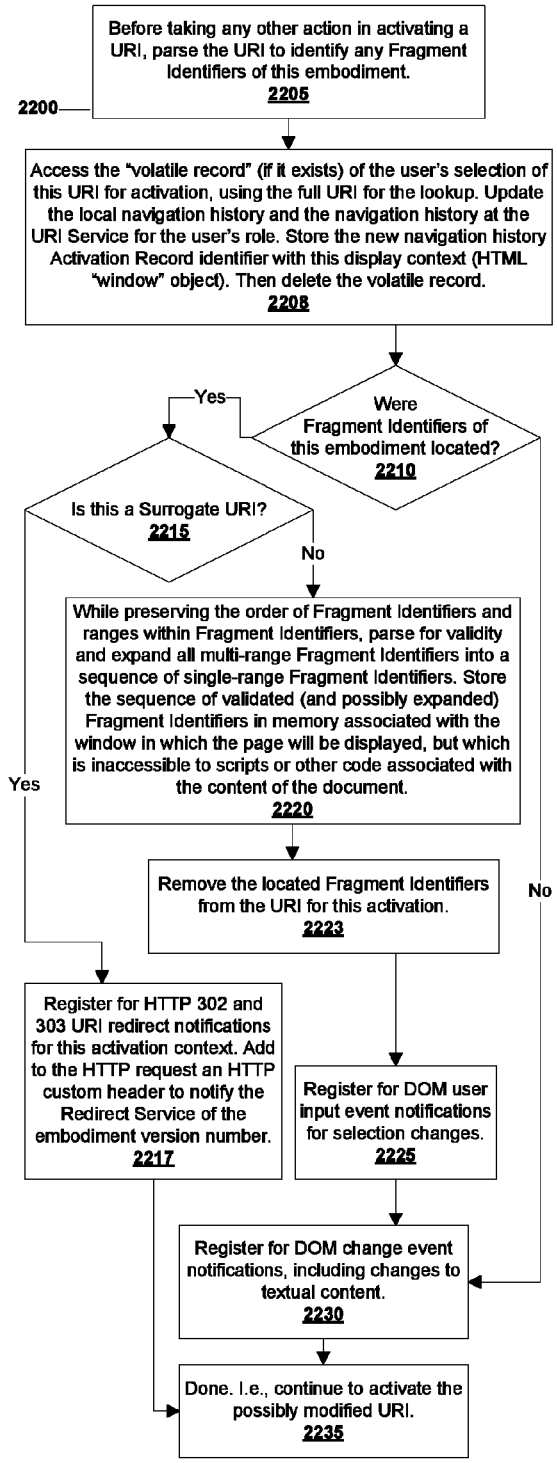
FIG. 22 illustrates actions of the user agent when activating (opening) a URI.

FIG. 22 illustrates preliminary actions 2200 of the user agent when activating (opening) a document identified by a URI. These actions beneficially take place when the user agent has identified a display context, which for this HTML example is identified by a "window" object according to the W3C specifications, but has not yet sent any HTTP or other protocol requests to external servers to retrieve information related to the URI or the document it represents. After these actions the URI activation proceeds to retrieve and display the document according to existing practice except that future actions of this specification are taken when various events occur. Thus, this process 2200 provides for the described future actions to occur. For the HTML document example described here, and in accordance with the standard HTML DOM model, these actions take place in response to HTML DOM model notifications. The notifications specified for use are described in W3C standards documents for the HTML DOM model and are supported by user agents conforming to those specifications. Before sending any HTTP requests to activate a URI, the URI is parsed 2205 to identify any Fragment Identifiers of this embodiment.

Attempt to access 2208 the volatile record created by the procedure 2135 presented in FIG. 21 that describes the user's selection of this URI for activation, using the full URI for the lookup. Note that it need not be a Fragment URI; i.e., this lookup attempt occurs for all URI activations. Because activation can occur by means that do not involve activating a hyperlink embedded in the document of a previously activated URI, this record may not exist. For the rest of the description of this process 2208, this identified volatile record is called the "Volatile Record" (that may not exist).

If there is no Content Record in the local navigation history that matches the current URI, then create 2208 a new navigation history Content Record for it.

While the user agent keeps navigation history Content Records including the title string and description string (if they exist), at this point in the process 2200 of FIG. 22 they are not yet retrieved at the user agent so they cannot be stored with a new Content Record at this time. Even though the Content Record may be incomplete, the URI Service needs information immediately in order to target advertisements for the current user before the document is opened. Moreover, the URI Service may have the strings by virtue of it being a version 1 Fragment URI or due to prior access to that URI by other user agents, users, or users' roles. The URI Service may also be a search engine and have that information for that reason. Therefore, the URI Service navigation history for this user's role will be updated in the course of this process 2200 with the information that the user agent has at this point in time, and the service will in turn use any additional content information it may already have for the URI and its document for targeting.

The information that the URI Service has for a URI may have become inaccurate or stale through document editing or URI changes. Even though it may be inaccurate, the advertisement targeting relating to opening the URI uses whatever information the URI Service has. If the current information at the URI Service is inaccurate, then it will be updated with accurate information after the first user agent embodiment opens the document and discovers the inaccuracy or missing information. For example, if a Simple Content Record at the URI Service has stale strings for the title or description, then the user agent will discover this after opening the document and finding that it must update the local Content Record for that URI. Once updated locally, synchronization propagates that information to the URI Service. In this way, unlike current schemes for indexing web content, inaccuracy at the URI Service is discovered and corrected by the first access by some user that results in discovery of the new information. Until the content changes again, processing based on that new information for other users will be accurate.

Figure 51:
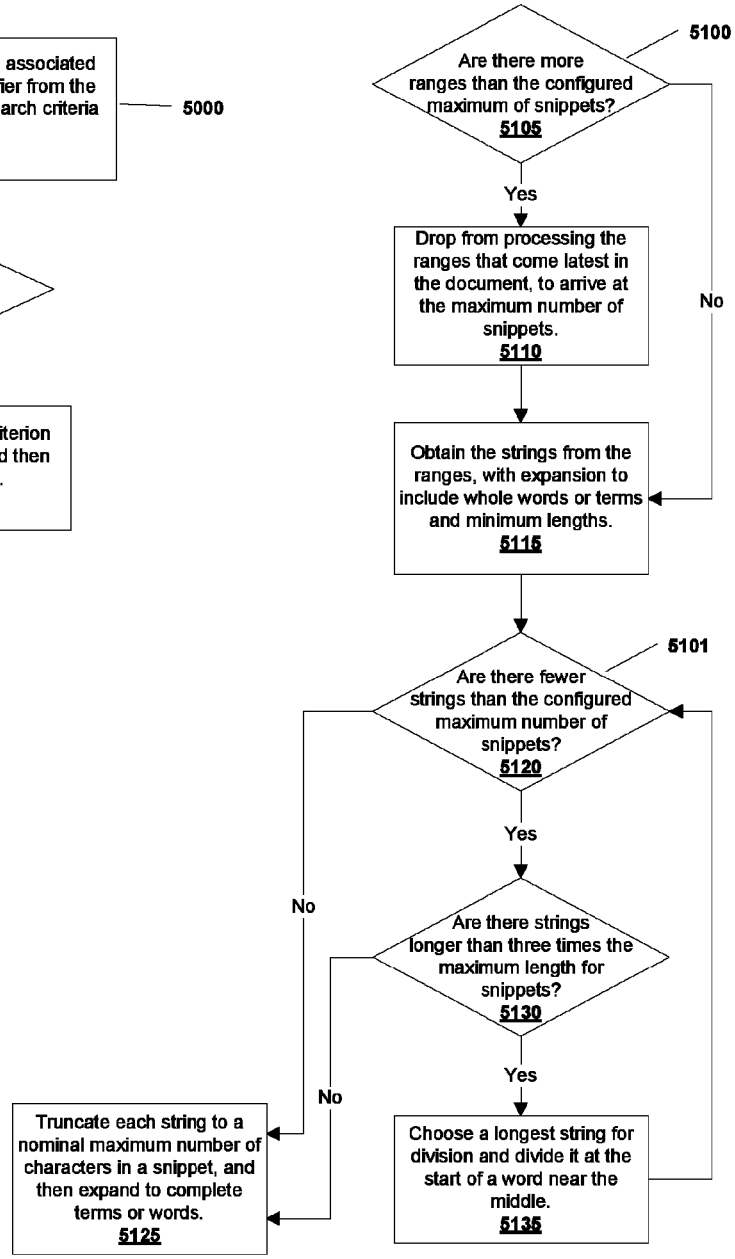
FIG. 51 illustrates navigation history (including bookmarks) snippet creation for Fragment Identifier Content Records.

If the Volatile Record exists, there are search snippets stored in it, and the Content Record does not yet have associated snippets, then the snippets are processed 5101 according to FIG. 51 and then stored 2208 as associated content record snippet strings. (Note that there are two starting points in FIG. 51.) In most circumstances where the URI is a version 2 Fragment Identifier, the output of the process 5101 of FIG. 51 is the same as its input, namely a snippet or ordered set of snippets that is small enough to be used (after concatenating if there are multiple of them) as a single search criterion. This result is also small enough to display in the expanded history displays of history and bookmarks.

An Activation Record is created and its Destination is set 2208 as the identifier of the Content Record (which may have just been created) for the current activation context. If the current URI is a search engine query then this Activation Record has no Previous. If it is not a search engine query, then the Previous is set to the navigation history Content Record identifier stored in the Volatile Record, provided the Volatile Record exists and has a navigation history Content Record identifier; if it does not exist or there is no Content Record identifier, then there is no Previous for this new Activation Record.

Store the identifier of the new navigation history Activation Record with this display context (an HTML "window" object). The identifier can be retrieved from this document's display context (window object) so long as it exists.

Once these updates to the local navigation history have occurred, the changes to the navigation history for this activation are sent 2208 to the URI Service in order to keep it synchronized and so that queries against the full history for the user's role can be performed in order to target advertisements for the user. In particular, this notifies the URI Service of the activation before the document content is requested from its server. If the activated URI is a Surrogate URI of an embodiment, then this information will nominally arrive at the URI Service slightly before the request for content arrives at the Redirect Service. If the user agent identifies itself as an embodiment in the request to the Redirect Service for content (which it does if the user agent is an implementation of some embodiments), then it is known that this update has occurred or is underway.

The user and his role are identified to the URI Service in some embodiments through the cookie that, according to standard HTTP specifications, goes with HTTP protocol requests.

Delete 2208 from memory the Volatile Record that was previously stored 2135.

Figure 23:
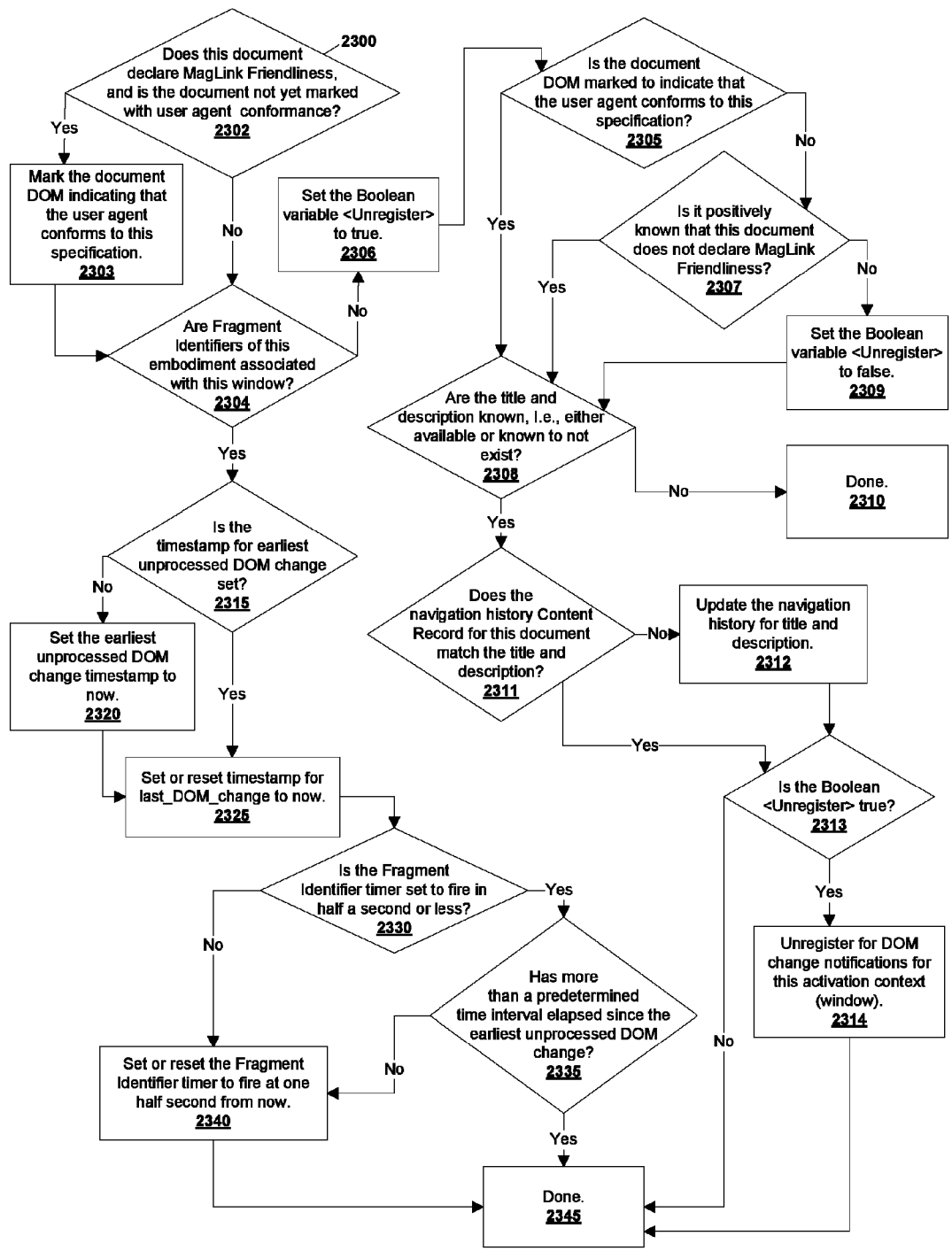
FIG. 23 illustrates actions on DOM change event notifications for documents opened in a user agent.

If there are no Fragment Identifiers of this embodiment found in the URI 2210 then the activities of the process 2300 of FIG. 23 are registered 2230 to be undertaken whenever the DOM instance for the document of this activation changes. In the example implementation this means registering the code that implements FIG. 23 for a DOM change event according to the W3C specifications of DOM events for HTML and XML. When the DOM is changed the actions specified in FIG. 23 are undertaken. Then the URI activation continues 2235 according to normal user agent behaviors, which is typically to download the content from a source such as the web and display the document.

If there are one or more Fragment Identifiers of this embodiment 2210 and this URI is not 2215 a Surrogate URI then in an order-preserving manner parse 2220 the fragment identifier of all types for validity. If they are not of this embodiment they are ignored. Expand any multi-range Fragment Identifiers into a sequence of single-range Fragment Identifiers. This expansion is done by changing the count of ranges to 1 in every resultant Fragment Identifier, keeping only one set of range fields (each set of range fields can simply be copied after parsing establishes where each range encoding is), and recalculating the hash for each single-range Fragment Identifier. The prefix of a URL (the part that precedes the Fragment Identifiers) remains the same and its hash should not be recalculated even if it does not match the existing URL prefix. Validation succeeds even if the hash for the URL prefix does not match. The sequence of validated (and possibly expanded) Fragment Identifiers is stored 2220 in volatile memory associated with the display context for the document. For this HTML example it is associated with the document's "window" object. For the display of HTML documents the W3C has defined the "window" object, which is also accessible from document based scripts; however, while this memory is associated with the window in some embodiments, it is isolated from any document based active content (e.g., scripts). Thus in some embodiments the Fragment Identifiers are kept in memory which is associated with the document but made inaccessible to scripts or other code associated with the content of the document.

In some embodiments, a Surrogate URI is recognized by its domain name, which is used for no other purpose. In other embodiments there could be other means to recognize a Surrogate URI; for example, the same domain name as the URI Service could be used but with a path that is only used for Surrogate URIs. In other embodiments the name of the server is unique and used only for Surrogate URIs; i.e., instead of beginning with "www" the URI could uniquely begin with "rdt". In other embodiments the fact that it is a Surrogate URI is recognized after redirection occurs and the new URI is known to be a Fragment URI of this embodiment, in which case the branch in the logic comes after the Surrogate URI content is requested.

Remove 2223 all validated Fragment Identifiers from the URI for this activation. This has the benefit of preventing the web server for the document's URI from discovering the Fragment Identifiers, and achieves an original intent for fragment identifiers of all kinds, this intent resulted in a standardized rule that content servers would not be sent fragment identifiers. While most user agents do not violate this intent per-se, they run scripts from the content servers that access Conventional Fragment Identifiers and have no provision to prevent the scripts from sending Conventional Fragment Identifiers or information dependent on them to the server. This regularly occurs in modern browsers running scripts from web pages. The behavior described here differs from existing practice and specifications in that some embodiments preclude any of the server's code from seeing a Fragment Identifier of the embodiment. It also has the benefit of removing any opportunity for confusion by the web server's document scripts when they see Fragment Identifiers that they cannot make sense of. Some document scripts are unable to function properly when there is more than one fragment identifier of any kind; this occurs in part because the original intent of Conventional Fragment Identifiers has been usurped and circumvented by document scripts.

Figures 24A, 24B:
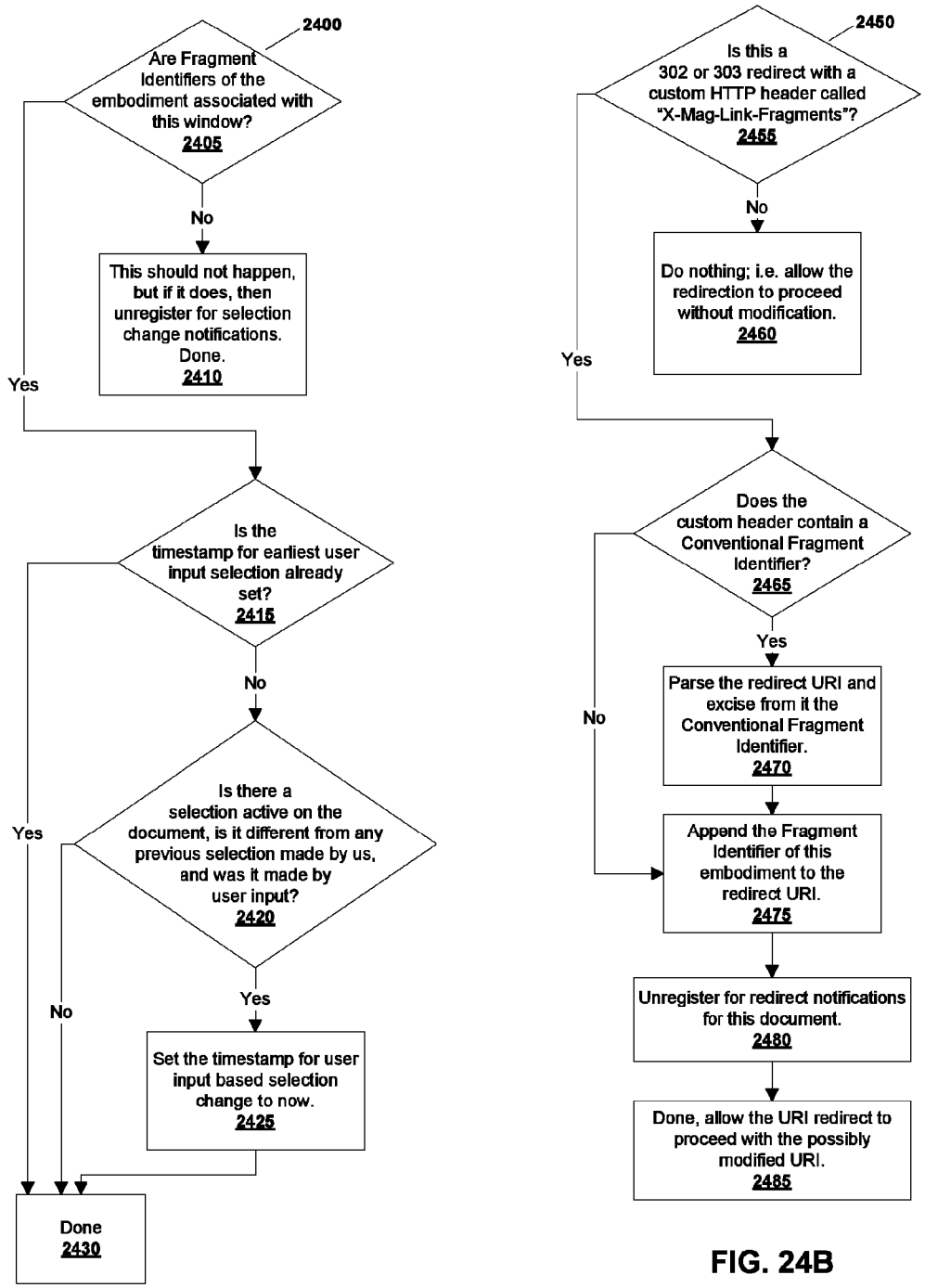
FIG. 24A illustrates actions on user input based selection change notifications.
FIG. 24B illustrates actions on HTTP 302 and 303 redirect notifications.

The activities of the process 2400 of FIG. 24A are registered 2225 to be undertaken whenever the user interactively makes a selection in the document that was opened by this activation. Typically this means registering the code that implements FIG. 24A for a selection change event. When a selection changes due to user interactive input, then the actions illustrated in FIG. 24A are undertaken.

The activities of the process 2300 of FIG. 23 are registered 2230 to be undertaken whenever the DOM instance created for this activation changes. In the example implementation this means registering the code that implements FIG. 23 for a DOM change event according to the W3C specifications of DOM events for HTML and XML. When the DOM is changed the actions specified in FIG. 23 are undertaken.

If this is 2215 a Surrogate URI, then the activities of the process 2450 of FIG. 24B are registered 2217 to be undertaken whenever HTTP 302 or 303 redirects occur for this activation context. In the example implementation this means registering the code that implements FIG. 24B for an HTTP redirect event associated with this activation context. When an HTTP redirect occurs (HTTP redirects include 301, 302, 303, and 307 redirects) associated with this activation context, the actions specified in FIG. 24B are undertaken. Note that when the Surrogate URI is redirected to a Fragment URI, according to FIG. 24B, the result is an activation of a Fragment URI which in turn causes actions of this process 2200 for that Fragment URI.

Also if this is 2215 a Surrogate URI, embed 2217 an HTTP header to notify the Redirect Service that this user agent is an embodiment, including a version number. In an implementation this might be performed by code that is low in the protocol stack and run whenever an HTTP request goes out; in that case the URI is inspected to determine if it is a surrogate URI and the header is added to the request. According to the usually followed convention, some embodiments use a custom header name that is prefixed with "X-"; an example implementation uses the header name "X-Mag-Link-Agent" with the assigned value having a prefix of "MagLink". An implementation version number follows the "MagLink" string; for example, "MagLink54" for implementation version 54 of an embodiment. This allows the Redirect Service to know what the capabilities are of the embodiment, and whether an upgrade from one implementation to another is in order. If this header is not present, the Redirect Service behaves as if the user agent is not an embodiment.

The URI activation continues 2235 according to normal user agent behaviors, which is typically to download the content and display the document. Again, an attempt to download the content for a Surrogate URI results in the redirection according to the Redirect Service, the actions of FIG. 24B when the redirect response arrives at the user agent, and then another activation for a Fragment URI according to this process 2200.

Note that the manner in which navigation history information is kept in some embodiments differs between the user agent and the URI Service. The URI Service has the Common DOM Form for all version 1 Fragment URIs and hence Surrogate URIs (which in some embodiments map to version 1 Fragment URIs), so the URI Service can accurately generate the title and description that appeared when the version 1 Fragment URI was created, as well as the target strings for any version 1 Fragment URI. Therefore, as a matter of efficiency at the service, the URI Service has no need to store those strings separately with a Content Record.

FIG. 23 illustrates actions 2300 taken on DOM change event notifications for documents opened in a user agent. When such a notification occurs (as registered 2225 in FIG. 22), a check is made to determine if the document declares 2302 itself MagLink Friendly and whether the document has been marked to indicate that the user agent is an embodiment. If the document is MagLink Friendly but has not yet been marked, then the user agent marks 2303 the document DOM instance, indicating to the content scripts that the user agent is an embodiment, by adding a new META tag node as a child to the head node in accordance with the following HTML:

<META name="MagLink_UserAgent" content="MagLink">.

This is done so that the page's content scripts can determine that the user agent is an embodiment, but only under the circumstance that the document is MagLink Friendly. If it is not MagLink Friendly then it is beneficial to deny that knowledge to the document scripts in order to avoid any possible accidental, deliberate, or even potentially malicious behavior whereby the actions of content scripts differ depending on whether a user agent is an embodiment. According to some embodiments, such differing behavior is avoided by denying this information to the scripts of documents that do not first declare MagLink Friendliness.

Note that the declaration of MagLink Friendliness could be temporarily missing from a DOM because it is not yet processed into the DOM by the time the DOM change notification occurs. It is important that DOM change notifications continue to be processed until the nonexistence of the metadata in the DOM accurately implies that the document does not declare MagLink Friendliness. While it is almost universally the behavior of a web based document server in practice, in some embodiments it is nevertheless the responsibility of a document server when acting according to an embodiment to ensure that the declaration of MagLink Friendliness is downloaded with the head of the document in advance of the transmission of the <body> tag. This is beneficial in some embodiments because it supports early and thereby computationally efficient un-registering for DOM change notifications for documents that are not MagLink Friendly, as they are downloaded, during a period when their DOM may be rapidly changing. It is also the responsibility of the user agent to process the document into the DOM in the order in which it is received. This preservation of order is almost universally the behavior of existing user agents. Those skilled in the art will appreciate that various means to achieve comparable efficiency could be used, including means that achieve such efficiency less often or at differing levels of efficiency, and that such efficiency could be sacrificed entirely without the loss of other benefits of embodiments.

If no Fragment Identifiers of an embodiment are associated 2304 with the activation context (in HTML, the "window" object) of the document display (which association would have been made 2220 previously), then set 2306 a Boolean variable <Unregister> to true.

If the document DOM is not already marked 2305 to indicate that the user agent conforms to this specification and it is not positively known 2306 that this document does not self-declare MagLink Friendliness, then set 2309 the Boolean variable <Unregister> to false.

If the title and description are not available 2308 from the DOM instance (which is determined by querying the DOM instance at the current time, perhaps as it is being built), or not enough of the DOM instance has been constructed to ensure that the title and description will not be created later during DOM construction, then processing halts 2310 for this process 2300 of FIG. 23.

If the title and description are available 2308 from the DOM instance (which is determined by querying the DOM instance at the current time, perhaps as it is being built), or enough of the DOM instance has been constructed to ensure that the title and description will not be created later during DOM construction, then the title and description of the current document are compared 2311 with the document's title and description in the local navigation history. If they differ 2311, then the title and description are updated 2312 in the local navigation history and the navigation history is synchronized with the URI Service.

According to FIG. 23, this particular update activity 2312 only occurs if the URI is not a Fragment URI of the embodiment. The title and description can change at any time but this process will detect changes and notify the URI Service. If the current user's role has not accessed this URI before, then it is added. If the current user's role has accessed this URI before but the title or description changed, information for this URI is updated. Note that the Content Record for this URI at the URI Service may have already been updated to the current title and description due to the activities of some other user.

If the <Unregister> Boolean is 2313 true, then unregister 2314 this activation context (window) for DOM change notifications before ending 2345 the process illustrated in FIG. 23.

If Fragment Identifiers of an embodiment are associated 2304 with the document display window (which association would have been made 2220 previously), then a check 2315 is made to determine if the time stamp for earliest unprocessed DOM change is set. If not, then that time stamp 2320 and the time stamp for the latest DOM change 2325 are both set to the current time. If the time stamp for earliest unprocessed DOM change is set 2315, then only the time stamp for latest DOM change is set 2325 to the current time.

Since much of the processing for DOM change notifications need not be done for every DOM change, especially when changes are occurring at a rapid rate, this processing is deferred in order to reduce processing costs. Deferral may occur repeatedly under circumstances of rapid changes. To support such deferral, a time stamp is kept for the earliest time when a DOM change occurred, and that time stamp remains unchanged while processing for it is deferred. Note that the processing itself is the same, whether there have been one or hundreds of deferrals, except that more of the document may be beneficially present for processing. These deferrals should not go on for too long however, even if DOM changes continue, because such processing is of benefit to the user even if the document is not complete. Since humans have such slow reaction times relative to the rate of DOM changes possible on a computer, this delayed processing benefits the user by consuming computational resources at a slower rate without causing the user to perceive annoying delays. Thus we delay processing of changes based on human reaction times and tolerance to delays. Those skilled in the art will appreciate that these benefits may be achieved in a multiplicity of ways and that many settings for delays and time limits will achieve such benefits.

Figure 25:
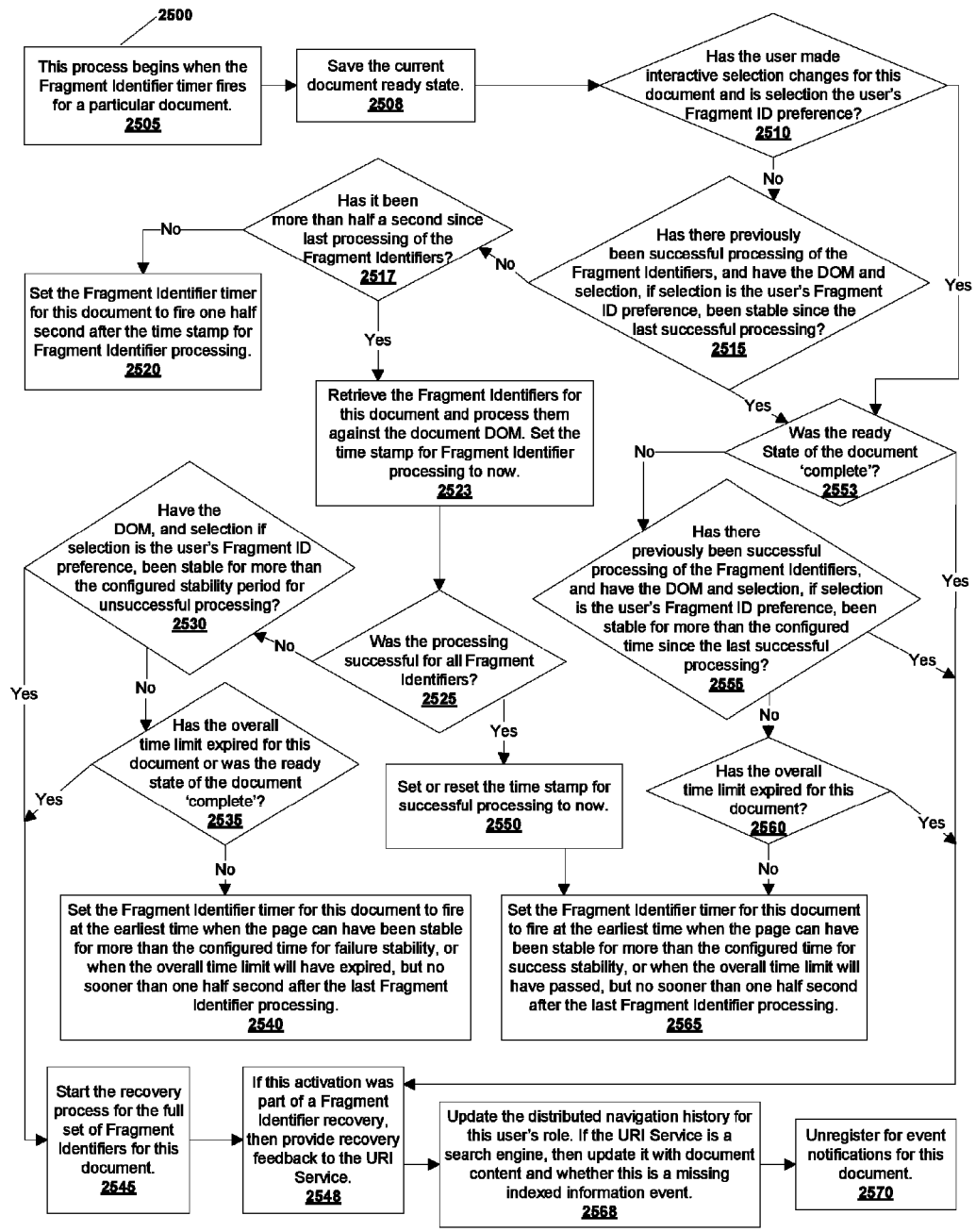
FIG. 25 illustrates actions on Fragment Identifier timer event for documents having version 1 or 2 Fragment Identifiers.

If the Fragment Identifier timer (there is a Fragment Identifier timer that causes further actions to occur when it fires) is not set 2330 to fire within half a second from now, then set it to fire 2340 in one half second and, when it fires, to cause the actions 2500 of FIG. 25 to be undertaken; then this notification process ends 2345.

If the Fragment Identifier timer is set to fire 2330 in half a second or less, then a check is made against the time stamp of the earliest deferred DOM change. If the earliest unprocessed change occurred long enough ago 2335 (in some implementations this is configurable and by default is 2 seconds), then even though there may have been rapid changes, do not advance the timer forward to half a second from now, but leave it to fire on schedule; end further activity for this notification 2345.

FIG. 24A illustrates actions 2400 taken when user input based selection changes occur for documents opened from Fragment URIs. When such a notification occurs (as registered 2225 in FIG. 22), for safety sake a check 2405 is made to ensure that at least one Fragment Identifier is associated with the activation. If not, then something went wrong and the remedy is to unregister for the notifications 2410.

The idea of this processing 2400 is to give priority to Fragment Identifiers of an embodiment, over all other sources for making selections, except those that may be made interactively by the user. Thus, we are registered for user based selection change events; we do this processing so that we can know that such an event occurred and we can (elsewhere in FIG. 25) avoid interfering with the user's selection choices.

If the timestamp for earliest user input selection is set 2415, then processing ends 2430.

The determination is made whether 2420 there is a selection active on the document that differs from any previous selection made according to this specification, and that was made by interactive user input. If all of these are true then the timestamp for earliest user selection input is set to now 2425, after which the processing of this notification halts 2430. This test is useful since content scripts can change a selection after activities of this specification have already made selections, and only interactive user selections will have the ability to alter the effects on the selection caused by Fragment Identifiers of some embodiments for a pre-determined time interval.

FIG. 24B illustrates actions 2450 taken when HTTP 302 or 303 redirect notifications occur for activation contexts that were previously registered 2217 for notifications of such redirects. If this redirect is not 2455 an HTTP 302 or 303 redirect message having a custom HTTP header called "X-Mag-Link-Fragments", then ignore 2460 this message and allow activation to proceed without modification of the redirect message.

In what follows, this redirect is 2455 an HTTP 302 or 303 redirect message having a custom HTTP header called "X-Mag-Link-Fragments".

If the custom header contains 2465 a Conventional Fragment Identifier, then search 2470 for the Conventional Fragment Identifier in the redirect URI using string matching and remove the matched Conventional Fragment Identifier from the redirect URI.

Whether or not the header contains 2465 a Conventional Fragment Identifier, append 2475 the Fragment Identifier of this embodiment, also taken from the custom HTTP header, to the redirect URI. Unregister 2480 for redirect notifications for this activation context (HTML window) and allow the URI redirect to continue 2485 with the modified URI.

In some embodiments, the value of the custom header named "X-Mag-Link-Fragments" contains a Fragment Identifier and possibly a Conventional Fragment Identifier. The Conventional Fragment Identifier, if there is one, is appended to the redirect URI. An embodiment user agent parses the value of the header to separate the two; however, there can be only one or two hashes ("#"), and the Conventional Fragment Identifier, if there is one, is the substring following the second hash.

FIG. 25 illustrates the process 2500 undertaken when timer events (created and set 2340 in FIG. 23 as well as here) fire 2505 for documents activated with URIs having version 1 or 2 Fragment Identifiers. Save 2508 the current document's "ready state" for later reference. The "ready state" of an HTML document is defined by the W3C HTML specifications; a "ready state" of "complete" indicates that the document content has been downloaded and the information processed into the DOM. (Uses of "ready state" and "complete" in this for FIG. 25 are in accordance with standard HTML specifications.) The ready state is used later to determine if the document was "complete". This or an analogous check is necessary for any document that can have a DOM available for processing before the document is entirely downloaded or otherwise available for display. Since the state could become complete during or after processing the Fragment Identifiers, save a copy of the ready state prior to doing any such processing.

Stable as used in this procedure means that the DOM has not changed, and no programmatic (i.e., non-interactive) changes were made to any selections (if the user's preference for Fragment Identifier processing is to display Fragment Identifiers using selections). The default value for success stability, i.e., the configured time period to wait after successful processing to ensure that the DOM is stable, is 10 seconds in some embodiments. There is also a configurable value for failure stability, which is the time period to wait after an unsuccessful attempt to process Fragment Identifiers before giving up. The default time period for failure stability in some embodiments is also 10 seconds.

Some documents never stop changing the DOM (e.g., via scripts), so it is necessary to have an overall timeout which is by default 40 seconds. These time limits can vary over a wide range and the main effect of overly long timeouts is unnecessary consumption of processor time. However, if timeouts are too short then a content script could interfere with the intended benefit of Fragment Identifiers.

Figure 47:
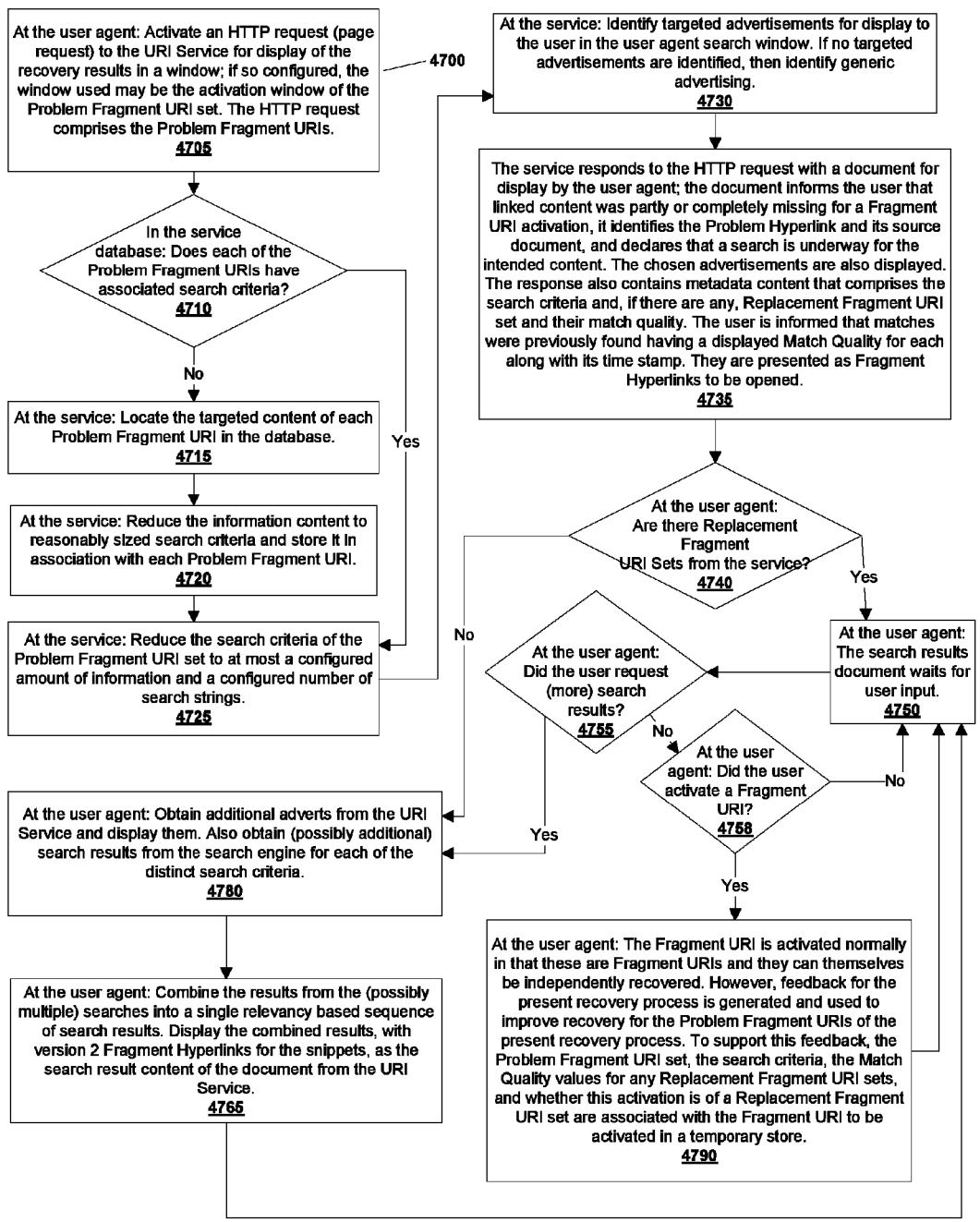
FIG. 47 illustrates version 1 Fragment URI recovery using an external search engine.
Figure 48:
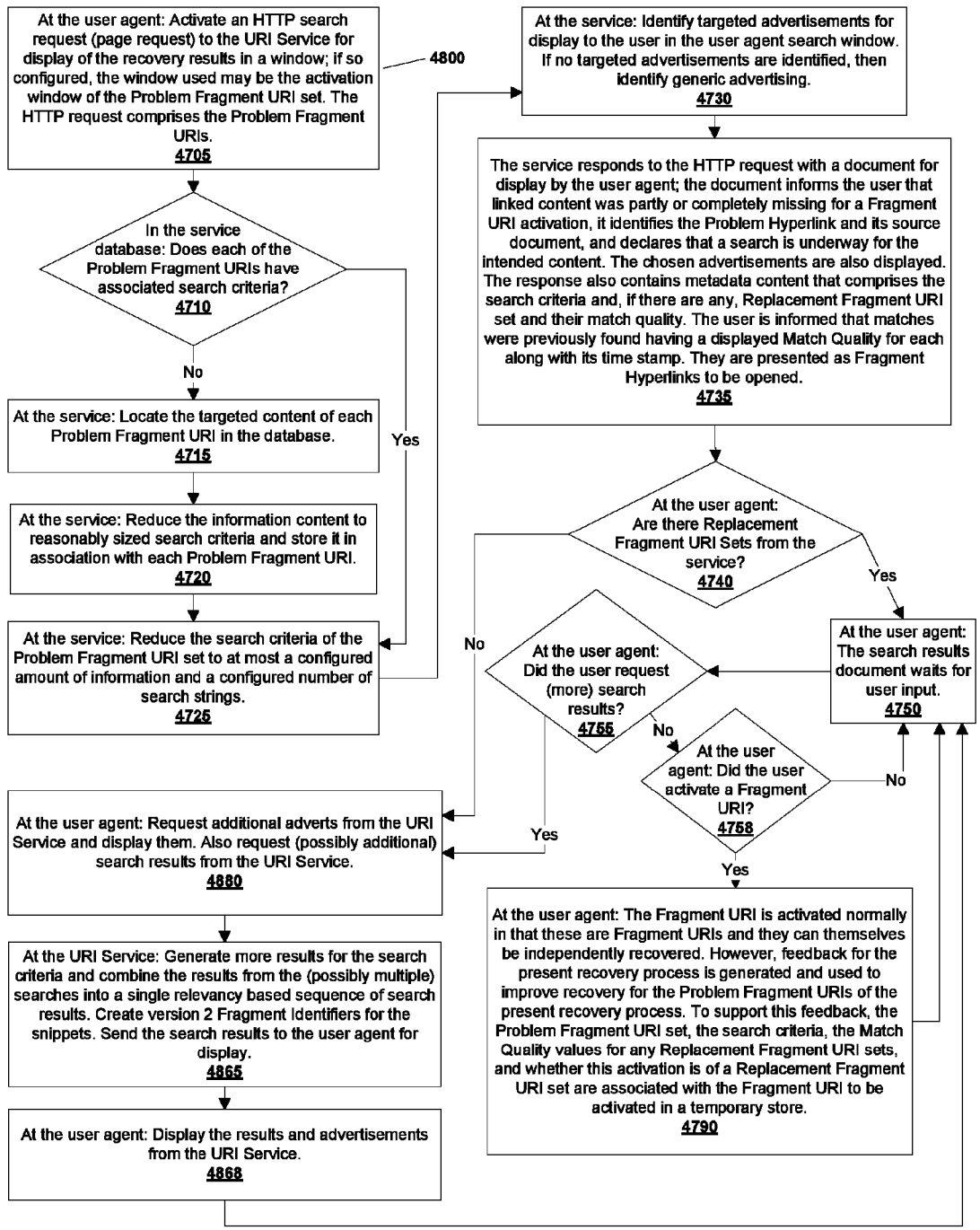
FIG. 48 illustrates version 1 Fragment URI recovery by a URI Service that is also a search engine.
Figure 49:
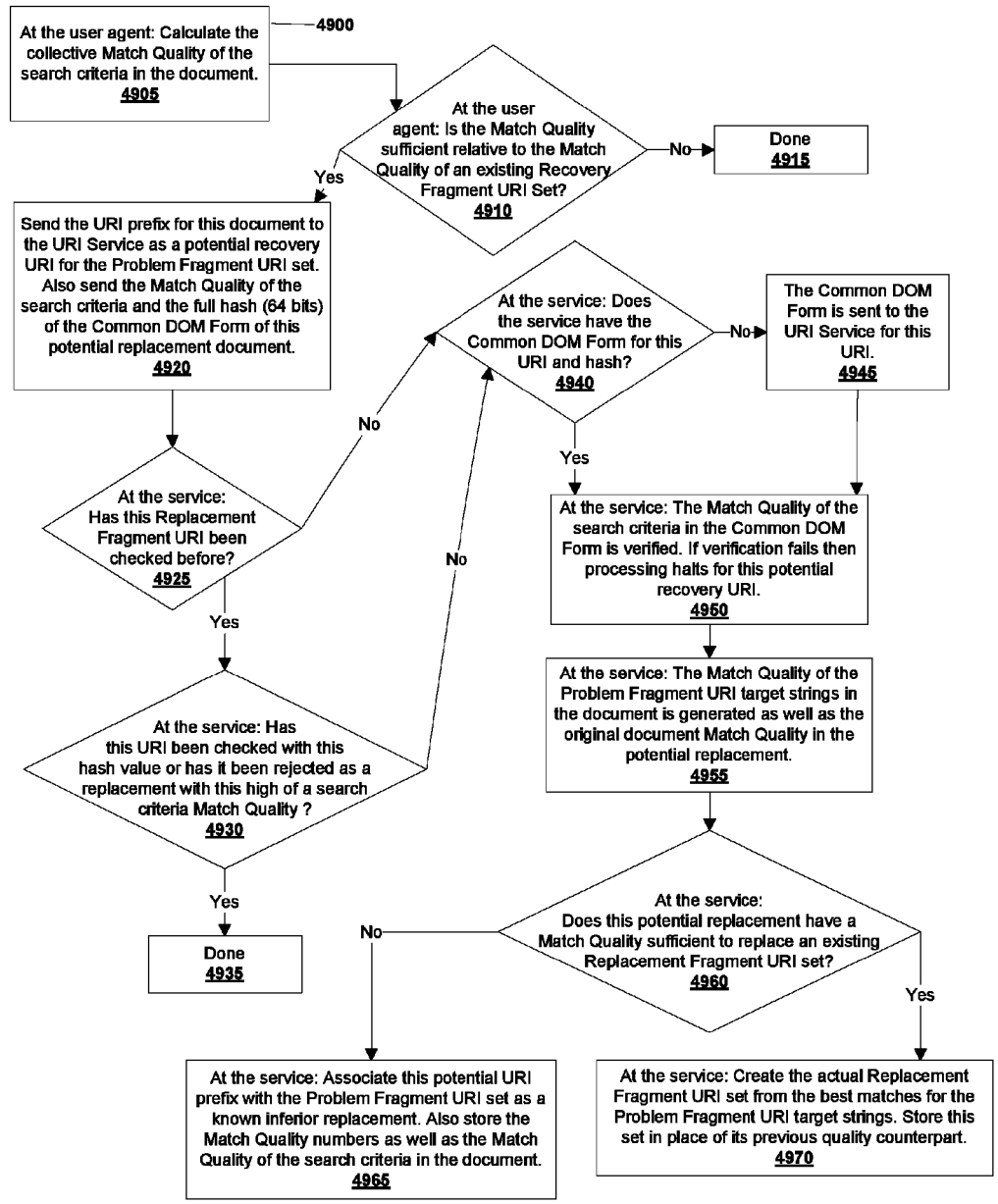
FIG. 49 illustrates recovery feedback for maintenance of Replacement Fragment URI sets.

If:
1. a) the user made interactive changes 2510 to the document's selection and the user's preference is to use selections (as opposed to highlighting) to show ranges in documents, or
   b) the Fragment Identifiers were successfully processed 2515 previously, and the DOM and selection (provided the user's preference is to display Fragment Identifiers using selections) remained stable since that point; and
2. a) the document's ready state (as saved 2508 previously) was 2553 'complete',
   b) the Fragment Identifiers were successfully processed 2555 previously, and the DOM and selection (provided the user's preference is to display Fragment Identifiers using selections) have been stable for more than the configured time since Fragment Identifiers were last processed successfully (the configured time for success stability), or
   c) the overall time limit for the page has expired 2560;
then check 2548 temporary storage, which is set 4790 in FIG. 47 and FIG. 48, to determine if this activation was launched as part of a Fragment Identifier recovery; if so, provide recovery feedback to the URI Service according to the process 4900 of FIG. 49. Update 2568 the distributed navigation history for this user's role. If the URI Service is also a search engine, then information useful for maintaining the search index is exchanged 2568 with the search engine.

This information includes whether the document access constituted a missing indexed information event (MIIE), which occurs when a Fragment URI is accessed from a search engine results document (i.e., the Previous attribute of the Activation Record for this activation identifies a Search Content Record) and at least one range of the Fragment URI could not be found (i.e., a recovery process was launched 2545 for this access). This indexing support is performed according to the process 5200 of FIG. 52 and occurs here in some embodiments in conjunction with updating and synchronizing 2568 the navigation history. Processing of Fragment Identifiers for this document ends by unregistering 2570 for event notifications for this document.

If:
1. a) the user made interactive changes 2510 to the document's selection and it is the user's preference to use selections (as opposed to highlighting) to show ranges in documents, or
   b) the Fragment Identifiers were successfully processed 2515 previously, and the DOM and selection (provided the user's preference is to display Fragment Identifiers using selections) remained stable since that point;
2. the document's ready state (as saved 2508 previously) was not 2553 'complete';
3. a) the Fragment Identifiers were not successfully processed 2555 previously,
   b) the DOM has been 2555 stable for less than the configured time since Fragment Identifiers were last processed successfully (the configured time for success stability), or
   c) the selection (provided the user's preference is to display Fragment Identifiers using selections) has been 2555 stable for less than the configured time since Fragment Identifiers were last processed successfully; and
4. the overall time limit for the page has not expired 2560;
then set 2565 the Fragment Identifier timer for this document to fire at the earliest time when the page can have been stable for more than the configured success stability time or when the overall time limit will have passed. However, the timer is set forward as needed to delay such processing until one half second will have elapsed since Fragment Identifiers were last processed. Note that the time of last processing was set 2523 previously (described below), after that most recent processing completed.

If:
1. the user did not make 2510 interactive selection changes to this document;
2. a) the Fragment Identifiers have not been successfully processed 2515 previously,
   b) the DOM has not been stable 2515 since the last successful processing, or
   c) the selection (provided the user's preference is to display Fragment Identifiers using selections) has not been stable 2515 since the last successful processing; and
3. it has been 2517 half a second or less since the last time Fragment Identifiers were processed;
then set 2520 the Fragment Identifier timer for this document to fire one half second after the time when this document's Fragment Identifiers were last processed. Note that, for timers that can be canceled and reset, this setting or resetting should not occur since we always set the timer to fire at least half a second after last processing, but such timer events cannot always be canceled. Some embodiments use timers that can be canceled and, by using cancellation of timer events, the activities of FIG. 25 are never scheduled to occur more than one time in the future for a single document.

The behavior described in this paragraph for detecting 2517 that processing is underway within half a second of last Fragment Identifier processing helps to recover if for any reason a timer fires too soon.

Figure 26:
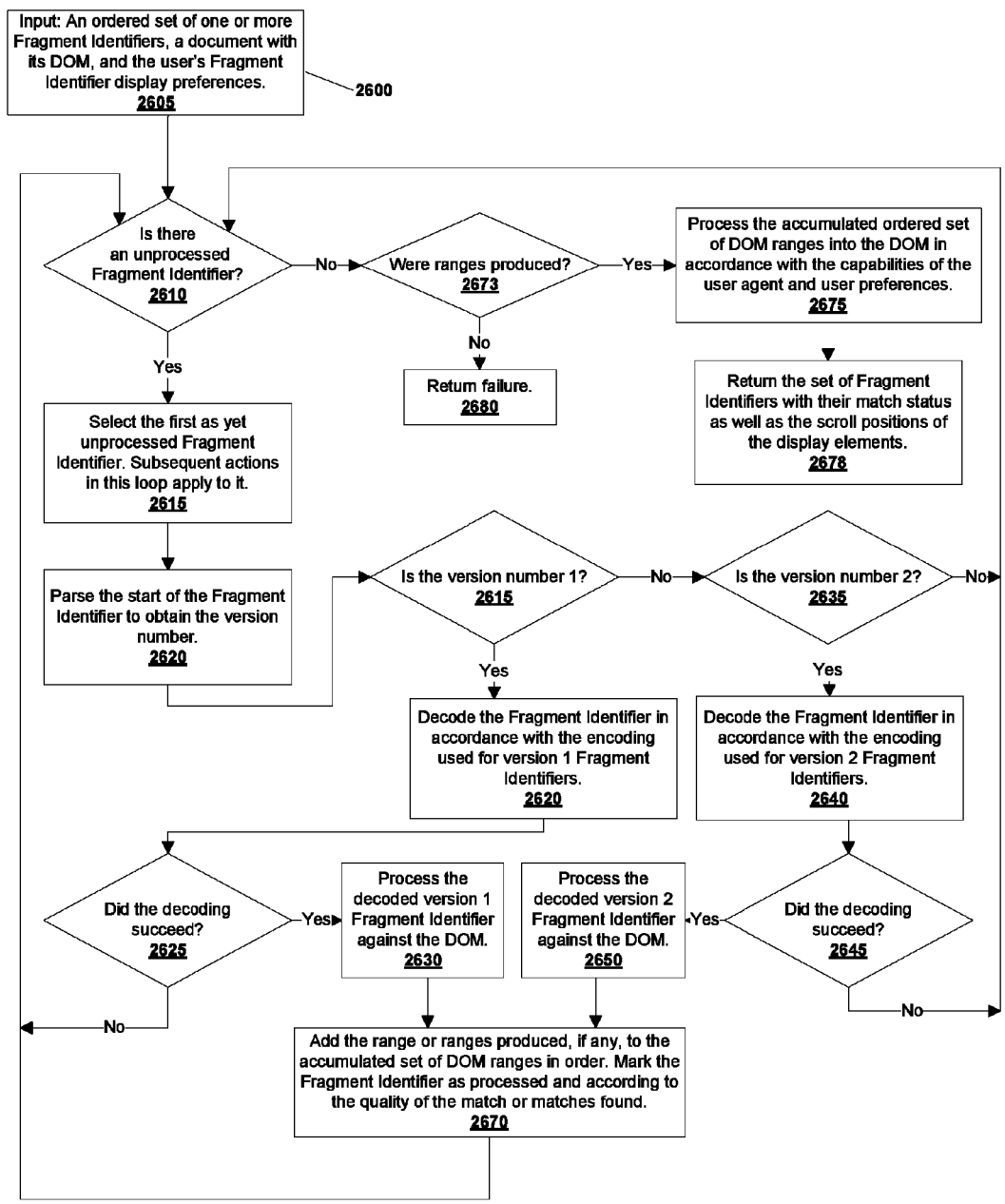
FIG. 26 illustrates modifying the display of a document based on Fragment Identifiers.

If:
1. the user did not make 2510 interactive selection changes to this document;
2. a) the Fragment Identifiers have not been successfully processed 2515 previously,
   b) the DOM has not been stable 2515 since the last successful processing, or
   c) the selection (provided the user's preference is to display Fragment Identifiers using selections) has not been stable 2515 since the last successful processing; and
3. it has been 2517 more than half a second since the last time Fragment Identifiers were processed;
then retrieve 2523 the Fragment Identifiers previously saved 2220 for this document and process 2523 them against the document DOM, which is done according to the process 2600 of FIG. 26. When complete, set 2523 the time stamp for this document's Fragment Identifier processing to the current time (now).

If the preceding processing 2523 was successful 2525 for all Fragment Identifiers, then set 2550 the time stamp for successful processing to the current time (now). Next set 2565 the Fragment Identifier timer for this document to fire at the earliest time when the page can have been stable for more than the configured time for success stability or when the overall timer will have passed. However, the timer is set forward as needed to delay such processing until one half second will have elapsed since the last processing of Fragment Identifiers for this document. Recall that the time of last processing was set 2523 after it completed.

If:
1. the preceding processing 2523 did not succeed 2525 for all Fragment Identifiers;
2. a) the DOM has not been 2530 stable for more than the configured failure stability period (the period used to declare processing to be unsuccessful), or
   b) the selection (provided the user's preference is to display Fragment Identifiers using selections) has not been 2530 stable for more than the configured failure stability period; and
3. a) the overall time limit for this document has not expired 2535, and
   b) the document's ready state was 2535 not 'complete' (when saved 2508 previously);
then set 2540 the Fragment Identifier timer for this document to fire at the earliest time when the page can have been stable for more than the configured time for failure stability, or when the overall time limit will have expired. However, the timer is set forward as needed to delay such processing until one half second after the last Fragment Identifier processing. Recall that the time of last processing was set 2523 after it completed.

If:
1. the preceding processing 2523 did not succeed 2525 for all Fragment Identifiers; and
2. a) the DOM and selection (provided the user's preference is to display Fragment Identifiers using selections) have been 2530 stable for more than the configured failure stability period (for unsuccessful processing), b) the configured overall time limit for this document has expired 2535, or c) the ready state of the document was 2535 'complete' (when saved 2508 previously);

then begin 2545 the recovery process 4700 (or in an alternative embodiment 4800) for this document's full set of Fragment Identifiers according to FIG. 47 (resp. FIG. 48). Then check 2548 temporary storage to determine if this activation was launched from a URI recovery document and if so, provide recovery feedback to the URI Service according to the process 4900 of FIG. 49.

Most document types are less complex than HTML with respect to being complete; however, HTML is not the only document type that can produce a display prior to the availability of all content. If a document type were to be created for which determination of the "complete" state is difficult to define or ascertain, then the other two criteria would be used and the "complete" criterion would be ignored for that document type.

Update 2568 the distributed navigation history for this user's role. This is done in some embodiments by obtaining the Destination of the Activation Record identifier associated with the display context (HTML "window" object in this example) that was previously stored 2208. This Destination is the identifier of the Content Record for the URI of this display context. (With less efficiency the Content Record may be looked up based on the URI.) Using that identifier, the Content Record is retrieved from the local navigation history and the title and description of that retrieved record are compared with the title and description of the document of this display context. If they are different, then the title and description strings are updated locally and if the URI of the Content Record is not a version 1 Fragment URI, then notify the URI Service of the changes. (Recall that a version 1 Fragment URI has a full Common DOM Form stored at the service, which includes its original title and description. A version 1 Fragment URI is a more complete snapshot in time.)

If the Content Record corresponds to a Fragment URI, any snippet strings of the Fragment Content Record were not obtained from located DOM ranges (a Boolean indicates whether this is the case in the Fragment Content Record), and the full complement of ranges were found for this Fragment URI, then convert the ranges to snippets according to the process 5100 of FIG. 51. Then set the Fragment Content Record snippets to the created snippets and set the Boolean indicating that snippet strings were created from located ranges to true. Synchronize changes to the snippet strings with the URI Service.

If the URI Service is also a search engine, then document indexing beneficially utilizes regular and accurate user agent access to document content; information useful for maintaining the search index is exchanged 2568 with the search engine (which is also the URI Service). This information includes whether the document access constituted a missing indexed information event (MIIE), which occurs when a Fragment URI is accessed from a search engine results document (i.e., the Previous attribute of the Activation Record for this activation identifies a Search Content Record) and at least one range of the Fragment URI could not be found (i.e., a recovery process was launched 2545 for this access). This indexing support is performed according to the process 5200 of FIG. 52 and occurs here in some embodiments in conjunction with updating and synchronizing 2568 the navigation history.

Processing of Fragment Identifiers for this document ends by unregistering 2570 event notifications for this document.

FIG. 26 illustrates the process 2600 of modifying the display of a document based on Fragment Identifiers. The idea is to produce a range or a set of ranges that are processed into the DOM in accordance with the user's preferences for selections, highlighting, and scrolling. First, all Fragment Identifiers are decoded and processed against a document's DOM to produce ranges. The inputs 2605 are an ordered set of one or more Fragment Identifiers, a document with its DOM, and the user's Fragment Identifier display preferences. Note that documents can change many times and can even change periodically, so this process may be invoked multiple times for any particular document. It is common for document scripts to make a multitude of changes during the first moments of the creation of a document, and many possible sources of delay can cause such changes to occur later at unintended times.

Select each Fragment Identifier in the ordered set and process it in order 2610,2615. The actions in the loop now described apply to this selected Fragment Identifier, to the exclusion of any other Fragment Identifiers. First, parse the start of the Fragment Identifier 2620 to determine its version number. If the version number is not 1 2615 and not 2 2635, then the Fragment Identifier is ignored and the loop begins again for another Fragment Identifier 2610.

If the Fragment Identifier is version 1 2615 (resp. version 2 2635) then decoded it in accordance with the encoding used for version 1 2620 (resp. version 2 2640) Fragment Identifiers. If the decoding fails for version 1 2625 (resp. version 2 2645) Fragment Identifiers, then reject the Fragment Identifier and begin the loop again 2610, for any additional Fragment Identifier. Note that such failures should not occur, since Fragment Identifiers are not saved for a document unless they have already been parsed successfully, but ensuring that nothing has gone wrong with the saved set before modifying the document is prudent and allows graceful recovery from unexpected circumstances.

Figures 27, 28:
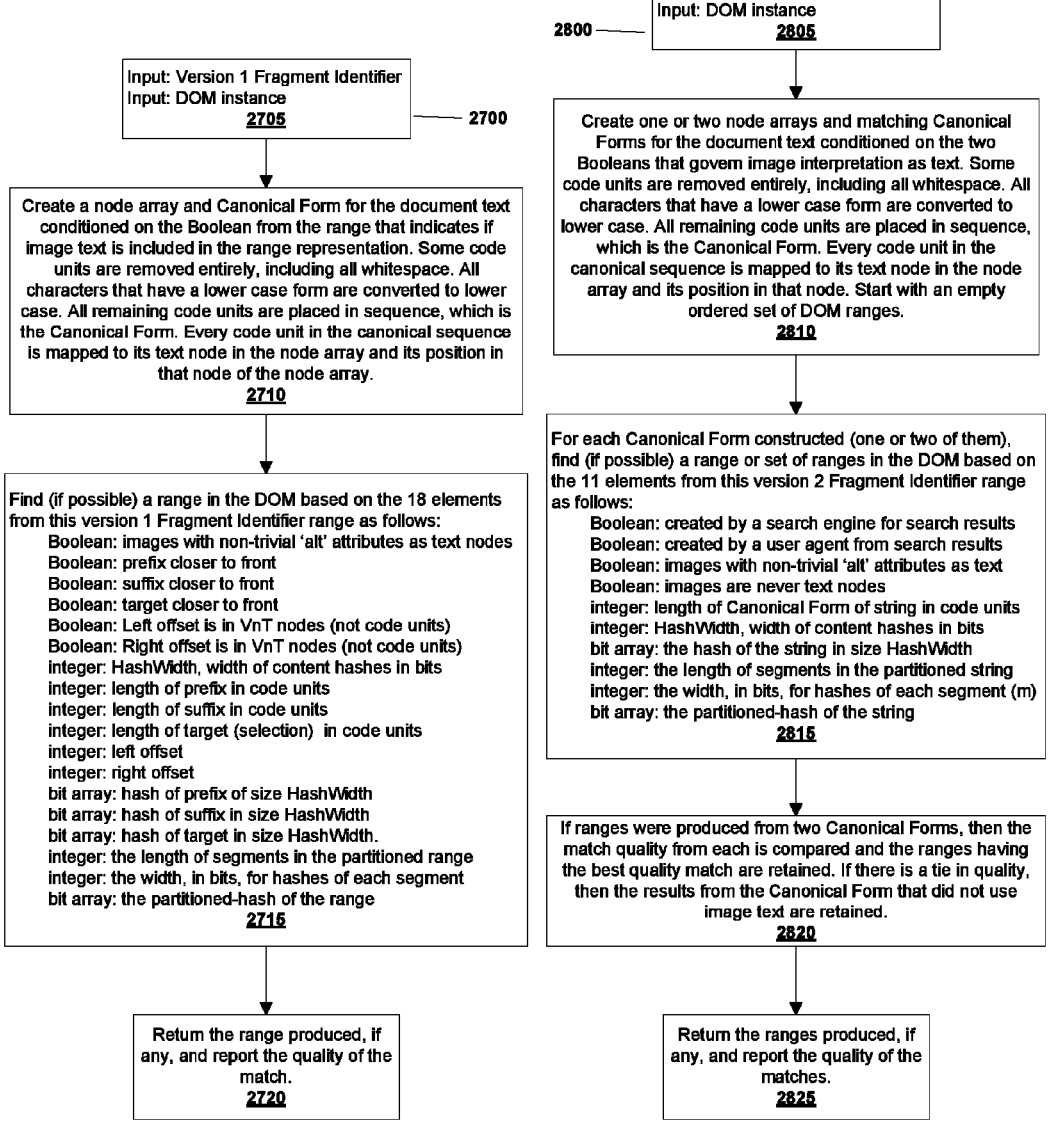
FIG. 27 illustrates producing a DOM range from a version 1 Fragment Identifier.
FIG. 28 illustrates producing DOM ranges from version 2 Fragment Identifiers.

If the decoding succeeded for the version 1 2625 (resp. version 2 2645) Fragment Identifier, then process the version 1 2630 (resp. version 2 2650) Fragment Identifier against the DOM to produce one or more ranges. Details of this process 2700 for version 1 Fragment Identifiers are illustrated in FIG. 27. Details of this process 2800 for version 2 Fragment Identifiers are illustrated in FIG. 28.

Add 2670 the range or ranges produced (2625, 2645), including any ranges from inexact matches, to the accumulated set of DOM ranges for the set of Fragment Identifiers, in order. If more than one match was produced from a single Fragment Identifier, then the earliest match in the page comes first, the second comes second, and so on. These accumulated ranges are associated with the Fragment Identifiers that produced them, which in turn are associated with the quality of the match produced. The quality of the match produced can be the following:

1. Exact, meaning that the target hash matched exactly in one or more places of the Canonical Form for a version 2 Fragment Identifier, and for a version 1 Fragment Identifier there was one or more in-order sequential matches for the prefix, target, and suffix Canonical Forms.

2. Inexact, this level only occurs for version 1 Fragment Identifiers, meaning that the canonical prefix, target, and suffix hashes were sufficient to find a match, including an exact match for the target only, but that not all three matched perfectly in order and position.

3. Partitioned inexact, meaning that the partitioned hash was used to find an approximate match.

If there are no more unprocessed Fragment Identifiers 2610 and if no ranges were produced 2673 then return 2680 failure for this process.

If there are no more unprocessed Fragment Identifiers 2610 and if ranges were produced 2673, use 2675 the accumulated ordered set of DOM ranges to modify the selections, the DOM, or both in accordance with the capabilities of the user agent and user preferences. This is done according to the process 2900 of FIG. 29. Return 2678 the set of Fragment Identifiers with their match status as well as the scroll positions of relevant scrollable elements of the display. If the range that is displayed by scrolling is displayed within more than one scrollable element, then its display involves a scroll position from more than one element. For example, a division of a document may itself be scrolled into view, but the range could be within that division, and so the range is beneficially scrolled into view within that division. The value returned here contains as many scrolling positions as are required to achieve the desired display of the range. These scroll positions are needed in order to later determine whether document-associated scripts have changed the positioning of display elements, after they have been set according to these specifications. This allows the scroll position to be re-set according to these specifications, as needed.

FIG. 27 illustrates the process 2700 of producing a DOM range from a single-range version 1 Fragment Identifier. The inputs 2705 to this process are the Fragment Identifier range and a DOM instance. From the DOM instance, a node array and Canonical Form of the document are created 2710. This is conditioned on the input range Boolean to determine whether or not to treat VnT nodes that have non-trivial alternative text as Alt nodes. E.g., HTML image nodes having non-trivial text in 'alt' attributes are treated as Alt nodes in accordance with this Boolean. This is necessarily the same Canonical Form used for creating Fragment Identifiers as described previously in the process 1200 of FIG. 12. Based upon the decoded version 1 fragment range, a range of the DOM is identified 2715 if possible. Since the document may have changed in arbitrary ways since the Fragment Identifier was created, it may not be possible to find a range, but ranges may be found even if they are not perfect or exact matches. Details are given in the process 3000 of FIG. 30. If a range is produced, along with its quality of match of Exact, Inexact, or Partitioned Inexact, it is returned 2720. If no range is produced, then failure is returned.

FIG. 28 illustrates the process 2800 of producing a DOM range or ordered set of DOM ranges from a single-range version 2 Fragment Identifier. The inputs 2805 to this process are the Fragment Identifier range and a DOM instance. Based on the DOM instance and the Booleans from the fragment range for image text inclusion, one or two node arrays and matching Canonical Forms of the document are created 2810. The first node array only includes text from text nodes; the second, if created, includes text from text nodes as well as text from VnT nodes (image nodes in the HTML example associated with some embodiments) that contain alternative text. Only one node array is created if exactly one of the two Booleans is set. If the two Booleans indicate that image text is included, then images having non-trivial alternative text representations are treated as text nodes. If the two Booleans indicate that image text is not included, then all images are treated as VnT nodes. If the two Booleans indicate that it is unknown whether image text is represented (which is the typical case if the version 2 Fragment Identifier was constructed at the user agent from snippets), then both Canonical Forms and mappings are created. These are the same Canonical Forms used for creating Fragment Identifiers as described previously for the process 1200 of FIG. 12. Based upon the decoded version 2 fragment range, one or more ranges of the DOM are identified 2815 if possible. Since the document may have changed in arbitrary ways since the Fragment Identifier was created, it may not be possible to find a range, but ranges may be found even if they are not perfect or exact matches. It may also be possible to find multiple exact matches, which results in multiple ranges up to a configurable limit. By default this limit is 5. Details relating to searching based on a version 2 Fragment Identifier are given in the process 3400 of FIG. 34.

If ranges were produced from two Canonical Forms, compare 2820 the match quality of the produced ranges. Retain the range or range set having the best quality. If there is a tie in quality, then preferentially retain the results from the Canonical Form that did not use image text and discard the other match or match set.

Return 2825 any ranges that are produced, along with the quality of match designation of Exact or Partitioned Inexact. (The quality designation "Inexact" is not used in some embodiments with version 2 Fragment Identifiers.) If no range is produced, then return failure.

Figure 29:
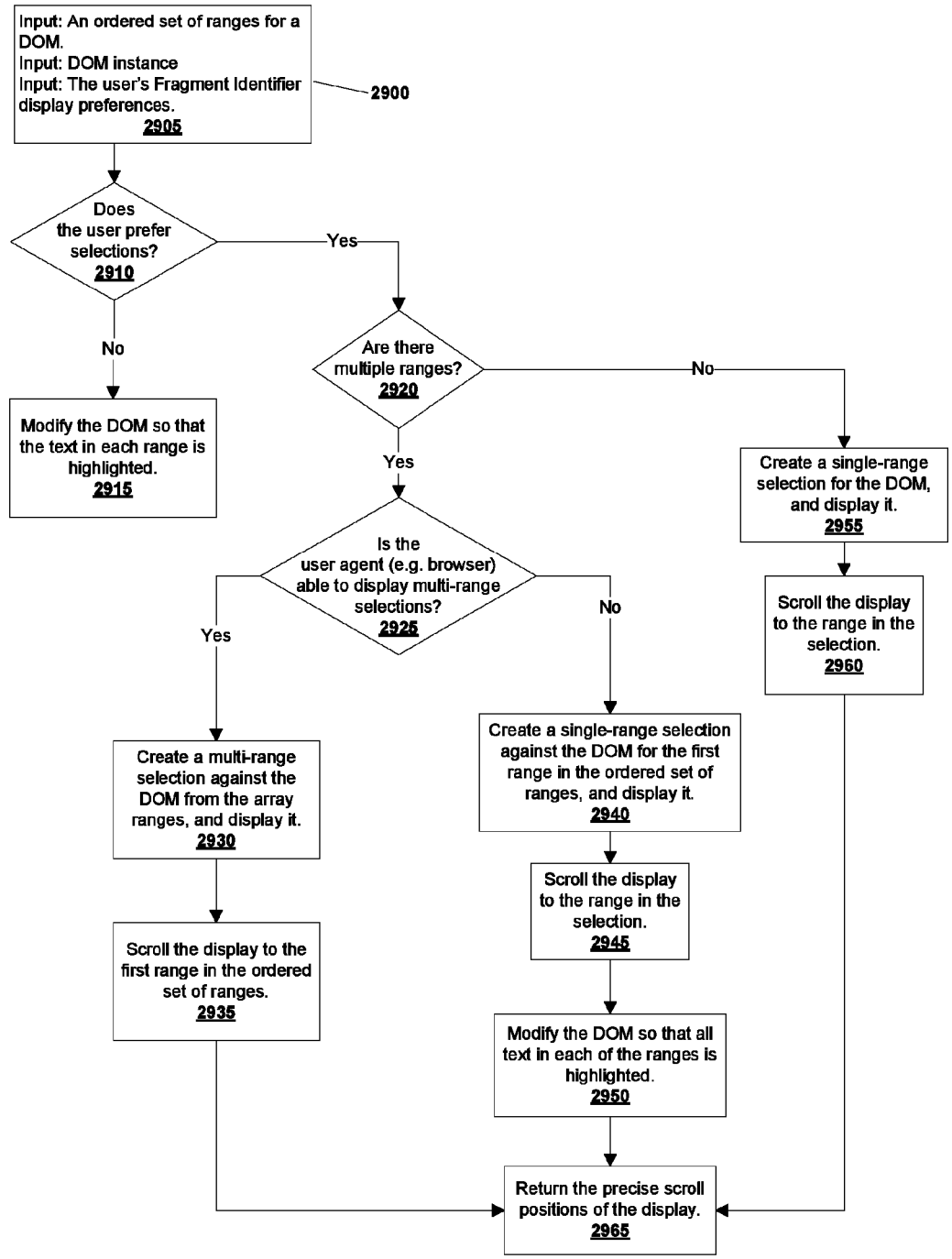
FIG. 29 illustrates displaying the ranges by altering the DOM and selection

FIG. 29 illustrates the process 2900 of displaying the ranges by altering the DOM and selection. The input 2905 is an ordered set of ranges for a DOM and a DOM instance. If the user prefers 2910 highlighting when displaying Fragment Identifiers over selections then the DOM is simply modified 2915 so that each range in the set is highlighted. If the user prefers 2910 selections, there are 2920 multiple ranges to display, and the user agent (typically a browser) is able to display 2925 multiple ranges in a single selection, then create 2930 a multi-range selection against the DOM instance that has all of the ranges and scroll 2935 to the range represented first in the ordered set. Return 2965 the precise scroll positions against the DOM.

Note that if the range that was scrolled into view is displayed within more than one scrollable element, then its display involves a scroll position from more than one element. For example, a scrollable division of a document may itself be scrolled into view, but the range could be within that division, and so it should be scrolled into view within that division. The value returned here contains as many scrolling positions as required to achieve the desired display of the range. These scroll positions are needed in order to later determine whether document-associated scripts have changed the positioning of display elements that were set according to these specifications. This allows the scroll position to be re-set according to these specifications, as needed.

If the user agent cannot 2925 display multiple range selections, then create 2940 a selection for just the first range in the ordered set, scroll 2945 to the selected range, and modify 2950 the DOM to highlight all of the ranges, including the selected range. Return 2965 the precise scroll positions against the DOM.

If there are not 2920 multiple ranges, create a single range selection for the range, display 2955 it against the DOM and scroll 2960 it into view. Return 2965 the precise scroll positions against the DOM.

Figure 30:
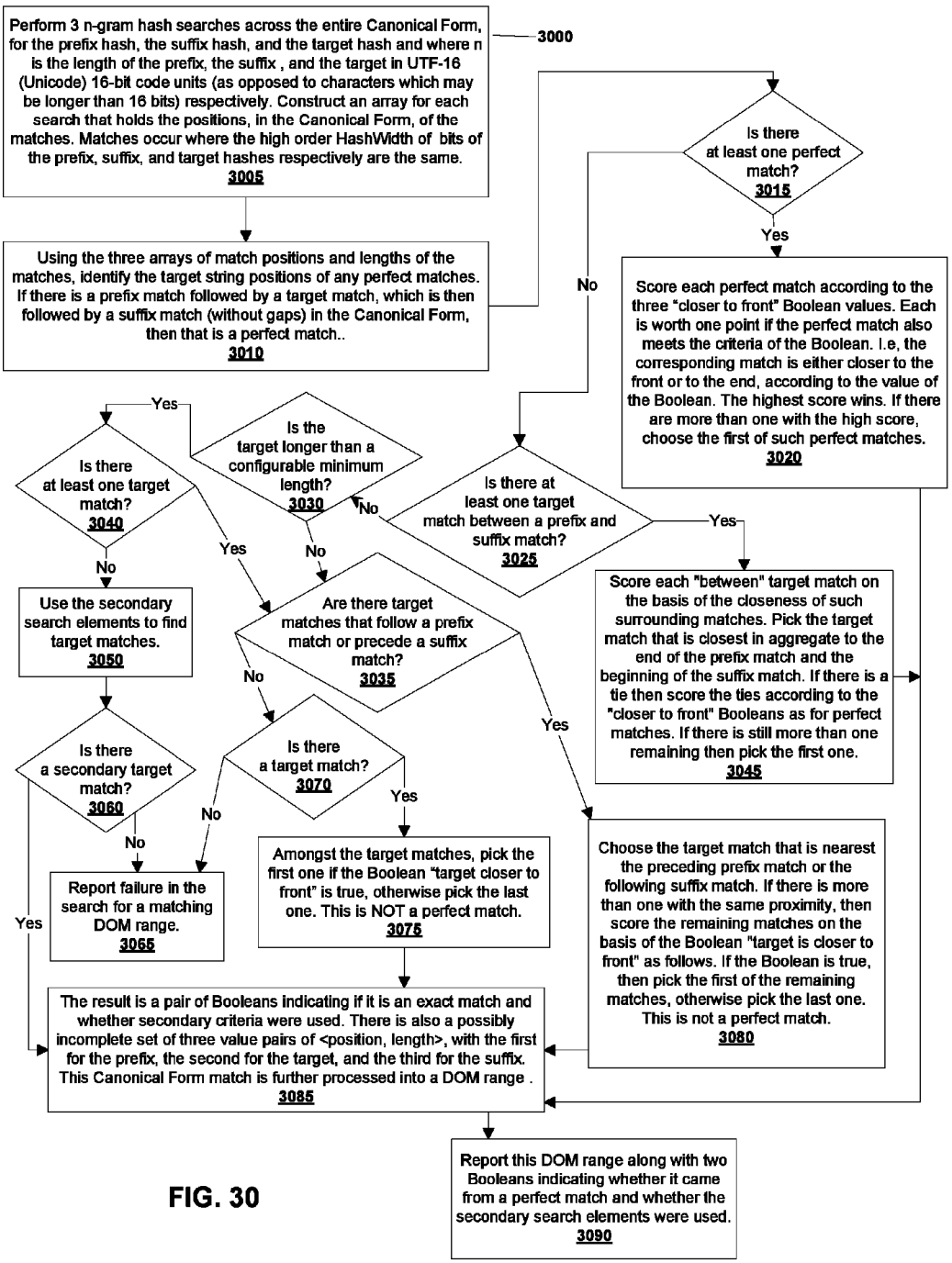
FIG. 30 illustrates version 1 Fragment Identifier range search.

FIG. 30 illustrates the process 3000 of performing a version 1 Fragment Identifier range search for a single range against a DOM instance. Perform 3005 three n-gram hash searches across the Canonical Form, one for each of the prefix hash, the suffix hash, and the target hash, and set n to the length of the prefix, the suffix, and the target in UTF-16 (Unicode) 16-bit code units respectively. An array of matches for each search holds the positions, in the Canonical Form, of the matches. Matches occur when the high order HashWidth of bits of the prefix, suffix, and target computed hashes respectively are the same as those from the Fragment Identifier. These n-gram searches are performed according to process 200, for which the inputs are the Canonical Form, the hash value to be found, the length of the hash (n), and the number of high order hash bits used (HashWidth). Recall that the value of HashWidth is encoded in each range of a Fragment Identifier. The returned values of interest here are the array of matches and the count of matches for each of the three searches.

Using these three arrays we first identify 3010 any perfect matches. A perfect match means the prefix matches, followed immediately by a match of the target, and that followed immediately by a match of the suffix; i.e., there is no overlap and no gaps. If there are 3015 one or more perfect matches, then score 3020 each match based on the three "closer to front" Boolean values from the fragment range. Each of the three is worth one point, and the perfect match with a component that corresponds most closely to the placement indicated by the Boolean when compared with the other perfect matches gets the point. The perfect match with highest score is taken. If there is more than one highest score then the match having the high score that appears first in the document is used 3085 and processed into a DOM range according to the process 2900 of FIG. 29.

If there is 3015 no perfect match, but there is at least one target match 3025 that lies between a prefix match and a suffix match, then score 3045 each such "between" target match on the basis of the closeness of such surrounding matches; i.e., pick the target match that is closest in aggregate to the end of the prefix match and the beginning of the suffix match. If there is a tie, then score the tied matches according to the "closer to front" Booleans as described above for perfect matches. If there is still more than one tie remaining then pick the one that appears first in the document. Process 3085 the resulting match into a DOM range.

If there is no 3025 target match that falls between a prefix match and suffix match, but the target length is 3030 greater than a configured minimum number of code units (the default for some embodiments is 10) and there is 3040 at least one target match somewhere in the Canonical Form; then if there is 3035 a target match that either follows a prefix match or precedes a suffix match, then pick 3080 the target match that is nearest its preceding prefix match or its following suffix match (provided they exist) from amongst such target matches. If there is more than one with the same proximity, then evaluate those on the basis of the Boolean "target is closer to front" as follows: if the Boolean is true, then pick the remaining match that appears first in the document; otherwise pick the one that appears last. Process 3085 the resulting match into a DOM range.

Note that the configured minimum target length in code units is used to ensure that there is a reasonable probability that the ultimate selected content was intended content. In this case the match is not perfect (not a perfect prefix-target-suffix match). Thus, we are only willing to accept a target match that is out by itself under circumstances that increase the probability of identifying intended content. For example, the hash of a single character could match in many places, and without the matching context is likely to be a randomly occurring match. In alternative embodiments the criterion could be that the target hash matches in no more than a configured number of places in the document; and if there are more then the additional matches are not used.

If there are no target matches 3035 that follow a prefix match or precede a suffix match, but there is 3070 at least one target match, then pick 3075 the match that appears earliest in the document if the Boolean "target closer to front" is true, and pick the one that appears last otherwise. Process 3085 the resulting match into a DOM range.

If no target matches 3070, then report 3065 failure to match in the DOM for this fragment range.

If no target matches 3040, then use 3050 the secondary search elements of the Fragment Identifier range to find target matches. This is done according to the process 3100 of FIG. 31. If the secondary search found 3060 a match, then process 3085 the match into a DOM range.

If the secondary search did not find 3060 a match, then report 3065 failure to match in the DOM for this fragment range.

When a target match has been identified, there is a Boolean indicating whether it is a perfect match, a Boolean indicating whether the secondary search information was used, the position of the target match and its length, the position (if any) of the prefix match and its length, and the position (if any) of the suffix match and its length. When the secondary search information was used for an approximate match, then the length of the match may not be the same as the target length in code units, so the length of the match is beneficially kept separately even though it is redundant when the target matched. For uniformity, even though the length may be obtained for the prefix and suffix matches from the decoded Fragment Identifier, we consider the intermediate result here to include the lengths. The two Booleans establish the quality of the match, whether it is exact, inexact, or inexact using secondary criteria.

The target or approximate match information is further processed 3085 into a DOM range. This is done according to the process 3500 of FIG. 35. The resulting DOM range is reported 3090 along with the Booleans that together indicate the quality of the match.

Figure 31:
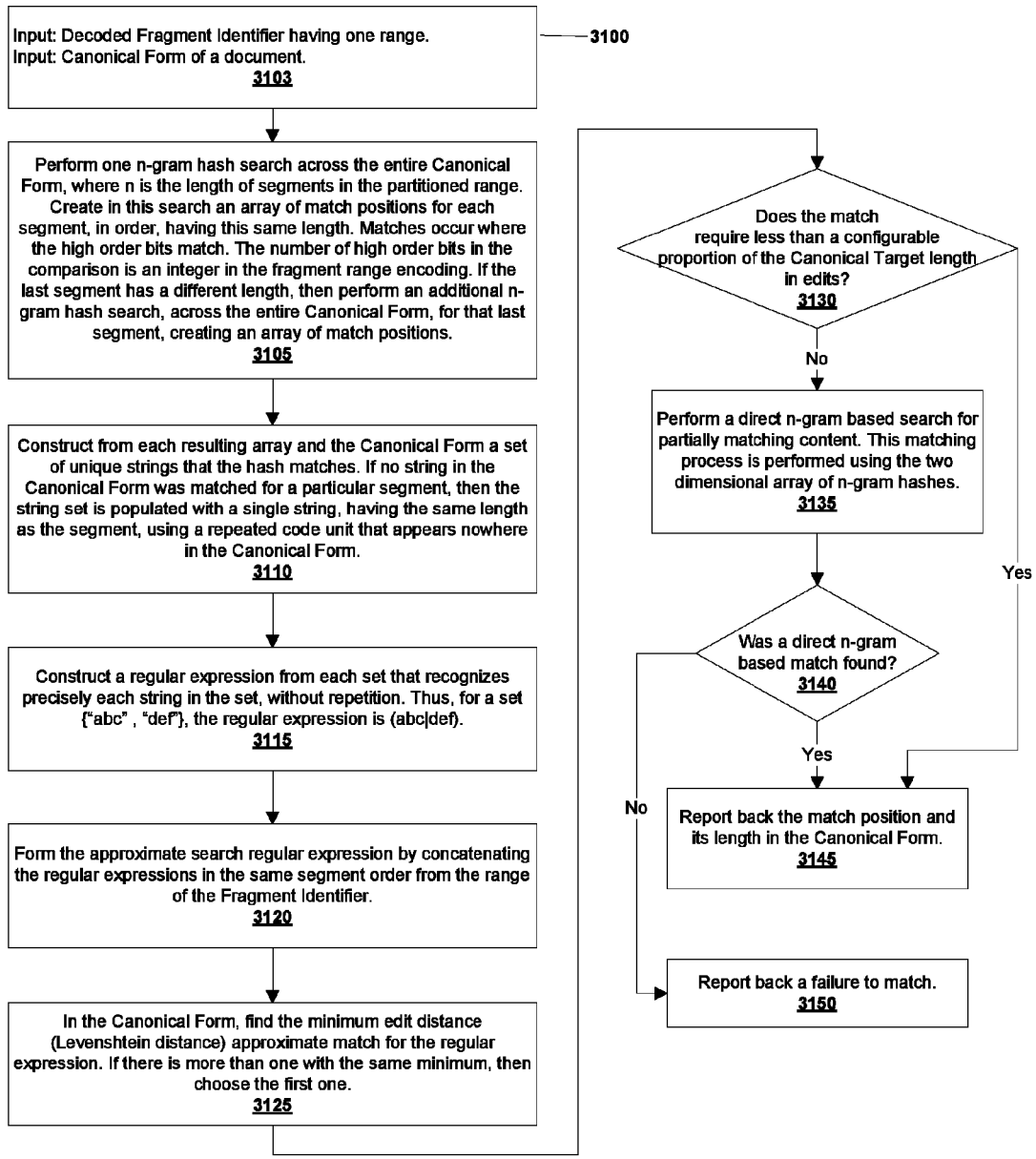
FIG. 31 illustrates creating target matches from secondary search elements.

FIG. 31 illustrates the process 3100 of creating target matches from secondary search elements. The inputs of this process are the Fragment Identifier (either version 1 or version 2), and the Canonical Form. The Fragment Identifier elements actually used are taken from the fragment's range, and are:

The length in code units (L). This is the length of the Canonical Target.

The length in code units of all but possibly the last segment in the partitioned Canonical Target ($n_1$).

The width in bits of the individual hashes for the segments (m).

The bit array containing the sequence of partitioned-hash values of the Canonical Target.

The number s of $n_1$-length segments in the Canonical Target is calculated by integer division (i.e., drop the remainder) as $s=L/n_1$. If there is a non-zero remainder to $L/n_1$, then there is an additional segment of length $L-(n_1*s)$, which is designated $n_2$.

A simultaneous n-gram rolling hash search 3105 for the s hash values is made across the Canonical Form, where the length in 16 bit code units (n) of the n-gram hash is $n_1$ and the hash values are in the s-length array of m-bit hash values from the bit array. This simultaneous search is closely related to process 200, using the same randomly chosen hash function, and is described in detail as the process 3200 of FIG. 32. It produces an array containing starting positions in the Canonical Form of strings having length $n_1$ that match, for each of the s hash values. If $n_2$ is not zero, then an additional n-gram search is performed across the Canonical Form where n is $n_2$, to obtain a single array containing starting positions of strings having length $n_2$ that match for the final segment.

From each resulting array of match positions, the length of the matched text in code units, and the Canonical Form, a set of unique code unit sequences that the particular hash matches is constructed 3110. Note that these sequences are in code units and not necessarily characters, since a matched string can start or stop within a character that is longer than a single code unit. If no code unit sequence in the Canonical Form was matched for a particular segment, then the matching set is populated with a single string, having the same length as the segment, using a code unit length character that appears nowhere in the Canonical Form. In some embodiments the standard space character is used, which is always adequate since it cannot appear in a Canonical Form. However, since upper case roman characters likewise do not appear and they are all 16 bit characters, any of them would suffice in alternative embodiments.

In what follows regular expressions are used, and in those regular expressions code units are treated as complete characters, so a Unicode character that requires two code units is treated as a two-character sequence for purposes of processing regular expressions.

Construct 3115 a regular expression of code units that recognizes precisely each code unit sequence in the set of matching code-unit sequences, without repetition. For example, if the first m hash bits in the bit array matched the m high-order bits of the hashes of "abc" and "def", and the sequences "abc" and "def" appear in the Canonical Form, then the set of code unit sequences {"abc","def"} would be in the result of the previous step for the first segment. This step transforms this set into the regular expression (abc|def).

A regular expression is formed 3120 by concatenating the regular expressions from the previous step in the segment order. For example, if the first segment results in the regular expression (abc|def) and the second segment results in the regular expression (zed|pud|hel), then the constructed regular expression from this step begins (abc|def)(zed|pud|hel); it is followed by the remaining constructed regular expressions from the previous step, in sequence. This resulting regular expression is called an approximate match regular expression; this regular expression is interpreted in meaning according to well known rules from the prior art.

Find 3125 the minimum edit-distance (Levenshtein distance) code unit subsequence of the Canonical Form to the approximate match regular expression. If there is more than one with the same minimum edit-distance, then choose the shortest one. If there is still more than one best match, then choose the one that comes first in the Canonical Form. The shortest string that achieves a best match is chosen over longer strings because this tends to eliminate extraneous text. For example, if the latter half of the target string were removed from the document (and this were the only change), and for simplicity we assume that none of the hashes from the second half of the intended target match anywhere in the resulting Canonical Form and no code unit from the second half of the target appears anywhere else in the Canonical Form, then the same Levenshtein distance would be observed for a number of strings that start with the remaining half of the intended target. However, the shortest of them would contain all of the intended matching content that was not removed from the document.

If the Levenshtein distance to the nearest substring is 3130 less than a configurable proportion of the length of the Canonical Target in code units, then its position and length are returned 3145 as a match. The default configurable proportion is 40% in some embodiments.

Figure 33:
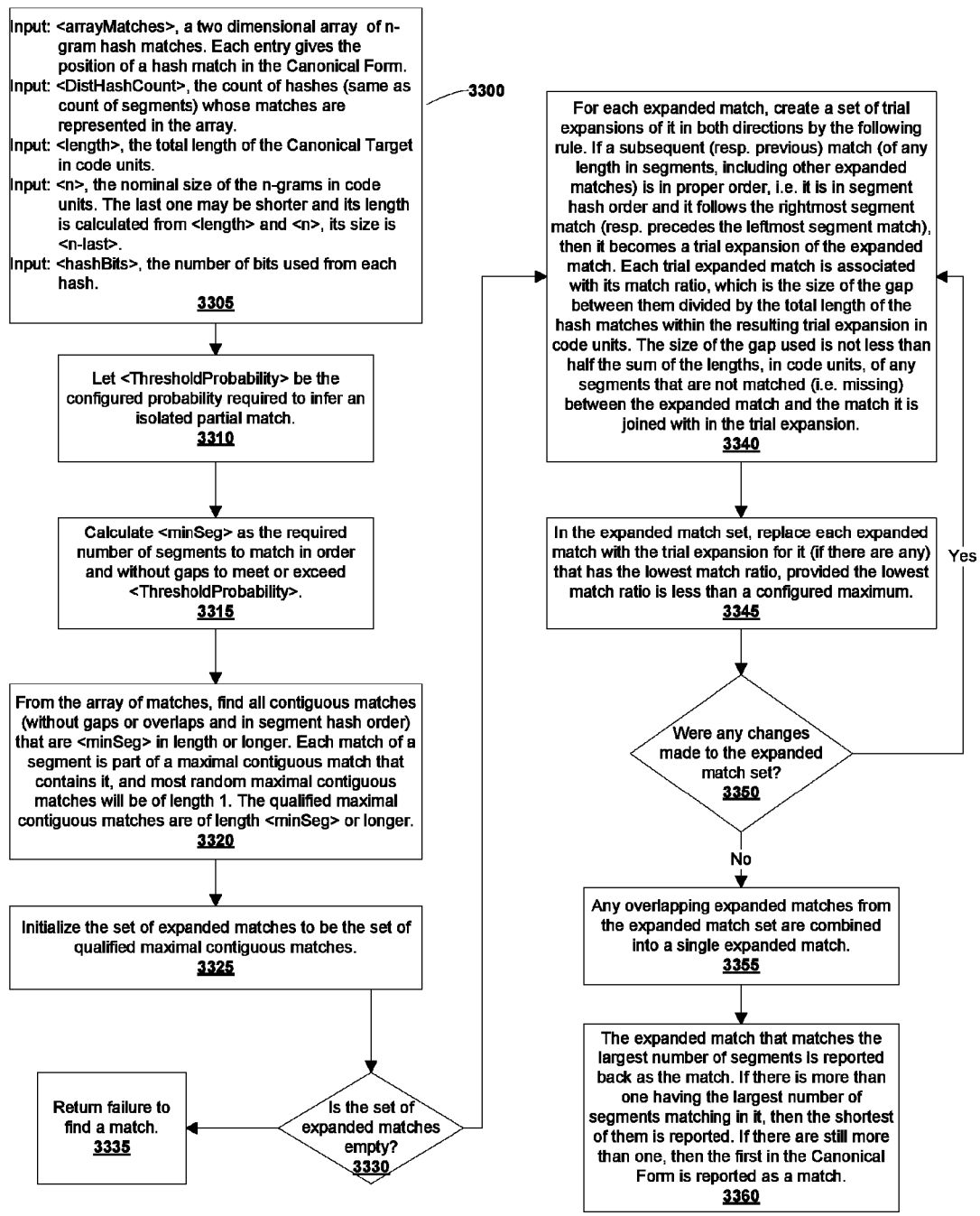
FIG. 33 illustrates finding a partial match based on segmented n-gram match arrays.

If the best Levenshtein match required 3130 more than the configured proportion of the target length in edits, then perform 3135 a direct n-gram based search for partially matching content according to the process 3300 of FIG. 33.

Those skilled in the art will appreciate that there are many metrics and means for approximate or fuzzy matching of sequences that could be used to find approximate string matches. For example, just within the family of approximate matches based on Levenshtein distance, there are an unbounded number of ways to weight the different kinds of edits, each producing a different metric for nearness. Insertions of missing characters could be weighted as a higher cost than deletions, which in turn could be weighted differently than replacement operations. Furthermore, transposing adjacent characters is a common typographical error, and some distance measures use this type of edit along with the other edits in the standard Levenshtein distance. Here equal weighting is used, in some embodiments, but slight or large adjustments can be made to find approximate matches without departing from the teachings herein. In addition, the use of other string distance measures (that are not directly related to Levenshtein distance) is also possible. When the Levenshtein measure fails to find a suitable match as described above, we seek matches in accordance with another aspect of some embodiments described for the process 3300 of FIG. 33.

If the direct n-gram based search resulted 3140 in a match or set of matches, then return 3145 the matches along with their lengths.

If the direct n-gram based search did not result 3140 in a match or set of matches, then return 3150 failure to find an approximate match.

Figure 32:
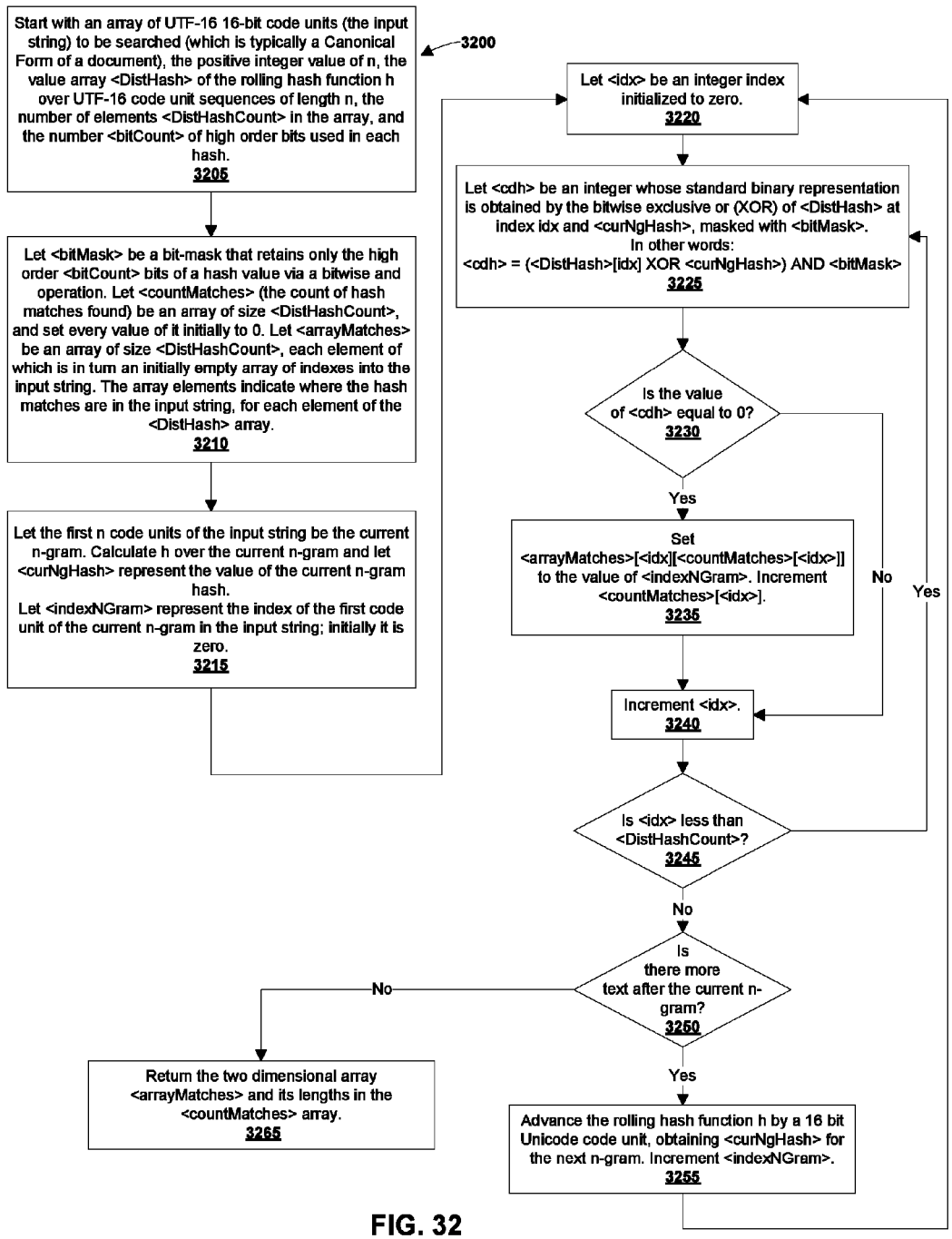
FIG. 32 illustrates searching simultaneously for one or more segment matches with a rolling n-gram hash.

FIG. 32 illustrates the process 3200 of simultaneously searching for a set of segment n-gram hashes. This is functionally equivalent to running the single-hash value search process 200 repeatedly for each segment's n-gram hash, except that there is no substring and no calculation of the required number of bits, and it is done in one pass (typically over the Canonical Form of a document in some embodiments) for a whole set of hashes whose matches are to be found. If an n-gram search needs to be done for matches to a set of segment hash values, where the size of the n-gram (i.e., the length of the segments in code units) is the same for each member of the set, then the search may advantageously be performed simultaneously. The inputs 3205 include an array of 16 bit code units (the input string, typically a Canonical Form), to be searched for matches; the length (n) of each n-gram (length of the segments); the value array <DistHash> containing the computed hash values for each segment, with the first segment at index 0 in the array; the number of elements (segments) <DistHashCount> in the array; and the number <bitCount> of high order bits of each hash that are used.

Initialize 3210 some variables. Let <bitMask> be a mask that retains only the high order <bitCount> bits of a hash value is used by a bitwise 'and' operation (AND). Let <countMatches> (the count of matches found for the corresponding hash value) be an array of size <DistHashCount>, and initialize each of its values to 0. Let <arrayMatches> be an array of size <DistHashCount>, each element of which is an initially-empty array of indexes into the input string. Array elements of this two dimensional array indicate where the hash value from the <DistHash> array matches in the input string. In summary, for an index i in the range

[0,<DistHashCount>], <arrayMatches>[i] is an array of indexes into the input string where the hash value <DistHash>[i] matches, and the size of the array <arrayMatches>[i] is <countMatches>[i]; initially <countMatches>[i] is zero.

Let the first n code units of the input string be the current n-gram. Calculate 3215 the hash value over the current n-gram and let <curNgHash> represent that value. Let <indexNGram> represent the index of the first code unit of the current n-gram in the input string; initially it is zero.

Let <idx> be an integer index initialized 3220 to zero. It is an index into the hash values to be checked. Compare the hash of an input string n-gram against each segment's hash value. Since by default the number of hash values to check is 16 or less, and walking through a 16 element array is fast (it will almost always be entirely in the L1 cache, for modern processors), the preferred manner of checking is to compare each one sequentially. Nevertheless, those skilled in the art will appreciate that there are many ways to search for such matches. For example, 16 is sufficiently large that on some processors a small hash table holding the 16 entries may provide a more efficient search mechanism, especially given that there is no need to calculate hash bits (the values are themselves high quality hashes, so any subset of their bits constitute well distributed hash values).

Let 3225 <cdh> be an integer whose standard binary representation is obtained by the bitwise 'exclusive or' (XOR) of <DistHash> at index idx with <curNgHash>, masked by a bitwise 'and' operation (AND) with <bitMask>. In other words:

<cdh>=(<DistHash>[idx] XOR <curNgHash>) AND <bitMask>

This masking calculation isolates the high order bits of the hash, which are the only bits kept in the result, so that the hashes of the segments and the n-gram hashes will appropriately match.

If the value of <cdh> is 3230 zero, then set <arrayMatches>[<idx>][<countMatches>[<idx>] ] to the value of <indexNGram> and increment <countMatches>[<idx>]. This stores the current position as a match for the hash value <DistHash>[idx], and increments its match count, <countMatches>[<idx>]. Then increment 3240 <idx>.

If the value of <cdh> is 3230 not zero, then increment 3240 <idx>.

If the value of <idx> is 3245 less than <DistHashCount>, then repeat this loop starting with the hash comparison 3225.

If there is 3250 more of the document left beyond the current n-gram, then the rolling hash function value <curNgHash> is updated 3255 to the hash of the next n-gram, which is the n-gram to the right in the document by one 16 bit code unit (one code unit is added to the end, and one removed from the beginning), and then the loop 3220 begins again. The calculation of the rolling hash function was previously described.

If there are 3250 no more input string code units to process, then return 3265 the two dimensional array <arrayMatches> and its corresponding lengths (number of matches for each segment) in the <countMatches> array.

FIG. 33 illustrates the process 3300 of finding a partial or imperfect match based directly on a set of matches for each segment hash, represented in an array of matches for each segment. These arrays contain data about matches and have already been computed using (in some embodiments) rolling n-gram hash matching techniques. Inputs 3305 are:

<arrayMatches>, a two dimensional array of n-gram hash matches. Each entry gives the position of a hash match in the Canonical Form.

<DistHashCount>, the count of hashes (which is the same as the count of segments) whose matches are represented in the array.

<length>, the total length of the Canonical Target in code units.

<n>, the size of the n-grams in code units. The last one may be shorter; its length is calculated from <length> and <n>, its size is <n-last>.

<hashBits>, the number of bits used from each hash.

The variable <ThresholdProbability> is 3310 the configured probability required to infer an isolated partial match. The idea of partial matches is that the n-gram hashes can be used to find substrings of the Canonical Form that are shorter than the full Canonical Target, but which with high probability match within the Canonical Target even though the entire Canonical Target does not match in the Canonical Form. Typically a single segment match will not meet the threshold. For example, if 16 bits is used for each segment, then the hash will match, at random, one in 64K positions. A document of size one megabyte is expected to match a 16 bit hash in about 16 positions, even if the content is unrelated. Thus, the probability that a single Canonical Form n-gram consists of the same sequence of n code units as was used to compute the segment hash value when they have the same 16 bit hash values is small. The question is: what is the number, <minSeg>, of segment matches required, in order and without gaps, to meet the <ThreasholdProbability>?

For computational reasons having to do with rounding errors, we use (1−<ThresholdProbability>) internally as the probability of failure, and define the probability of failure as the probability of matching a random sequence of segment length strings using segment hashes (in order and without gaps). This probability is calculated as the size of the Canonical Form "L" in code units multiplied by the total number of segments <DistHashCount>; the resulting product is divided by two taken to the power of the total number of bits in the hashes of the matches. Thus, calculate <minSeg> as the smallest whole number that satisfies the following equation.

$$(<DistHashCount>*L)<=(1-<ThresholdProbability>)*(2^{(<minSeg>*<hashBits>)})$$

In this equation, the binary operator "^" means that the operand on the left (i.e., 2 here) is taken to the power (exponent) of the operand on the right. This is preferably calculated by repetition using consecutive whole numbers for <minSeg>, starting with 1, until the equation is true, at which point <minSeg> is known 3315. The default configurable value for (1−<ThresholdProbability>) is the inverse of (2^37), or about 1 in about 137 billion. For example, if the number of segments is 16, the number of bits in a hash as 16, and the Canonical Form has one million code units, then the number of consecutive segments required to match is 4. With 4 the probability of a spurious match is less than 1 in 137 billion, but with 3 the probability of a spurious match somewhere in a mega code unit size document is about one in 17 million, which means that about one in 17 million documents of that size would have a spurious match of three consecutive segments somewhere in the document. By default this is considered to be too high of a probability of a spurious match to infer success.

Since the default configurable setting usually results in 16 segments, this means that a minimum of about 25% of the Canonical Target must match somewhere in the Canonical Form for this standard to be met. Substrings longer than 25% of the Canonical Target may be found in the Canonical Form without resulting in 4 contiguous matches. A discussion of this issue was presented in conjunction with the details for FIG. 10. Using the default settings for sufficiently long Canonical Targets, a contiguous match of ⅓ of a Canonical Target ensures that this embodiment will positively identify the match based on the "at least 4 contiguous matching segments" criterion.

This difference between the minimum contiguous proportion of a Canonical Target that is required to match at all, and the minimum proportion required to ensure that a match meeting the criterion will be detected, can be reduced by increasing the number of segments. To keep the size of a Fragment Identifier the same would require a simultaneous proportional lowering of the number of bits in each segment; however, this increases the computational cost by greatly increasing the number of single segment matches. Moreover, creating a Fragment Identifier that has large numbers of single segment matches can be appropriate if the available computational resources of the recipient machine are sufficient, but the capabilities of a recipient machine are generally not known in advance. Thus, by default, 16 hash bits are used for each segment in order to keep the computational costs down. Simply increasing the number of segments, without decreasing the number of bits in each segment hash, allows positive identification of smaller pieces of a Canonical Target mainly at the cost of increasing the size of Fragment Identifiers; the computational cost increases are modest.

From the array of matches, find 3320 all contiguous matches (without gaps or overlaps and in segment order) that are <minSeg> in length or longer. Each segment match is part of a maximal contiguous match that contains it, but most random maximal contiguous matches will be of length 1. The qualified maximal contiguous matches are of length <minSeg> or longer. Initialize 3325 the set of expanded matches to be the set of qualified maximal contiguous matches.

If the set of expanded matches is 3330 empty, then return 3335 failure to match.

If the set of expanded matches is not 3330 empty, then for each expanded match, create 3340 a set of trial expansions by effectively extending the match in one or both directions. If a subsequent (resp. previous) match, including other expanded matches and having any number of segments, is in segment order (i.e., the order of the hashes in the Fragment Identifier range matches the order of the corresponding matching substrings in the Canonical Form) and follows the rightmost segment match (resp. precedes the leftmost segment match), then it becomes a trial expansion of the expanded match. Note that a part of an existing multi-segment match can be used, by removing portions of the match that overlap the expanded match. Such removals are extended into the match so that the resultant trial expansion begins and ends with individual segment hash matches (the first and last code units are part of a match with a segment). Each such trial expanded match has an associated value called its match ratio, which is a measure of the quality of the trial expansion based on the eventual number of segments that match in the expansion as well as the added non-matching text. It is calculated as the number of code units in the gap between two matches (after any removal), divided by the total length in code units of the segment matches within the resulting trial expansion. The size of the gap is increased before computing the match ratio until it is at least half the sum of the lengths, in code units, of any missing segments, whose matches would be expected between the expanded match and the match it is joined with in the trial expansion.

For example, if segments 2, 3, 4, and 5 match in one expanded match string A, and 5, 6, and 7 match in another expanded match string B that follows A, then the 5 match is dropped from B creating a 6 and 7 match, and a trial expanded match is constructed from A and the reduced B match. The result matches segments 2, 3, 4, 5, 6, and 7; the value of the ratio is the number of non-matching code units between the 4 and 5 match positions divided by the sum of the size of the segments 2, 3, 4, 5, 6, and 7 in code units. Because there are no additional matches expected between 4 and 5, there is no adjustment of the gap value before calculating the ratio. If A had segments 1, 2, 3, and 4, and B had 6 and 7, then the gap size for the trial expansion calculation would be adjusted up if it were less than half the size of a segment, since 5 (one segment) is missing.

Replace 3345 each expanded match with its trial expansion (if there are any) that has the lowest match ratio, provided the lowest match ratio is less than a configured maximum. The default maximum is 0.25. I.e., if the gap is less than 25% of the sum of the length of the individual matches in the trial expansion, then the trial expansion becomes an expanded match and replaces the expanded match from which it was constructed.

If any changes were made 3350 in the set of expanded matches by these expansion rules, then begin again 3340 creating trial expanded matches for each expanded match in the set.

If no changes were made 3350 in the set of expanded matches by these expansion rules, then combine any overlapping expanded matches into single expanded matches.

The expanded match that matches the largest number of segments is reported 3360 as a match. If there is more than one that contains the largest number of matching segments, then report the one that is shortest from end to end. If there is still more than one, then the one that appears first in the Canonical Form is reported as a match.

In alternative embodiments the partial match provisions are entirely removed, and dealing with imperfect matches is equivalent to dealing with entirely missing content, which falls entirely on the URI Service. In other embodiments the use of secondary search criteria is configurable, and when not so configured, Fragment URIs are created without them.

Figure 34:
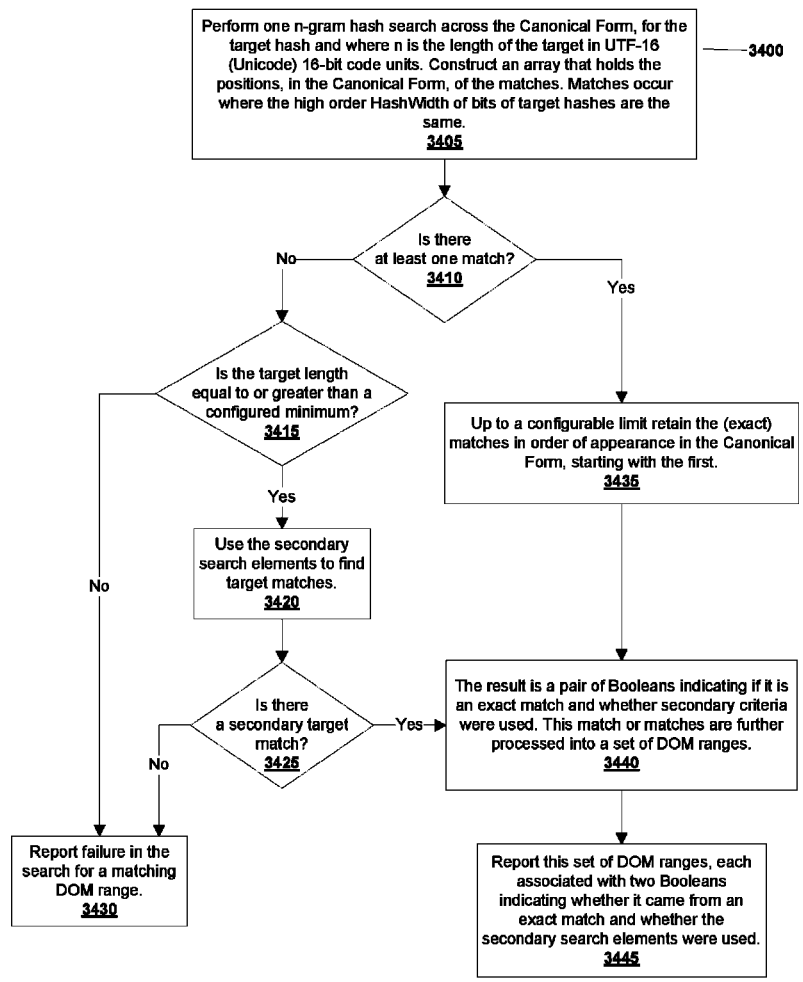
FIG. 34 illustrates version 2 Fragment Identifier range search.

FIG. 34 illustrates the process 3400 of performing a version 2 Fragment Identifier range search. This is simpler than the version 1 range search since version 2 Fragment Identifiers have no context (no prefix or suffix). In addition, in some embodiments, the URI Service does not explicitly keep the content of version 2 Fragment Identifiers, so the recovery process is also simpler. The inputs are a Canonical Form (which is possibly an Alternative Canonical Form) and the version 2 range from the Fragment Identifier. The target hash and its length are used 3405 to perform an n-gram search across the entire Canonical Form, according to the process 200 of FIG. 2, for which the inputs are the Canonical Form, the hash value to be searched, the length of the hash (n), and the number of high order bits used (HashWidth). Recall that the value of HashWidth is encoded in each range of a Fragment Identifier. The returned value is an ordered set of ranges.

If there is 3410 at least one match (these are necessarily "perfect" matches), then reduce 3435 the set of matches as necessary by only retaining the matches appearing in the first (configurable maximum) number of positions in order of appearance in the Canonical Form. In some embodiments, the configurable maximum is by default 5.

The matches are processed 3440 individually into a set of matching DOM ranges; the details of this processing 3500 are illustrated in FIG. 35. FIG. 35 includes processing rules for creating ranges from more complicated matches, such as arise from version 1 Fragment Identifiers, but its rules work for version 2 matches as well. The rules of FIG. 35 provide for the case where no prefix or suffix matches, which is implicitly the case for version 2 Fragment Identifiers. While these are simple text matches without offsets, a version 2 Fragment Identifier could nevertheless match alternative text from an image in an Alternative Canonical Form. This routinely occurs since search engines often provide such alternative text in snippets. Thus, either by matching text that spans across an image, or by matching the alternative text of an image, images can occur within the ranges that are created. Recall that if any alternative text for an image node is matched, then the entire image is within the resulting range. I.e., for images it is all or nothing. Report 3445 the resulting DOM ranges and associate each range with a Boolean indicating whether that range is an exact match and a Boolean indicating whether secondary search criteria were used to find it.

If there are 3410 no matches (i.e., no "perfect" matches) and the target length is 3415 less than a configured minimum match length (the default minimum is 10 code units in some embodiments), then report 3430 failure for this range search.

If there are 3410 no matches (i.e., no "perfect" matches) and the target length is 3415 equal to or greater than a configured minimum match length (the default minimum is 10 code units in some embodiments), then in some embodiments use 3420 the secondary search criteria to find an inexact or partial match. Perform this partial match activity according to the process 3100 of FIG. 31. If a secondary target match is 3425 created, then this single match is processed 3440 into a set containing one DOM range, the details of which are illustrated in FIG. 35. Report 3445 this at most singleton set and associate its range (if there is one) with a Boolean indicating that an inexact match was found and a Boolean indicating that secondary search criteria were used to find it.

If a secondary target match is 3425 was not created, then report 3430 failure for this range search.

FIG. 35 illustrates the process 3500 of converting a Canonical Form match into a DOM range. Inputs 3505 are:
1. A DOM instance for a document.
2. A node array for the DOM instance mapped to by the Canonical Form.
3. A Canonical Form, or possibly an Alternative Canonical Form.
4. A set of three possible matches and their lengths, one each for the prefix, target, and suffix. The prefix and suffix matches may be missing and are always missing for version 2 Fragment Identifiers. In some embodiments there is required to be a target match.
5. A Boolean indicating whether the match is exact. Note that matches for version 2 Fragment Identifiers may be marked exact even though there are no prefix or suffix matches.
6. A Boolean that is set to true if there is a target, suffix, and prefix match and the target match is unique between the prefix and suffix. Note that this is always false for version 2 Fragment Identifier matches because these have no prefix or suffix to match.
7. Left and Right offset types and values. For version 2 Fragment Identifiers these are always type text and have values of −0 and 0, respectively; because of the logic for missing prefix and suffix matches, these inputs are ignored for version 2 Fragment Identifiers.

If there is no 3510 prefix, target, and suffix match in the input, and the target match is 3527 empty, then report 3529 failure to create a DOM range. If there is 3510 a prefix, target, and suffix match, the match is not 3515 exact, and the target match is not 3525 unique between the left and right prefixes or it is not a configurable minimum number of code units in length, then report 3529 failure to create a DOM instance. The configurable minimum number of code units in length is, by default, 3.

If there is no 3510 prefix, target, and suffix match in the input, but the target match is not 3527 empty, then let 3530 the left final position pair <FL_Node, FL_Position> be the node and position of the node array code unit mapped to by the first code unit in the Canonical Form target match, and let the right final position pair <FR_Node, FR_Position> be the node and position of the node array code unit mapped to by the last code unit in the Canonical Form target match. Then create 3565 a DOM range using the left and right final position pairs of the node array as described in more detail below.

If there is 3510 a prefix, target, and suffix match, the match is 3515 exact (i.e., the prefix, target, and suffix matches are in order without gaps) and the target is 3520 the empty string, then:
1. Let 3535 the left working position quadruple be <LL_Node, LL_Position, LR_Node, LR_Position>, where <LL_Node, LL_Position> (resp. <LR_Node, LR_Position>) is set to the node and code unit position mapped to by the last (resp. first) code unit in the canonical prefix (resp. suffix). If the canonical prefix (resp. suffix) is empty (0-length), then <LL_Node> (resp. <LR_Node>) is null and <LL_Position> (resp. <LR_Position>) is 0, which indicates an imaginary code unit and node immediately before (resp. after) any content of the node array.
2. Let 3540 the right working position quadruple be <RL_Node, RL_Position, RR_Node, RR_Position>, and let its values be identical to those of the left working position quadruple.

If there is 3510 a prefix, target, and suffix match; the match is 3515 exact and the target is not 3520 the empty string; or the match is not 3515 exact, the target match is 3525 unique between the left and right prefixes, and it is at least a configurable minimum number of code units in length (which by default is 3 in some embodiments); then:
1. Let 3545 the left working position quadruple be <LL_Node, LL_Position, LR_Node, LR_Position>; where <LL_Node, LL_Position> (resp. <LR_Node, LR_Position>) is set to the node and code unit position mapped to by the last (resp. first) code unit in the canonical prefix (resp. target). If the canonical prefix is empty (0-length), then <LL_Node> is null and <LL_Position> is 0.
2. Let 3550 the right working position quadruple be <RL_Node, RL_Position, RR_Node, RR_Position>, where <RL_Node, RL_Position> (resp. <RR_Node, RR_Position>) is set to the node and code unit position mapped to by the last (resp. first) code unit in the canonical target (resp. suffix). If the canonical suffix is empty (0-length), then <RR_Node> is null and <RR_Position> is 0.

Find 3555 the left final position pair <FL_Node, FL_Position> from the left working position quadruple, <LL_Node, LL_Position, LR_Node, LR_Position>, in the mapped node array. This is achieved according to the process 3600 of FIG. 36.

Find 3560 the right final position pair <FR_Node, FR_Position> from the right working position quadruple, <RL_Node, RL_Position, RR_Node, RR_Position>, in the mapped node array. This is achieved according to the process 3700 of FIG. 37.

If <FR_Node, FR_Position> is 3563 to the left of <FL_Node, FL_Position> in the node array, then let <FL_Node, FL_Position> be the object to the immediate right of <FR_Node, FR_Position> in the node array. The object to the immediate right may be a VnT node or a code unit, depending on circumstances. If <FR_Node> is a text node and <FR_Node, FR_Position+1> is a code unit, then that code unit is the object to the immediate right. If <FR_Node, FR_Position+1> is not a code unit (i.e., there is no code unit in that position) and <FR_Node_Next> is the node to the immediate right of <FR_Node>, then <FR_Node_Next, 0> is the object to the immediate right of <FR_Node, FR_Position>.

Create 3565 a DOM range using the left and right final position pairs of the node array. This step is an adjustment to obtain a range in a DOM instance based on the internal range representation used in some embodiments. These rules are for the HTML DOM model used in this example embodiment and, depending on the DOM model, these rules may change. Because the Common DOM Form uses the internal representation for end points and ranges, this step is not performed when creating a range for a Common DOM Form instance.

Recall that a boundary of an HTML range identifies a gap or space between objects (where objects are nodes or code units), and does not identify objects themselves. Therefore the activity of creating a DOM range converts object identifiers of some embodiments to HTML DOM style range boundaries, which are between objects.

The rules 3565 for creating an HTML DOM range proceed as follows. If <FL_Node> is a text node (not a VnT node or an Alt node), then let the left boundary of the range, <BL_Node, BL_Offset>, be <FL_Node, FL_Position>. If <FL_Node> is not a text node (i.e., is either a VnT node or Alt node), then let <BL_Node> be the parent node of <FL_Node> (in the DOM) and let <BL_Offset> be the position of <FL_Node> in a left to right enumeration of the children of <BL_Node>. <BL_Node, BL_Offset> is the left boundary of the range being created in the DOM. This activity 3565 converts an object identifier <FL_Node, FL_Position> to an HTML DOM style range boundary, which is <BL_Node, BL_Offset> between objects.

If <FR_Node> is a text node (not an Alt node), then let the right boundary of the range in the DOM, <BR_Node, BR_Offset>, be set to <FR_Node, FR_Position +1>. If <FR_Node> is not a text node (i.e., is either a VnT node or Alt node), then let <BR_Node> be the parent node of <FR_Node> in the DOM and let <BR_Offset> be 1 plus the position of <FR_Node> in a left to right enumeration of <BR_Node>'s children. <BR_Node, BR_Offset> is the right boundary of the range being created in the DOM. Since an HTML boundary identifies a gap or space between objects (where objects are nodes or code units), add 1 to the position to identify the gap following the object as the right boundary. This activity 3565 converts an object identifier <FR_Node, FR_Position> to an HTML DOM style range boundary <BR_Node, BR_Offset> between objects.

Some DOM instance range boundaries have more than one valid representation because a gap between nodes in a tree can generally be identified relative to two or more nodes in the node hierarchy; however, DOM instance range boundaries are nevertheless uniquely generated in some embodiments and, for a non-empty range, are always relative to a node that is at least partially contained in the range. Note that by these rules, if a match occurs partially into the alternative text of a VnT node, then the whole of that VnT node is included in the resulting DOM range.

Figure 36:
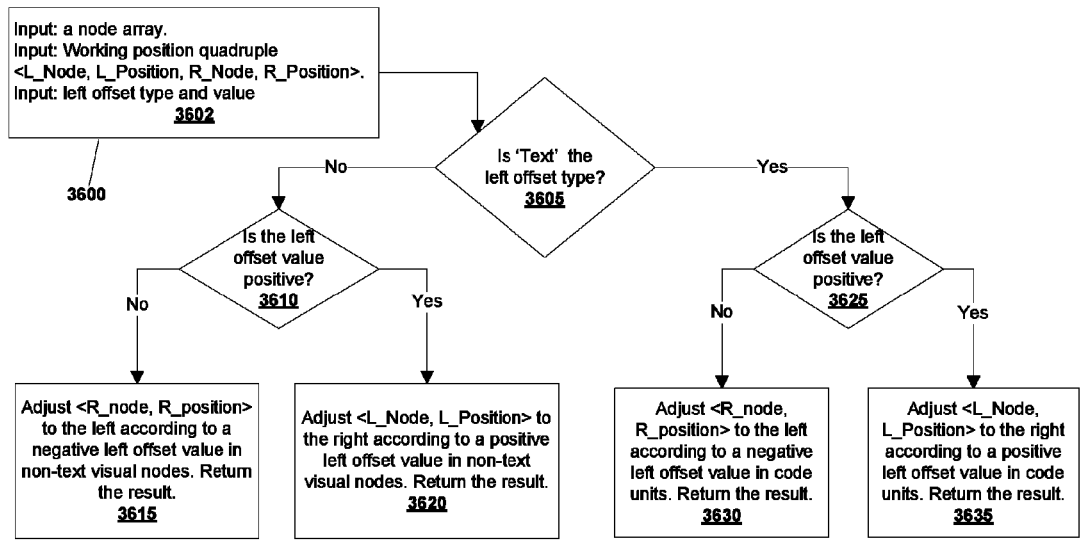
FIG. 36 illustrates finding the final left position in the mapped node array.

FIG. 36 illustrates the process 3600 of finding the final left position in the mapped node array (the node array mapped into by the Canonical Form), which is the position of the node or code unit that is leftmost in the resulting range. Inputs consist 3602 of a node array, a working position quadruple <L_Node, L_Position, R_Node, R_Position>, and a left offset type and value.

If the type of the fragment range offset is not 3605 'Text' and its value is 3610 negative, then adjust 3615 <R_node, R_position> to the left according to the negative left offset value, in non-text visual nodes. Do this adjustment using the process 3800 of FIG. 38. The result of this adjustment is the final left position in the node array and it is returned.

If the type of the fragment range offset is not 3605 'Text' and its value is 3610 positive, then adjust 3620 <L_Node, L_Position> to the right according to the positive left offset value, in non-text visual nodes. Do this adjustment according to the process 3900 of FIG. 39. The result of this adjustment is the final left position in the node array and it is returned.

If the type of the fragment range offset is 3605 'Text' and its value is 3625 negative, then adjust 3630 <R_node, R_position> to the left according to the negative left offset value, in code units. Do this adjustment according to the process 4000 of FIG. 40. The result of this adjustment is the final left position in the node array and it is returned.

If the type of the fragment range offset is 3605 'Text' and its value is 3625 positive, then adjust 3635 <L_Node, L_Position> to the right according to the positive left offset value, in code units. Do this adjustment according to the process 4100 of FIG. 41. The result of this adjustment is the final left position in the node array and it is returned.

Figure 37:
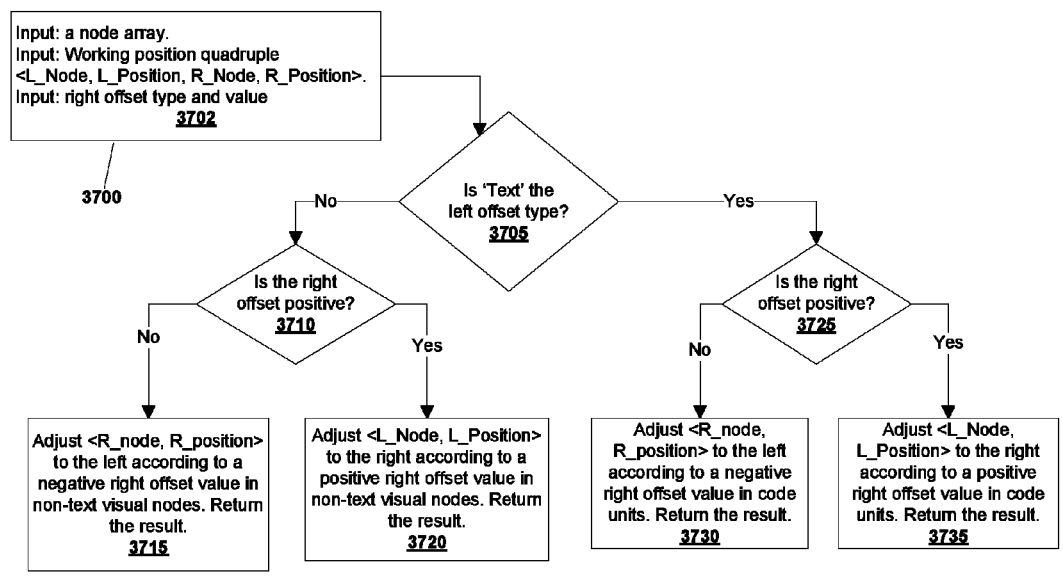
FIG. 37 illustrates finding the final right position in the mapped node array.

FIG. 37 illustrates the process 3700 of finding the final right position in the mapped node array (the node array mapped into by the Canonical Form), which is the position of the node or code unit that is rightmost in the resulting range. Inputs consist 3702 of a node array, a working position quadruple <L_Node, L_Position, R_Node, R_Position>, and a left offset type and value.

If the type of the fragment range offset is not 3705 'Text' and its value is 3710 positive, then adjust 3720 <L_Node, L_Position> to the right according to the positive right offset value, in non-text visual nodes. This adjustment is according to the process 4200 of FIG. 42. The result of this adjustment is the final right position in the node array and it is returned.

If the type of the fragment range offset is 3705 not 'Text' and its value is 3710 negative, then adjust 3715 <R_Node, R_Position> to the left according to the negative right offset value, in non-text visual nodes. Do this adjustment according to the process 4300 of FIG. 43. The result of this adjustment is the final right position in the node array and it is returned.

If the type of the fragment range offset is 3705 'Text' and its value is 3725 positive, then adjust 3735 <L_Node, L_Position> to the right according to the positive right offset value, in code units. Do this adjustment according to the process 4400 of FIG. 44. The result of this adjustment is the final right position in the node array and it is returned.

If the type of the fragment range offset is 3705 'Text' and its value is 3725 negative, then adjust 3730 <R_Node, R_Position> to the left according to the negative right offset value, in code units. This adjustment is according to the process 4500 of FIG. 45. The result of this adjustment is the final right position in the node array and it is returned.

Figures 38, 39:
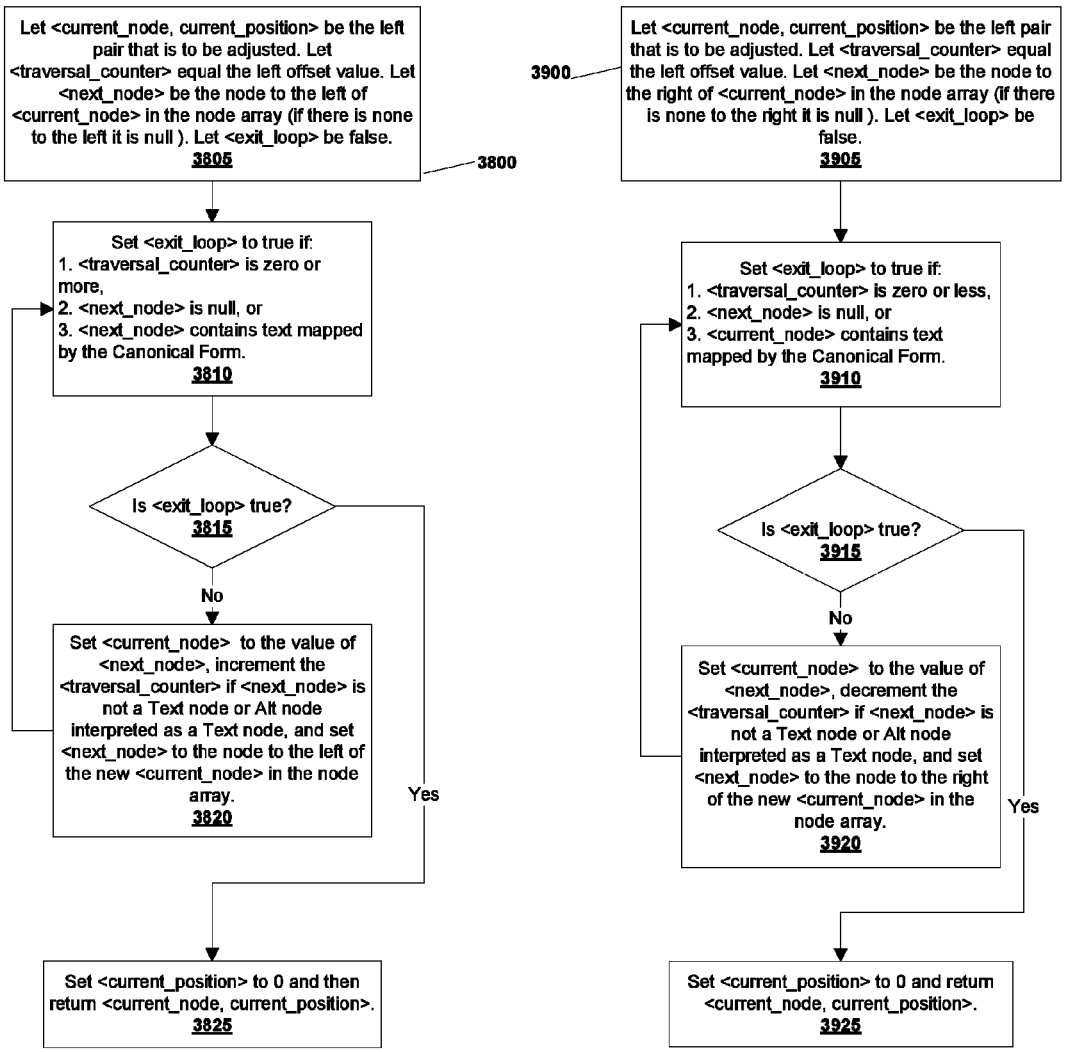
FIG. 38 illustrates adjusting the left position relative to a mapped node array according to a negative left offset value of type VnT (non text visual nodes).
FIG. 39 illustrates adjusting the left position relative to a mapped node array according to a positive left offset value of type VnT (non text visual nodes).

FIG. 38 illustrates the process 3800 of adjusting the left position relative to a mapped node array (a node array mapped to by a Canonical Form) according to a negative left offset value in VnT (non-text visual) nodes. This adjustment traverses the array from the original left position to the left, counting VnT nodes according to the offset, and ideally arrives at a VnT node. If changes have been made to the document since the offsets were calculated, then the traversal may halt on a non-VnT node. The starting position is typically the node mapped to by the leftmost code unit of the Canonical Target but may be the leftmost code unit mapped by the Canonical Suffix, if the Canonical Target is empty. Because the document may have changed, the traversal halts when a node having code units that are mapped to by the Canonical Form is encountered. This makes sense because, if the encountered mapped code units had been in the original document then they would have been included in the Canonical Target or been part of the context, and would not be traversed in adjusting for an offset.

For example, if three images were to be traversed to the left to establish the left boundary of a range, but the document changed by the removal of one of those images, then it is possible to encounter a text node to the left during the traversal. If the text node encountered had been in the document at the time the version 1 Fragment Identifier was created, then that node would have been part of the prefix.

Let 3805 <current_node, current_position> be the left pair that is to be adjusted. Let <traversal_counter> equal the left offset value. Let <next_node> be the node to the left of <current_node> in the node array; if there is no node to the left set <next_node> to null. Let <exit_loop> be false.

Set 3810 <exit_loop> to true if:
1. <traversal_counter> is zero or greater,
2. <next_node> is null, or
3. <next_node> is a Text node (or an Alt node interpreted as a Text node in this instance) that is mapped to by the Canonical Form.

Note that this procedure traverses VnT nodes, so if we unexpectedly encounter a node having text that is mapped to by the Canonical Form, which could be a Text node or a VnT node that has alternative text and alternative text is being considered, then we halt the traversal. This is unexpected, in a sense, because this can only occur if the document has been altered after the Fragment Identifier was made.

If <exit_loop> is not 3815 true then set 3820 <current_node> to the value of <next_node>, increment the <traversal_counter> if <next_node> is not a Text node or an Alt node interpreted as a Text node in this instance, and set <next_node> to the node to the left of the new <current_node> in the node array; if there is no node to the left then set <next_node> to null. Restart the loop above 3810.

If <exit_loop> is 3815 true then set 3825 <current_position> to zero and return <current_node, current_position>.

FIG. 39 illustrates the process 3900 of adjusting the left position relative to a mapped node array range according to a positive left offset value in VnT (non-text visual) nodes. This is similar to the procedure of FIG. 38, except that the traversal is to the right.

Let 3905 <current_node, current_position> be the left pair that is to be adjusted. Let <traversal_counter> equal the left offset value. Let <next_node> be the node to the right of <current_node> in the node array; if there is no node to the right, set <next_node> to null. Let <exit_loop> be false.

Set 3910 <exit_loop> to true if:
1. <traversal_counter> is zero or less,
2. <next_node> is null, or
3. <current_node> contains text (is a Text node or an Alt node interpreted as a Text node in this instance) and is mapped to by the Canonical Form.

Note the difference with FIG. 38, in that criterion 3 here checks <current_node> whereas in criterion 3 FIG. 38 checks <next_node>. This difference derives from the fact that the adjusted left end point is included in the resulting range, and objects to its left are excluded from the range. In the case of FIG. 38, nodes are added to the range as the left endpoint is moved to the left (in the negative offset direction) and in the case described here, nodes are removed from the range as the left endpoint is moved to the right (positive offset direction).

If <exit_loop> is not 3915 true then set 3920 <current_node> to the value of <next_node>, decrement the <traversal_counter> if <next_node> is not a Text node or an Alt node interpreted as a Text node in this instance, and set <next_node> to the node to the right of the new <current_node> in the node array. Restart the loop above 3910.

If <exit_loop> is 3915 true then set 3925 <current_position> to zero and return <current_node, current_position>.

Figures 40, 41:
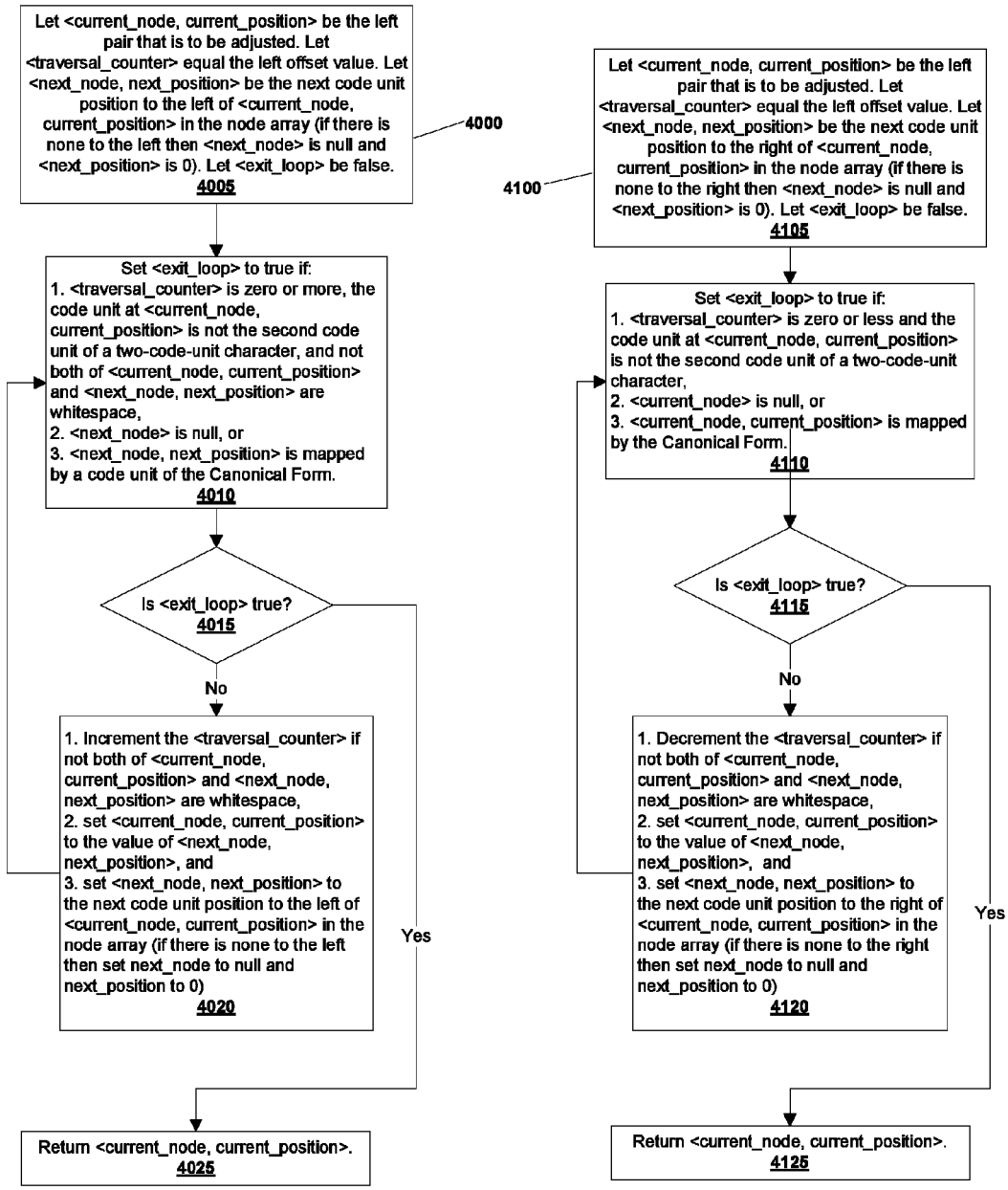
FIG. 40 illustrates adjusting the left position relative to a mapped node array according to a negative left offset value in code units.
FIG. 41 illustrates adjusting the left position relative to a mapped node array according to a positive left offset value in code units.

FIG. 40 illustrates the process 4000 of adjusting the left position relative to a mapped node array according to a negative left offset value, in code units. This adjustment traverses the array from the original left position to the left, counting code units according to the offset, and ideally arrives at a code unit. If changes have been made to the document since the offsets were calculated, then the traversal may halt on a VnT node. The starting position is typically the code unit in the node array mapped to by the leftmost code unit of the Canonical Target, but may be the leftmost code unit mapped to by the Canonical Suffix if the target is empty. Because the document may have changed, the traversal halts when a code unit mapped to from the Canonical Form is encountered. This makes sense because, if the encountered code unit had been in the original document then it would have been included in the target or been part of the target's context (prefix or suffix), and would not be traversed in adjusting for an offset.

Let 4005 <current_node, current_position> be the left pair that is to be adjusted. Let <traversal_counter> equal the left offset value. Let <next_node, next_position> be the next code unit position to the left of <current_node, current_position> in the node array; if there is no code unit to the left then set <next_node> to null and <next_position> to 0. Let <exit_loop> be false.

Set 4010 <exit_loop> to true if:
1. <traversal_counter> is zero or greater, the code unit at <current_node, current_position> is not the second code unit of a two-code-unit character, and <current_node, current_position> and <next_node, next_position> are not both whitespace,
2. <next_node> is null, or
3. <next_node, next_position> is mapped to by a code unit of the Canonical Form.

The value <next_node, next_position> is typically mapped to by the Canonical Form if there is a code unit in the Canonical Form that came from the code unit in position <next_position> of the node <next_node>. However, in some embodiments (e.g., if acronyms are expanded in constructing the Canonical Form) a mapping from a code unit in the Canonical Form can map to a set of code units in the node array, and the same set may be mapped to from more than one code unit; thus, while a code unit in the Canonical Form usually maps to a single node array code unit, in its most general form the check determines if <next_node, next_position> is a member of a set mapped to by a Canonical Form code unit.

If <exit_loop> is 4015 not true, then 4020:
1. increment the <traversal_counter> if <current_node, current_position> and <next_node, next_position> are not both whitespace,
2. set <current_node, current_position> to the value of <next_node, next_position>, and
3. set <next_node, next_position> to the next code unit position to the left of <current_node, current_position> in the node array. If there is none to the left then set <next_node> to null and <next_position> to 0. Note that the next code unit position to the left of a code unit position will sometimes be in another node and there may be intervening VnT nodes, which are skipped.

Then restart the loop above 4010.

If <exit_loop> is 4015 true, then return 4025 <current_node, current_position>.

FIG. 41 illustrates the process 4100 of adjusting the left position relative to a mapped node array (a node array mapped to by a Canonical Form) according to a positive left offset value, in code units. This is similar to FIG. 40, except that the traversal is done to the right.

Let 4105 <current_node, current_position> be the left pair that is to be adjusted. Let <traversal_counter> equal the left_offset value. Let <next_node, next_position> be the next code unit position to the right of <current_node, current_position> in the node array; if there is no code unit to the right then set <next_node> to null and <next_position> to 0. Let <exit_loop> be false.

Set 4110 <exit_loop> to true if:
1. <traversal_counter> is zero or less and the code unit at <current_node, current_position> is not the second code unit of a two-code-unit character,
2. <current_node> is null, or
3. <current_node, current_position> is mapped to by the Canonical Form.

See the description above 4010 of FIG. 40 for additional information and rationale for this determination. Note the difference with FIG. 40, in that criterion 3 here checks <current_node, current_position> whereas in FIG. 40 the check is for <next_node, next_position>. This difference derives from the fact that the adjusted left end point is included in the resulting range, and objects to its left are excluded from the range. In the case of FIG. 40, code units are added to the range as the left endpoint is moved to the left (in the negative offset direction) and in this case, code units are removed from the range as the left endpoint is moved the right (positive offset direction).

If <exit_loop> is 4115 not true, then 4120:
1. decrement the <traversal_counter> if <current_node, current_position> and <next_node, next_position> are not both whitespace,
2. set <current_node, current_position> to the value of <next_node, next_position>, and
3. set <next_node, next_position> to the next code unit position to the right of <current_node, current_position> in the node array. If there is no code unit position to the right then set <next_node> to null and <next_position> to 0. The next code unit position to the right of a code unit position will sometimes be in another node and there may be intervening VnT nodes, which are skipped.

Then restart the loop above 4110.

If <exit_loop> is 4115 true then return 4125 <current_node, current_position>.

FIG. 42 illustrates the process 4200 of adjusting the right position relative to a mapped node array (a node array mapped to by a Canonical Form) according to a positive right offset value, in non-text visual nodes. This adjustment traverses the array from the original right position to the right, counting VnT nodes according to the offset, and ideally arrives at a VnT node. If changes have been made to the document since the offsets were calculated, then the traversal may halt on a non-VnT node. The starting position is typically the node mapped to by the rightmost code unit of the Canonical Target but may be the rightmost code unit mapped by the Canonical Prefix if the target is empty. Because the document may have changed, the traversal halts when a node having code units that are mapped to by the Canonical Form is encountered. This makes sense because, if the encountered mapped code units were in the original document then they would have been included in the target or been part of the target's context, and would not be traversed in adjusting for an offset.

Let 4205 <current_node, current_position> be the right pair that is to be adjusted. Let <traversal_counter> equal the right offset value. Let <next_node> be the node to the right of <current_node> in the node array; if there is no node to the right, set <current_node> to null. Let <exit_loop> be false.

Set 4210 <exit_loop> to true if:
1. <traversal_counter> is zero or less,
2. <next_node> is null, or
3. <next_node> contains text mapped to by the Canonical Form.

If <exit_loop> is not 4215 true then set 4220 <current_node> to the value of <next_node>, decrement the <traversal_counter> if <next_node> is not a Text node or an Alt node interpreted as a Text node in this instance, and set <next_node> to the node to the right of the new <current_node> in the node array. Restart the loop above 4210.

If:
1. <exit_loop> is 4215 true and
2. <current_node> is 4225 null or has type VnT,
then set 4235 <current_position> to 0 and return 4240 <current_node, current_position>.

If:
1. <exit_loop> is 4215 true and
2. <current_node> is not 4225 null, and
3. the type of <current_node> is not 4225 VnT,
then set 4230 <current_position> to the position of the last code unit of the text of <current_node> and return 4240 <current_node, current_position>. Note that the position of the last code unit of the node's text is the length of the node's text minus one.

FIG. 43 illustrates the process 4300 of adjusting the right position relative to a mapped node array (a node array mapped to by a Canonical Form) according to a negative right offset value, in VnT (i.e., non-text visual) nodes. This adjustment traverses from the original right position to the left, counting VnT nodes according to the offset, and ideally arrives at a VnT node. If changes have been made to the document since the offsets were calculated, then the traversal may halt on a non-VnT node. The starting position is typically the node mapped to by the leftmost code unit of the Canonical Suffix, but if the suffix is empty then the starting position is an imaginary node one beyond the end of the node array. Because the document may have changed, the traversal halts when a node having code units that are mapped to by the Canonical Form is encountered. This makes sense because, if the encountered mapped code units had been in the original document then they would have been included in the target or the target's context, and would not be traversed in adjusting for an offset.

Let 4305 <current_node, current_position> be the right pair that is to be adjusted. Let <traversal_counter> equal the right offset value. Let <next_node> be the node to the left of <current_node> in the node array; if there is no node to the left, set <current_node> to null. Let <exit_loop> be false.

Set 4310 <exit_loop> to true if:
1. <traversal_counter> is zero or greater,
2. <next_node> is null, or
3. <current_node> contains text mapped to by the Canonical Form.

Note that this procedure traverses VnT nodes, so if we unexpectedly encounter a node having text that is mapped to by the Canonical Form, which could be a Text node or VnT node if it has alternative text and is treated as a Text node for this calculation, then we halt the traversal. For example, if three images were to be traversed to the left to establish the right boundary of a range, but one of those images was removed from the document, then it is possible to encounter a text-type node to the left during the traversal. Note that, if the text node encountered was in the document at the time the Fragment Identifier was created, then it would be part of the target.

If <exit_loop> is not 4315 true then set 4320 <current_node> to the value of <next_node>, increment the <traversal_counter> if <next_node> is not a Text node or an Alt node interpreted as a Text node in this instance, and set <next_node> to the node to the left of the new <current_node> in the node array. Restart the loop above 4310. If the Canonical Form is an Alternative Canonical Form then treat an Alt node as a Text node during traversal.

If <exit_loop> is 4315 true then 4325 set <current_position> to zero and then return <current_node, current_position>.

If:
1. <exit_loop> is 4315 true and
2. <current_node> is 4325 null or <current_node> has type VnT, then set 4335 <current_position> to 0 and return 4340 <current_node, current_position>.

If:
1. <exit_loop> is 4315 true and
2. <current_node> is not 4325 null, and
3. <current_node> is not 4325 a VnT node, then set 4330 <current_position> to the position of the last code unit of the text of <current_node> and return 4340 <current_node, current_position>. Note that the position of the last code unit of the text of a node is the length of the text of that node minus one.

Figures 44, 45:
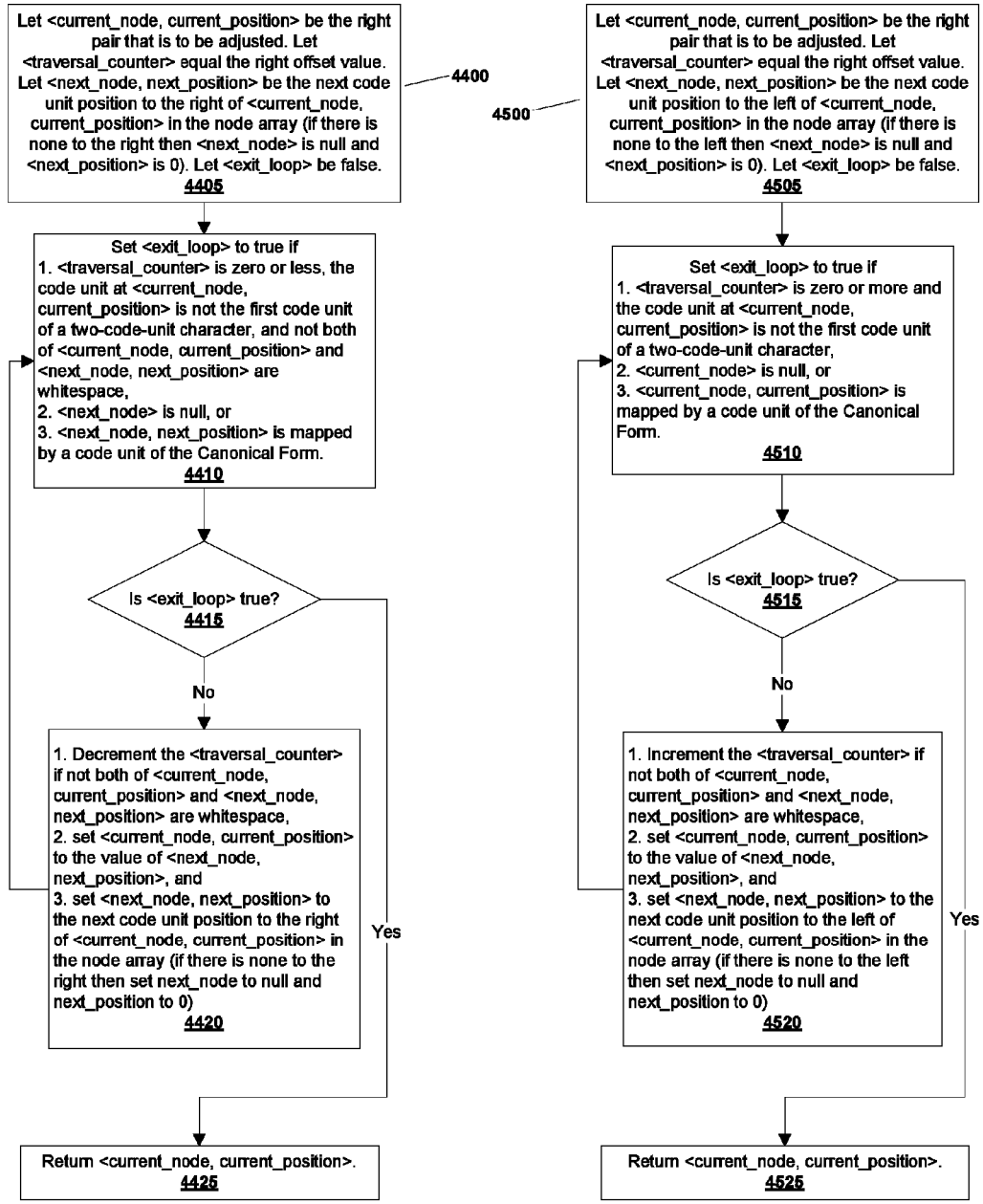
FIG. 44 illustrates adjusting the right position relative to a mapped node array according to a positive right offset value in code units.
FIG. 45 illustrates adjusting the right position relative to a mapped node array according to a negative right offset value in code units.

FIG. 44 illustrates the process 4400 of adjusting the right position relative to a mapped node array (a node array mapped to by a Canonical Form) according to a positive right offset value, in code units. This adjustment traverses the array from the original right position to the right, counting code units according to the offset, and ideally arrives at a code unit. If changes have been made to the document since the offsets were calculated, then the traversal may halt on a VnT node. The starting position is typically the node mapped to by the rightmost code unit of the Canonical Target but may be the rightmost code unit mapped by the Canonical Prefix if the target is empty. Because the document may have changed, the traversal halts when a code unit mapped to from the Canonical Form is encountered. This makes sense because, if the encountered code unit had been in the original document then it would have been included in the target or been part of the target's context (prefix or suffix), and would not be traversed in adjusting for an offset.

Let 4405 <current_node, current_position> be the right pair that is to be adjusted. Let <traversal_counter> equal the right offset value. Let <next_node, next_position> be the next code unit position to the right of <current_node, current_position> in the node array; if there is no code unit to the right then set <next_node> to null and <next_position> to 0. Let <exit_loop> be false.

Set 4410 <exit_loop> to true if:
1. <traversal_counter> is zero or less, the code unit at <current_node, current_position> is not the first code unit of a two-code-unit character, and <current_node, current_position> and <next_node, next_position> are not both whitespace,
2. <next_node> is null, or
3. <next_node, next_position> is mapped to by a code unit of the Canonical Form.

Note above that exiting the loop is prevented in some circumstances where the traversal is on whitespace and continuing the traversal includes additional whitespace. Recall that contiguous whitespace is counted as a single code unit in order to avoid some consequences of uncertainty about where whitespace comes from as well as the inconsequential nature of whitespace.

If <exit_loop> is 4415 not true, then 4420:
1. decrement the <traversal_counter> if <current_node, current_position> and <next_node, next_position> are not both whitespace,
2. set <current_node, current_position> to the value of <next_node, next_position>, and
3. set <next_node, next_position> to the next code unit position to the right of <current_node, current_position> in the node array; if there is no code unit to the right then set <next_node> to null and <next_position> to 0). The next code unit position to the right of a code unit position will sometimes be in another node and there may be intervening VnT nodes, which are skipped.

Restart the loop above 4410.

If <exit_loop> is 4415 true then return 4425 <current_node, current_position>.

FIG. 45 illustrates the process 4500 of adjusting the right position relative to a mapped node array (a node array mapped to by a Canonical Form) according to a negative right offset value, in code units. This adjustment traverses the array from the original right position to the left, counting code units according to the offset, and ideally arrives at a code unit.

Let 4505 <current_node, current_position> be the right pair to be adjusted. Let <traversal_counter> equal the right offset value. Let <next_node, next_position> be the next code unit position to the left of <current_node, current_position> in the node array; if there is no code units to the left then set <next_node> to null and <next_position> to 0. Let <exit_loop> be false.

Set 4510 <exit_loop> to true if:
1. <traversal_counter> is zero or greater, the code unit at <current_node, current_position> is not the first code unit of a two-code-unit character,
2. <current_node> is null, or
3. <current_node, current_position> is mapped to by a code unit of the Canonical Form.

In some embodiments (e.g., if acronyms are expanded in constructing the Canonical Form) a code unit in the Canonical Form can map to a set of code units in the node array, and the same set may be mapped to from more than one code unit; thus, while the mapping of a code unit in the Canonical Form is usually a single code unit, in its most general form (in alternative embodiments) the check (above) determines if <current_node, current_position> is a member of a set mapped to by a Canonical Form code unit.

If <exit_loop> is 4515 not true, then 4520:
1. increment the <traversal_counter> if <current_node, current_position> and <next_node, next_position> are not both whitespace,
2. set <current_node, current_position> to the value of <next_node, next_position>, and
3. set <next_node, next_position> to the next code unit position to the left of <current_node, current_position> in the node array; if there is no code unit to the left then set <next_node> to null and <next_position> to 0. The next code unit position to the left of a code unit position will sometimes be in another node and there may be intervening VnT nodes, which are skipped.

Restart the loop above 4510.

If <exit_loop> is 4515 true, then return 4525 <current_node, current_position>.

Figure 46:
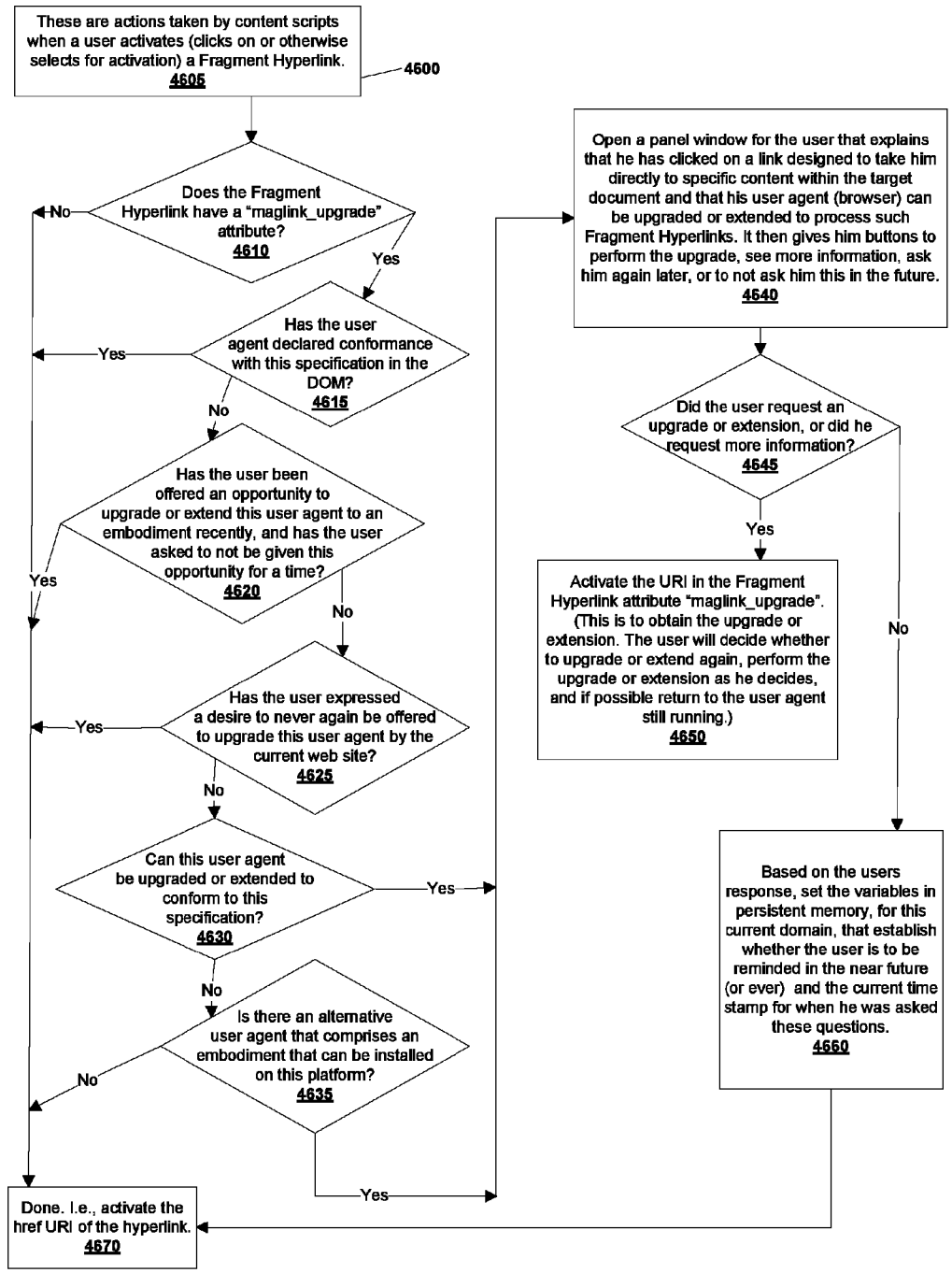
FIG. 46 illustrates content scripts informing a user that Fragment Hyperlink activation could be more functional if he upgraded.

FIG. 46 illustrates a process 4600 whereby content scripts inform a user that Fragment Hyperlink activation could be more functional if the user upgraded his user agent. These actions are taken by content scripts when a user activates 4605 a hyperlink, which is typically done by clicking a mouse but there are various means to interactively activate a hyperlink.

There are a number of checks that are, in some embodiments, made before the user is presented with an opportunity to upgrade his user agent.

The following 5 determinations are made:
1. Does the hyperlink have 4610 a "maglink_upgrade" attribute? This is inserted in documents' Fragment Hyperlinks if their authors wish to enable MagLink upgrades to their documents' viewers. One motivation to do this is the improved user experience when reading a document and activating Fragment Hyperlinks.
2. Has the user agent not declared 4615 conformance with a particular embodiment in the document DOM instance? If the user agent is already upgraded or is otherwise an expected instance of an embodiment, then it will have previously declared 2303 this state to the document by altering the DOM of the document. If the user agent has not made this declaration, then it may be beneficially updated to have those capabilities.
3. Has the user not been 4620 offered an opportunity to upgrade or extend this user agent to an embodiment recently, or has the user not asked to not be given this opportunity for a time? In some embodiments this information is kept in a browser cookie with a time stamp, for the domain of the document. If the user deletes his cookies then this information is lost. By default, less than two weeks is "recently", but this is a configurable amount of time.
4. Has the user not expressed 4625 a desire to never again be offered a chance to upgrade his user agent by the current web site? In some embodiments this information is kept in a browser cookie for the domain of the document. If the user deletes his cookies then this information is lost.
5. Can this user agent be upgraded or extended 4630 to an embodiment or can an alternate user agent embodiment be installed 4635 on this platform? In some embodiments this information is determined by querying the URI Service with an HTTP request that identifies the user agent, its version number, and platform. The location of the URI Service is, in some embodiments, either a value of the "maglink_upgrade" attribute of the hyperlink or the value of a 'META' tag. However, since this is communication between the document content and document scripts, no coordination on this particular choice need be made with other components of a distributed embodiment. For example, if the user agent is the open-source browser Firefox version 13.0 and the platform is Windows 7 service pack 1, then this information is sent to the URI Service (that was identified in non-visible document data, perhaps as the "maglink_upgrade" attribute of the hyperlink); the return consists of values indicating whether an upgrade or extension is possible for the user agent and for the platform in general. This information, concerning this browser and platform combination, is beneficially cached in state accessible to document content scripts.

If the answer is no to any of the questions as asked above, then the hyperlink is activated normally; if the user agent is an embodiment then it may open the hyperlink with full benefits to the user.

If the answer is yes to all of the questions as asked above, then in some embodiments open 4640 a panel window for the user that explains that he has clicked on a link designed to take him directly to specific content within the target document and that his user agent (typically a browser) can be upgraded or extended to fully process such Fragment Hyperlinks. Then it gives him choices (typically by clicking on buttons) to perform the upgrade, see more information, ask him again later, or to not ask him in the future.

If the user requested 4645 more information, an upgrade, or an extension, then activate 4650 the URI for the URI Service in a separate window; in some embodiments the URI for the URI Service is found in the hyperlink attribute "maglink_upgrade". This activation requests an upgrade or extension, but there is no guarantee that this will happen (e.g., the user could decide against an upgrade or the upgrade could fail). In some embodiments any upgrade occurs asynchronously with this activity. Thus, once an upgrade has been requested, the Fragment Hyperlink activation halts, before the user has actually upgraded anything. In a document served up by the upgrade site of the URI Service, the user will decide whether to perform the upgrade or extension. If he does choose to upgrade or extend a user agent, but it is not possible to upgrade the already running user agent without restarting it, or if the upgrade is to another user agent (another piece of software) entirely, then the upgrade is performed and the appropriate user agent is started. For some user agents it is possible to upgrade and then either reload the prior state or, in some cases, to upgrade the running process without ever shutting it down. The latter is done in some embodiments for those user agents for which it is possible.

If the user asked 4645 to be reminded later or to not be asked in the future (i.e., he did not ask for more information, an upgrade, or an extension) then based on the user's response, set 4660 the variables in persistent memory (such as a cookie), for this current domain, that establish whether the user is to be reminded in the future and the current time stamp. Then activate 4670 the hyperlink normally. Note that setting this persistent memory need not occur if the user requested more information or an update; if he follows through with a successful update the information becomes superfluous, and if he does not follow through or the update failed then the reason the update failed is unknown and it is inappropriate to make any change of state; thus the user will get another opportunity the next time he activates such a hyperlink.

FIG. 47 illustrates the process 4700 of recovery of version 1 Fragment URIs using an external search engine. This process includes actions at the user agent and actions at the URI Service. Communications between the two involve actions by both, but some actions occur at one or the other. The inputs to this process are a set of version 1 Fragment URIs; typically there will only be one but there may be multiple of them. However, all of the Fragment URIs have the same URI prefix because they were all Fragment Identifiers or Fragment Identifier ranges for the same URI. They may have been expanded from a multi-range Fragment URI in order to have just one range per URI. (See the processing rules 2220 of FIG. 22.)

We rank a document highest that produces the smallest Levenshtein distance between the Canonical Targets and the closest substring in the document's Canonical Form, with the minimum Levenshtein distances for each Canonical Target (i.e., each range) summed. Whenever a Canonical Target was not unique in the original Canonical Form, the shortest unique context on the left or right is considered part of that target for purposes of calculating the Levenshtein distance for that Canonical Target. The left context is used if the left and right contexts have the same length, or both contexts are used if neither context is unique.

A perfect recovery would be to find another document with a Canonical Form that is identical to that of the original document and which comes from the same domain. A good recovery would involve finding a single document in which the target ranges are all found, though perhaps in a different order. While the difference in quality of recovery can be enormous between these two possibilities, the combined Levenshtein distance between the Canonical Targets for the original document and the best matching Canonical Targets for the replacement document is zero in either of these cases. Such an exact match for Canonical Targets in potential replacement documents that otherwise differ has been found to occur often. To break such ties we assign an overall quality measure, which consists of the Levenshtein distance between the original target document Canonical Form and the best matching substring of a replacement document Canonical Form. If two or more possible replacement documents are identical by these measures, the shortest is beneficially selected since it has the least amount of extraneous information. If the original domain has a high quality result which is not the best, then we keep two high quality replacement results—the best from the original domain and the best from all sources.

Other distance or similarity measures are possible between documents and between canonical targets and best-matching substrings. Such measures have been studied in the literature for many years and are often compared directly against the Levenshtein distance; the different methods have various advantages and disadvantages. For example, some are more computationally efficient than the Levenshtein distance and could be used in alternative embodiments for that reason. Variants of the Levenshtein distance have been studied and could be used similarly in an embodiment.

As pointed out earlier, the number of ranges in a Fragment URI can vary from one to many. A multi-range Fragment URI is separated into single-range Fragment Identifier URIs when the user activates it, as is shown 2220 in FIG. 22. The resulting single-range Fragment URIs are still closely related and share the same URI prefix. If the document referenced by a multi-range Fragment Identifier (and by the set of single-range Fragment URIs derived from it) has not changed then all of the original ranges will be found and will have perfect matches. If the document changed, all combinations of individual ranges matching perfectly, partially matching, and not matching at all can result. When a user activates a multi-range Fragment URI and one or more of the ranges do not match acceptably, recovery can be done. In some embodiments, Fragment URIs with one or more ranges that do not match perfectly are candidates for recovery. Depending on configuration, either the entire set of related Fragment URIs with at least one range that did not match perfectly will be submitted for recovery (which is the default in some embodiments), or the set that only includes URIs with imperfectly matching ranges will be submitted.

Related Fragment URIs submitted for recovery are referred to as "Problem URIs" or "Problem Fragment URIs", and sometimes the "Problem URI set".

At the user agent, issue 4705 an HTTP request to the URI Service to begin recovery. Results of the recovery attempt will appear to the user in a user agent display (typically a browser window). For clarity, in what follows we describe the behavior of an embodiment in the context of a browser. If the user has configured his browser to replace the contents of the browser window used to activate the problem URI set with the recovery results, or if the problem URI set is based on a URI that does not resolve to a document (i.e., the document could not be found), then display the results in the activation window that generated the problem URI set. Otherwise, display the results in a new browser tab or window. The HTTP request sent to the URI Service comprises the Problem Fragment URIs.

At the URI Service, for each of the Problem Fragment URIs that does not already have 4710 associated search criteria, locate 4715 the targeted content for the Problem URI in the database, resize the content upward if too small and downward if too large, to arrive at a reasonably sized search query, and store 4720 the result in association with the Problem Fragment URI. The location is performed by looking up each Fragment Identifier and finding its associated Common DOM Form. The lookup is based on the hash of the URI prefix (not the URI prefix itself since it may have been altered), the time stamp, and the hash bits of the full Common DOM Form in the Fragment URI. While unlikely, if more than one Fragment Identifier matches these lookup criteria then the whole Fragment Identifier is compared with those potential matches that match the lookup criteria in order to locate the correct Fragment Identifier.

The target content itself is used to construct the search query in a simple string, starting with the first characters of the match. The content is found by first locating the range for this Fragment Identifier in the Common DOM Form, as described earlier 1158 for process 1100 of FIG. 11. As a consequence of the design, a range should always be found in some embodiments; however, if something unexpected has occurred and no matching range is found then the Fragment Identifier is treated as corrupt and it is dropped from the analysis. If ranges remain (have not been dropped) then the contiguous text of the resulting range of the Common DOM Form is taken as the search string. Note that this text reliably separates terms of any language for the search engine because the whitespace (collapsed to one space) and the punctuation are retained. If the length of this search string is below a configurable minimum, which by default is 50 code units in some embodiments, then the context of the string is added from both sides equally (unless there is no more on a side) until the minimum length is reached or the code units of the Common DOM Form are all in the search string. However, whole words are added and not single code units (characters that have two code units are also not split). If the resulting search string exceeds a configurable maximum, which by default is 600 code units in some embodiments, it is truncated to the maximum and then code units are added until any term split by the truncation is entirely contained in the search string.

This resulting search sequence is used without modification because the best search engines perform sophisticated analysis of such string sequences; for example, they search for exact in-order matches even if the string is not surrounded by quotes and give such exact matches a higher relevancy ranking. They also rank matches containing significant terms higher than those matching less significant terms.

Reduce 4725 the set of search criteria for the Fragment URIs to a set that is no more than a configured maximum number of total code units in length, which by default is 3000, and no more than a configured maximum number of criteria, which by default is 8 in some embodiments. First, the number of criteria is reduced to the maximum by elimination of those criteria that are the shortest. If two criteria are the same length then the criterion having the shortest target is preferentially eliminated. If a tie remains then one of those that tied for removal is arbitrarily picked and removed. If the resulting set of search criteria exceeds the maximum length in total, then the longest criteria are truncated (a word at a time) until the maximum is reached.

Using the full strings from the ranges of the Problem URIs, identify 4730 advertisements that target users who may be interested in that data. This is done beneficially using context based advertisement targeting. In some embodiments, the text is scanned for key words or key phrases. The key words or phrases are taken from an advertising keyword database for targeting advertisements. Based on the price offered by the advertiser, with the price potentially depending on matches of key words or phrases important to a particular advertiser and advertisement, choose and advertisement to optimize the return per impression. Note that there may be no key word or phrase matches, in which case the highest price per impression offered by advertisers would generally be less. Unless there are no available advertisers or they are uninterested in targeting a user on the basis of the strings he seeks to find, advertisements are chosen for display. In effect a user is declaring sufficient interest in the subject matter to open a Fragment Hyperlink to that specific information, which is a stronger statement of interest in that information than is opening a URI to the whole document, which generally contains information of no interest to the user. I.e., the user has revealed more specific information about his interests than would a user who opens the same page but without specific identification of what part or parts interest him. However, unlike most searches performed by the general public, the key words of the selected text are not identified by the user and are therefore beneficially extracted by automated means. For evaluation purposes we determine the pertinent key words or phrases to be those that match available advertisers' key word criteria. The advertisers have already determined which key words and phrases are meaningful in that those key words and phrases affect the price paid for a placement of advertisements containing them. Since the price is the parameter to be optimized, non-keyword words and terms in the text do not affect the decision.

The Levenshtein distance between a target string and its best matching substring in a string to be searched (typically here the Canonical Form or Alternative Canonical Form of a document) is always between zero and the length of the target string. To see this observe that if no symbol of a target string matches any symbol of the string being searched, then creating a match at the beginning of the string being searched can be achieved by replacing the first symbols of the string being searched with the symbols of the target string. This involves a number of replacements equal to the length of the target string, so the Levenshtein distance to the best matching substring cannot be greater than the target string length. We therefore define the "Levenshtein Ratio" for such a best substring match to be the Levenshtein distance between a target string and its best match in the string being searched divided by the length of the target string. A "Composite Levenshtein Ratio" for a set of target strings and their best matches in their respective strings being searched (often the same string for the set) is the sum of the Levenshtein distances to their best substring matches in the strings being searched divided by the sum of their target string lengths. A Levenshtein Ratio and a Composite Levenshtein Ratio are constrained as a mathematical consequence of their definitions to have values only between 0 and 1 inclusive, with the best possible matches having the value of 0.

For purposes of displaying comprehensible results to general public users, it is beneficial for larger numbers to imply the more desirable condition and for the ratio to be expressed as a percentage, with 100 percent being the best possible match. Therefore we define the "Levenshtein Percentage" (resp. "Composite Levenshtein Percentage") for a match to be 100 multiplied by the remainder of 1 minus the Levenshtein Ratio (resp. Composite Levenshtein Ratio). Users will be presented with metrics for substrings, sets of substrings, and whole document comparisons called "Match Quality". In some embodiments, the value of a displayed Match Quality is calculated as the Levenshtein Percentage or a Composite Levenshtein Percentage. Note that Match Quality values are not symmetrical; i.e., the Match Quality of a string A matching in a string B is typically not the same as the Match Quality of the string B matching in the string A. If A is a substring of B then the Match Quality of A in B is 100% but unless B is also a substring of A then the Match Quality of B in A is less than 100% and could be arbitrarily small.

In alternative embodiments the Match Quality is taken from different ranges of values. For example, the range of Match Quality values displayed could be "Excellent", "Very Good", "Good", "Fair", and "Poor". In alternative embodiments the Match Quality values can be calculated on the basis of a multiplicity of distance measures, many of which have been studied and compared in the literature for advantages and disadvantages under differing circumstances. These are often compared directly with the Levenshtein distance. One reason that there are so many measures is that it is beneficial if a calculated match that is significantly inferior is also a match that the user examining it would agree is inferior. Because this is difficult to achieve for even one user, it may vary by user, and for some users it may vary depending on circumstances, in an alternative embodiment users are allowed to choose between different Match Quality measures for display and thereby allowed to find a measure or measures that suit their notion or notions of match quality.

Prior to responding, the URI Service checks its database for a set of "Replacement Fragment URIs" that are stored in association with one or more Problem Fragment URI sets. These Problem URI sets are associated with sets of Fragment URIs so that replacements for members of a problem set can preferentially be taken from a single document. Nevertheless, in the usual case the problem and replacement sets have a single Fragment URI and the association is relatively simple. Replacement Fragment URI sets are stored in association with sets of Problem Fragment URIs if they were determined to have sufficiently high quality. However, replacements for some sets of Problem Fragment URIs have higher quality than others. Thus, provided the quality is above a configurable minimum, the replacement sets are compared for quality with other possible Replacement Fragment URI sets and the best sets are stored for later retrieval. In general, multiple sets are kept for a particular Fragment URI set because it is possible for one replacement set to have the best Match Quality for the target strings and another to have the best Match Quality when comparing the original and replacement documents overall. Further, the best Match Quality for either of these may not have the same original domain as the Problem URI set. Thus, in some embodiments, up to four replacement sets are kept for a Problem URI set. These are:

- the Replacement Fragment URI set having the best known Match Quality for the original target strings in the replacement document,
- the Replacement Fragment URI set having the best known Match Quality for the original document in the replacement document,
- the best known Match Quality values for each of the previous two matches, but only considering documents in the original domain.

This can result in four Replacement Fragment URI sets if the sets from the original domain are not the best but are better than the minimum.

The Match Quality is kept for both the target strings and the overall document, relative to the replacement document.

In some embodiments, the default configurable minimum composite Match Quality is 25% for target strings matching in replacement documents. By default this is the only minimum requirement; even though entire document Match Quality values are used, their default minimum quality is zero in some embodiments. Note that a match which meets the minimum Match Quality requirement for target strings must have a document Match Quality that is greater than zero, since one or more substrings from the original document match in the replacement.

If one or more Replacement Fragment URI sets are stored for the Problem URI set being considered then they are retrieved. The information for these replacement sets that is retrieved for transmission comprises:

1. The Replacement Fragment URI set.
2. The Match Quality of individual original Canonical Target in its replacement documents. There is one of these for each Problem Fragment URI in the set. (Recall that multiple ranges of a problem Fragment URI were 2220 separated into a single Fragment URI for each range when the URI was initially activated; at this point each Problem Fragment URI has one range.)
3. A snippet of information for each member of the Replacement Fragment URI set. This will be displayed to users so they can evaluate the content. These are limited to a configurable maximum length, which by default is 150 code units in some embodiments.
4. The Match Quality of the original Canonical Targets collectively in their replacement documents. (If there is only one Problem Fragment URI, then this value is identical to the individual Match Quality.)
5. The Match Quality of the original document in the replacement document. This uses the Alternative Canonical Forms of the two documents if one or more of the Problem Fragment URIs uses the Alternative Canonical Form, otherwise it uses the Canonical Form.
6. The time stamp for when this Replacement Fragment URI set was generated, which is also when the Match Quality numbers were generated. Since URI replacements are themselves subject to potential linkrot, it may be that a freshly retrieved document would not have the same Match Quality as when the Replacement Fragment URI set was created. The user therefore is given a time stamp that indicates when this solution was created.
7. A Boolean indicating whether this Replacement Fragment URI set comes from the original domain of the Problem URI set.

The service responds 4735 to the user agent's HTTP request with a document that displays the chosen advertisements. The document tells the user that the targeted content for a link that he activated was partly or completely missing. The document identifies the problem hyperlink and its source document (the document from which it was activated). If there are no Replacement Fragment URI sets from which to offer the user an existing solution, then the page declares that a search is underway. (In some embodiments, the user agent will begin to search when this page is received and displayed to the user.) If there are Replacement Fragment URI sets then they are displayed together with their Match Quality parameters, how long ago the Match Quality was determined, a set of snippets (one for each Replacement Fragment URI in the set, up to a configurable maximum number for each), and a hyperlink to the replacement document. In some embodiments the configured maximum number is 6 by default. A non-displayed part of the document contains the generated search criteria from which the user agent can construct search requests against a search engine in order to retrieve the content. (This is effectively metadata.) The page contains a button so the user can request search results or additional search results, depending on whether searching has already occurred. It also contains a button or buttons, used to return to previously displayed search results.

If there are 4740 one or more Replacement Fragment URI sets for the user to choose from in the received document, then in some embodiments, the document waits 4750 for user input, in the way some web pages wait for user input before taking some action. I.e., if existing replacement Fragment Hyperlinks are displayed, no search is launched until the user explicitly asks for it. When the user provides input, if it is not 4755 a request for search results and if it is not 4758 an activation of a Fragment Hyperlink, then the user input is processed according to normal user agent behavior and (if the document is still displayed after such processing) the document again waits 4750 for user input.

If there are no 4740 Replacement Fragment URI sets, or user input is received 4750 indicating that a search should be started or continued, then request 4780 additional advertisements relevant to the search criteria from the URI Service and search results (or additional search results) for the distinct search criteria from the search engine. Display the advertisements and merge 4765 the search results for the different criteria by combining results for the same URI, including their snippets, and placing those results in the highest relevancy position held by any of the results for that URI that are being merged. Interleave the search results from the results for each of the search criteria, one result at a time. Create Fragment Hyperlinks from the snippets according to the process 1900 of FIG. 19, so that the snippets have version 2 Fragment Hyperlinks, in accordance with the user's preferences. Add them to the display document. Then the display document waits 4750 for user input.

When user input for the document is received 4750, if it is 4755,4758 a Fragment Hyperlink activation, activate 4790 the Fragment URI in the normal way. (Even though part of a recovery process these are standard Fragment URIs and can themselves be independently recovered.) However, before activation the URI prefix and Fragment Identifier are associated in temporary (not persisted on disk) storage with:
1. the Problem URI set,
2. the search criteria,
3. the Match Quality values for any Replacement Fragment URI sets, and
4. whether this is an activation of a Replacement Fragment URI set or a search result.

This temporarily stored information allows the activation process for the Fragment URI to check if the activation is the result of a Fragment URI recovery (i.e., it originated as it did here, from a recovery operation). This stored information identifies the activation of the URI prefix and Fragment Identifier as a recovery operation and supports the maintenance of the URI Service database; in particular it supports the update of the URI Service database with new Replacement Fragment URI sets. These updates are ultimately done, in some embodiments, using a fully retrieved document at the URI Service; however, as noted earlier the full retrieval of a document in general means running computationally costly scripts that are intended for user agent execution during document display, typically in response to a user's interactive request for such display. Therefore, since the user agent is opening the document for display at the user's request, additional processing to ascertain the quality of the document as a potential replacement, or to verify its quality as a replacement since a replacement document may have been altered, is also performed at the user agent, as illustrated in FIG. 49. If a document is of sufficient quality to be a new potential replacement or if it is an existing replacement document that requires recovery (which implies the replacement document has changed), then the Common DOM Form for the document is sent to the URI Service along with related information for further processing. The Common DOM Form is not sent if the current version is already there.

FIG. 48 illustrates the process 4800 of recovery of version 1 Fragment URIs for a URI Service that also serves as the search engine. Note that the URI Service could perform as the search engine in this manner (with respect to the user agent, which sees the URI Service as the search engine), but it could be that the URI Service is in effect a search engine proxy for the user agent; such a URI Service would retrieve the search results from the external search engine in the same way that a user agent does in FIG. 47, on behalf of the user agent. However, one advantage of the process 4700 of FIG. 47 is that of cost when an outside search engine is used; many search engines allow user agents to make free search requests but require a search proxy service to pay per search. If the user agent requests searches from a third party search engine for free, or the URI Service is a search engine, then the external costs of the searches are avoided.

This process 4800 involves actions at the user agent and actions at the URI Service. Communications between the two involve actions by both, but some actions occur at one or the other. The inputs to this process are a set of version 1 Fragment URIs; typically there will only be one but there may be multiple of them. However, all of the Fragment URIs have the same URI prefix because they were all Fragment Identifiers or Fragment Identifier ranges for the same URI. They may have been expanded from a multi-range Fragment URI in order to have just one range per URI. (See the processing rules 2220 of FIG. 22.)

The process 4800 of FIG. 48 is identical to process 4700 of FIG. 47, except for the location where some search activities occur. Searching occurred in a separate search service and merging of search results occurred at the user agent in the process 4700 for FIG. 47. Both of these occur at the URI Service in the process 4800 of FIG. 48. Thus, elements of FIG. 48 have the same numeric identifiers as corresponding identical elements in FIG. 47. Only some diagram elements have different numerical identifications 4865, 4868, 4880 and need be described separately.

For the process 4800 of FIG. 48, control flow for two of the decisions 4740,4755 enters the process 4880 of FIG. 48 where the user requests additional advertisements and search results under precisely the same circumstances as described for the analogous process 4780 in FIG. 47.

If there are no 4740 (in FIG. 48) Replacement Fragment URI sets or user input is received 4750 (in FIG. 48) indicating that a search for more input should be started or continued, then request 4880 additional advertisements relevant to the search criteria and additional search results for the distinct search criteria from the URI Service. Generate 4865 the advertisements and search results at the URI Service and merge the search results for the different criteria by combining results for the same URI, including their snippets, and placing those results in the highest relevancy position held by any of the results being merged for that URI. Interleave the search results from the results for each of the search criteria, one result at a time. Create Fragment Hyperlinks from the snippets according to the process 1900 of FIG. 19, so that the snippets have version 2 Fragment Hyperlinks, in accordance with the user's preferences. Add them to the display document. Since this occurs at the URI Service, the request 4880 beneficially has the user's preference information concerning how to construct version 2 Fragment Hyperlinks. Send these results to the user agent, where the user agent displays 4868 them. Then the display document at the user agent waits 4750 (in FIG. 48) for user input for this document.

In alternative embodiments, when the URI Service generates 4865 search results, Surrogate URI based hyperlinks are created for the search snippets. The URIs of these hyperlinks are beneficially indirect (i.e., Surrogate) so that the Redirect Service will automatically obtain tracking information on the user when he selects a Surrogate URI for activation. Further, as noted before, version 1 Fragment URIs can beneficially identify larger document sections than can usefully be shown in a snippet. The persistent information kept for search engine Surrogate URIs at the URI Service is similar to that for any other Surrogate URI and its version 1 Fragment URI that a user creates. However, in some embodiments such search engine created URIs are not marked as having been created by a user, but as search engine creations. If such a Fragment URI is activated then the activation contacts the Redirect Service since it is indirect. If it is copied or stored outside of the user agent (which occurs e.g., when content of a document is copied to the clipboard or a document is saved locally), then a user agent acting according to this embodiment notifies the URI Service for each such Surrogate URI that is copied. If activation or another notification of use for such a Fragment URI does not arrive at the Redirect Service or the URI Service within a configured time limit, then those URIs are discarded by the URI Service and Redirect Service. By default this configured time limit is set to one week. The creator of such URIs is the search engine, and when a user activates one of them, that activation goes on his statistics as it would for any Fragment URI followed.

According to some embodiments a URI Service that also acts as a search engine maintains a Common DOM Form for every document that it indexes; it beneficially maintains and indexes the latest version known for any document that remains generally accessible through a URI (except documents excluded for legal reasons, such as requests for exclusion by copyright owners). If a Fragment Hyperlink can be activated for a particular Common DOM Form, then that Common DOM Form is beneficially maintained indefinitely after the document is modified. Thus, discarding of search engine generated version 1 Fragment URIs that can no longer be activated allows the potential efficiency of discarding versions of documents that will never be used to recover a Fragment URI.

FIG. 49 illustrates the process 4900 for feedback to the URI service for maintenance of Replacement Fragment URI sets. At the user agent calculate 4905 the collective Match Quality of the search criteria in the document. While typically the search criteria will in fact be the same as the target strings from the Problem URI set that is in recovery, since the target strings can be arbitrarily long this is not always the case. Therefore, this value is in general only an estimate of the Match Quality of the full Problem URI target strings in this potential replacement document.

If this estimated Match Quality is 4910 not greater than a configured minimum percentage of either of the corresponding Recovery Fragment URI set's Match Quality that were sent for this recovery from the URI Service, then processing ends 4915 for this 4900 maintenance activity. The configured minimum percentage is by default 75%; i.e., processing continues if the estimate is at least this minimum portion of these best known potential replacements. The two Replacement Fragment URI sets that correspond to this potential replacement are those from the same domain as the original domain of the Problem Fragment URI set, provided this potential replacement is also from that same domain. The Replacement Fragment URI sets that correspond are the pair from other than the same domain, provided this potential replacement is not from the same domain. Note however that there may be no Replacement Fragment URI sets, there may be fewer than 4 of them, or a particular Replacement Fragment URI set could occupy more than one position. For example, a replacement could be the best replacement from any domain as well as from the same domain according to its composite Match Quality for the target strings from the Problem Fragment URI set.

If this estimated Match Quality is 4910 greater than the configured minimum percentage of either of the corresponding Recovery Fragment URI sets' Match Qualities that were sent for this recovery by the URI Service, then the user agent sends 4920 the URI prefix for this document to the URI Service as a potential recovery URI for the Problem Fragment URI set. It also sends the Match Quality of the search criteria and the full hash (64 bits in some embodiments) of the Common DOM Form for this potential replacement document.

At the URI Service, if this Replacement Fragment URI has been 4925 checked before, and a) the form of the document that was checked had the same Common DOM Form hash or b) it was rejected as a replacement and at the time of rejection the search criteria Match Quality in this document was as high as the user agent reports it to be now, then processing ends 4935 for this 4900 maintenance activity.

At the URI Service, if this Replacement Fragment URI has not been checked 4925 before, it was checked but the form that was checked did not 4930 have the same Common DOM Form hash, or it was checked and rejected but at the time of rejection the search criteria Match Quality in this document was not as high as the user agent reports it to be now; and if the service does not yet have 4940 a copy of the Common DOM Form for this URI that has a matching Common DOM Form hash value, then send 4945 the Common DOM Form for this URI to the URI Service. In some embodiments this transmission uses one of the deduplication technologies to reduce bandwidth utilized. In some embodiments, the deduplication technology used is that which is specified in U.S. Pat. No. 5,446,888. According to that specification, the content of the last version of the Common DOM Form at the Service is used to avoid re-transmitting information that is common to it and this new version. These Common DOM Forms are not necessarily implemented as files to be synchronized, as recited in U.S. Pat. No. 5,446,888, but they can be implemented as files to be synchronized. While U.S. Pat. No. 5,446,888 does not use the term "deduplication", the technology it discloses has since come to be known as a form of or application of deduplication. As used in some embodiments, the general "key defining method" recited in the claims of U.S. Pat. No. 5,446,888 is implemented here as a modified 64-bit GENERAL rolling hash function described earlier in this document and used for various purposes in some embodiments of this disclosure. The full 64 bits of this GENERAL rolling hash function are used in some embodiments for the "reference key values" of the claims and specification of U.S. Pat. No. 5,446,888. In alternative embodiments a higher number of bits is used for the rolling hash function for deduplication, such as 128 or 256 bit versions of GENERAL. Also in alternative embodiments, the number of bits used from the hash function is fewer than the hash function creates.

The particular member of the GENERAL family (as modified here) used for deduplication is determined by sending, from the recipient to the sender, a new set of random bits that define the precise member of the GENERAL family of hash functions used, which in some embodiments includes a new initial hash value. In some embodiments the block size used is 256 bytes. In some embodiments the initial value and the particular hash function is sent using SSL (secure sockets layer) encryption. In other embodiments other encryption is used. In some embodiments no encryption is used. In some embodiments, before transmitting to the sender the new initial value is generated repeatedly until not less than 25% of its bits are 0 and not less than 25% of its bits are 1; note that most of the time these conditions are met by a random sequence of 64 bits. In some embodiments the initial random content of the table, as sent, uses random values generated by pre-computing random values for this purpose and storing them. In some embodiments uncolored true random bits (independently distributed with 0.5 probability of being 0 or 1 for each bit) are generated; in some embodiments this is accomplished by collecting thermal noise from a charge coupled device (CCD) having its lens covered, such as simple video recording devices commonly found on computers, and then concentrating the entropy in the output and whitening it using a cryptographic hash function such as SHA-2 256. In other embodiments other entropy concentrators and whiteners are used. In other embodiments, this is done by running the scheduler clock of an operating system against the performance clock, and the minute variances in the two clocks are used to yield random bits that are subsequently whitened and concentrated. In other embodiments, only pseudo-random bits are used by application of a pseudo-random number generator.

At the service the Match Quality of the search criteria in the Common DOM Form is verified. If the Match Quality does not verify, then processing halts 4950 for this potential recovery URI.

At the service the composite Match Quality of the Problem URI target strings in the document are generated 4955, along with a best substring match in the document for each Problem URI target string. If the Problem URI target strings are the same as the search criteria strings, which is a common occurrence, then the results of the previous step (4950) are used. Also generate the Match Quality of the Canonical Form (resp. Alternative Canonical Form) of the document and version of the Problem Fragment URI set in the Canonical Form (resp. Alternative Canonical Form) of this potential replacement document. The Alternative Canonical Form is used if any of the Fragment Identifiers in the Problem Fragment URI set uses the Alternative Canonical Form.

At the service, if this potential replacement does not have 4960 a composite Match Quality for the Problem URI target strings that exceeds a counterpart Replacement Fragment URI set for this Problem Fragment URI set, and likewise does not have a document Match Quality that exceeds a counterpart in the set of Replacement Fragment URI sets, then associate 4965 this potential URI prefix with the Problem Fragment URI set as a known inferior replacement. Also store its Match Quality numbers as well as the Match Quality of the search criteria in the document.

At the service, if this potential replacement has 4960 a composite Match Quality for the Problem URI target strings or a document Match Quality that exceeds a counterpart in the set of Replacement Fragment URI sets, then create the actual Replacement Fragment URI set from the best match strings for the Problem URI target strings and store 4970 this set in place of its previous counterpart or counterparts. This includes storage of its Match Quality for the search criteria. The counterpart or counterparts of a potential replacement depend on whether the potential replacement is in the same domain as the Problem Fragment URI set. Note that a document can have multiple counterparts; for example, if the document is a sufficiently good replacement and it is in the same domain as the Problem Fragment URI set, then it could replace all four previous Replacement Fragment URI sets for this Problem Fragment URI set. Move all previous Replacement Fragment URI sets that are no longer one of these sets into the rejected set for this Problem Fragment URI set.

Most commercial data deduplication uses cryptographic hash functions, regardless of whether the deduplication is source or target deduplication, in-line or post-process deduplication, or fixed size blocks versus variable sized blocks. Cryptographic hash functions are used because they provide high quality bits and attacking the integrity of the process by deliberately creating a collision for a cryptographic hash is thought to be infeasible.

Cryptographic hash functions are not rolling hash functions, so commercial fixed-block size deduplication schemes for bandwidth optimization often use a rolling hash function to find potential matches that almost always are true matches, and then they use a cryptographic hash function to further ensure that the potential match is a true match. Other deduplication schemes do not use a rolling hash function to identify potentially matching blocks, but instead use signature based blocking schemes (also using rolling hash functions usually to find block delimiters) to establish block boundaries, and then calculate a cryptographic hash of each variable sized block to look for matches. Again, in any such scheme the use of cryptographic hash functions is thought to ensure that any match found has not been deliberately arranged by inserting known collisions in an attack on the system. It is also thought to probabilistically ensure that accidental collisions do not occur.

Drawbacks of deduplication schemes that use cryptographic hash functions or any other single (not randomly changed) hash function include:

1. The methods are deterministic, so any hash collision that occurred in such a transmission would deterministically repeat given the same transmission state. This is markedly different from any simple transmission, whereby the probability of corruption is independent of any previous corruption that may have occurred.
2. Once any collision is found for any of the standard cryptographic hash functions, which includes MD5, SHA-1 and SHA-2 hash functions, the known collision can be used to create a collision in data being deduplicated.
3. Cryptographic hash functions are expensive to compute.

In contrast, benefits from using the method described in FIG. 49 include:

1. The hash function is highly efficient (more efficient than any cryptographic hash function).
2. Previously found collisions are useless for creating a collision in the future, since the specific hash function that will be used is unknown until its state is generated and it will likely be used only once (globally in time and space only once).
3. The method is random; in the unlikely event that a corrupting collision ever did occur in a data deduplication process, then sending the same data a second time would have an independent probability of collision based corruption.
4. Since the modified GENERAL hash functions are rolling hash functions, for fixed block size source deduplication (as in FIG. 49) it is unnecessary to have a primary rolling hash function to find potential matches and then calculate the modified GENERAL hash function as a replacement for the secondary cryptographic hash. However, simple replacement of the cryptographic hash with a randomized modified GENERAL beneficially increases the performance of any such implementation. However, as shown in the example embodiment of FIG. 49, it is only necessary to calculate one hash function, a modified GENERAL hash function that is randomly chosen for each use, as a rolling hash function in a single pass over the data at the source.

In addition, the GENERAL family of hash functions are pairwise independent, so the probability of a single uncontrived corrupting collision is as good as it can be, which is therefore at least as good as a cryptographic hash function can provide.

In other embodiments, data deduplication schemes that in the prior art use cryptographic hash functions or some other fixed hash function, are beneficially modified to instead use randomized modified GENERAL hash functions. Whether the deduplication scheme used is to store the data efficiently (as is performed at the URI Service), or to send it efficiently (as described in FIG. 49), so long as the actual hash function utilized is changed often enough, the hash is unknown (securely transmitted and both sides are trusted to not disclose it), or it is used on one side only and that side is trusted, then no deliberate attack can feasibly be made and any potential accidental corruption will beneficially (with high probability) be corrected when the hash function changes. The random hash utilized can be changed periodically in any deduplication scheme, although for some schemes and depending on the amount of data probed for duplicates the period over which it is changed is for practical reasons longer than for others. In the deduplication scheme described in FIG. 49, the GENERAL hash function used can beneficially be changed for every Common DOM Form transmitted.

Figure 50:
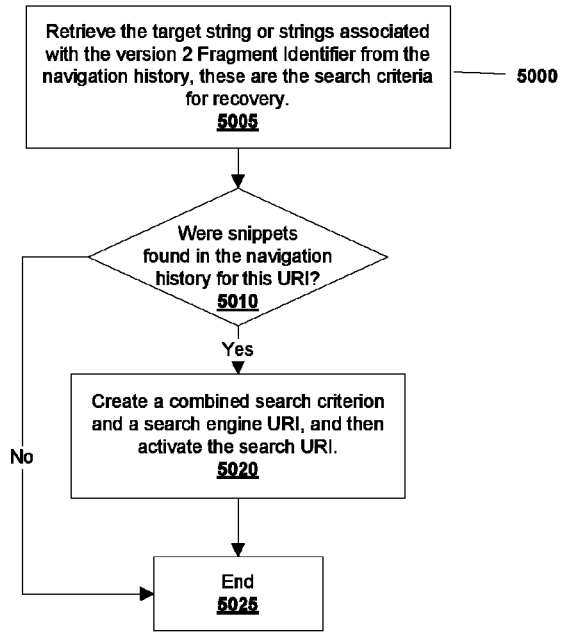
FIG. 50 illustrates version 2 Fragment URI recovery.

FIG. 50 illustrates the process 5000 for version 2 Fragment URI recovery for Fragment URIs associated with snippets. A search engine will generate snippets that sometimes are not part of the target document. For example, a snippet may be taken from the 'meta' tag description of the document or from some third party description of the document. It may also be that the search engine has not indexed the document since it was modified and the target snippet is no longer there. It may also be that the document has become temporarily or permanently unavailable. In all of these cases, the user has requested the snippet or snippets in document context, but the document opened has no such content or is incomplete. If the snippets are in the navigation history in order to perform a search, then the user agent embodiment attempts to recover by performing a search for the content that was expected and the user may then choose from the search engine results.

Retrieve 5005 any snippet strings associated with the Version 2 Fragment URI from the navigation history, and if found these will become the search criteria for recovery. These strings are used directly as search criteria by concatenating them (with spaces between) to arrive at the search criterion. Modern browsers can accept very long strings as search criteria.

If snippets were not found 5010 for the version 2 Fragment URI, then end this recovery processing 5025.

If snippets were found 5010 for the version 2 Fragment URI, then concatenate them in order while ensuring that there is a space between each; the result is the search criterion. The search criterion is transformed into an argument for a search engine URI in a manner specific to the particular search engine, which creates a search engine query URI; the created URI is activated for display in the user agent. For a web browser, in some embodiments, a new tab is created for this activation. In alternative embodiments, a search engine main web page is opened in a new tab and the search criterion is entered programmatically into the search criteria input field, and then the search button is programmatically pushed.

As a consequence the user is presented with results for the search in a search engine results document. According to some embodiments, as illustrated in FIG. 17, if the search engine is not an embodiment that has already provided snippet associated Fragment Hyperlinks, then the user agent creates version 2 Fragment Hyperlinks for the results snippets from which the user can choose and activate additional snippet associated version 2 Fragment Hyperlinks. These can in turn be recovered if the searched content is not found.

The use of snippet search criteria in the manner of FIG. 50 is likely to find the same document that was already activated by the user, and the user may not recognize this and follow the link a second time, which can create an unintended recursive recovery process that attempts to reopen the same document repeatedly. In some embodiments the possibility of such unintended recursive recovery is programmatically suppressed. This can be done in various ways that include:

1. Marking the results as hidden content, without otherwise altering the DOM of the search engine results document. The user will not see the recursive results in this case.
2. Removing the specific results that match the URI from the document. The user will not see the recursive results in this case.
3. Marking the matching results as "In Recovery" in place of making Fragment Hyperlinks for it. In this case the user will see the recursive results, and will be able to activate a non-Fragment Hyperlink to it, but no recovery attempts will ensue from such activation.
4. Disabling the search engine supplied hyperlinks for these results. In this case the user will see the recursive results, but will not be able to activate them.
5. Making such recursive hyperlinks visually obvious; for example, by making the color of a directly recursive hyperlink distinctively different from the standard hyperlink colors. In this case the user will see the recursive results, and will be able to activate them normally, but he will have visual clues to inform him of what he is doing.
6. Recognizing the recursion after the user has requested activation, and opening a panel explaining to the user that he is attempting to open the same document that already failed to have the content he was looking for previously; then asking if he wants to continue.
7. Recognizing the recursion after the user has requested activation but only if there is a repeated failure to find the content, then opening a panel explaining to the user that he can attempt to recover a Fragment URI for the same document having a URI already in recovery; then asking if he wants to continue.
8. Combinations are possible; for example, making recursive hyperlinks visually obvious (5 above) can be combined with recognition of recursive activation after the fact and causing the user to confirm his desires (6,7 above).
9. The user is allowed to choose the mode for suppression of unintended recursive recovery by configuration.

Those skilled in the art will appreciate that there are many alternative embodiments that achieve selection within a document and scrolling to a search snippet taken from search results, which occurs in some embodiments when a document is opened from a search results document. In example alternative embodiments, snippet strings are incorporated directly (as strings) into URIs as another kind of fragment identifier; this can be practical since search snippet strings are usually fairly short. In these embodiments, new fragment identifiers are created from search results as represented in FIG. 18 or FIG. 19, but the strings are themselves incorporated into the fragment identifier rather than hash-based ranges. When a URI having such a fragment identifier is opened, only then are the strings processed into a Canonical Form and the hashes generated as described in the process 200 of FIG. 2. Then a search using the generated hash ensues; if the string is not found then recovery proceeds essentially as described for some embodiments starting in FIG. 47 or FIG. 48. In other similar embodiments, the strings are converted to a canonical form (but not hashed) before incorporation into the fragment identifier.

In a further modification (in yet other embodiments), there is no conversion to a canonical form and no hash generated; instead the document text is searched directly to find the string. If the string is not found, then recovery proceeds essentially as described for some embodiments. In other embodiments, there is no recovery phase if the string is not found. In yet other embodiments, there is no attempt to find a partial match. In still other embodiments, the search string is converted to a canonical form and searched for directly against the canonical form of the document; i.e., it uses canonical forms but does not use hashes. As discussed before, many useful but different canonical forms are possible in embodiments.

Embodiments using a canonical form and hash based searching are beneficial because of the efficiency of the search and because they more reliably find the intended content. Some embodiments use n-gram hashes in the URI fragments that are created, rather than the snippet strings, in part because this allows arbitrary length strings to be identified in Fragment URIs. Recall that, in some embodiments, if the URI is constructed at the search engine (as in the process 1800 of FIG. 18), the snippet may beneficially only be a part of arbitrarily long text identified by an associated Fragment URI.

FIG. 51 illustrates the processes 5100,5101 of navigation history (including bookmarks) snippet creation for Fragment Identifier Content Records. One process starts 5101 with strings and arrives at snippets, and is contained in the process that starts 5100 with DOM ranges, first obtains strings, and then using 5101 the string-to-snippet process arrives at snippets.

If there are 5105 more ranges for this URI than the configured maximum number of snippets allowed, then drop 5110 the ranges that come latest in the document from processing until the number of ranges equals the maximum number of snippets allowed. In some embodiments, the default maximum number of snippets allowed is 5. In alternative embodiments, the number of ranges is reduced by removing the shortest ranges in code units contained until the number of ranges equals the maximum number of snippets allowed.

Each range remaining is expanded 5115 in both directions to include complete terms and until a configurable minimum size is achieved. By default the configurable minimum size is 50 characters. The range's context is added from both sides (unless there is no more on a side) until the minimum length is reached or the code units of the node array are all in the search string. However, whole terms (words) are added and not single code units. While it shouldn't be necessary, since whole terms are used, we also expand to be sure that whole characters are included, which could add up to one code unit on each end.

If there are 5120 fewer strings than the configured maximum number of snippets and there are 5130 strings longer than three times the maximum length for snippets, then choose 5135 a longest string for division (there may be more than one that has the longest length in code units, in which case pick the one of these appearing first in the DOM), and divide it at the code unit nearest the middle (if there are two then divide at the first code unit) putting the middle code unit in the second string. If the chosen code unit is in a term and not at the beginning of a term, then add code units from the end of the first sequence to the beginning of the second until the first term of the second sequence is wholly in the second sequence. Insert the first and second strings in order in the position of the string from which they came in the ordered set of strings. Then return to check 5120 for the number of strings for snippet conversion. In some embodiments, the maximum length for snippets is configurable but by default is 200 code units (before adding any code units required to include complete terms).

If there are not 5120 fewer strings than the configured maximum number of snippets or there are no 5130 strings longer than three times the maximum length for snippets, then truncate 5125 each string to the configured maximum number of code units in a snippet and expand it to complete terms or words (as well as complete characters). By default the maximum number of code units in a snippet is 200 (before adding any code units required to include complete terms).

Documents are typically crawled by a search engine web crawler that periodically downloads every document or its stand-in (stand-ins are used for example when URIs include hashbangs according to the Google specification described in the introduction). Corrections for inaccurate information can only occur at the time the document is crawled. The effects of a change to a document can take two weeks or more to take effect, even with aggressive search engine crawlers. During the time period when changes are not yet reflected in the search index, queries against the search engine can repeatedly produce inaccurate results.

Stale indexes in a search engine affect users by two main mechanisms. The first is when a user opens or attempts to open a document that once had information of interest which is no longer there; in general we call such an event a "Missing Information Event". When a Missing Information Event was caused by a stale search engine index, we call that specific form of Missing Information event a "Missing Indexed Information Event" (MIIE). The second occurs when new information is available in a document and a user's search would have uncovered it if it were indexed, but the information is not yet indexed so the user cannot find it; we call this a "Index Missing Event" (IME). While a document may change in arbitrary ways that would affect how it is indexed, a stale index is of no consequence to search service users until it results in a MIIE or IME event. We dismiss as minor a third mechanism whereby users read and cognitively process snippets but do not open the corresponding documents; when such a snippet is no longer present in the document the user may draw a false conclusion. However, unless the user actually attempts to open the document and experiences a MIIE, the information cognitively processed in this way was recently valid and any conclusions about the information would have been valid recently and often remain valid. Missing Indexed Information Events directly waste a user's time and are more apparent to users than Index Missing Event occurrences. In some embodiments, Missing Indexed Information Events are mechanistically observed, recorded, and the results used to affect indexing operations at search engine embodiments.

If a search engine interacts with user agents to achieve efficient document indexing, then user agents calculate the Common DOM Form and its hash for documents; then the search engine and user agent together determine if the document should be re-indexed at that time. The hash is sent to the search engine where it is compared with the hash of the document's latest known version (known at the search engine). When they differ, there has been a change to the document so it becomes a candidate to be re-indexed. The user agent transmits the document's Common DOM Form to the URI Service for indexing if the URI Service ultimately determines that the document should be re-indexed at that time. This transmittal of the Common DOM Form, in embodiments, utilizes deduplication technology. In some embodiments the deduplication technology used is as described in U.S. Pat. No. 5,446,888 to reduce the bandwidth utilized in a manner similar that described 4945 for FIG. 49.

However, additional checks and determinations are beneficially used because many documents have small parts of their content that dynamically change and may change with every access (e.g., a counter for the number of document accesses or a field for fine-grained current time). For many documents, the behavior described so far essentially always results in transmittal of a new Common DOM Form to the search engine for re-indexing. While deduplication reduces the bandwidth and storage costs in such cases, so long as Fragment Identifier ranges do not include the dynamic content, the document may not need to be kept in all of its versions. Various strategies can be used to alleviate this drawback. In an embodiment the URI Service recognizes that, for many documents, only a small part of the total document has such dynamic content, and those documents are put on a schedule for updates. I.e., such documents are only re-indexed after an amount of time since the last re-indexing. In another embodiment, the last configurable numbers of stored versions are compared, and if a configured minimum amount of their Alternative Canonical Form content is stable in all of those versions, then a version 2 Fragment Identifier is created with ranges that identify the stable parts of the document. By default the configured amount that should be stable is 90% of the Alternative Canonical Form text over a maximum of 5 ranges. Such a document will typically have multiple stable ranges that are encoded into the version 2 Fragment Identifier. If the hash for the full document differs at the URI Service, and the timeout for general re-indexing has not been exceeded for this document, then this version 2 Fragment Identifier is sent to the user agent and the user agent determines if the version 2 Fragment Identifier matches in the document; if it does not then the new Common DOM Form is sent to the URI Service. Some embodiments use both of these mechanisms as well as user access frequency to establish how often to re-index a document.

Figure 52:
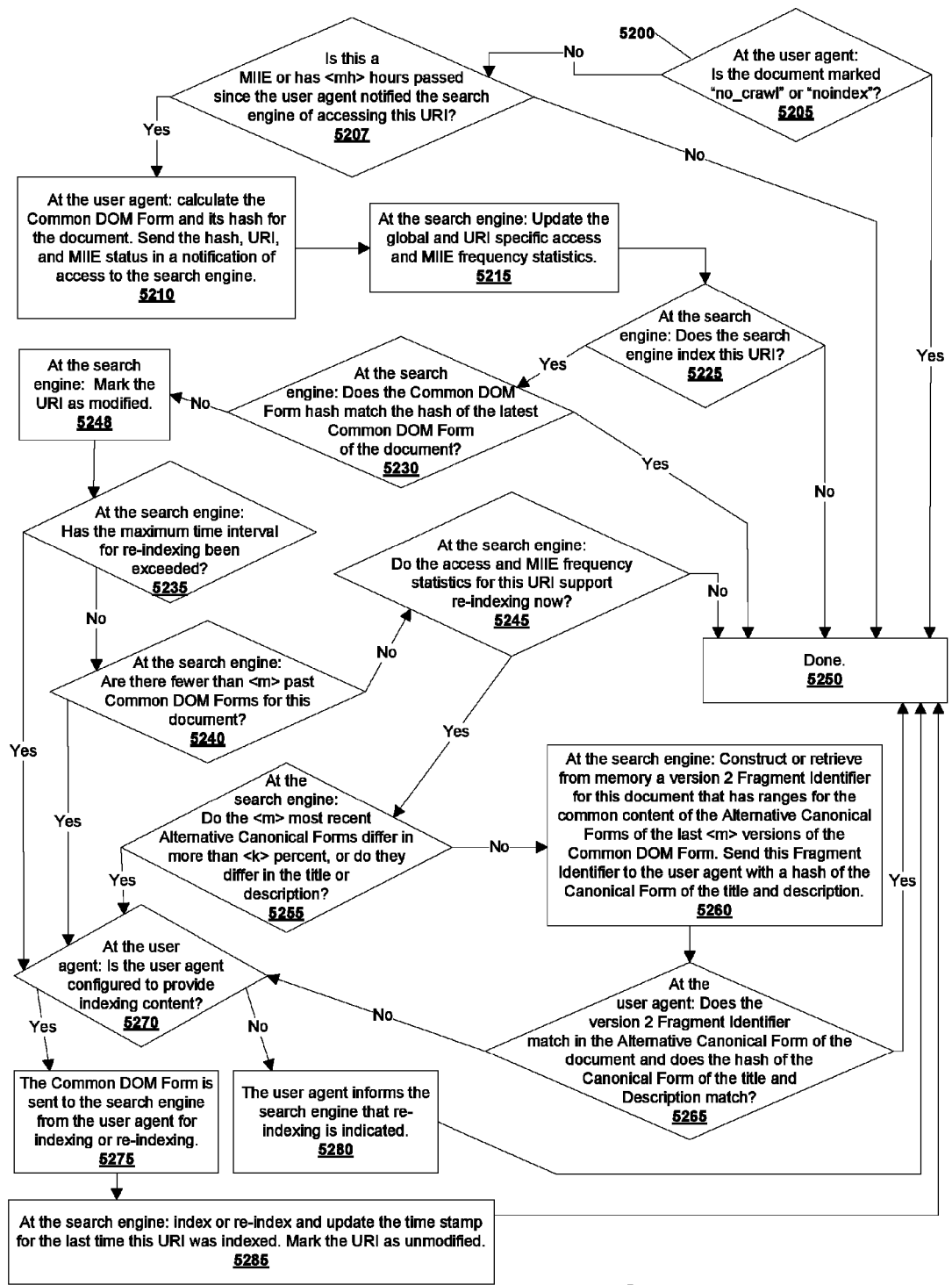
FIG. 52 illustrates efficient search engine indexing with Canonical Form hashes, Fragment Identifiers, and user agent integration.

FIG. 52 illustrates a distributed process 5200 that supports efficient search engine indexing by integration of user agent activities into the indexing process. User agents and the search engine use Common DOM Form hashes and Fragment Identifiers to establish whether content has been altered and if so, by how much. In some embodiments, the user agent acts as an indexing agent in conjunction with opening documents; the user agent hashes the document content and sends the hash for comparison, which allows inexpensive comparison with prior versions of the document. In contrast to current practice whereby search engines download a document periodically, if the hashes compare positively then it is unnecessary for the search engine to download the document contents to ascertain if it changed. If it changed and a determination is made to re-index the document, then by default the user agent sends the Common DOM Form to the search engine for re-indexing. Again in contrast to current practice, it is thereby unnecessary for the search engine to download content and possibly run scripts to alter that content in order to obtain the current content—it has already been provided by the user agent. In addition, user agents can be configured so they only inform the search engine of the document status, without uploading the document's Common DOM Form to the search engine. This can be useful for bandwidth limited devices such as cell phones, or for users who do not wish to send content to search engines. In that case the search engine may directly retrieve the document content, or it may wait until a user agent that is configured to send document content opens the document. This activity takes place after a document has been downloaded at the user agent, which download is typically requested interactively by a user, so that he can view the document (see the indexing actions 2568 of FIG. 25).

If this feature is included in an embodiment, and the search engine is also the URI Service, then the preferred behavior is that search engine records for a URI be updated whenever the URI's Common Dom Form is updated; for example, such an update can occur when version 1 URIs are created as in FIG. 11. The reduction in traffic is one benefit for unification of search engine and URI Service embodiments. If users regularly create Fragment Identifiers for a particular URI, then explicit updates resulting from Fragment Identifier creation can virtually eliminate the need for the explicit search engine updates, as described for this 5200 process. Another benefit is that an often-accessed document that has not been updated need not be downloaded and re-indexed, which is established because the user agent, in conjunction with the search engine embodiment, determines that the document has not changed and need not be re-indexed. Another benefit is the efficiency of the search engine in that it does not download and run the document scripts to establish content, which is done by the user agent; this processing is not an added burden to the user agent because it only does this when the user requests that the content of the document be downloaded and displayed.

The URI prefix (i.e., not the full URI including Fragment Identifiers) is used to identify document content since search engine indexing operations do not depend on Fragment Identifiers. However, as already noted Conventional Fragment Identifiers may affect document content and therefore can affect search engine indexing operations. For the rest of the description of this 5200 process, "URI" means the URI prefix (i.e., the URI absent all Fragment Identifiers).

In order for a user agent comprising some embodiments to support search engine indexing, it keeps in its persisted navigation history for each user's role an association between accessed URIs (URI prefix) and a time stamp. This record may be empty, but if it is populated for a user's role and URI, then the time stamp gives the Coordinated Universal Time when the user agent last informed the search engine that it accessed the URI. A user agent updates this information after notifying the search engine of an access. The message to the search engine contains the URI, the time stamp, and the MIIE status of the access. The MIIE status for this access is passed into this process 5200 when it is invoked, see where this process is invoked 2568 from FIG. 25.

If 5205 "no_crawl" is a directory name in the path of the URI of the document, or the document is marked "noindex" in a head meta tag, then the user agent halts 5250 this indexing support process. Note that "no crawl" in the URI path and "noindex" in a meta tag are well known conventions to prevent indexing by indexing services, including search engines. To prevent indexing, by using information in the document's HTML, a meta tag can be placed in the head section of the document similar in form to: <meta name="robots" content="noindex">.

If 5205 "no_crawl" is not a directory name in the path of the URI of the document, the document is not marked "noindex" in a meta tag of the header; and a) the user agent has not 5207 notified the search engine of accessing this URI within a configurable minimum <mh> number of hours or b) this is 5207 a Missing Indexed Information Event (MIIE) at the user agent; then the user agent calculates 5210 the Common DOM Form and its hash for the retrieved document. By default <mh> is 24 hours. The user agent sends the URI, its Common DOM Form hash, and the MIIE status for this access in an access notification to the search engine. With this information the search engine updates 5215 the global and URI specific MIIE and access statistics.

The accumulated histories of missing indexed information events (MIIE) and access events for a URI are kept at the search engine in a compact form that efficiently uses few state variables. An exponential decay in the weight function is used to retain a long history in little space and at low computational cost. The configurable exponential decay variable is called "Exponential_Decay" and its default value is chosen together with the configurable period over which events are counted, stored in a variable called "TimePeriod". The default value of TimePeriod is one day and the default Exponential_Decay value is 0.95169. With this default Access_Period and Exponential_Decay, the number of events for any one day period is weighted approximately twice as much as a one day period 14 days prior. In some embodiments, the state variables (described as a type followed by a name) for keeping the frequency history for these events are:
Large Integer: URI_Hash
Floating Point: Frequency_History
Floating Point: Frequency_History2
Integer: Accumulator
Integer: LastTimeStamp
Floating Point: Exponential_Decay
Integer: TimePeriod
Integer: BaseTime The values Exponential_Decay, BaseTime, and TimePeriod are the same for a large number of otherwise independently kept statistics, so for each such additional statistic, the additional space required is two floating point numbers, two integers (64 bits each in some embodiments), and the state to associate a particular statistic with its related information, i.e., the hash of a URI (128 bits in some embodiments). There are three main operations on this state; the first initializes the Frequency_History, Frequency_History2, Accumulator, and LastTimeStamp to zero. The common state variables are pre-set for all event histories in some embodiments; Exponential_Decay has the value 0.95169, TimePeriod has the value of one day in seconds, and BaseTime has the value of midnight Jan. 1, 1601 at the prime meridian in Greenwich, England. Note that if time is retrievable as Coordinated Universal Time, which is the most commonly available and accurately duplicable by computation devices, then the value of BaseTime is conveniently zero on most modern computation devices. The two repetitive operations are update and retrieve. An access (limited to one per period per user role) or MIIE event for a URI at a user agent ultimately causes the update procedure for the particular event type to be performed at the search engine for the URI. Once the state for a particular URI and event type is found, using the URI_Hash to identify the applicable set of state variables, the update procedure is executed against that state as follows:
Update Weighted Frequency
Updating weighted frequency data for a repeating event comprises the following steps:
1. Calculate the number of TimePeriod boundaries (from BaseTime) that have been traversed (by the advance of time) since the LastTimeStamp for this event; let <chb> be this calculated value.
2. If <chb> is greater than zero, then:
   a. Modify the Frequency_History and Frequency_History2 by multiplying them by Exponential_Decay.
   b. Add the Accumulator to Frequency_History and the Accumulator squared (multiplied by itself one time) to Frequency_History2.
   c. If <chb> is greater than 1 then multiply the Frequency_History and Frequency_History2 by Exponential_Decay raised to the power (<chb>−1). E.g., Frequency_History=Frequency_History*(Exponential_Decay$^{(<chb>-1)}$)).
   d. Set Accumulator to zero.
3. Increment Accumulator.
4. Set LastTimeStamp to current time.

In order to make determinations based on the frequency of events, the weighted average frequency, standard deviation for that weighted average frequency, and adjusted weighted average frequency are retrieved for those events. These statistics are used to help decide when and how often to re-index a URI. The state for a weighted event is changed when the event occurs, but the frequency statistics are affected by the passage of time even if an event does not occur (in which case the average frequency tends to be falling). Thus, accounting appropriately for the passage of time in the state of these statistics is undertaken before results of the weighted statistics are calculated and returned. Once the state for a particular URI and event type is found by using the URI_Hash to identify that state, the retrieval procedure is executed against that state as follows:
Retrieve Weighted Frequency
Retrieving a weighted frequency and standard deviation for a repeating event comprises the following steps:
1. Calculate the number of TimePeriod boundaries (from BaseTime) that have been traversed (by the advance of time) since the LastTimeStamp for this event; let <chb> be this calculated value.
2. If <chb> is greater than zero, then:
   a. Modify the Frequency_History and Frequency_History2 by multiplying them by the configurable value of Exponential_Decay.
   b. Add the Accumulator value to Frequency_History and the Accumulator value squared (multiplied by itself once) to Frequency_History2.
   c. If <chb> is greater than 1 then modify the Frequency_History and Frequency_History2 by multiplying them by Exponential_Decay raised to the power (<chb>−1). E.g., Frequency_History=Frequency_History*(Exponential_Decay$^{(<chb>-1)}$).
   d. Set Accumulator to zero.
3. Set <average-events-per-period> to Frequency_History* (1−Exponential_Decay).
4. Set <variance-events-per-period> to ((Frequency_History2*(1−Exponential_Decay))−(<average-events-per-period>*<average-events-per-period>)).
5. Set <std-dev-events-per-period> to the square root of <variance-events-per-period>.
6. Return <average-events-per-period> and <std-dev-events-per-period> as the weighted average and standard deviation. Also return the <adjusted_average_events_per_period> as the <average-events-per-period> added to three times the <std-dev-events-per-period>. (This <adjusted_average_events_per_period> can be calculated from the other returned values, but it is convenient for it to be generated here.)

For each indexed URI, the search engine keeps such frequency statistics for two event types, user agent accesses of the URI, and missing indexed information events (MIIE); these are called the "Access Record" and "MIIE Record" respectively. Based on these two statistics for the history, a maximum frequency for indexing of the URI is determined; this is done in such a manner that a URI that users access more often is permitted to be indexed more often. However, a URI that is accessed frequently may not change often; embodiments discover that the URI content has not changed and thereby avoid unnecessarily re-indexing a URI that has stable content. Even if the content at a URI changes regularly, those changes may not result in missing indexed information events, which are most annoying to users.

Therefore, MIIE events are tracked for each URI (in some embodiments), and some embodiments are arranged so that higher numbers of MIIE events result in more frequent re-indexing for a URI. The MIIE history records the events whereby users attempt to access information on the basis of search engine results, but cannot find it.

Access events and missing indexed information events occur at widely differing frequencies, and a missing indexed information event is more important than an access event. In an alternative embodiment only the MIIE events are used. In some embodiments a global statistic (i.e., across all URIs) is kept for all accesses by user agents and all MIIE events by user agents (that is user agents that are embodiments), these two statistics are kept identically using the same weighting, exponential decay, and time period as the weighted frequency statistics for each individual URI. Each day these statistics are examined for the weighted average of accesses to MIIE events, and the ratio of accesses to MIIE events is computed as the <Global Accesses to MIIE Ratio> for that day. This number is used to normalize the importance of MIIE events by multiplying the MIIE event statistics for a URI by this ratio, before adding the two statistics together to form a single statistic for each URI. For this calculation the <adjusted_average_events_per_period> statistic is used.

In some embodiments there are two globally configured values that limit the effects of access events and MIIE events on the frequency of re-indexing operations. In computing whether a particular URI may be re-indexed (at the present time), the answer will be yes if it was last indexed more than a configurable amount of time in the past called "Max_Index_Period", and the answer will be no if it was last indexed less than a configurable amount of time in the past called "Min_Index_Period". By default Max_Index_Period is 14 days and Min_Index_Period is 15 minutes. These periods define related frequencies by taking their reciprocal. For example, the reciprocal of Min_Index_Period is 96 per day. Thus the frequency of re-indexing URIs can range over more than three orders of magnitude when using the default values of Min_Index_Period and Max_Index_Period.

For each URI, its combined statistic <adjusted_average_events_per_period> is multiplied by a global <Index-to-Access> ratio, and then the reciprocal is taken to compute the indexing period for the URI. If the computed indexing period for this URI is less than Min_Index_Period, then the indexing period is set to Min_Index_Period; if it is greater than Max_Index_Period, then the indexing period is set to Max_Index_Period. For each URI, the result of determining 5245 "Do the access and MIIE frequency statistics for this URI support re-indexing now?" is yes if the last time the URI was indexed plus this computed indexing period is less than current time, otherwise the result is no. This computed indexing period need not be realized; even a regularly accessed URI may be stable and re-indexing is done at most once every Max_Index_Period if no changes or MIIE events are detected for that URI.

When used in this way to affect the indexing period for all URIs, the <Index-to-Access> ratio directly affects and can be used to control the incoming bandwidth to the search engine. In one configuration of some embodiments, the <Index-to-Access> ratio is dynamically adjusted to maintain a configured set point for the incoming network bandwidth from those indexing operations that are described in this 5200 process. This control is done using well known means to avoid oscillations in such a control feed-back loop, and in particular a MIAC (Model Identification Adaptive Control) system is used in some embodiments. Those skilled in the art will appreciate that useful control can be achieved by many automated control mechanisms that have been extensively documented in the prior art including the popular PID (Proportional Integral Derivative) control, adaptive control mechanisms in general of which MIAC is an example, the so-called Alpha-Beta and related filter (e.g., Kalman filter) based control mechanisms, and many others. In some embodiments MIAC adaptive control mechanisms are used, which has the benefit of an adaptive model that automatically (adaptively) adjusts to the changing Internet environment.

The chosen MIAC control mechanism does not explicitly model the periodically varying levels of Internet usage, which can vary widely over a typical 24 hour period. Internet usage also varies during events of high public interest and at other times, like weekends and holidays. This configuration instead allows the control system to adjust (adaptively) to both somewhat predictable and unpredictable variances alike, which means that the <Index-to-Access> ratio may vary widely when usage varies significantly from the average. In this configuration some embodiments attempt to keep bandwidth usage essentially constant, which is useful if the search engine has a fixed limited bandwidth, such as a bandwidth limited "pipe" into the Internet, where the usage of the pipe must remain below that limit over short time intervals.

Some embodiments provide, also by user configuration, for a control model that instead attempts to find a stable <Index-to-Access> ratio, and allows the short term bandwidth to vary widely about a configured set value for the average bandwidth. In this configuration the short term bandwidth usage rises and falls; for example, over 24 hour periods where bandwidth usage may vary widely. This configuration may be more useful where the instantaneous bandwidth is not limited. In such circumstances the equipment is (for practical purposes) unlimited in its ability to carry bandwidth but there is nevertheless a cost based on the total amount of information that flows over time. This total information flow and its cost would typically be controlled. While this configuration is superior in that re-indexing can come more rapidly when users are accessing the indexed information the most, it may not be practical in some situations.

Also by configuration in some embodiments, the user can choose a combination of these two control mechanisms. In this combined mechanism there is both a target average bandwidth controller and an instantaneous bandwidth controller; both control systems run simultaneously. The <Index-to-Access> ratio actually used at any point is the minimum of the two control outputs. This keeps short term usage below a configured maximum, but within that constraint the average or total usage is adjusted to a different (lower) set point. Note that for this configuration, setting the average usage above the maximum usage is equivalent to having no average bandwidth control system.

In some embodiments, both control mechanisms use a MIAC (Model Identification Adaptive Control). Those skilled in the art will appreciate that similar benefits can be achieved by the use of many other control mechanisms described in the prior art. Those skilled in the art will also appreciate that adjusting the event weighted averages with the weighted standard deviation can be performed using various mechanisms, such as Kalman filters with various coefficients, and with a multiplier other than 3 for the standard deviation adjustment (including a multiplier of 0), without departing from the teachings herein. A benefit of embodiments using the examples presented here is that they are particularly efficient computationally.

In alternative embodiments the <Index-to-Access> ratio is a configurable value that is changed only by direct user interaction (e.g., by the system administrator for the search engine), whereby it is set to an arbitrary value.

The search engine checks 5225 whether it indexes this URI; if it does not, or if the Common DOM Form hash matches 5230 the hash of the document's latest Common DOM Form, then this process halts 5250.

The determination of whether the search engine indexes 5225 a particular URI presumes that the user agent has already established that the document is not marked internally to prevent indexing (see the discussion of meta tag appearances of "noindex" above). The search engine first verifies that there is no "no_crawl" directory name in the URI (which was checked at the user agent). It then checks its database for prohibitions against indexing this URI and instructions specifically enabling of indexing this URI. If there is no robots.txt file that governs the domain of the URI, or if the robots.txt entry governing the domain has a time stamp older than a configured maximum age, then the search engine downloads (if it exists) the robots.txt file for the domain. By default the maximum age is two weeks. If the robots.txt file exists and was downloaded, then it is used to update the database allowing indexing for the domain.

Also, if the database has configured information about this site that either prohibits or enables its being indexed, then the configured information governing indexing is used as a priority over the contents of the robots.txt file. For example, the configured information could have resulted from a request by a copyright holder that the site not be indexed. These rules for determining whether the search engine will index a document are based on common practice in the industry, which is only partially supported by standard specifications or legal regulations. For example, the "robots.txt" file mechanism is industry practice, but is not explicitly governed by any legal requirement or standards body.

If the Common DOM Form hash does not match 5230 this URI's latest Common DOM Form hash at the search engine, then the search engine marks 5248 the URI as modified in its database.

If the maximum time interval for re-indexing this URI (Max_Index_Period) has not 5235 been exceeded at the search engine, there are 5240 at least a globally configurable <m> (by default 3) past Common DOM Forms at the search engine for this URI, and this URI's access and MIIE frequency statistics (at the search engine) do not support 5245 re-indexing this URI now, this process halts 5250.

The search engine keeps, for each URI, a time stamp for the last time it was indexed or re-indexed. This time stamp is used to determine if re-indexing the URI is allowed (supported) by comparing now (the current time) with the last time of indexing the URI plus the minimum time interval for re-indexing the URI, which is computed as described above using (for part of the computation) the MIIE and access statistics for the URI. If the current time is the largest of the two values in the comparison, re-indexing is allowed (supported).

If the configurable maximum time interval for re-indexing (Max_Index_Period) has not been 5235 exceeded, there are 5240 at least a configurable <m> past Common DOM Forms for this document, the access and MIIE frequency statistics for this URI (at the search engine) support 5245 re-indexing this URI now, the <m> most recent Alternative Canonical Forms for this URI differ 5255 in less than a configurable <k> percent (after matching up to a configurable <maxMatch> substrings), and none of the last <m> versions have a differing title and description, then at the search engine construct or retrieve from memory a version 2 Fragment Identifier for this document that has up to <maxMatch> ranges for the common content of the Alternative Canonical Forms of the last <m> versions of the Common DOM Form. Send 5260 this Fragment Identifier to the user agent together with a hash of the Canonical Form of the title and description. By default <maxMatch> is 5 to ensure that very small parts of documents are not used to achieve similarity; in alternative embodiments <maxMatch> can vary based on the length of the document.

In the some embodiments, the determination that a set of Alternative Canonical Forms for a URI are 5255 sufficiently similar is done by finding a longest common substring in the <m> most recent Alternative Canonical Forms, which is known in the art as the <m>-longest common substring problem; there are multiple solutions in the prior art for finding longest common substring from a set of input strings. Then the longest common substring between the remaining parts is found and so on. Note that there could be an additional remaining part for each original input string after each round of looking for the longest common substring. This is repeated until there are <maxMatch> common substrings or there are no remaining common substrings. If the sum of the lengths of the common substrings in code units is within <k> percent of the length of the longest Alternative Canonical Form, then the version 2 Fragment Identifier described above is made 5260 using those substrings and it is sent to the user agent. By default <k> is 10%.

If, at the user agent, the version 2 Fragment Identifier matches 5265 (perfectly) in the document's Alternative Canonical Form, the hash of the Canonical Form of the title and description also matches 5265 the hash of the title and description of the document, and the user agent is configured 5270 to not provide indexing content (i.e., the actual content to be indexed for this URI will not be provided by this user agent), then the user agent informs 5280 the search engine that re-indexing is indicated and this process halts 5250.

If, at the user agent, the version 2 Fragment Identifier matches 5265 (perfectly) in the document's Alternative Canonical Form, the hash of the Canonical Form of the title and description also matches 5265 the hash of the title and description of the document, and the user agent is configured 5270 to provide indexing content (i.e., the actual content to be indexed for this URI will be provided by this user agent), the Common DOM Form is sent 5275 to the search engine from the user agent for indexing or re-indexing, at the search engine the URI is indexed or re-indexed 5285 and the URI is marked as unmodified (unmodified since last indexing), the time stamp for the last time this URI was indexed is set 5285 to now, and this process halts 5250.

If:
1. at the search engine the configurable maximum time interval (Max_Index_Period) for re-indexing has been 5235 exceeded;
2. there are 5240 fewer than a configurable <m> past Common DOM Forms for this document; or
3. a) the access and MIIE frequency statistics for this URI (at the search engine) support 5245 re-indexing this URI now, and
3. b) the <m> most recent Alternative Canonical Forms for this URI differ 5255 in more than a configurable <k> percent (after matching up to a configurable <maxMatch> substrings) or the <m> most recent Common DOM Forms differ in the title or description;
then:
1. if the user agent is configured 5270 to not provide indexing content (i.e., the actual content to be indexed for this URI will not be provided by this user agent), the user agent informs 5280 the search engine that re-indexing is indicated and this process halts 5250; and 2. otherwise (i.e., if the user agent is configured 5270 to provide indexing content), the Common DOM Form is sent 5275 to the search engine from the user agent for indexing or re-indexing, at the search engine the URI is indexed or re-indexed 5285 and the URI is marked as unmodified (unmodified since last indexing), the time stamp for the last time this URI was indexed is set 5285 to now, and this process halts 5250.

FIG. 53 illustrates by example the relationship between Canonical Forms and Alternative Canonical Forms. The Canonical Form 5320 has less text than the Alternative Canonical Form 5350. The extra text appearing in 5350 is the transformed (i.e., the whitespace is collapsed and the 'F' in the node array appears as 'f' in 5350) text from the 'Alt' node 5312. All text in 'Text' nodes appears identically in both the Canonical Form and Alternative Canonical Form. If these node arrays were from an HTML document using some embodiments, the 'Alt' node 5320 would be an image, perhaps a stylized image of 'For', and the image would have an 'alt' attribute of 'For' or 'For'.

FIG. 54 illustrates the Common DOM Form structure, including the Common DOM Node Array and compacted representation for transmission. The two structures 5405, 5450 represent the same segment of a Common DOM Form instance; they could be a complete Common DOM Form except that they do not have the required initial text nodes for title and description. They both illustrate the fact that a Common DOM Form and a node array (as used in processing DOM instances into a node array form) are essentially alike in structure; but unlike a node array, Common DOM Form nodes are not also in some separate DOM instance. In a sense, a Common DOM Form is a node array structure with an additional pair of text nodes. However, because the nodes of a Common DOM Form instance are not also nodes of a related DOM instance, the Common DOM Form may be transmitted. Note that each node 5405,5450 has a 'Len' attribute, which is the length of the text for nodes having text. For VnT nodes the Len attribute represents the number of VnT nodes represented. In the Common DOM Form this is always 1 but in the compact representation (for transmission) it represents the number of contiguous VnT nodes. This is possible because the content of VnT nodes is not represented in the Common DOM Form. Thus we have the compaction of adjacent VnT nodes 5420,5430,5435 into one node 5460 for transmission. Notice also that the Common DOM Form 5405 segment of FIG. 54 corresponds to the node array 5330 of FIG. 53; which illustrates the combination of adjacent text nodes 5335,5340 into a single text 5440 node in a Common DOM Form.

Figure 57:
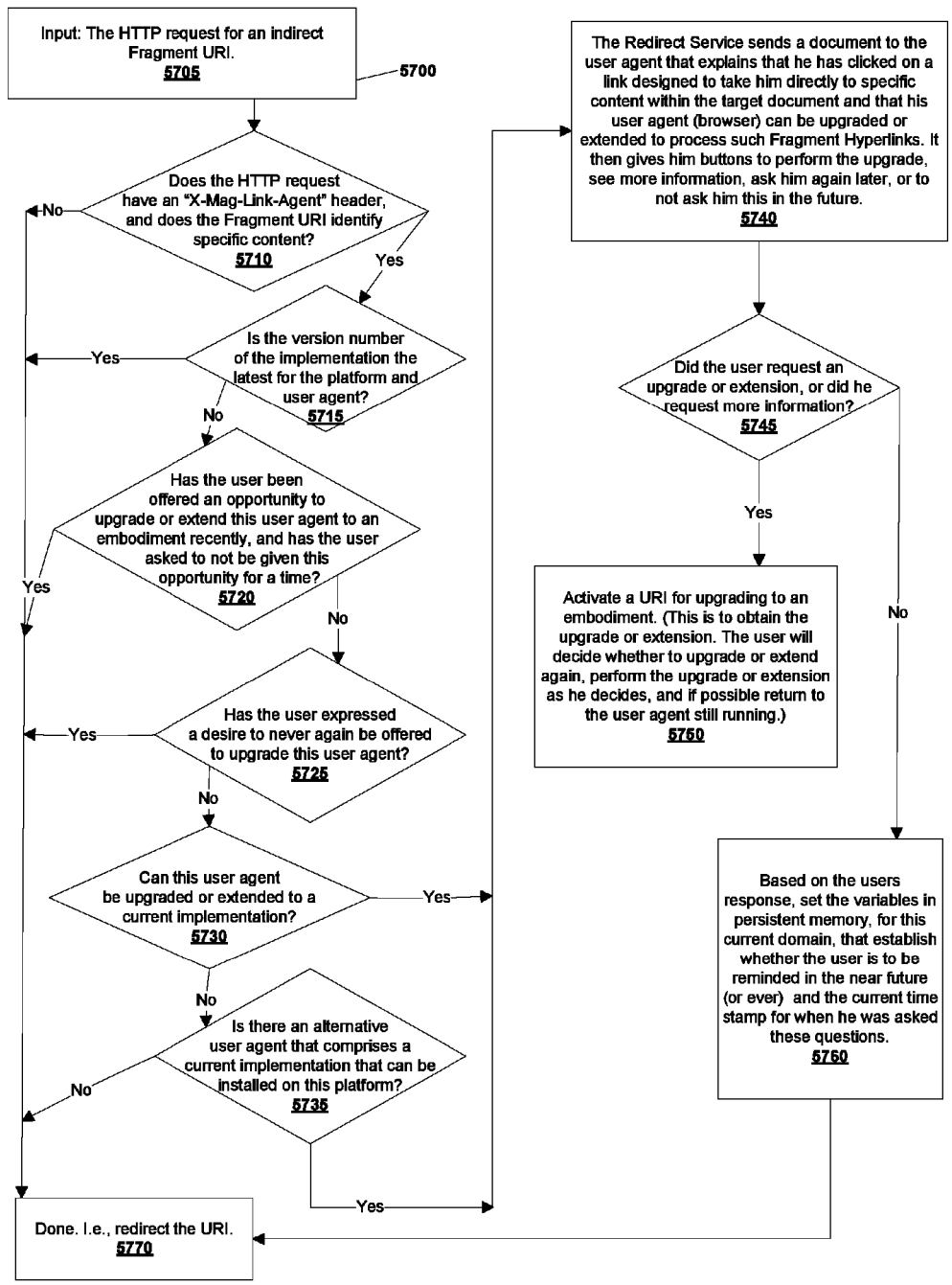
FIG. 57 illustrates redirect Service actions on receiving an HTTP request for an indirect Fragment URI, including informing a user that Fragment Hyperlink activation could be more functional if he upgraded.

FIG. 57 illustrates Redirect Service actions on receiving an HTTP request for an indirect Fragment URI, which is also called a Surrogate URI. It is here that the Redirect Service informs a user that Fragment Hyperlink activation could be more functional if the user upgraded his user agent. These actions are taken by the Redirect Service, the URI Service, and the scripts (executing on the user agent) that are served out by these two services in documents.

There are a number of checks that are, in some embodiments, made before the user is presented with an opportunity to upgrade his user agent.

The following 5 determinations are made:

1. Does the Fragment URI identify 5710 specific content, i.e., does the Fragment Identifier that the indirect Fragment URI is associated with have a range (this is the usually expected case); and is the HTTP request without an "X-Mag-Link-Agent" header.

2. Is 5715 the version number of the implementation the latest for the platform and user agent? This version number is parsed from the value of the X-Mag-Link-Agent custom HTTP header. The platform and user agent is ascertained from the cookie for the domain of the Redirect Service. However, if there has never been a redirect through the Redirect Service for this user agent on this platform, and no document of the URI Service or Redirect Service has ever been opened, (or cookies have been deleted at the user agent) then there will be no cookie. If there is no such cookie the Redirect Service gets a cookie by opening a special page for that purpose, which is sent to the user agent and which has scripts to perform an accurate determination of the platform and user agent, place it in a cookie, and return the information back to the Redirect Service. If this special page is used to make the determination, then redirects are script based and not 302 or 303 redirects.

3. Has the user not been 5720 offered an opportunity to upgrade or extend this user agent to an embodiment recently, or has the user not asked to not be given this opportunity for a time? In some embodiments this information is kept in a browser cookie with a time stamp, for the domain of the document. If the user deletes his cookies then this information is lost. By default, less than two weeks is "recently", but this is a configurable amount of time.

4. Has the user not expressed 5725 a desire to never again be offered a chance to upgrade his user agent by the current web site? In some embodiments this information is kept in a browser cookie for the domain of the document. If the user deletes his cookies then this information is lost and must be regenerated by this 5700 process.

5. Can this user agent be upgraded or extended 5730 to an embodiment or can an alternate user agent embodiment be installed 5735 on this platform?

If the answer is no to any of the questions as asked above, then the Surrogate URI is redirected 5770 without first giving the user an opportunity to update his user agent. In some embodiments, if the redirection occurs without first generating the cookie information, which is described above when a cookie was not present in the HTTP request, then the URI is redirected using either a 302 or 303 HTTP redirect, with the determination between the two depending on the platform and user agent information, as well as configuration information, as described earlier in this document. In the redirect response, some embodiments use a custom header having a name that is prefixed with "X-"; an example implementation uses the header name "X-Mag-Link-Fragments". Both the Fragment Identifier and any Conventional Fragment Identifier associated with the indirect Fragment URI are included in the custom header value. This is done with the Fragment Identifier first, followed by (if one exists) the Conventional Fragment Identifier. These include their initial hash ('#') character so that a simple search for '#' efficiently parses and separates the two fragment identifiers. If there is an associated Conventional Fragment Identifier, it is appended to the URI prefix (of the Fragment URI) at the Redirect Service to obtain the URI that the redirect response conventionally points to. This redirect HTTP message is sent to the user agent. (If the user agent is an embodiment, which is capable of processing the Fragment Identifier, then the Conventional Fragment Identifier is removed and the Fragment Identifier appended as illustrated in FIG. 24B.) In this way the redirect is beneficially the same, when executed by the Redirect Service, regardless of whether the user agent is an embodiment.

If the answer is yes to all of the questions as asked above, then in some embodiments the Redirect Service sends 5740 (in response to the HTTP request for the indirect Fragment Hyperlink) a document to the user agent that explains that he has clicked on a link designed to take him directly to specific content within the target document and that his user agent (browser) can be upgraded or extended to process such Fragment Hyperlinks, or to better process such Fragment Hyperlinks if the user agent is an old version of an embodiment. It then gives him buttons to perform the upgrade, see more information, ask him again later, or to not ask him this in the future.

If the user requested 5745 more information, an upgrade, or an extension, then activate 5750 an upgrade URI for the URI Service in the same window. This activation requests an upgrade or extension, but there is no guarantee that this will happen (e.g., the user could decide against an upgrade or the upgrade could fail). In some embodiments any upgrade occurs asynchronously with this activity. Thus, once an upgrade has been requested, the Fragment Hyperlink activation halts, before the user has actually upgraded anything. In the document served up by the upgrade site of the URI Service, the user will decide whether to perform the upgrade or extension. If he does choose to upgrade or extend a user agent, but it is not possible to upgrade the already running user agent without restarting it, or if the upgrade is to another user agent (another piece of software) entirely, then the upgrade is performed and the appropriate user agent is started. For some user agents it is possible to upgrade and then either reload the prior state or, in some cases, to upgrade the running process without ever shutting it down. The latter is done in some embodiments for those user agents for which it is possible.

If the user asked 5745 to be reminded later or to not be asked in the future (i.e., he did not ask for more information, an upgrade, or an extension) then based on the user's response, set 5760 the variables in persistent memory (such as a cookie) for this current domain, that establish whether the user is to be reminded in the future and the current time stamp. Then activate 5770 the mapped Fragment URI or the Conventional Fragment URI (as appropriate based on the capabilities of the user agent) by script based redirection from the scripts of the URI Service document from which the user expressed his decision. Note that setting 5750 the persistent memory need not occur if the user requested more information or an update; if he follows through with a successful update the information becomes superfluous, and if he does not follow through or the update failed then the reason the update failed is unknown and it is inappropriate to make any change of state; thus the user will get another opportunity the next time he activates such a hyperlink.

Figure 58:
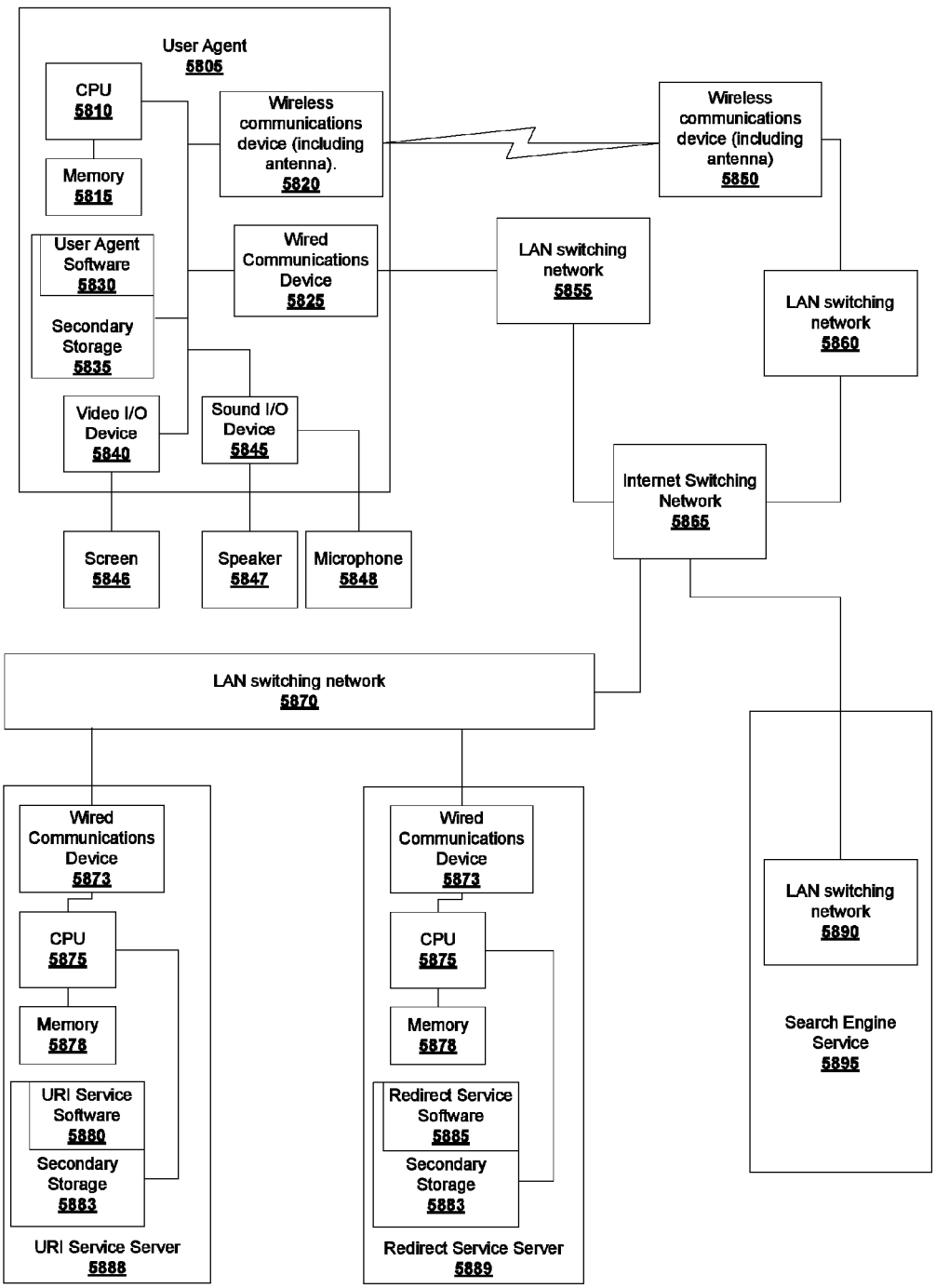
FIG. 58 illustrates a typical physical architecture for realizing embodiments, including a communications capability that enables the sending and receiving of messages between various elements of the physical architecture.

FIG. 58 illustrates a typical physical architecture for realizing embodiments. Embodiments include a communications capability that enables the sending and receiving of messages between various elements of the physical architecture; in some embodiments this communications capability is provided by the Internet switching network infrastructure 5865, with attached Local Area Networks (LANs) 5855,5860,5870,5890. Attached to some LANs 5860 are radio transmission based (wireless) communications antenna devices 5850, that enable communications without wires between user agent wireless communication devices 5820 and the communications capability that in some embodiments (including the physical architecture illustrated in FIG. 58) comprises the Internet switching network 5865. In alternative embodiments wireless communications are used also to communicate with server devices. While this is a typical physical architecture, in other embodiments the Internet switching network is not utilized. For example, many phone companies are connected to a worldwide circuit switched network that in some circumstances can complete long distance communications independently of Internet facilities; such communications take place on what are sometimes called dial-up networks.

Major communication end-points of this example physical architecture are the user agent 5805, the URI Service server 5888, the Redirect Service server 5889, and the search engine service 5895. In some embodiments the search engine service can be an existing search service as a beneficial element in the environment. In other embodiments the search engine service provides specific new functionality to achieve additional benefits. Both possibilities for search engine aspects of embodiments have been described in detail previously. In some embodiments the search engine service is combined physically with the URI Service, Redirect Service, or both; benefits of embodiments having such a combination of services have been previously described.

There may be any number of user agents in an implementation of this physical architecture, which for illustrative purposes shows only one. User agents typically have one or more screens 5846, which are a typical means by which a user agent machine communicates visually to the user. The screen in some embodiments is used for the user to communicate to the device, typically using touch with fingers or stylus. In the illustration the screen is shown as a separate single device, but some devices have more than one screen and in some user agent devices it is typical for one or two screens to be physically integral with the rest of the device 5805. For example, a cell phone computation device typically has one or more screens that are integral with the device, and such a device may also have the ability to use a separate screen. Screens are typically controlled by a video I/O device 5840.

A speaker 5847 and microphone 5848 may be present on user agent embodiments, and may be separate (as shown) or physically integral with the user agent. In some embodiments sound devices may be used to enter or receive textual information; for example, by use of voice recognition and voice synthesis techniques. In some embodiments a microphone and speaker may be integrated physically into a single device or may be connected to a user agent by wires (as shown) or by wireless means; for example, Bluetooth wireless is often used for such a connection because of its low power requirements. Microphones and speakers are typically controlled by a sound input/output device 5845.

In embodiments user agents comprise a CPU (central processing unit) 5810 connected either separately (as shown) or integrally with primary memory 5815 and memory act together to provide direct control of user agent components according to a particular physical arrangement of non-volatile secondary storage 5835. While shown as a single unit, in some embodiments the user agent comprises multiple CPUs. The particular non-volatile secondary storage physical arrangement is in part set according to user agent software 5830; when non-volatile secondary storage is physically arranged according to user agent software, and the CPU or CPUs act according to that physical arrangement, the secondary storage is said to "hold" or "store" the user agent software and the CPU is said to "run" the user agent software.

The user agent communicates with other elements of embodiments through a wired communication device 5825, a wireless communication device 5820, or both. Wired communication devices in embodiments include any form of physical guide for signals that stretches from both the device and the recipient of communications. Thus embodiments may have wired devices that include devices using copper wires for electrical signals, fiber optics, or a microwave wave guide. If the devices send their signals without such a physical guide from the sender to recipient of messages, then it is said to be a wireless communication device, such signals are propagated by means that include, without limitation, radio waves, visible light, and sound.

While the servers shown 5888,5889 do not comprise wireless devices, in other embodiments the servers comprise wireless communications capabilities. Because servers are typically not mobile and wired communications are beneficially cheaper and faster to devices fixed in place, wireless communications are not shown as typical of embodiments.

A URI Service server 5888 is shown, for convenience, as a single device. However, in embodiments the service may comprise many such servers and may be distributed physically across nations, continents, or world-wide. When it is distributed widely, the service itself may be internally connected via the Internet 5865.

A Redirect Service server 5889 is shown, for convenience, as a single device. However, in embodiments the service may comprise many such servers and may be distributed physically across nations, continents, or world-wide. When it is distributed widely, the service itself may be internally connected via the Internet 5865.

The URI Service servers and Redirect Service servers are shown separate, but may operate on the same physical server devices.

In embodiments, URI Service servers and Redirect Service servers comprise a CPU (central processing unit) 5875 connected either separately or integrally with primary memory 5878, which act together to provide direct control of server components according to a particular physical arrangement of non-volatile secondary storage 5883. While shown as a single unit, in some embodiments the user agent comprises multiple CPUs and may comprise separate memory components attached to those CPUs. The particular non-volatile secondary storage physical arrangement is in part set according to URI Service software 5880 or Redirect Service software 5885; when non-volatile secondary storage is physically arranged according to such software, and the CPU or CPUs act according to that physical arrangement, the secondary storage is said to "hold" or "store" the software and the CPU is said to "run" that software.

The URI Service servers and Redirect Service servers communicate with other elements of embodiments through a wired communication device 5873 (although usually less efficient wireless devices can be used). Wired communication devices in embodiments include any form of physical guide for signals that stretches from both the device and the recipient of communications. Thus embodiments may have wired devices that include devices using copper wires for electrical signals, fiber optics, or a microwave wave guide.

Those skilled in the art will appreciate that there are many embodiments having physical realizations that differ from the example physical architecture shown, and that differ from the several alternative physical architectures explicitly described in conjunction with FIG. 58 and previously, without departing from the teachings herein.

DEFINITIONS

Canonical Form Transform: The Canonical Form Transform of a string can be obtained using the following procedure:
1. Transform the text using full case folding, which is a mapping described by the Unicode Consortium as part of the Unicode Standard version 6.2.0, available in machine and human readable form in the document Public/UNIDATA/CaseFolding.txt, found on the Unicode.org web site. This expands some ligatures and ligature-like forms, and converts all characters that have case to lower case.
2. Transform the output of step 1 to the standard NFKD (Normalized Form Compatibility Decomposition) form, as described in the Unicode consortium's "Unicode Standard Annex #15: Unicode Normalization Forms", found in the document reports/tr15, on the Unicode.org web site. This is the standard normalization procedure that expands Unicode ligatures and decomposes various complex characters to their base characters followed by combining characters. It does not convert to lower case, which was done in step 1.
3. The non-starters (also called combining characters by the Unicode Consortium) are removed. These include the combining forms for diacritical marks, all of which were separated out in step 2. The combining characters that are removed are those that are marked "COMBINING" in the Unicode Consortium file found in the document Public/UNIDATA/UnicodeData.txt on the Unicode.org web site.
4. Whitespace and punctuation characters are removed. Specifically, the following Unicode code units and code unit ranges are removed from the sequence: \u0000-\u002f, \u003a-\u0040, \u005b-\u0060, \u007b-\u00bf, \u00d7, \u00f7, \u055a, \u1680, \u180e, \u2000-\u206f, \u2420, \u2422, \u2423, \u3000, \u301 c, \u3030, \ufe58, \ufe63, \ufeff, \uff0d.

Those skilled in the art will appreciate that the same transformation may be achieved by different rules applied in a different order, and also that many different transformations will provide similarly useful results.

canonical similarity: Canonical similarity is a binary relationship that establishes whether a string is canonically similar or canonically dissimilar to a base string. The following definite procedure can be used to establish this relationship.
1) If either the candidate string or the base string is not UTF-16 Unicode encodings, then convert them to UTF-16 Unicode encodings.
2) The UTF-16 Unicode encodings of the candidate string and the base string are processed according to the Canonical Form Transform to obtain the Canonical Form Transform of the candidate string and the Canonical Form Transform of the base string.
3) The Levenshtein distance d between the Canonical Form Transform of the candidate string and the Canonical Form Transform of the base string is determined.
4) If the Levenshtein distance d is less than 25% of the length of the Canonical Form Transform of the base string in characters, then the candidate string is canonically similar to the base string; otherwise, the candidate string is canonically dissimilar to the base string.
Note that the Levenshtein distance d is zero in step 3 if the Canonical Form Transform of the candidate string and the Canonical Form Transform of the base string are identical.

A candidate string is canonically similar to a set of base strings if it is canonically similar to any member string belonging to the set of base strings; otherwise it is canonically dissimilar to the set of base strings. If a set of base strings has no member string, i.e., the set is empty, then no string is canonically similar to the set.

clicking: The action of selecting the display element under the current cursor location on the device's display screen. Doing so involves moving the cursor to the display element of interest and pressing a mouse button, lightly tapping a touch screen or similar actions.

distinguished: A part of a document display is distinguished if that part, including all of its sub-parts, are set apart visually so that a viewer can see that the part differs from the normal (non-distinguished) form of display. Other forms of the word 'distinguish' derive the expected meanings; for example, to set a part of a document apart visually when displaying the document is to distinguish that part, distinguishing a part of a document is the act of setting it apart visually and that act distinguishes that part; once done that part is distinguished and has been distinguished. If a sub-part of a part is distinguished then the part is partially distinguished, even if not all of its sub-parts are distinguished. For instance, a word is partially distinguished if the first character of the word is highlighted. Verbal and gerundial phrases have the expected meanings; for example, distinguishing partially and partially distinguishing a part are the act or acts of setting that part of a document apart visually when displaying the document.

A visual component may be created and added to a display in order to indicate a border or position in the display; useful examples include the common editing practice of placing a cursor at a position between two characters to indicate where certain user inputs will take effect, or placing a red-line box around a thumbnail image to draw attention to that particular thumbnail. These added display elements may have dynamic behavior such as blinking on and off or changing color. What is distinguished or partially distinguished may be a matter of convention specific to the product that provides such a display. The meaning of a cursor with particular shape added between characters in a span of text could be different than that for a cursor with another shape, and the meaning could be sensitive to context. For example, matched left and right boundary cursors generally have a defined meaning when the left one occurs earlier than the right one in left-to-right text. That might mean that all of the text between them is distinguished and is selected for editing operations. However, the conventions of that particular display determine what is distinguished, would govern the meaning, and would need to be learned by the user.

There are many commonly encountered ways of distinguishing the display of parts of documents, some of which affect the display of the part itself and others that call attention to that part. A visual object may be added that "floats over" the display; this is not part of the display itself in the sense that it does not take up space within the document display, but sets some part of the display apart; e.g., by pointing to it with a finger shaped cursor, with just the end of an acute triangular shape, or with a barbed arrowhead shape. What is distinguished is a matter established between the designers of the system and the users; if the end of such a floating visual object is over a character in a word, it could mean that it distinguishes the whole word, just distinguishes the character, or does something unusual and unique to that application, such as distinguishing the word and any word immediately following it. Such a floating object could contain text that clarifies what the pointer indicates, or it could contain an arbitrary annotation.

Note that a part of a document can be any subset, and not necessarily only contiguous subsets. Thus, a character taken from one word combined with another character from somewhere else in the document, further combined with an image from yet elsewhere can constitute a part of the document, and if any sub-part of that part is further distinguished then that part is partially distinguished. Nevertheless, documents have a Document Object Model (DOM) or a DOM can be created for them, and the parts of the document have a defined order relative to a document's DOM instance. Given the defined order from a document's DOM, a part of a document is contiguous if it consists of consecutive document sub-parts. More particularly, a part of a document is contiguous if there are left and right boundary positions in a DOM instance for that document and that part includes everything between them in the DOM instance. Highlighting a single character of a document would generally distinguish that character and partially distinguishes the document and any part that includes the highlighted single character; it does not distinguish any part of the document that does not comprise the highlighted single character.

Selecting a part of a document, as is done in a preparatory step for copy and paste operations, generally distinguishes that selected part. Similarly, highlighting a part generally distinguishes that part. The convention for a particular application could be that the distinguished part of a highlighted document is everything that is not highlighted, or it could even be that the distinguished part is a part immediately to the right of the highlighted part. Note that details of a document display could cause user confusion with respect to what is distinguished; e.g., by using a highlighting color that is also the background color. For brevity and clarity in subsequent examples it is assumed that highlighting a part in any color distinguishes that part and that other display alterations distinguish the part or parts having an altered appearance.

There are many other possible techniques for distinguishing the display of a document part; boxing in the part using a thin-line border, or the part's text could be italicized, made bold, or presented using a color that contrasts with the surrounding text. Indenting and enclosing text in quotes are also potentially techniques of distinguishing a document part. Positioning a visual indicator at the beginning of a part, at the end of a part, or at both the beginning and the end of a part, or placing an indication that a position in the document is in the interior of a part may partially distinguish that part. Highlighting every other character or image in a span of text and images within a document distinguishes each such highlighted character and image, and it partially distinguishes each word having a highlighted character as well as partially distinguishing the span. Highlighting only a subset of the words from a span of text distinguishes the highlighted words and partially distinguishes the span of text. Causing a part to flash on and off or change colors dynamically distinguishes it. Highlighting of key words from a search query within a document snippet partially distinguishes the document snippet in addition to distinguishing each highlighted word. Combinations of techniques for distinguishing a document part may be used. For example, highlighting in yellow and red can be used simultaneously. Or highlighting text and having an object pointing to it simultaneously distinguishes that text. Similarly, selections, highlighting, and boxing can be used in concert to distinguish parts of documents.

Moreover, a product could attach different meanings to different techniques of distinguishing parts and use them simultaneously in a display. For example, a display that distinguishes document snippets that are closely related to snippets in a query result could highlight key words from the query in red and the rest of the document snippet in yellow. Such a display would distinguish the document snippets, and the key words in the snippets, but it might not distinguish instances of those key words appearing elsewhere in the document. Even if the key words were highlighted in red wherever they appeared, including outside the document snippets, the document snippets would be visually distinguishable from all other text since they would be highlighted using a different color than that used for the key words. If just the key words were distinguished, but only those instances appearing within the document snippets, then the document snippets would be partially distinguished and any key word appearing outside the document snippets would not be distinguished. The visible portion of a document can be visually distinguished from the rest of the document by virtue of being visible, and automated scrolling to make a particular part visible can usefully distinguish or partially distinguish that part, along with whatever else becomes visible. Scrolling in this way can be used to particular advantage in combination with other techniques for distinguishing parts of documents. For example, distinguishing a document snippet by highlighting or selecting it and also scrolling to it can be a particularly useful technique of distinguishing snippets.

distinguishing context: A display of a document's contents, including any state affecting what is or is not distinguished, a distinguishing manner, and a set or class of user inputs (called the distinguishing inputs of the distinguishing context) that can cause parts of the document to be distinguished or not distinguished in the display, are together a distinguishing context. If a part of a document is either distinguished or can become distinguished according to the distinguishing manner and by the effects of some sequence of the distinguishing inputs, then that part is distinguished in the distinguishing context. The display of a document's contents is said to have a distinguishing context if it is the display of that distinguished context. A particular display of a document typically has many distinguishing contexts because there are many combinations of different distinguishing inputs and different distinguishing manners. If a visible part of document content is neither distinguished nor partially distinguished in a distinguishing context, then it is undistinguished in that distinguishing context. Only a part of a document that is visible, or that can become visible by scrolling or some other action to make it visible to a user, can be distinguished or undistinguished; if it is invisible then it is simply not part of the display of contents and is neither distinguished nor undistinguished. A typical Internet browser display of a typical Internet HTML document has a distinguishing context that distinguishes no part of the document because use of the empty set for the distinguishing inputs results in no part of the display ever being distinguished by the distinguishing manner of highlighting. That same browser display also has another distinguishing context that distinguishes all possible selectable parts of the document because a typical browser has a set of inputs allowing the user to make selections—which distinguishes each of those possible selections if the distinguishing manner of the distinguishing context is the visual indication of selection. Similarly, a typical browser has "find" box functionality, including the ability to enter arbitrary text into the "find" box and "next" and "previous" buttons that cause matches to the text in the "find" box to be located in the document and selected for editing; thus, by including all of these "find" box inputs in the distinguishing inputs, the typical browser display distinguishes the set of all possible strings of the document that can be found using the "find" box functionality.

Note that a display may have state, external to the contents of a document, that affects what parts are distinguished, so the contents of the "find" bar can be fixed in a distinguishing context by not including inputs that change it in the distinguishing inputs. For example, a typical browser could have the string "food bar" in its find-box by some prior automated mechanism, so that pressing the "next" and "previous" buttons causes the display to find a next or previous match to "food bar" and select it for editing; this distinguishes those matching parts of the document without distinguishing, for example, instances of "food in the bar". The external state need not be visible; for example, some external state could comprise the text of one or more snippets from a search query response and if there is an exact match of any such snippet with a textual span from the document, then the display could highlight or select that exact match. The content of the clipboard is external state, and if pasting into the find box is permitted, i.e., it is in the distinguishing inputs, and typing arbitrary text into the find-box is not permitted, then the text in the clipboard can be pasted into the find-box and then instances of that text can be distinguished.

Distinguishing inputs can be provided that allow a user to scroll between one distinguished document snippet and the next. A distinguishing context that distinguishes a set of document snippets can distinguish all of the document snippets simultaneously, some of them simultaneously, or it can distinguish just one of the snippets at a time; for example, it can do this if the distinguishing inputs allow user input to change which of the set of snippets is distinguished. A distinguishing context may provide for user input to cause scrolling in order to make a particular one of a set of snippets visible in the display. Since a user may scroll away from one or more parts of a document that are set apart visually, a display can provide for user input to return, e.g., via scrolling, to one or more distinguished parts of a document. Since some techniques of setting parts of a document apart visually are transient, e.g., simply clicking on a browser display can cause a document snippet that is selected for editing to no longer be selected and hence not set apart visually at that moment, a display can also provide inputs that re-distinguish and re-scroll to one or more distinguished parts of the document.

distinguishing manner: There are many ways to distinguish parts of a document in a display. These include use of different highlight colors, different ways to point to parts, different ways to draw a box around parts and other ways to surround parts with added elements. Added elements for distinguishing parts may have different appearances and may themselves contain text including quotes from the document or annotations. Such included text could attach different meanings to different distinguished parts. Each such way of distinguishing or combinations of ways, is a distinguishing manner or a manner of distinguishing. A combination of multiple distinguishing manners is also a distinguishing manner.

document server: A device consisting of one or more CPUs, some memory, access to persistent storage, and one or more wired and/or wireless communication devices. It receives requests for document content and transmits responses that include requested document content using an electronic communication network. It can be configured to act alone or in concert with other document servers.

document snippet: A triple consisting of a snippet, a document, and the snippet's location in the document. Since documents can have duplicate content, two document snippets can have the same snippet and document but different locations.

path tag sequence: In an HTML, XML, or XHTML document, a path tag sequence for a specific element of the document is the ordered sequence of tags of the enclosing elements, starting with the HTML, XML, or XHTML root element and ending with the tag of the specific element being considered. For example, a particular character in a particular word is embedded at some depth in enclosing HTML elements; the path tag sequence for that particular character is the sequence of tags, starting at the root, down to the tag of the last HTML element that contains the character. For an XHTML document the root element tag name is "html" and the next for anything visible is "body" (not all elements in "body" are visible). After that there are a large number of possible tag names such as "div", "span", and "li". Each of those elements in which the character is embedded has a tag name, and together they define a sequence of tag names. The path tag sequence for a character in the document is the sequence of tag names from the root to the innermost element that contains the character. Similarly, a path tag sequence for a specific element node of a DOM instance for an HTML document is the sequence of tags starting from the HTML root element tag, including the tags of all of the ancestor nodes of the specific element node, and ending with the tag of the specific element node. The path tag sequence for a part of the document is the path tag sequence starting at the root and ending with the tag of the innermost element that comprises all of the sub-parts of the part. Thus, the path tag sequence for a word ends with the tag of the innermost element (or lowest level element node in a DOM tree) that comprises all of the characters of the word.

path tag set: The unordered set of tags, without repetition, from a path tag sequence.

pressing: Pushing with a finger or a tool such as a stylus.

response snippet: If a snippet is found in or taken from a search query response, then it is called a response snippet. Response snippets are commonly sequences of text (i.e., strings).

search engine server: A device consisting of one or more CPUs, some memory, access to persistent storage, and one or more wired and/or wireless communication devices. It receives search queries and transmits search results using an electronic communication network. It can be configured to act alone or in concert with other search engine servers as part of a search engine service.

search engine service: One or more search engine servers acting in concert to receive and respond to search queries.

single action: Single actions are acts performed to control or provide useful input to a machine such as a user agent. In general a single action is not usefully divisible into component single actions. Single actions include clicking a mouse, tapping a screen, pressing two fingers on a touch screen, spreading two fingers previously pressed into a touch screen, swiping a finger over a touch screen, and pressing a key on a keyboard are all single actions. Movement is a bit more complicated, on touch screen devices the point of action is typically established by pressing a finger or stylus, but a cursor is moved around in various ways including mouse movement that comprises many smaller movements so that the progress of the cursor or mouse pointer can be tracked visually. When movement is the effect of a contiguous set of such actions, i.e., that are not punctuated by other non-movement actions, then the overall movement is counted as a single action. When counting single actions of a sequence of single actions to achieve some result, any initial movement is not counted since it is presumably not known where anything is prior to initiation of a sequence of single actions. However, if movement is required after the first non-movement single action, then the movements that occur before the next non-movement single action is counted as one single action of movement.

snippet: a sequence of document parts consisting of text having two or more words. Note that a snippet may include non-character elements such as images. However, search result snippets often comprise a textual character sequence extracted from an original source document, without taking intervening non-textual parts.

tapping: Lightly striking a display screen with a finger or a tool such as a stylus.

undistinguished retrieval: When a document is requested from a document source, there is value if the source cannot discern what parts of the document interest the user, what part the user will automatically be directed to, or what parts will automatically be distinguished. (This is discussed in RFC 3986, "Uniform Resource Identifier (URI): Generic Syntax", section "3.5 Fragment".) The source can discern these if the act of making a request (either directly or indirectly) and downloading the content conveys this information to the source. For example, if the source of a document were actively engaged in the process of distinguishing display content, which it could do by altering document content before sending it out, then that request would not be a request for an undistinguished document and would not protect the user's privacy at arbitrary document sources. This information could be conveyed to the source either directly by the user agent or by some intermediary such as a URI Service, Redirect Service or other service that may receive the information. If no such information is conveyed as part of the request and downloading process, either directly from the user agent or indirectly, then the document request and download is called an undistinguished retrieval of the document.

APPENDIX

The following documents and web pages are incorporated by reference:

Daniel Lemire, Owen Kaser: Recursive n-gram hashing is pairwise independent, at best, Computer Speech & Language 24 (4), pages 698-710, 2010.

Jonathan D. Cohen, Recursive hashing functions for n-grams, ACM Trans. Inf. Syst. 15 (3), 1997.

ECMA-182—Standard ECMA-182. Data Interchange on 12.7 mm 48-Track Magnetic Tape Cartridges—DLT1 Format, December 1992.

Sebastian Hellmann, Jens Lehmann, and Sören Auer, NIF: An ontology-based and linked-data-aware NLP Interchange Format. This has been preliminarily 'published' on the Internet and can be downloaded from the document papers/2012/WWW_NIF/public.pdf, found on the web site at svn.aksw.org.

RFC 3986/(2005)—Uniform Resource Identifier (URI): Generic Syntax.

RFC 4648/(2006)—The Base 16, Base 32, and Base 64 Data Encodings.

ITU-T Rec. X.680, X.681, X.682, X.683—ASN.1 standards
ITU-T Rec. X.691—PER encoding rules Repurposing the Hash Sign for the New Web. W3C Working Draft: Putative TAG Finding 15 Jan. 2011. This content is contained in document 2001/tag/2011/01/HashInURI-20110115, found on the web site www.w3.org.

RDF Primer, W3C Recommendation, 10 Feb. 2004. This content is contained in document TR/rdf-primer/found on the www.w3.org web site.

The Unicode Standard Version 6.2.0 (Sep. 26, 2012). Specific www.unicode.org content referenced includes:
- a table containing the list of the individual Unicode characters and their properties, last modified in 2012 Sep. 26 and contained in the document Public/UNIDATA/UnicodeData.txt, and
- a table with the mapping from characters to their case-folded forms, last modified 2012 Aug. 14, and contained in the document Public/UNIDATA/CaseFolding.txt.

Unicode Standard Annex #15, UNICODE NORMALIZATION FORMS, revision 37, 2012-08-31. This is contained in document reports/tr15, which can be found at the web site www.unicode.org.

U.S. Pat. No. 5,446,888, Remote file transfer method and apparatus. XML XPointer Requirements Version 1.0, W3C Note 24 Feb. 1999. This is contained in the document TR/NOTE-xptr-req, found on the web site www.w3.org.

The invention claimed is:

1. A system for search, retrieval, and display of information in an electronic communication network, the system comprising:
   one or more hardware-based processors and one or more hardware-based memories storing computer-executable instructions;
   a user agent comprising one or more of the one or more hardware-based processors, one or more of the one or more hardware-based memories storing computer-executable instructions, and one or more screens, that:
      in response to a query input, transmits a search query, receives a query response document comprising a set of two or more response snippets, and displays the query response document in a response document display on the one or more screens;
      in response to a first selection input received within the response document display that comprises selection of a sourced document, provides a first document display on the one or more screens using a client content version of the sourced document; and
      in response to a second selection input received within the response document display that comprises selection of the sourced document, provides a second document display on the one or more screens using the client content version of the sourced document;
   wherein:
      in response to a first action set comprising a first set of multiple single actions, wherein the first set of multiple single actions comprise the first selection input and zero or more additional inputs permitted according to a set of distinguishing inputs of a first distinguishing context of the first document display, a first matching document snippet that is canonically similar to a first snippet from the set of two or more response snippets is visibly displayed and partially distinguished in the first document display on the one or more screens;
      in response to a second action set comprising a second set of multiple single actions, wherein the second set of multiple single actions comprise the second selection input and zero or more additional inputs permitted according to a set of distinguishing inputs of a second distinguishing context of the second document display, a second matching document snippet that is canonically similar to a second snippet from the set of two or more response snippets is visibly displayed and partially distinguished in the second document display on the one or more screens; and
      the first matching document snippet is undistinguished in the second distinguishing context; and
      the second matching document snippet is undistinguished in the first distinguishing context.

2. The system of claim 1, wherein the manner of partially distinguishing the first matching document snippet comprises changing the background color of at least some of the textual display of the first matching document snippet.

3. The system of claim 1, wherein the first action set comprises no more than five single actions.

4. The system of claim 3, wherein the first action set comprises no more than three single actions.

5. The system of claim 4, wherein the first action set comprises no more than one single action.

6. The system of claim 5, wherein the second action set comprises no more than one single action.

7. The system of claim 5, wherein the effects of the first single action being performed include activation of a hyperlink.

8. The system of claim 4, further comprising:
   a search engine service in the electronic communication network comprising one or more of the one or more hardware-based processors and one or more of the one or more hardware-based memories storing computer-executable instructions;
   wherein:
      in response to receiving the search query the search engine service generates the query response document; and
      the search engine service transmits the query response document.

9. The system of claim 8, wherein the search engine service receives a server content version of the sourced document from a document source and in response to the first selection input the user agent retrieves the client content version from the document source.

10. The system of claim 9, wherein the retrieval of the client content version of the sourced document is an undistinguished retrieval from the document source.

11. The system of claim 5, further comprising:
- a search engine service in the electronic communication network comprising one or more of the one or more hardware-based processors and one or more of the one or more hardware-based memories storing computer-executable instructions;
- wherein:
  - in response to receiving the search query the search engine service generates the query response document; and
  - the search engine service transmits the query response document.

12. The system of claim 11, wherein the search engine service obtains a server content version of the sourced document from a document source and in response to the first selection input the user agent retrieves the client content version from the document source.

13. The system of claim 12, wherein the retrieval of the client content version of the sourced document is an undistinguished retrieval from the document source.

14. The system of claim 5, wherein the text of the first matching document snippet matches the text of the first snippet from the set of two or more response snippets.

15. A method for search, retrieval, and display of information in an electronic communication network, the method comprising:
- transmitting, in response to a query input, a search query from a user agent comprising one or more hardware-based processors, one or more hardware-based memories storing computer-executable instructions, and one or more screens in the electronic communication network;
- receiving a first query response document comprising a set of two or more response snippets;
- displaying the query response document in a response document display on the one or more screens;
- selecting a sourced document by receiving a first selection input from within the response document display;
- in response to the first selection input, providing a first distinguishing context for a first document display of a client content version of the sourced document on the one or more screens;
- selecting the sourced document by receiving a second selection input from within the response document display;
- in response to the second selection input, providing a second distinguishing context for a second document display of the client content version of the sourced document on the one or more screens;
- in response to a first action set of single actions comprising the first selection input and zero or more single actions permitted according to the set of distinguishing inputs of the first distinguishing context of the first document display, distinguishing partially and displaying visibly a first matching document snippet of the client content version that is canonically similar to the first set of one or more response snippets in the first document display on the one or more screens;
- in response to a second action set of single actions comprising the second selection input and zero or more single actions permitted according to the set of distinguishing inputs of the second distinguishing context of the second document display, distinguishing partially and displaying visibly a first matching document snippet of the client content version that is canonically similar to the second set of one or more response snippets in the second document display on the one or more screens;
- displaying, in the first document display and in a manner that is not distinguishing according to the distinguishing manner of the first distinguishing context, the second matching document snippet; and
- displaying, in the second document display and in a manner that is not distinguishing according to the distinguishing manner of the second distinguishing context, the first matching document snippet.

16. The method of claim 15, wherein the manner of partially distinguishing the first matching document snippet comprises changing the background color of at least some of the textual display of the first matching document snippet.

17. The method of claim 15, wherein the first action set comprises no more than five single actions.

18. The method of claim 17, wherein the first action set comprises no more than three single actions.

19. The method of claim 18, wherein the first action set comprises no more than one single action.

20. The method of claim 19, wherein the second action set comprises no more than one single action.

21. The method of claim 18, wherein the effects of the first single action being performed include activation of a hyperlink.

22. The method of claim 18, further comprising:
- receiving the search query at a search engine service comprising one or more hardware-based processors and one or more hardware-based memories storing computer-executable instructions;
- constructing, in response to receiving the search query, the query response document;
- transmitting the query response document from the search engine service.

23. The method of claim 22, further comprising:
- receiving a server content version of the sourced document from a document source by the search engine service; and
- retrieving the client content version of the sourced document from the document source by the user agent in response to the first selection input.

24. The method of claim 23, wherein retrieving the client content version of the sourced document from the document source by the user agent is an undistinguished retrieval from the document source.

25. The method of claim 19, further comprising:
- receiving the search query at a search engine service comprising one or more hardware-based processors and one or more hardware-based memories storing computer-executable instructions;
- constructing, in response to receiving the search query, the query response document;
- transmitting the query response document from the search engine service.

26. The method of claim 25, further comprising:
- receiving a server content version of the sourced document from a document source by the search engine service; and
- retrieving the client content version of the sourced document from the document source by the user agent in response to the first selection input.

27. The method of claim 26, wherein retrieving the client content version of the sourced document from the document source by the user agent is an undistinguished retrieval from the document source.

28. The method of claim 18, wherein the text of the first matching document snippet matches the text of the first snippet from the set of two or more response snippets.

\* \* \* \* \*